(12) United States Patent
Tagawa et al.

(10) Patent No.: US 7,471,878 B2
(45) Date of Patent: *Dec. 30, 2008

(54) PLAYBACK PROGRAM

(75) Inventors: Kenji Tagawa, Katano (JP); Hideki Matsushima, Studio City, CA (US); Teruto Hirota, Moriguchi (JP); Tomokazu Ishikawa, Toyonaka (JP); Shinji Inoue, Neyagawa (JP); Masayuki Kozuka, Arcadia, CA (US)

(73) Assignee: Panasonic Corporation, Osaka (JP)

( * ) Notice: Subject to any disclaimer, the term of this patent is extended or adjusted under 35 U.S.C. 154(b) by 1191 days.

This patent is subject to a terminal disclaimer.

(21) Appl. No.: 10/832,434

(22) Filed: Apr. 27, 2004

(65) Prior Publication Data

US 2004/0197084 A1 Oct. 7, 2004

Related U.S. Application Data

(62) Division of application No. 10/446,655, filed on May 29, 2003, now Pat. No. 6,779,116, which is a division of application No. 09/580,581, filed on May 26, 2000, now Pat. No. 6,647,496.

(30) Foreign Application Priority Data

| May 28, 1999 | (JP) | 11-149893 |
| Aug. 24, 1999 | (JP) | 11-236724 |
| Dec. 28, 1999 | (JP) | 11-372604 |

(51) Int. Cl.
   *H04N 5/91* (2006.01)
(52) U.S. Cl. .................. 386/96; 713/193
(58) Field of Classification Search .................. 386/46, 386/82, 95–98, 131; 713/167, 193, 200, 713/201; 369/30.01; 715/719; 700/94; 711/115
See application file for complete search history.

(56) References Cited

U.S. PATENT DOCUMENTS 5,244,705 A   9/1993  Tsurushima et al.

(Continued)

FOREIGN PATENT DOCUMENTS

CN   1084108   12/1996

(Continued)

OTHER PUBLICATIONS

Chinese Office Action mailed Dec. 26, 2003 for Chinese Application No. 00801493.0 w/English translation.

(Continued)

*Primary Examiner*—Thai Tran
*Assistant Examiner*—Mishawn Dunn
(74) *Attorney, Agent, or Firm*—Wenderoth, Lind & Ponack, L.L.P.

(57) ABSTRACT

A plurality of audio object (AOB) files and a plurality of picture object (POB) files are stored. Default Play list Information and sets of Playlist Information each show an order in which AOBs stored in the plurality of AOB files are to be reproduced. The DPLGI includes DPLI_POB_SRPs that specify at least one POB to be displayed during the playback period of AOBs indicated by the playback order given in the Default Playlist Information. The TKGI includes TKI_POB_SRPs that specify at least one POB to be displayed only during the playback period of a particular AOB out of the AOBs indicated by the playback order given in the Default Playlist Information.

3 Claims, 100 Drawing Sheets

U.S. PATENT DOCUMENTS

| | | | |
|---|---|---|---|
| 5,300,233 A | | 4/1994 | Lee et al. |
| 5,301,172 A | | 4/1994 | Richards et al. |
| 5,499,316 A | | 3/1996 | Sudoh et al. |
| 5,815,201 A | | 9/1998 | Hashimoto et al. |
| 5,887,193 A | * | 3/1999 | Takahashi et al. ............... 710/8 |
| 5,892,975 A | | 4/1999 | Barnes et al. |
| 5,911,031 A | | 6/1999 | Lee |
| 5,920,477 A | * | 7/1999 | Hoffberg et al. ............. 382/181 |
| 6,480,197 B1 | | 11/2002 | Bluthgen et al. |
| 6,693,636 B2 | | 2/2004 | Bluthgen et al. |
| 2003/0043136 A1 | | 3/2003 | Snyder et al. |

FOREIGN PATENT DOCUMENTS

| | | |
|---|---|---|
| EP | 0 802 688 | 10/1997 |
| EP | 0 840 506 | 5/1998 |
| GB | 2 300 286 | 10/1996 |
| RU | 2 032 233 | 3/1995 |
| RU | 2 121 164 | 10/1998 |

OTHER PUBLICATIONS

Chinese Office Action mailed Jul. 16, 2004 for Chinese Application No. 00801493.0 w/English translation.

Russian Office Action mailed Sep. 29, 2004 for Russian Application No. 2001105543 w/English translation.

* cited by examiner

USER DATA AREA

PROTECTED AREA

FIG. 11A
MPEG2-AAC format

| format | Audio_Data_Transport_Stream(ADTS) |
|---|---|
| Profile | Low Complexity(LC) profile(mandatory) |
| bitrate per channel** | between 16kbit/s(min.)and 72kbit/s(max.)<br>Other bitrates are optional. |
| sampling_frequency | 48 kHz(mandatory)<br>44.1 kHz(mandatory)<br>32 kHz(mandatory)<br>24 kHz(mandatory)<br>22.05 kHz(mandatory)<br>16 kHz(mandatory) |
| channel_configuration | single_channel_element(mandatory)<br>channel_pair_element(mandatory) |
| number_of_data_blocks_in_frame | 1 header/1 raw_data_block(mandatory) |

FIG. 11B
MPEG layer 3 format

| format | MPEG-1 layer 3<br>MPEG-2 layer 3 low sampling frequency |
|---|---|
| bitrate per channel** | MPEG 1:between 16kbit/s and 96kbit/s<br>MPEG 2 LSF:between 16kbit/s and 80kbit/s<br>Other bitrates and variable bitrate are optional.<br>Bitrate index "0000",i.e. "free format" is not supported. |
| sampling_frequency | 48 kHz<br>44.1 kHz<br>32 kHz<br>24 kHz<br>22.05 kHz<br>16 kHz |
| mode | stereo<br>joint_stereo<br>single_cannel |

FIG. 11C
Windows Media Audio format

| format | Windows Media Audio format |
|---|---|
| bitrate per channel** | between 8kbit/s and 80kbit/s<br>Other bitrates are optional. |
| sampling_frequency | 48 kHz<br>44.1 kHz<br>32 kHz<br>22.05 kHz<br>16 kHz |
| mode | monaural<br>stereo |

FIG. 14

| sampling frequency | FNs_Middle_TMSRTE | | |
|---|---|---|---|
| | AAC | MPEGlayer3 | WMA |
| 48kHz | 47*N | 42*N | ××× |
| 44.1kHz | 43*N | 38*N | ××× |
| 32kHz | 32*N | 28*N | ××× |
| 24kHz | 24*N | 42*N | ××× |
| 22.05kHz | 22*N | 38*N | ××× |
| 16kHz | 16*N | 28*N | ××× |

※ N BEING THE PLAYBACK PERIOD "TIME_LENGTH" OF AN AOB_ELEMENT TO AN ACCURACY OF 1/1000TH OF ONE SECOND

FIG. 23A

| RELATIVE BYTE POSITION | FIELD NAME | CONTENT | NUMBER OF BYTES |
|---|---|---|---|
| 60 to 63 | DATA_OFFSET | FIRST ADDRESS OF AOB_BLOCK | 4 BYTES |
| 64 to 67 | SZ_DATA | DATA LENGTH OF AOB_BLOCK | 4 BYTES |
| 68 to 71 | TMSRTE_Ns | NUMBER OF TMSRT_entries | 4 BYTES |
| 72 to 73 | FNs_1st_TMSRTE | NUMBER OF AOB_FRAMEs IN FIRST AOB ELEMENT | 2 BYTES |
| 74 to 75 | FNs_Last_TMSRTE | NUMBER OF AOB_FRAMEs IN LAST AOB ELEMENT | 2 BYTES |
| 76 to 77 | FNs_Middle_TMSRTE | NUMBER OF AOB_FRAMEs IN AOB_ELEMENTS | 2 BYTES |
| 78 to 79 | TIME_LENGTH | PLAYBACK PERIOD OF AOB_ELEMENTS | 2 BYTES |
|  |  | TOTAL | 20 BYTES |

FIG. 23B

| sampling frequency | FNs_Middle_TMSRTE | | |
|---|---|---|---|
| | AAC | MPEGlayer3 | WMA |
| 48 kHz | 47*N | 42*N | xxx |
| 44.1 kHz | 43*N | 38*N | xxx |
| 32 kHz | 32*N | 28*N | xxx |
| 24 kHz | 24*N | 42*N | xxx |
| 22.05 kHz | 22*N | 38*N | xxx |
| 16 kHz | 16*N | 28*N | xxx |

※ N BEING THE PLAYBACK PERIOD "TIME_LENGTH" OF AN AOB_ELEMENT TO AN ACCURACY OF 1/1000TH OF ONE SECOND

FIG. 23C

TIME_LENGTH

| b15 | b14 | b13 | b12 | b11 | b10 | b9 | b8 |
|---|---|---|---|---|---|---|---|
| | | | TIME_LENGTH[15...8] | | | | |

| b7 | b6 | b5 | b4 | b3 | b2 | b1 | b0 |
|---|---|---|---|---|---|---|---|
| | | | TIME_LENGTH[7...0] | | | | |

TIME_LENGTH=2000 FOR AAC.MP3

FNs_Middle_TMSRTE

| b15 | b14 | b13 | b12 | b11 | b10 | b9 | b8 |
|---|---|---|---|---|---|---|---|
| | | | reserved | | | | |

| b7 | b6 | b5 | b4 | b3 | b2 | b1 | b0 |
|---|---|---|---|---|---|---|---|
| | | | FNs_Middle_TMSRTE[7...0] | | | | |

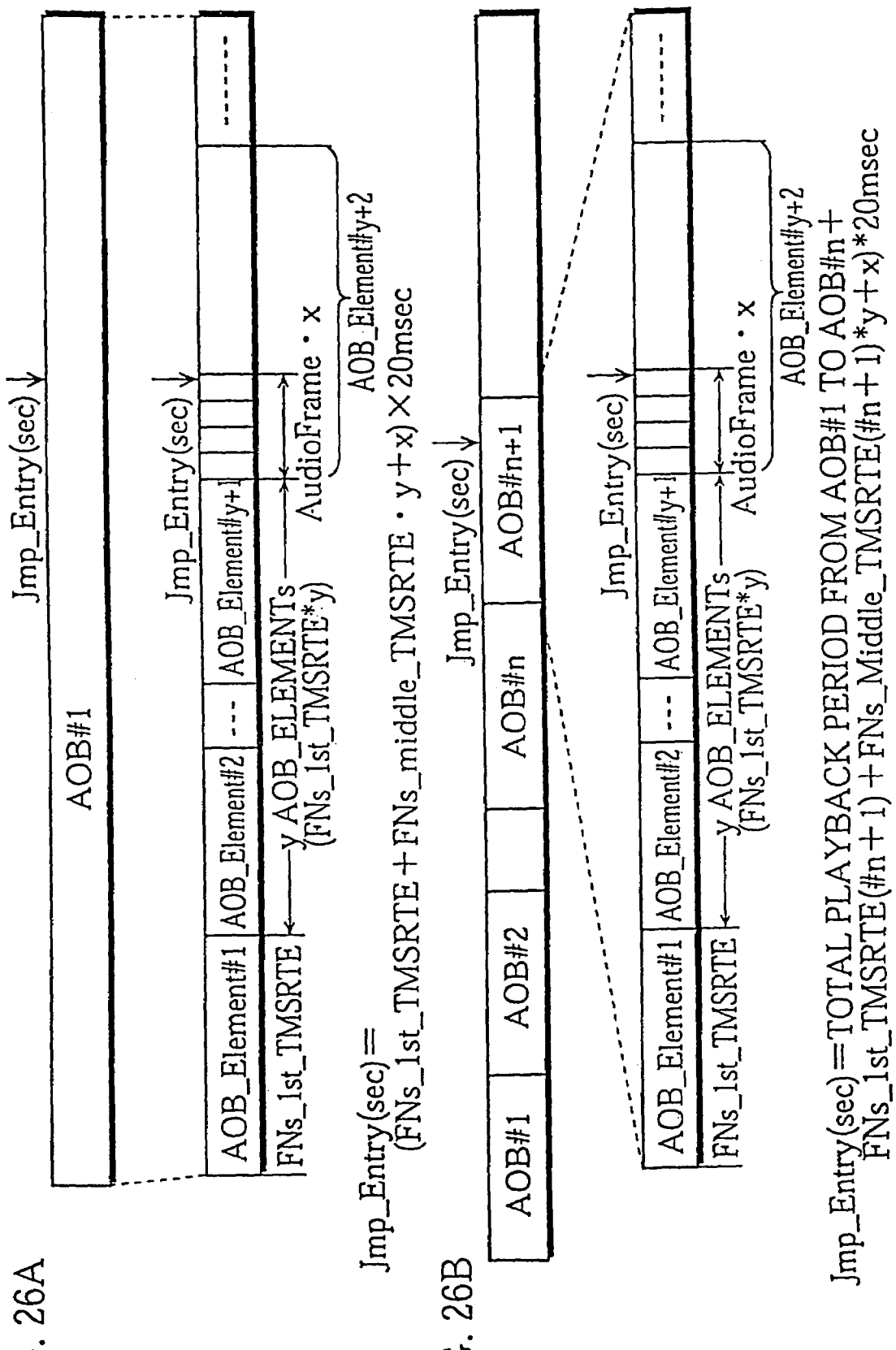

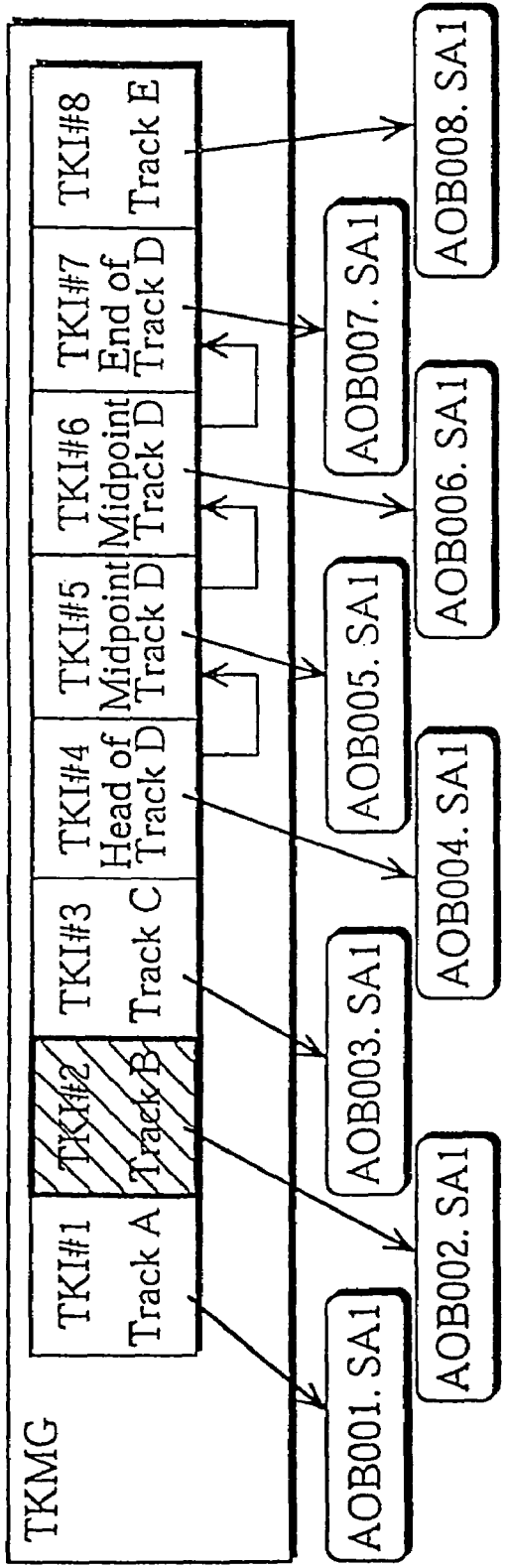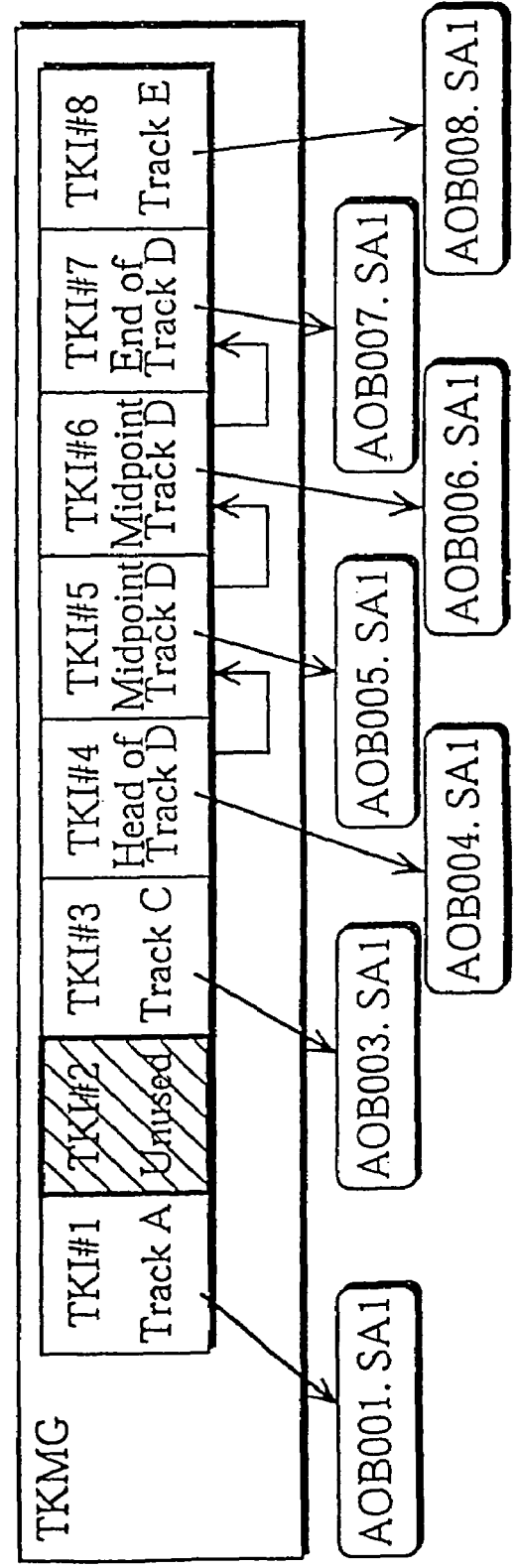

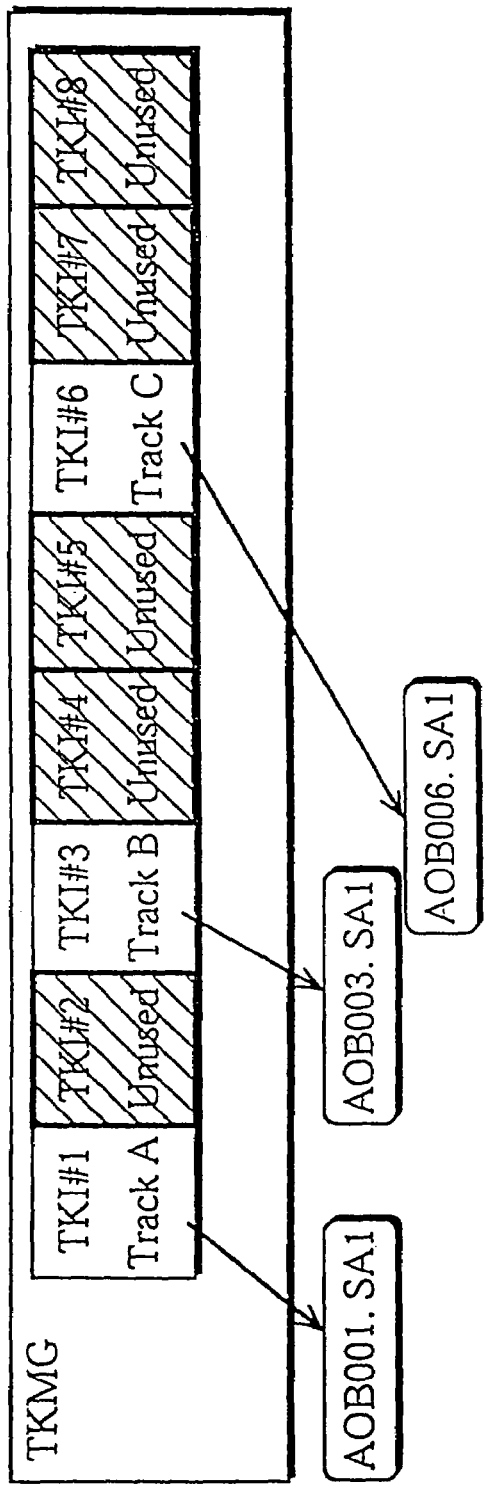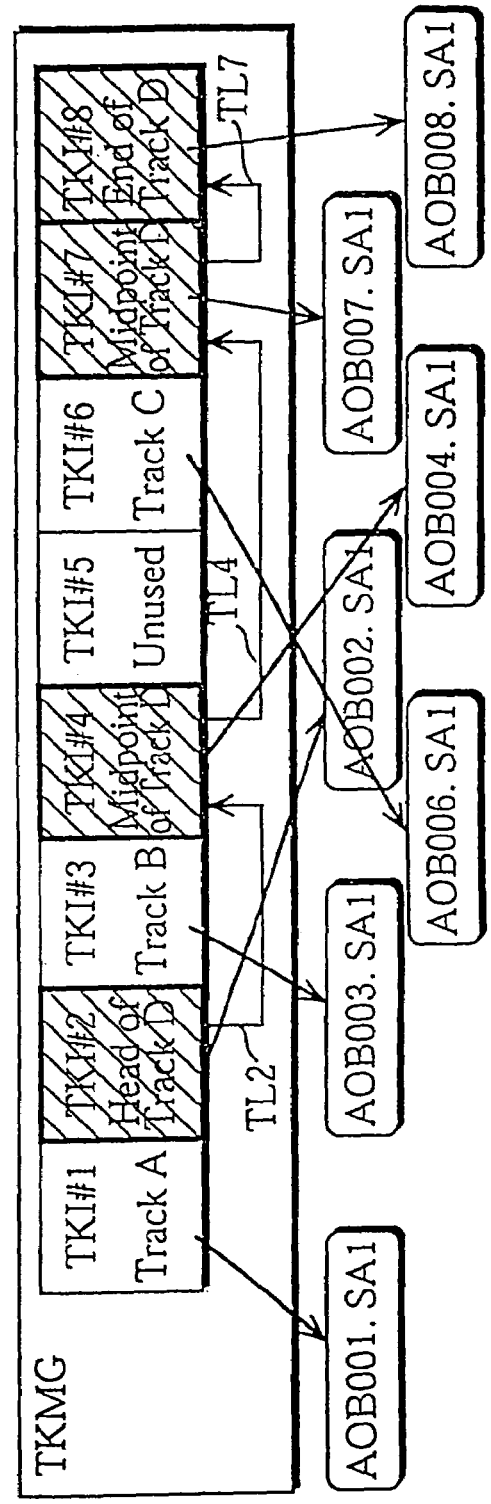
FIG. 28A  UPDATING TrackManager USING UNUSED TKI AT DIFFERENT POSITIONS (case 2)
FIG. 28B

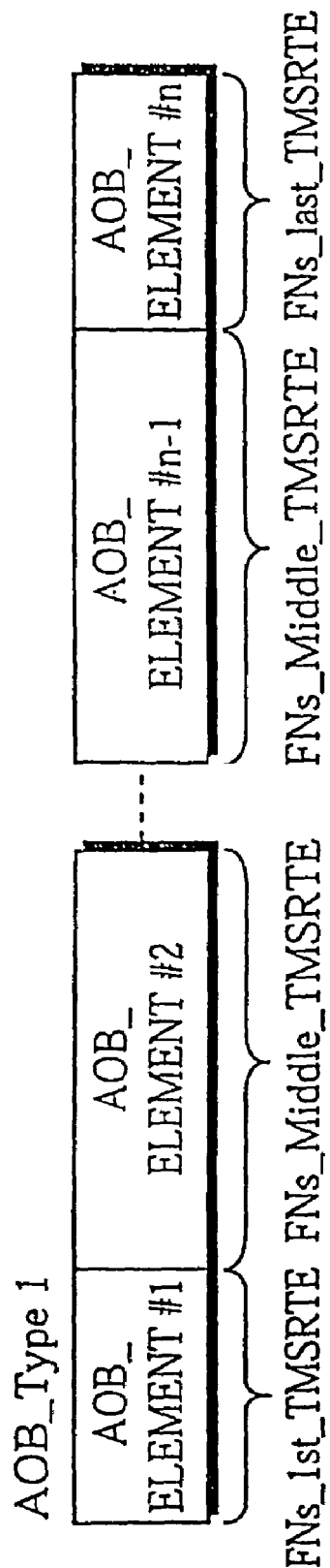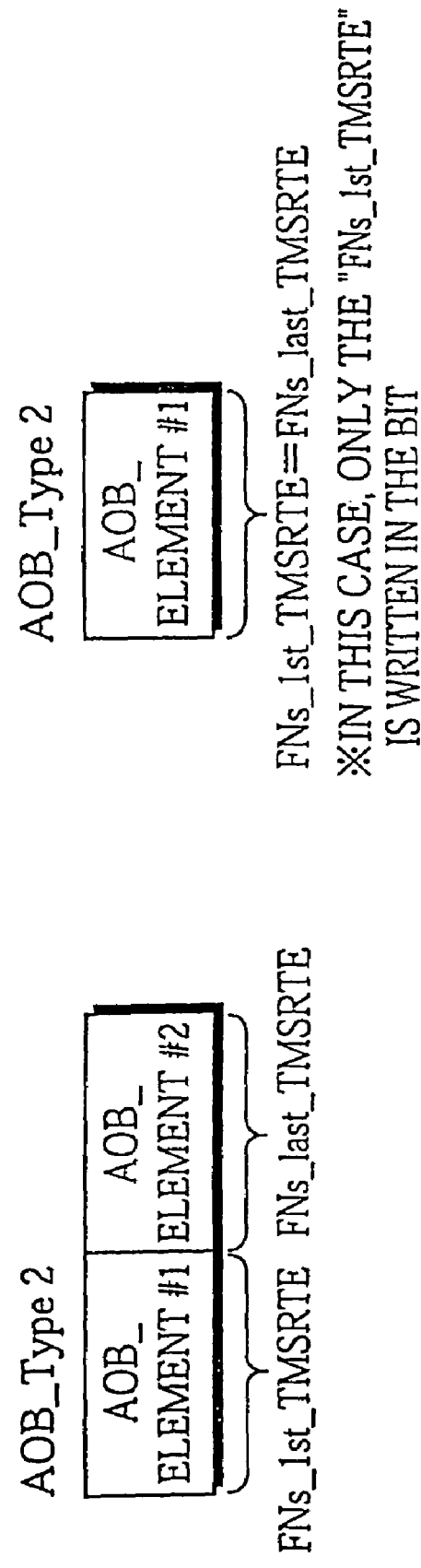

SD-Audio DIRECTORY ENTRY

SD-Audio DIRECTORY ENTRIES

FIG. 50A
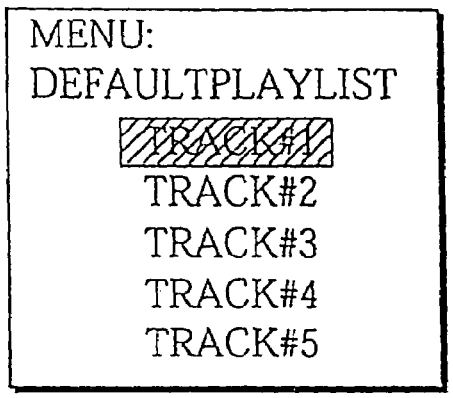
FIG. 50B
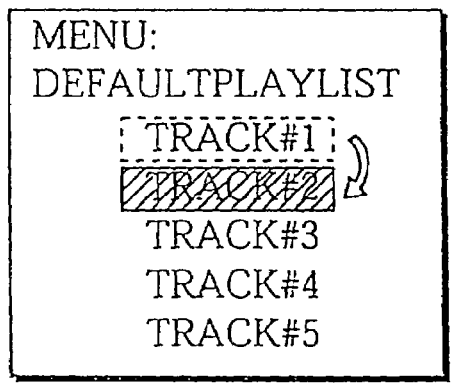
FIG. 50C
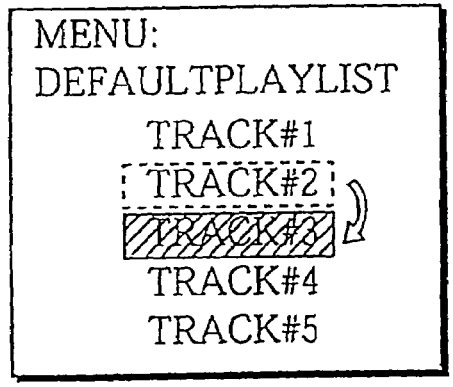
FIG. 50D
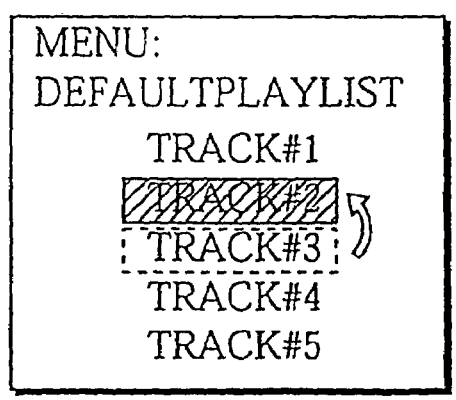
FIG. 50E
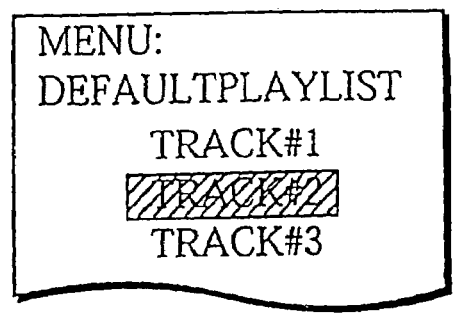
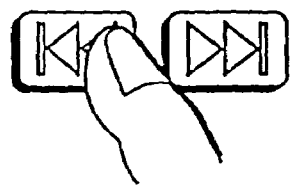
PLAY ···INDICATES THAT TRACK#2 SHOULD BE PLAYED BACK
Playlist ···INDICATES THAT TRACK#2 SHOULD BE EDITED

PLAYBACK TIME CODE=00:00:00. 000

PLAYBACK TIME CODE=00:00:00. 020

PLAYBACK TIME CODE=00:00:00. 040

PLAYBACK TIME CODE=00:00:00. 120

PLAYBACK POINT
PLAYBACK TIME CODE=00:00:01.000

PLAYBACK TIME CODE=00:00:01.240

PLAYBACK TIME CODE=00:00:03.240(2.000sec+1.240sec)

PLAYBACK TIME CODE=00:00:03.480

PLAYBACK TIME CODE=00:04:40 (=280sec)
280sec=(80(=FNs_1st_TMSRTE)+148*94
(=FNs_Middle_TMSRTE)+8*20msec

FRAME POSITION
AT WHICH PLAYBACK
SHOULD START

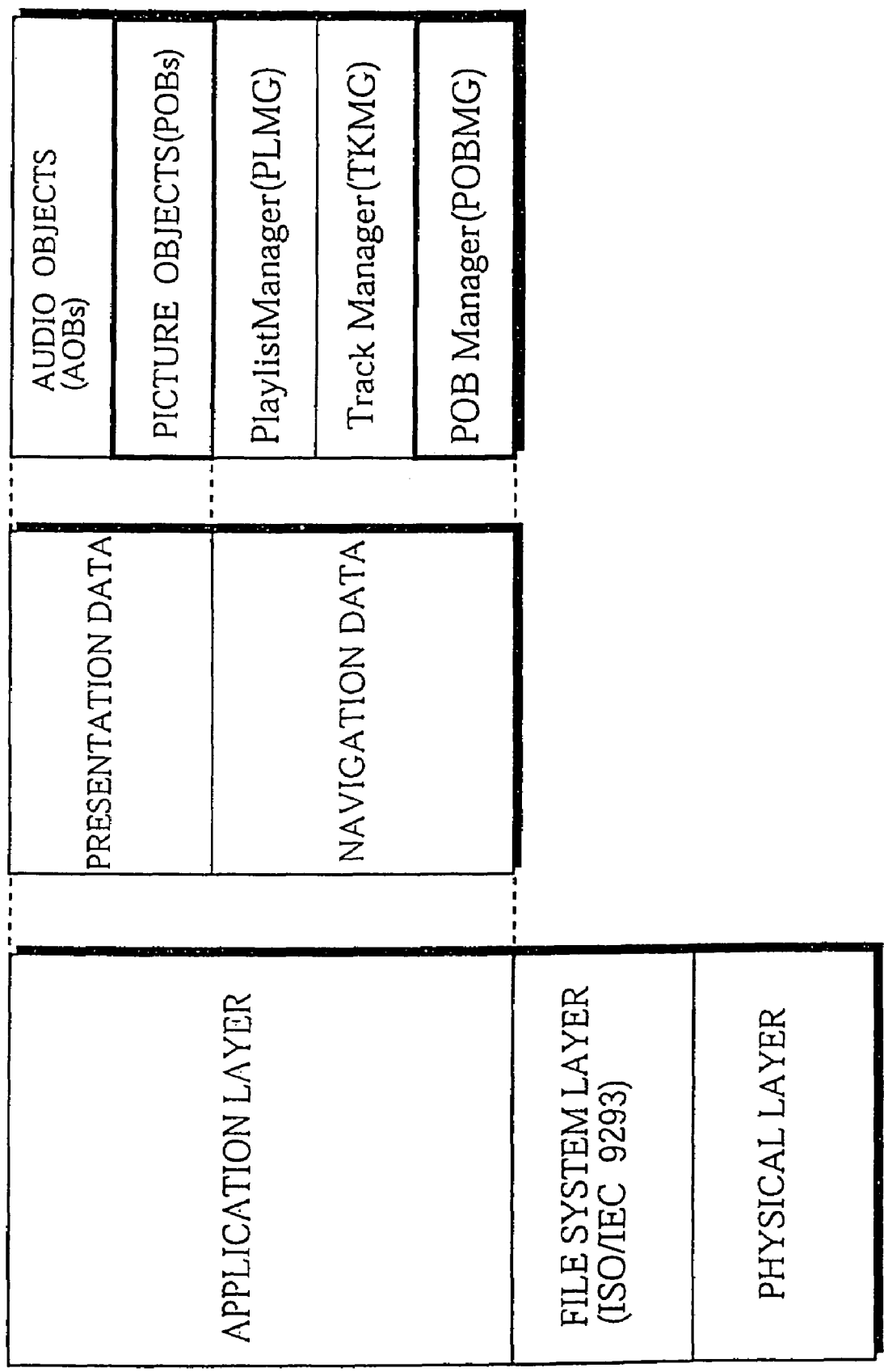

FIG. 70A
USER DATA AREA
FIG. 70B
PROTECTED AREA
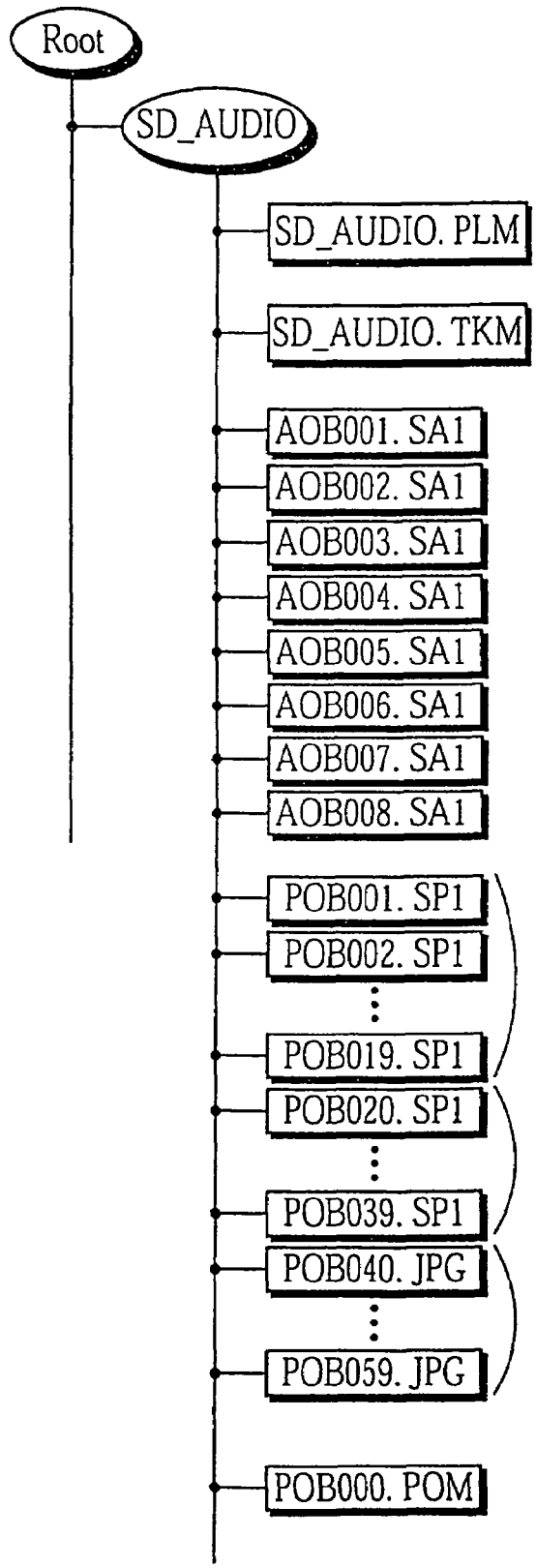
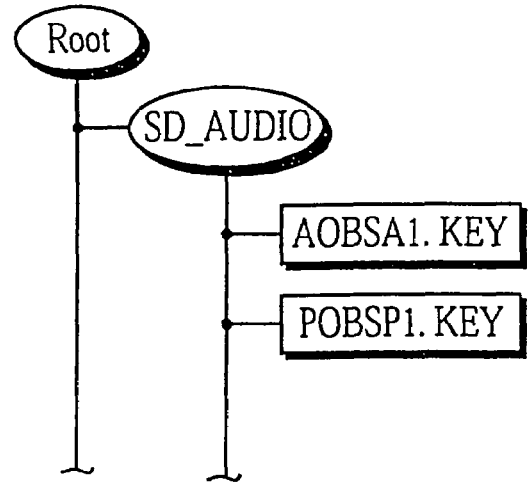

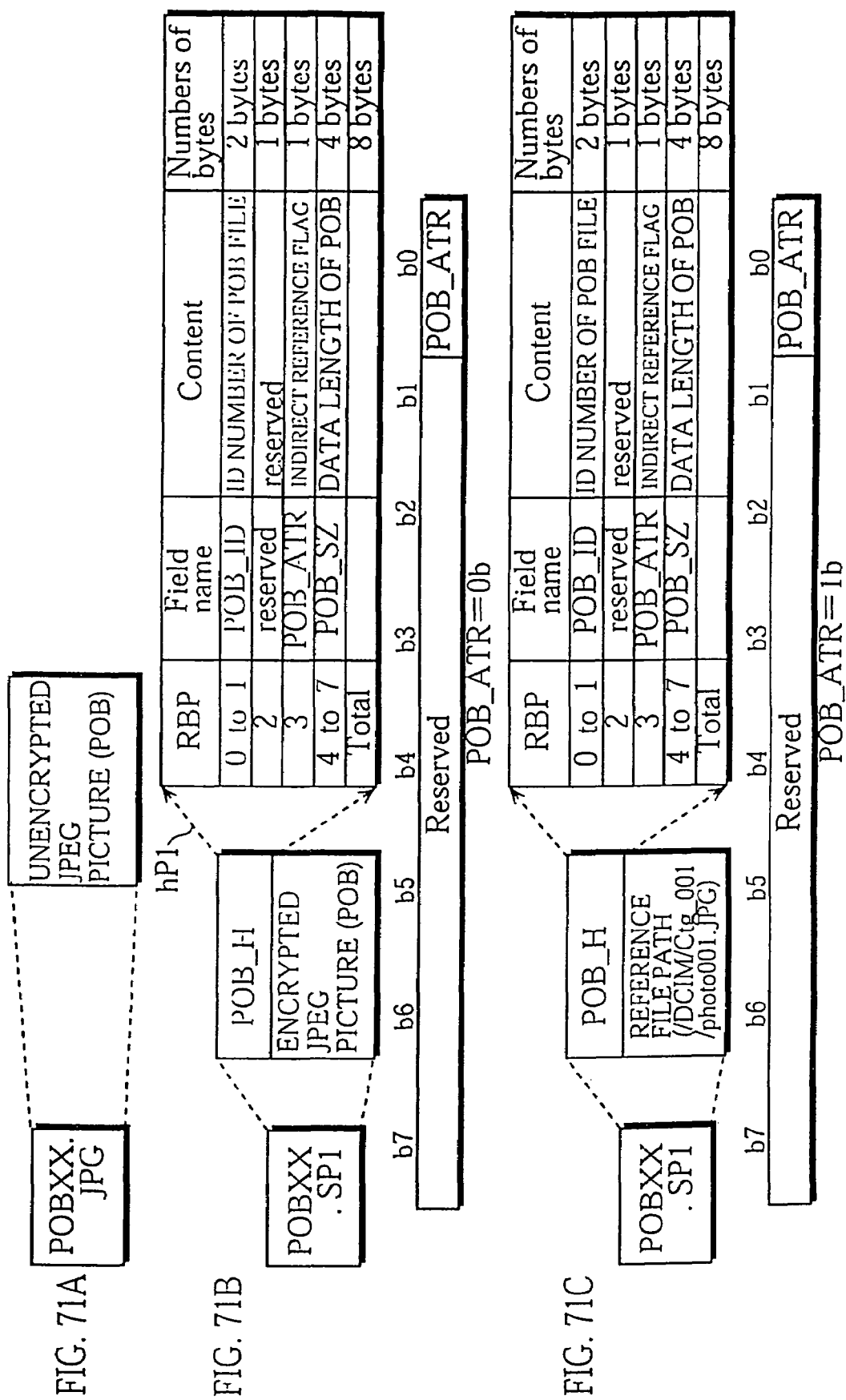

FIG. 80
POB004.SP1  
TrackB LYRICS
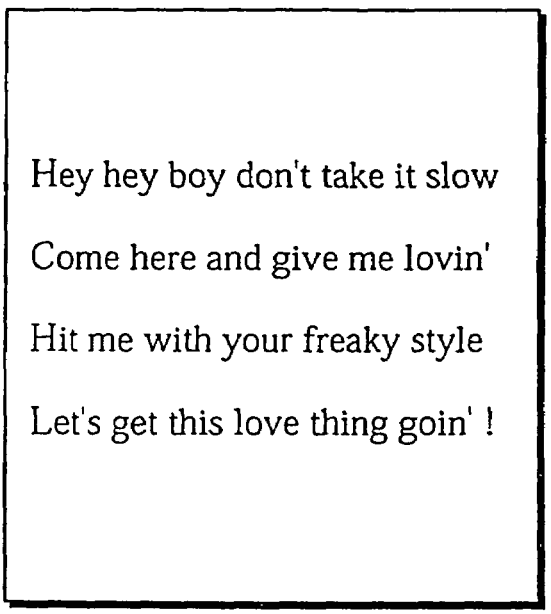
POB022.SP1  
ARTIST PHOTO

FIG. 81
POB010 TrackD (1/4) LYRICS
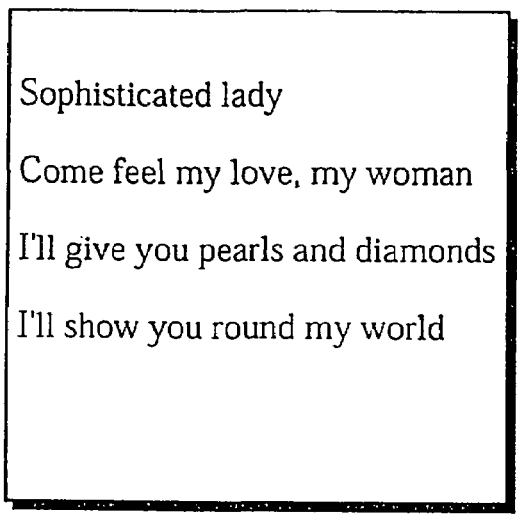
POB026 IMAGE FROM PROMO VIDEO

FIG. 85
POB004.SP1  
TrackB LYRICS
POB042  
PET PHOTO
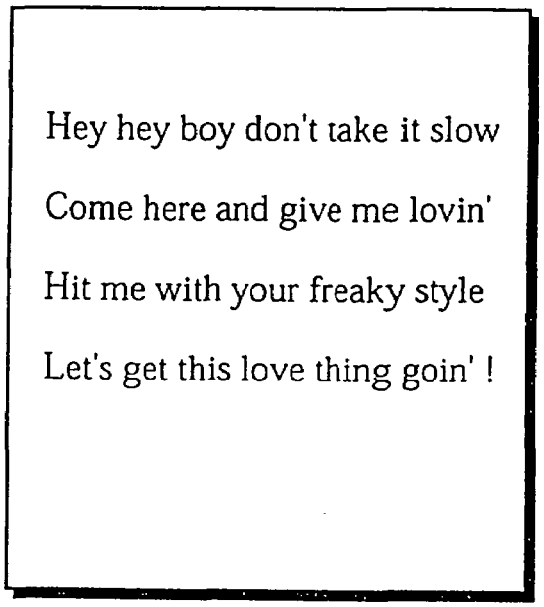
IMAGE FORMED BY COMBINING
POB004 SPECIFIED BY PLI#1 WITH POB042

FIG. 86
POB010 TrackD (1/4) LYRICS
Sophisticated lady
Come feel my love, my woman
I'll give you pearls and diamonds
I'll show you round my world
POB046 HOLIDAY SNAP FROM EUROPE
IMAGE FORMED BY COMBINING
POB010 SPECIFIED BY PLI#1 WITH POB046

SIX MINUTES AFTER
START OF PLAYBACK

SIXTEEN MINUTES AFTER
START OF PLAYBACK

SIX MINUTES AFTER
START OF PLAYBACK

SIXTEEN MINUTES AFTER
START OF PLAYBACK

FIG. 100A    PHRASE TIMING TABLE

```
TKI#1
  TKI_POB_SRP#1   PHRASE DISPLAY START 0min0.000sec
                  PHRASE DISPLAY END 2min1.800sec
  TKI_POB_SRP#2   PHRASE DISPLAY START 2min1.801sec
                  PHRASE DISPLAY END 4min3.600sec
  TKI_POB_SRP#3   PHRASE DISPLAY START 4min3.601sec
                  PHRASE DISPLAY END 6min6.000sec
TKI#2
  TKI_POB_SRP#1   PHRASE DISPLAY START 0min 0.000sec
                  PHRASE DISPLAY END 1min 6.000sec
  TKI_POB_SRP#2   PHRASE DISPLAY START 1min 6.001sec
                  PHRASE DISPLAY END 2min12.000sec
  TKI_POB_SRP#3   PHRASE DISPLAY START 2min12.001sec
                  PHRASE DISPLAY END 3min18.000sec
TKI#3
  TKI_POB_SRP#1   PHRASE DISPLAY START 0min 0.000sec
                  PHRASE DISPLAY END 1min49.800sec
  TKI_POB_SRP#2   PHRASE DISPLAY START 1min48.901sec
                  PHRASE DISPLAY END 3min39.600sec
  TKI_POB_SRP#3   PHRASE DISPLAY START 3min39.601sec
                  PHRASE DISPLAY END 5min30.000sec
```

FIG. 100B    HIGHLIGHT COORDINATE TABLE

```
TKI#2、TKI_POB_SRP#1
        DISPLAY
COORDINATES OF CHARACTERS    PHRASE START TIME
    X,Y COORDINATES OF "H"       0min10.000sec
    X,Y COORDINATES OF "e"       0min10.000sec
    X,Y COORDINATES OF "y"       0min10.000sec
    X,Y COORDINATES OF "h"       0min12.000sec
    X,Y COORDINATES OF "e"       0min12.000sec
    X,Y COORDINATES OF "y"       0min12.000sec
    X,Y COORDINATES OF "b"       0min13.000sec
    X,Y COORDINATES OF "o"       0min13.000sec
    X,Y COORDINATES OF "y"       0min13.000sec
    X,Y COORDINATES OF "d"       0min15.000sec
    X,Y COORDINATES OF "o"       0min15.000sec
    X,Y COORDINATES OF "n"       0min15.000sec
    X,Y COORDINATES OF "'"       0min15.000sec
    X,Y COORDINATES OF "t"       0min15.000sec
    X,Y COORDINATES OF "t"       0min16.000sec
    X,Y COORDINATES OF "a"       0min16.000sec
    X,Y COORDINATES OF "k"       0min16.000sec
    X,Y COORDINATES OF "e"       0min16.000sec
```

PLAYBACK PROGRAM

This is a divisional application of Ser. No. 10/446,655, filed May 29, 2003, now U.S. Pat. No. 6,779,116 which is a divisional application of Ser. No. 09/580,581, filed May 26, 2000 now U.S. Pat. No. 6,647,496.

This application is based on applications Nos. H11-149893, H11-236724, and H11-372604 filed in Japan, the contents of which is hereby incorporated by reference.

BACKGROUND OF THE INVENTION

1. Field of the Invention

The present invention relates to a semiconductor memory card that stores audio data, still image data and control data, and to a playback apparatus, recording apparatus, playback method, recording method, and computer-readable recording medium relating to such a semiconductor memory card. In particular, the present invention relates to improved storage of audio data, image data and control data distributed as contents by a content distribution service, such as an electronic music distribution service.

2. Description of Background Art

Electronic music distribution enables users to purchase and receive music contents (e.g., songs and albums) via the Internet. Such technology has the potential to greatly change the market for recorded music and is gradually becoming possible as the necessary infrastructure is introduced. One way to store music contents that are obtained from an electronic, music distribution service is on semiconductor memory cards whose portability makes them ideal. Accordingly, a great increase is expected in the demand for such cards.

Music contents are not restricted to merely containing audio data. As one example, "mixed-media" audio contents can include related images that are to be displayed when music is played back. Such mixed-media audio contents can be used for "karaoke software" that is composed of a backing audio track and images for the lyrics of a song and a background. It is believed such mixed-media audio contents will also be subject to electronic music distribution, so that it is necessary to consider how such contents should be stored in a semiconductor memory card.

The following describes how mixed-media music contents are stored on a recording medium, such as a CD (Compact Disc), which is to say, how audio data and image data are conventionally stored on a recording medium.

To enable a player to play back music and display images, a conventional mixed-media music content is recorded onto a recording medium as multiplexed data produced by multiplexing audio data for the music with image data for the lyrics and/or background images. When the multiplexed data is reproduced, the image data can be displayed while the audio data is being played back.

A CD-Graphics disc is one example of a medium that enables image data to be displayed while audio data is being played backed by having such data multiplexed together. When producing a CD-Graphics disc, data is multiplexed in units composed of 16-bit main codes and subcodes. Audio data is assigned to the 16-bit main codes, while image data for lyrics, background images and the like is assigned to the subcodes. When playback commences for any of the music contents recorded on a CD-Graphics disc, the audio data assigned to the 16-bit main codes is successively played back while the image data assigned to the subcodes is successively displayed.

When audio data and image data are multiplexed together in this way, it becomes necessary to provide separate images to each music content in a music album. This means that in this conventional multiplexing method, a disc producer has had to go to the trouble of producing at least one image for each music content.

It is believed that fans of major recording artists will appreciate having a different image for each song (music content) on an album. Since such artists can expect to sell many copies of their albums, the cost of providing such extra material should be covered by sales.

However, minor artists cannot expect high sales for their work even if different images are provided for each song, so that the cost of providing such material may not be offset by sales.

In this way, the commercial effect that results from the money and effort expended in the production of images will greatly differ depending on whether the artist is popular. With conventional discs, however, it is necessary to assign at least one image to each music content regardless of how popular the recording artist is or of how many sales can be expected. As a result, producers are dissatisfied with conventional media.

SUMMARY OF THE INVENTION

It is an object of the present invention to provide a semiconductor memory card that can reduce the effort required when providing images for a plurality of audio contents that compose an album.

When images are displayed during the playback of audio contents, images that represent the lyrics of a song should only be displayed during the playback of the corresponding song. Background images, however, may be commonly used during the playback of any number of songs. As one example, when the songwriter or artist is the same, the same picture of the songwriter or artist can be used as a background image for a number of songs. It is believed that this will make it easy for disc producers to store music data (audio objects) and image data (picture objects) together.

The sharing of image data (still image objects) between a plurality of audio objects can be preferably achieved by a semiconductor memory card storing: an audio sequence including a plurality of audio objects; a plurality of still image objects; at least one piece of playback route information showing an order in which audio objects, out of the plurality of audio objects in the audio sequence, are to be played back; at least one piece of first pointer information, each of which corresponds to a piece of playback route information and specifies at least one still image object that should be displayed when the audio objects in the order indicated by the corresponding piece of playback route information are played back; and at least one piece of second pointer information, each of which corresponds to an audio object in the audio sequence and specifies at least one still image object that should be displayed only during playback of the corresponding audio object.

A plurality of audio objects in an audio sequence are played back in accordance with a playback order given in a piece of playback route information. Still image objects that are to be displayed as background images during the playback of the audio objects are indicated by the first pointer information corresponding to the playback route information. As a result, shared still image objects can be displayed during the playback period of the plurality of audio objects included in the audio sequence.

Since the same images can be used for a plurality of tracks, the same image or images can be displayed during the playback of a plurality of audio objects in an audio sequence that corresponds to an album by a minor recording artist. This reduces the cost and effort of producing images for such an album.

Conversely, a plurality of different images can be provided for display during the playback of each audio object in an audio sequence that corresponds to an album by a major recording artist. Displaying a number of different images for each track makes the album more appealing to customers, and so can improve sales.

When there are still image objects, such as for song lyrics, that are to be displayed separately to the background images only during the playback of a particular track, such still image objects can be specified using second pointer information to assign the still image objects to only the particular track.

Here, the semiconductor memory card may further store a plurality of symbolic counters, each of which corresponds to a still image object and shows whether the still image object is specified by any of the at least one piece of first pointer information and the at least one piece of second pointer information and, if so, how many pieces of first pointer information and second pointer information specify the still image object.

When deleting audio objects and audio sequences, the recording apparatus for a semiconductor memory card specifies the second pointer information for the deleted audio objects and audio sequences and the first pointer information for any deleted audio sequence. The recording apparatus then decrements the numbers assigned to still image objects to show how many pieces of first pointer information and second pointer information specify each object. When the number assigned to any still image object reaches zero, the recording apparatus assumes that no piece of first pointer information or second pointer information specifies the still image object and so deletes the still image object. By deleting unused still image objects in this way, the storage capacity of a semiconductor memory card can be used more efficiently.

BRIEF DESCRIPTION OF THE DRAWINGS

These and other objects, advantages and features of the invention will become apparent from the following description thereof taken in conjunction with the accompanying drawings which illustrate a specific embodiment of the invention. In the Drawings:

FIG. 11A shows the parameters stipulated by ISO/IEC 13818-7 standard in tabular form;

FIG. 11B shows the parameters that should be used when encoding a file in MPEG-Layer 3 (MP3) format in tabular form;

FIG. 11C shows the parameters that should be used when encoding a file in Windows Media Audio (WMA) format in tabular form;

FIG. 14 shows the correspondence between the sampling_frequency and the number of AOB_FRAMEs included in an AOB_ELEMENT;

FIGS. 23A and 23B show the composition of the BIT;

FIG. 23C shows the Time_Length field;

FIGS. 26A and 26B shows how an AOB, an AOB_ELEMENT, and an AOB_FRAME that correspond to an arbitrary playback time code are specified;

FIGS. 27A and 27B show the deletion of a track;

FIG. 28A shows the TrackManager after the deletion of a track has been performed several times;

FIG. 28B shows how a new TKI and AOB file are written when "Unused" TKIs are present in the TrackManager;

FIG. 30A shows a Type1 AOB;

FIG. 30B shows Type2 AOBs;

FIGS. 50A to 50E show examples of the display on the LCD panel when a track is selected;

FIG. 69 shows the internal construction of a flash memory card according to the second embodiment of the present invention;

FIGS. 70A and 70B show the internal composition of the user data area and the protected area in the file system layer;

FIG. 71A shows the internal composition of a "POBXXX.JPG" file;

FIG. 71B shows the internal composition of a POB file that includes encrypted still image data;

FIG. 71C shows an example of a POB file that stores a file path in place of an encrypted data body;

FIG. 80 shows how a background image and foreground image are combined at a point six minutes after the start of playback according to the Default_Playlist_Information;

FIG. 81 shows how a background image and foreground image are combined at a point sixteen minutes after the start of playback according to the Default_Playlist_Information;

FIG. 85 shows how a background image and foreground image are combined at a point six minutes after the start of playback according to a PLI;

FIG. 86 shows how a background image and foreground image are combined at a point sixteen minutes after the start of playback according to a PLI;

FIG. 100A shows an example of the phrase timing table; and

FIG. 100B shows an example of the highlight coordinate table.

DESCRIPTION OF THE PREFERRED EMBODIMENTS

The following describes a semiconductor memory card (flash memory card) that is an embodiment of the present invention, with reference to the attached figures.

The following paragraphs are arranged into a hierarchy using reference numbers with the notation given below.

{x1-x2_x3-x4}

The length of a reference number shows the level of the topic in the hierarchy. As a specific example, the number x1 is the number of drawing that is being referred to in the explanation. The drawings attached to this specification have been numbered in the order in which they are referred to in the specification, so that the order of the drawings roughly matches the order of the explanation. The explanation of certain drawings has been divided into sections, with the reference number x2 giving the section number of a section in the explanation of a drawing indicated by the reference number x1. The reference number x3 shows the number of an additional drawing that is provided to show the details of the section indicated by the section number x2. Finally, the reference number x4 shows the number of a section in the explanation of this additional drawing.

First Embodiment

{1-1_2} External Appearance of the Flash Memory Card 31

Figure 1:
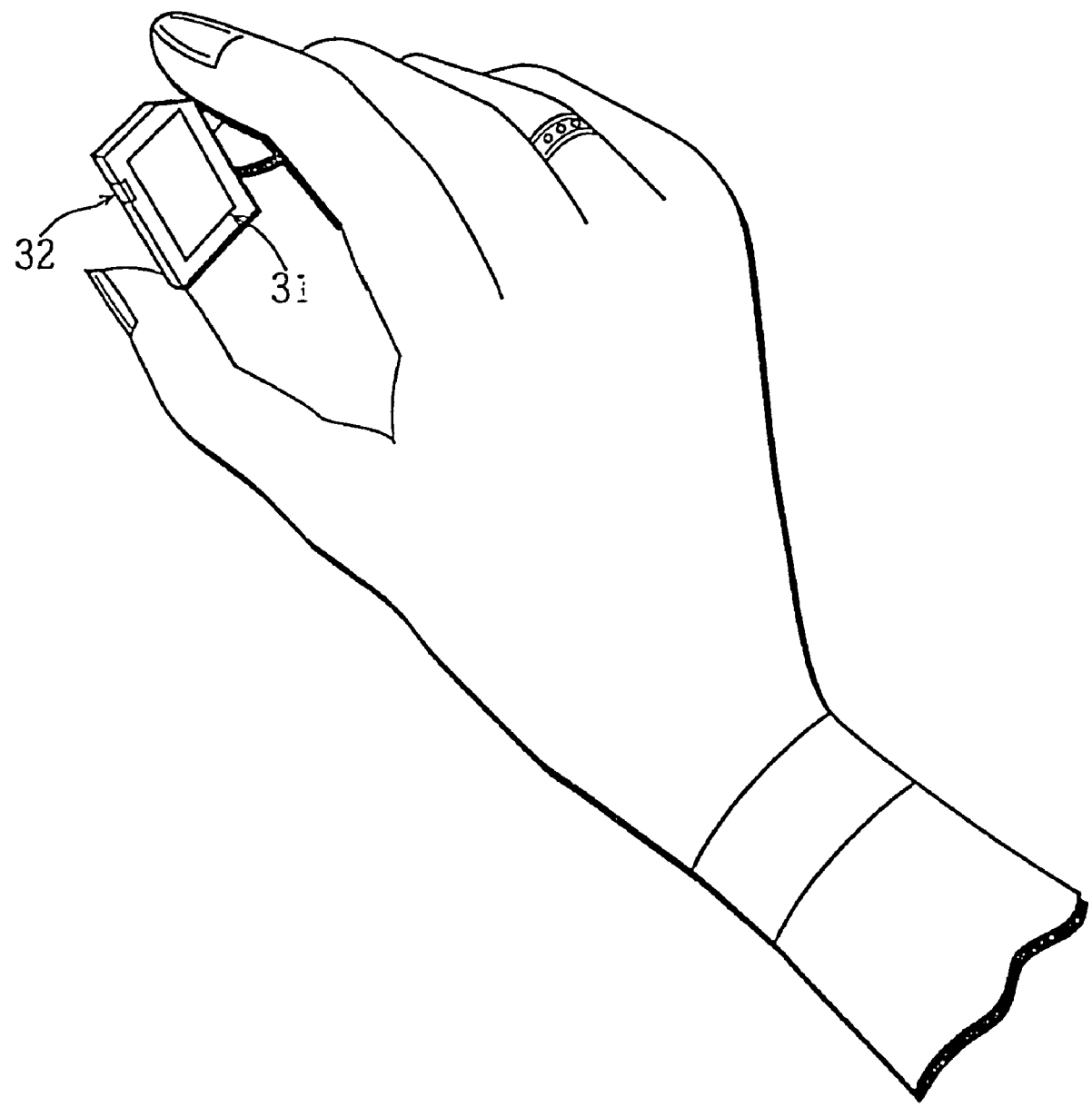
FIG. 1 shows the appearance of a flash memory card 31 when viewed from above.
Figure 2:
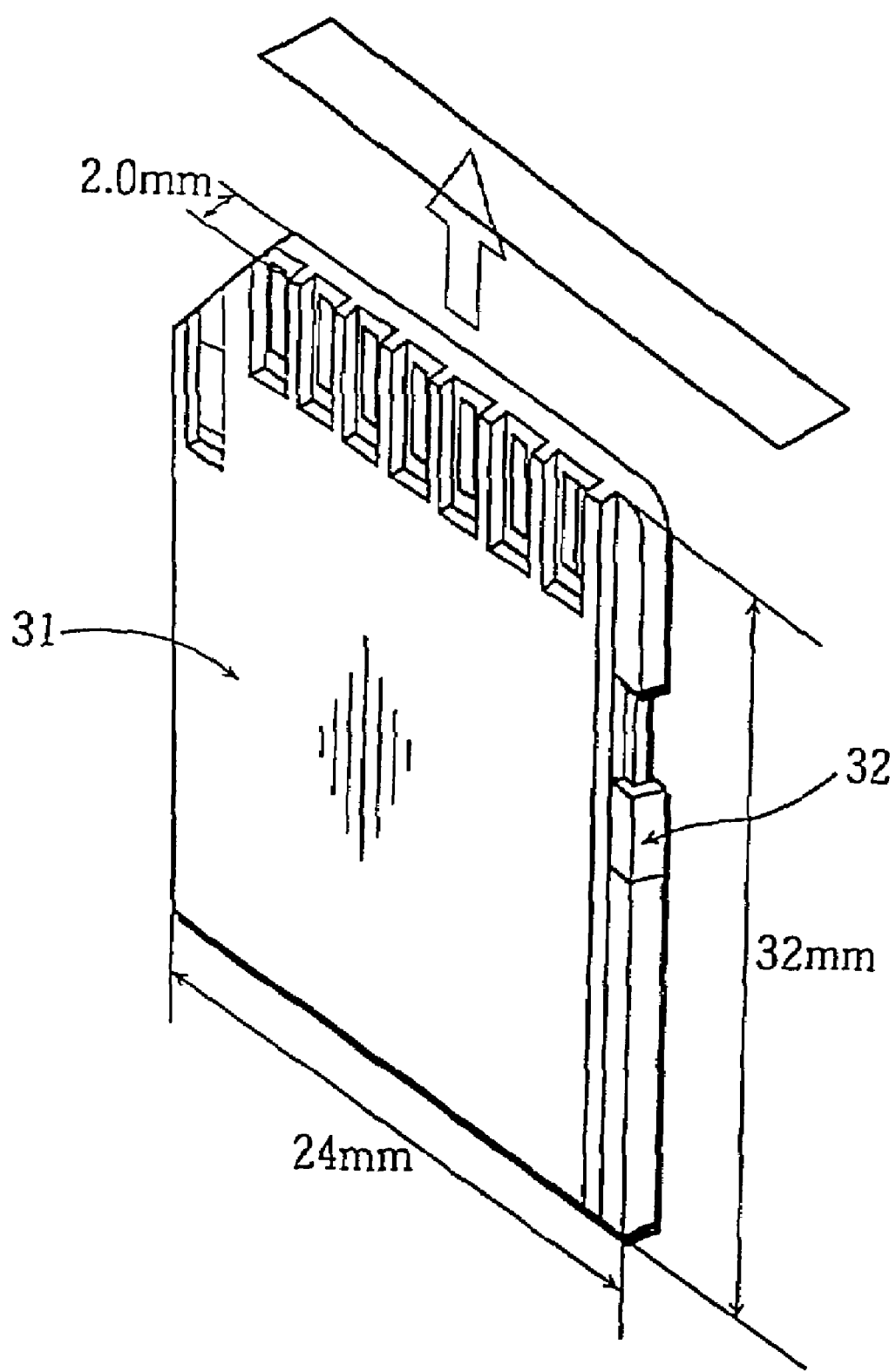
FIG. 2 shows the construction of the flash memory card 31 when viewed from below.

The present explanation starts with the external appearance of the flash memory card 31. FIG. 1 shows the appearance of the flash memory card 31 when viewed from above, while FIG. 2 shows the construction of the flash memory card 31 when viewed from below. As shown in FIGS. 1 and 2, the flash memory card 31 is around the same size as a postage stamp, and so is large enough to be held by hand. Its approximate dimensions are 32.0 mm long, 24.0 mm wide, and 2.0 mm thick.

The flash memory card 31 can be seen to have nine connectors on its bottom edge for connecting the card to a compatible device and a protect switch 32 on one side to enable the user to set whether overwriting of the stored content of the flash memory card 31 is permitted or prohibited.

{3-1} Physical Construction of the Flash Memory Card 31

Figure 3:
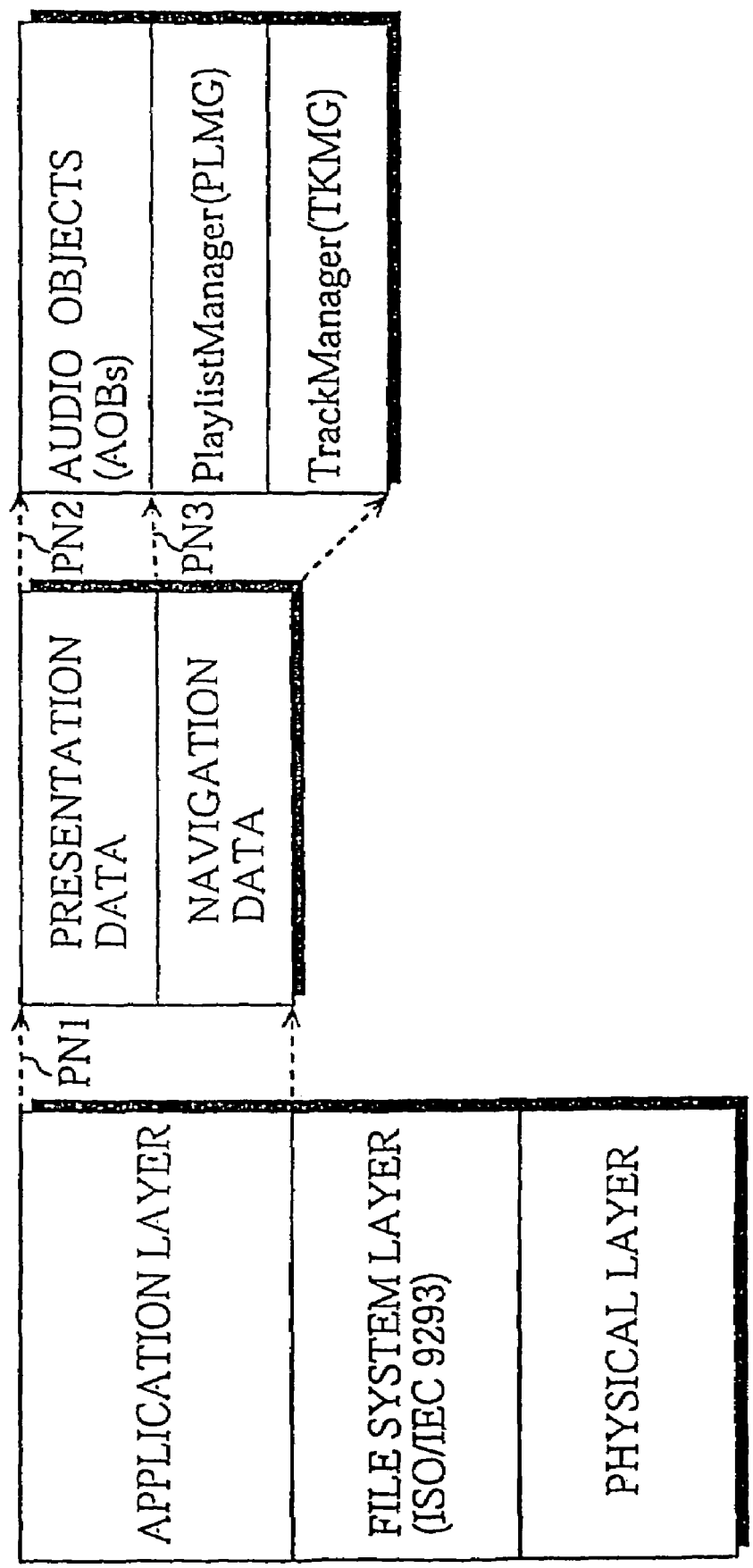
FIG. 3 shows the hierarchical composition of the flash memory card 31 in the embodiments.

FIG. 3 shows the hierarchical structure of the semiconductor memory card (hereafter referred to as the "flash memory card 31") of the present embodiment. As shown in FIG. 3, the flash memory card 31 is constructed with a physical layer, a file system layer and an application layer in the same way as a DVD (Digital Video Disc), though the logical and physical constructions of these layers are very different to those on a DVD.

{3-2} Physical Layer of the Flash Memory Card 31

The following describes the physical layer of the flash memory card 31. The flash memory is composed of a plurality of sectors, each of which stores 512 bytes of digital data. As one example, a 64 MB flash memory card 31 will have a storage capacity of 67,108,864 (=64*1,024*1,024) bytes, so that this card will include 131,072 (=67108864/512) valid sectors. Once the number of replacement sectors, which are provided for use in case of errors, is subtracted, the remaining number of valid sectors into which various kinds of data can be written is around 128,000.

{3-2__4A-1} Three Regions in the Physical Layer

Figure 4B:
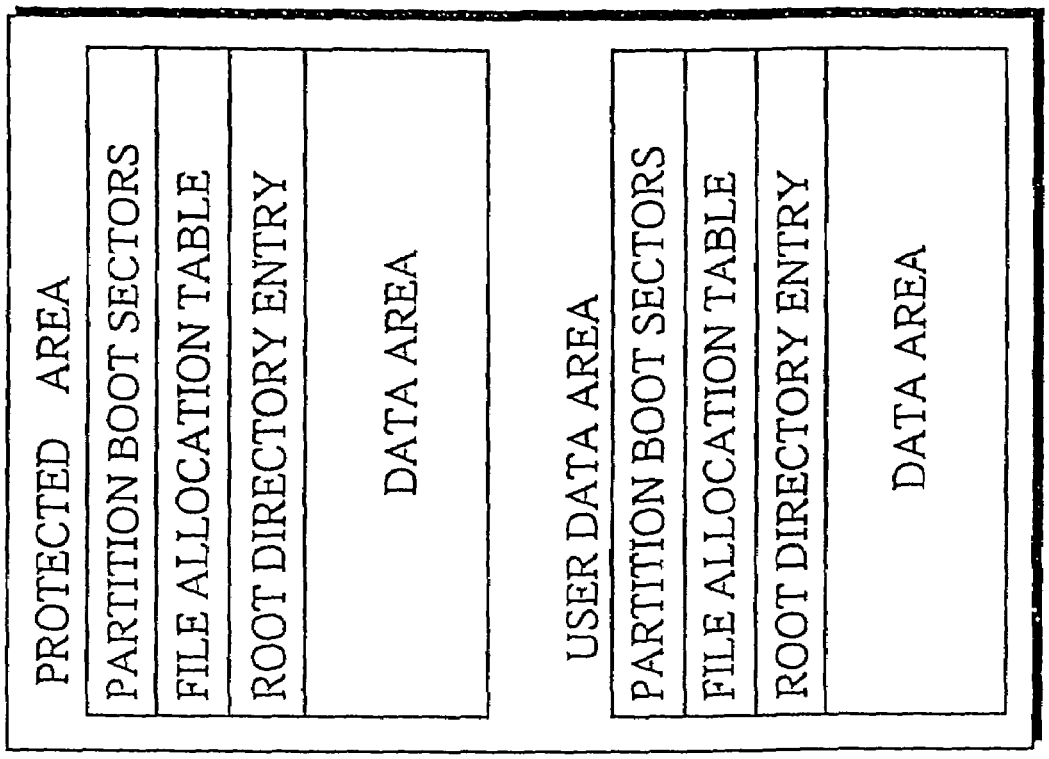
FIG. 4B shows the composition of the authentication region and the user region in the file system layer.
Figure 4A:
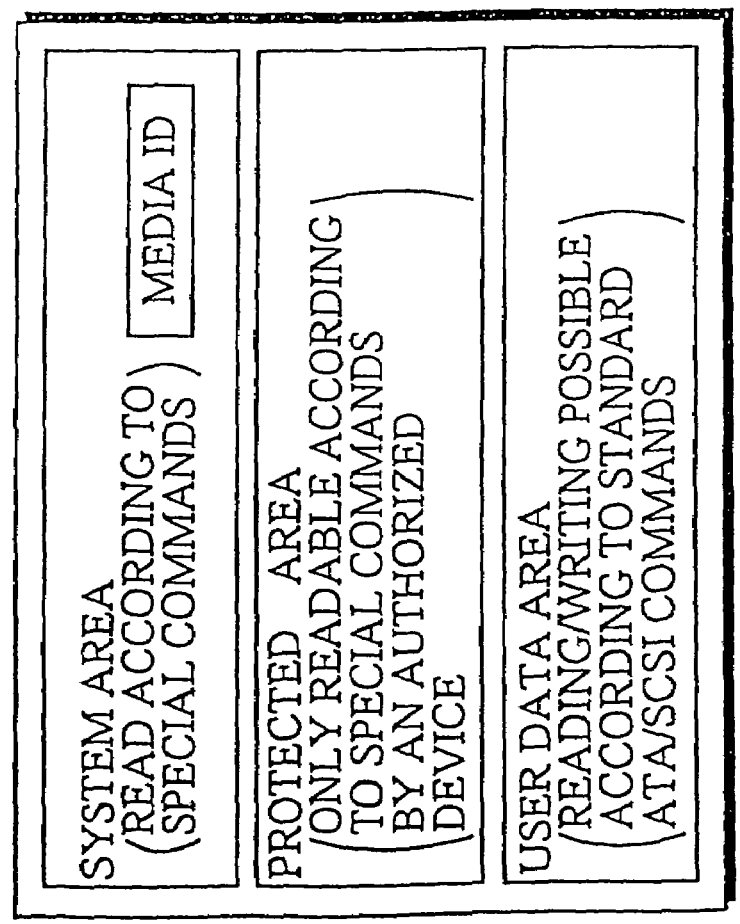
FIG. 4A shows the special region, the authentication region and the user region provided in the physical layer of the flash memory card 31.

The three regions shown in FIG. 4A are provided in the storage area composed of these valid sectors. These regions are the "special region", the "authentication region" and the "user region", and are described in detail below.

The user region is characterized in that a device to which the flash memory card 31 is connected can freely read or write various kinds of data from or into this region. Areas within the user region are managed by a file system.

The authentication region is a writeable region, like the user region. This region differs from the user region in that a device connected to the flash memory card 31 can access (i.e., read or write data in) the authentication region only if the flash memory card 31 and the device have first confirmed that each other is an authentic device. In other words, data can only be read, from or written into the authentication region if mutual authentication has been successfully performed by the flash memory card 31 and the device connected to the flash memory card 31.

{3-2__4A-2} Uses of the Three Regions in the Physical Layer

When the device connected to the flash memory card 31 writes data into the flash memory card 31, the region used to store this data will depend on whether copyright protection is necessary for the data being written. When data that requires copyright protection is written into the flash memory card 31, the data is encrypted using a predetermined encryption key (called a "FileKey") before being written into the user area. This FileKey can be freely set by the copyright holder and, while the use of this FileKey provides some level of copyright protection, the FileKey used for encrypting the written data is itself encrypted to make the copyright protection more secure. Any value obtained by subjecting the media ID stored in the special region into a predetermined calculation can be used to encrypt the FileKey. The encrypted FileKey produced in this way is stored in the authentication region.

Since data that requires copyright protection is subjected to a two-step encryption process where the data is encrypted using a FileKey that is itself encrypted based on the media ID, copyright infringement, such as the production of unauthorized copies of this data, will be extremely difficult.

{3-2__4B-1} Overview of the File System

As can be understood, the construction of the physical layer of the flash memory card 31 strengthens the copyright protection of the data written in the flash memory card 31. The following describes the file system layer present on this physical layer. While the file system layer of a DVD uses a UDF (Universal Disk Format)-type file system, the file system layer of the flash memory card 31 uses a FAT (File Allocation Table)-type file system, as described in ISO/IEC 9293.

FIG. 4B shows the construction of the authentication region and the user region in the file system layer. As shown in FIG. 4B, the authentication region and the user region in the file system each include "partition boot sectors", a "file allocation table (FAT)", a "root directory", and a "data region", meaning that the authentication region and the user region have the same construction.

Figure 5:
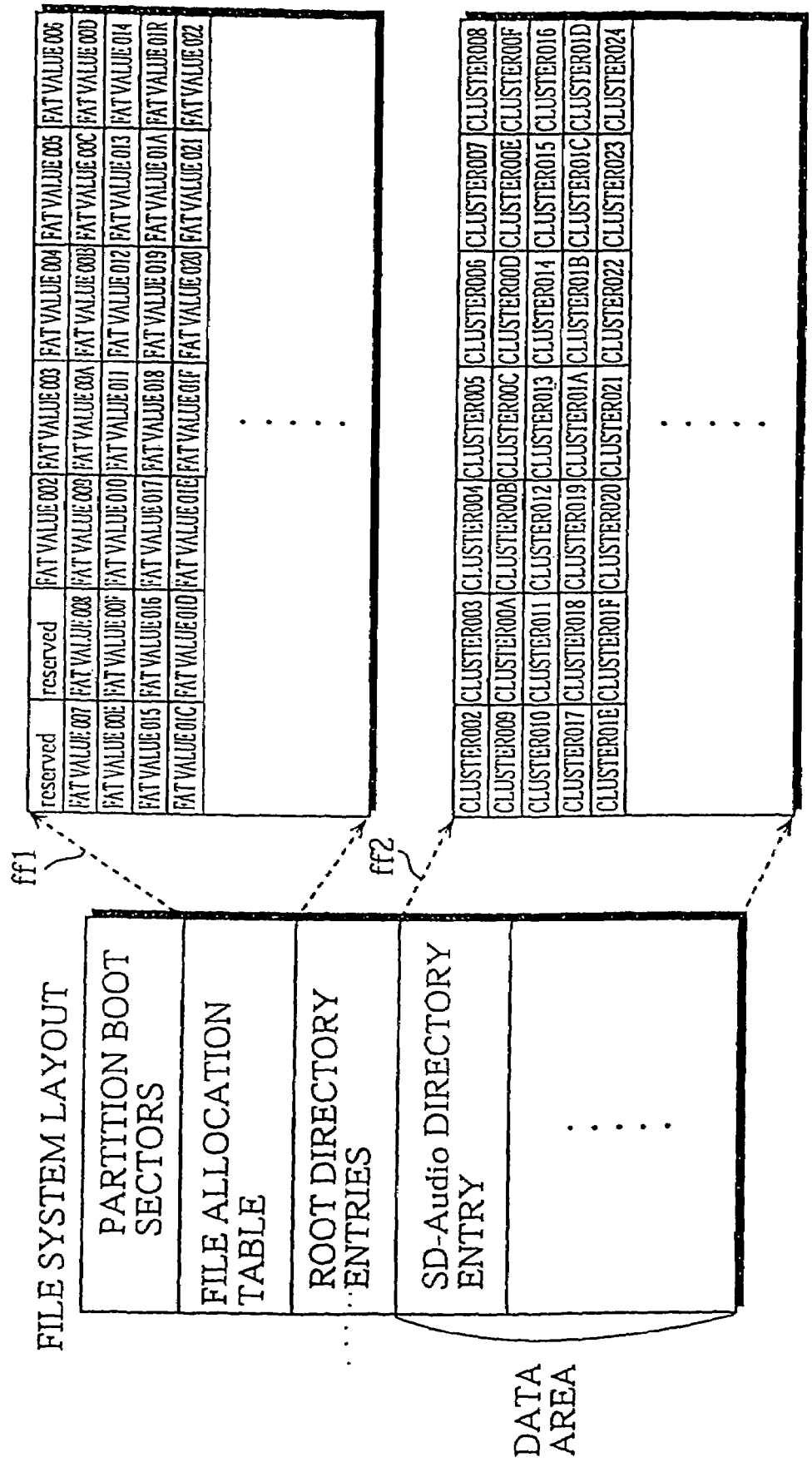
FIG. 5 shows the detailed composition of the file system layer.

FIG. 5 shows the various parts of these file systems in more detail. The following describes the construction of the user region with reference to FIGS. 4A, 4B and 5.

{3-2__4B-2} Partition Boot Sectors

The partition boot sectors are sectors that store the data that will be referred to by a standard personal computer that is connected to the flash memory card 31 when the flash memory card 31 is set as the boot disk for the operating system (OS) of the personal computer.

{3-2__4B-3__5} Data Region

The data region can be accessed by a device connected to the flash memory card 31 in units no smaller than a "cluster". While each sector in the flash memory card 31 is 512 bytes in size, the cluster size is 16 KB, so that the file system layer reads and writes data in units of 32 sectors.

The reason the cluster size is set at 16 KB is that when data is written onto the flash memory card 31, part of the data stored in the flash memory card 31 first has to be erased before the write can be performed.

The smallest amount of data that can be erased in the flash memory card 31 is 16 KB, so that setting the smallest erasable size as the cluster size means that data writes can be favorably performed. The arrow ff2 drawn using a broken line in FIG. 5 shows the plurality of clusters 002, 003, 004, 005 . . . included in the data region. The numbers 002, 003, 004, 005, 006, 007, 008 . . . used in FIG. S5 are the three-digit hexadecimal cluster numbers that are exclusively assigned to identify each cluster. Since the smallest unit by which access can be performed is one cluster, storage positions within the data region are indicated using cluster numbers.

{3-2__4B-4__5} File Allocation System

The file allocation system has a file system construction in accordance with ISO/IEC 9293 standard, and so is made up of a plurality of FAT values. Each FAT value corresponds to a cluster and shows which cluster should be read after the cluster corresponding to the FAT value. The arrow ff1 shown by a broken line in FIG. 5 shows the plurality of FAT values 002, 003, 004, 005 . . . that are included in the file allocation table. The numbers 002, 003, 004, 005 . . . assigned to each FAT value show which cluster corresponds to each FAT value and therefore are the cluster numbers of the clusters corresponding to the FAT values.

{3-2__4B-5__5-1} Root Directory Entries

The "root directory entries" are information showing what kinds of files are present in the root directory. As specific examples, the "filename" of an existing file, its "filename extension", the "revision time/date" and "number of first cluster in file" showing where the start of the file is stored can be written as the root directory entry of a file.

{3-2__4B-5__5-2} Directory Entries for Subdirectories

Information relating to files in the root directory is written as root directory entries, though information relating to subdirectories is not written as the root directory entries. Directory entries for subdirectories are instead produced in the data region. In FIG. 5, the SD-Audio directory entry given in the data region is one example of a directory entry for a subdirectory. Like a root directory entry, an SD-Audio directory entry includes the "filename" of a file present in this subdirectory, its "filename extension", the "revision time/date" and "number of first cluster in file", showing where the start of the file is stored.

{3-2__4B-5__6-1} Storage Format for AOB Files

Figure 6:
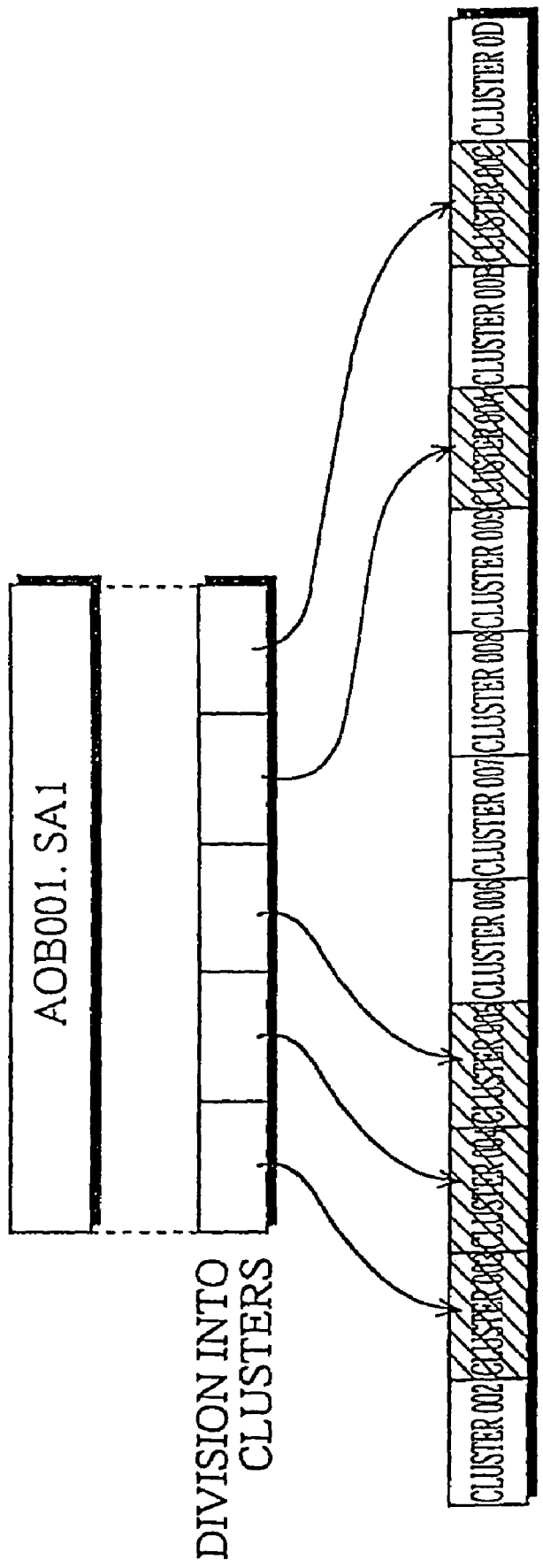
FIG. 6 is a representation of when the AOB file "AOB001.SA1" is divided into five parts that are stored in clusters 003, 004, 005, 00A, and 00C.

The following describes the file storage method by showing how a file named "AOB001.SA1" is stored in the SD-Audio directory, with reference to FIG. 6. Since the smallest unit by which the data region can be accessed is one cluster, the file "AOB001.SA1" needs to be stored in the data region in parts that are no smaller than one cluster. The file "AOB001.SA1" is therefore stored having first been divided into clusters. In FIG. 6, the file "AOB001.SA1" is divided into five parts in keeping with the cluster size, and the resulting parts are stored into the clusters numbered 003, 004, 005, 00A, and 00C.

{3-2_4B-5_7-1} Storage Format for AOB Files

Figure 7:
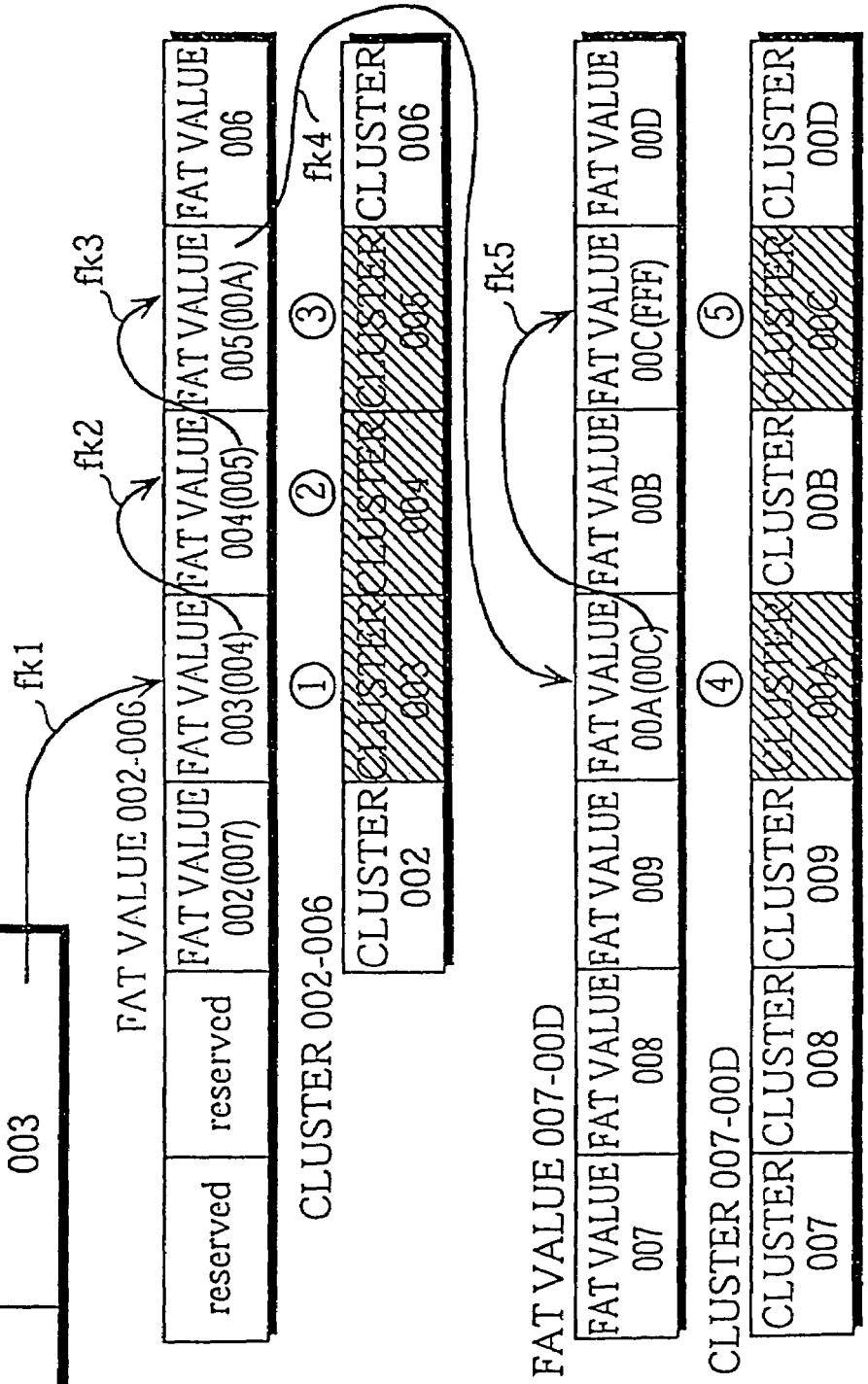
FIG. 7 shows one example of the settings of the directory entries and file allocation table when the AOB file "AOB001.SA1" is recorded in a plurality of clusters.

When the file "AOB001.SA1" is divided up into parts and stored, a directory entry and the file allocation table need to be set as shown in FIG. 7. FIG. 7 shows one example of how the directory entry and file allocation table need to be set when the file "AOB001.SA1" is stored having been divided up into parts and stored. In FIG. 7, the start of the file "AOB001.SA1" is stored in cluster 003, so that cluster number 003 is written into "the number of first cluster in file" in the SD-Audio directory entry to indicate the cluster storing the first part of the file. As shown in FIG. 7, the following parts of the file "AOB001.SA1" are stored in clusters 004 and 005. As a result, while the FAT value 003 (004) corresponds to cluster 003 that stores the first part of the file "AOB001.SA1", this value indicates cluster 004 as the cluster storing the next part of the file "AOB001.SA1". In the same way, while the FAT values 004 (005) and 005 (00A) respectively correspond to clusters 004 and 005 that store the next parts of the file "AOB001.SA1", these values respectively indicate cluster 005 and cluster 00A as the clusters storing the next parts of the file "AOB001.SA1". By reading the clusters with the cluster numbers written into these FAT values in order as shown by the arrows fk1, fk2, fk3, fk4, fk5 . . . in FIG. 7, all of the parts produced by dividing the file "AOB001.SA1" can be read. As explained above, the data region of the flash memory card 31 is accessed in units of clusters, each of which is associated with a FAT value. Note that the FAT value that corresponds to the cluster storing the final part of an AOB file (the cluster 00C in the example shown in FIG. 7) is set as the cluster number FFF to show that the corresponding cluster stores the final part of a file.

This completes the explanation of the file system in the flash memory card 31 of the present invention. The following describes the application layer that exists on this file system.

{3-3} Overview of the Application Layer in the Flash Memory Card 31

An overview of the application layer in the flash memory card 31 is shown in FIG. 3. As shown by the arrow PN2 drawn with a broken line in FIG. 3, the application layer in the flash memory card 31 is composed of presentation data and navigation data that is used to control the playback of the presentation data. As shown by the arrow PN2, the presentation data includes sets of audio objects (AOB sets) that are produced by encoding audio data that represents music, for example. The navigation data includes a "PlaylistManager" (PLMG) and a "TrackManager" (TKMG).

{3-3_8A,B-1} Directory Composition

Figure 8A:
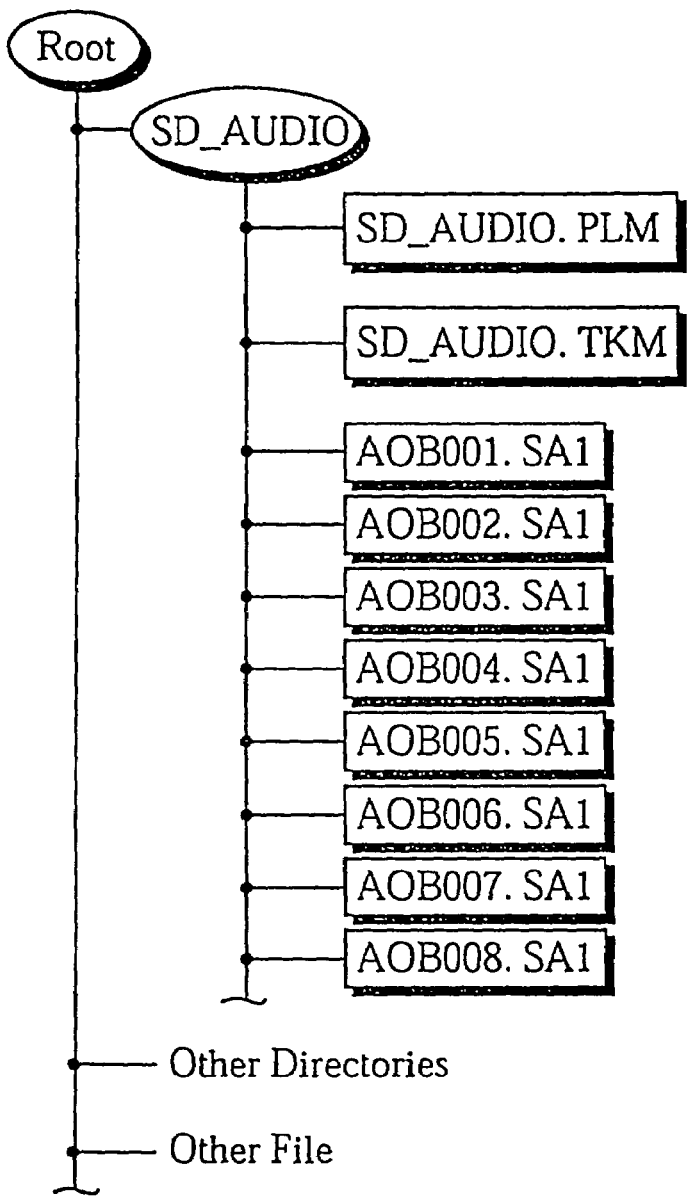
FIGS. 8A and 8B show what directories are provided in the user region and the authentication region in the file system layer when the above two types of data are recorded in the application layer, as well as what kind of files are recorded in which directories.
Figure 8B:
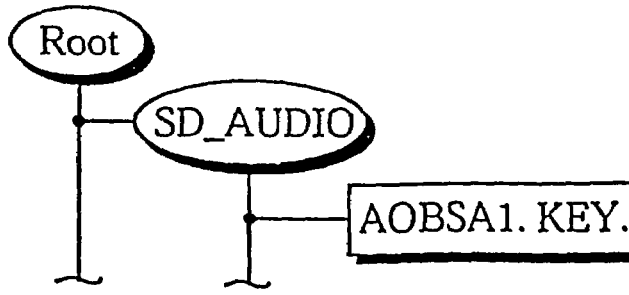

FIGS. 8A and 8B show what kind of directories are present in the user region and the authentication region in the file system layer when these two types of data are stored in the application layer, as well as showing what files are arranged into these directories.

The filenames "SD_AUDIO.PLM" and "SD_AUDIO.TKM" in FIG. 8A indicate the files in which the PlaylistManager (PLMG) and TrackManager (TKMG) composing the navigation information are stored. Meanwhile, the filenames "AOB001.SA1", "AOB002.SA1", "AOB003.SA1", "AOB004.SA1", . . . indicate the files ("AOB" files) storing the audio objects that are the presentation data. The letters "SA" in the filename extension of the filename "AOB0xx.SA1" are an abbreviation for "Secure Audio", and show that the stored content of this file requires copyright protection. Note that while only eight AOB files are shown in the example in FIG. 8A, a maximum of 999 AOB files can be stored in an SD-Audio directory.

When copyright protection is required for presentation data, a subdirectory called an "SD-Audio directory" is provided in the authentication region and an encryption key storing file "AOBSA1.KEY" is produced in this SD-Audio directory.

FIG. 8B shows the encryption key storing file "AOBSA1.KEY" that is stored under the "SD-Audio" legend (i.e., within the "SD-Audio directory"). This encryption key storing file "AOBSA1.KEY" stores a sequence of encryption keys that is produced by arranging a plurality of encryption keys into a predetermined order.

The SD-Audio directory shown in FIGS. 8A and 8B is stored in a server computer managed by a record label that uses electronic music distribution. When a consumer orders a music content, the corresponding SD-Audio directory is compressed, encrypted and transmitted to the consumer via a public network. The consumer's computer receives this SD-Audio directory, decrypts it, decompresses it and so obtains the original SD-Audio directory. Note that the expression "public network" here refers to any kind of network that can be used by the public, such as a wired communication network, e.g., an ISDN network, or a wireless communication network, e.g., a mobile telephone system. It is also possible for a consumer's computer to download an AOB file from a server computer operated by a record label and then produce an SD-Audio directory, such as that shown in FIGS. 8A and 8B, in the flash memory card 31.

{3-3_9-1} Correspondence Between the "AOBSA1.KEY" File and the AOB Files

Figure 9:
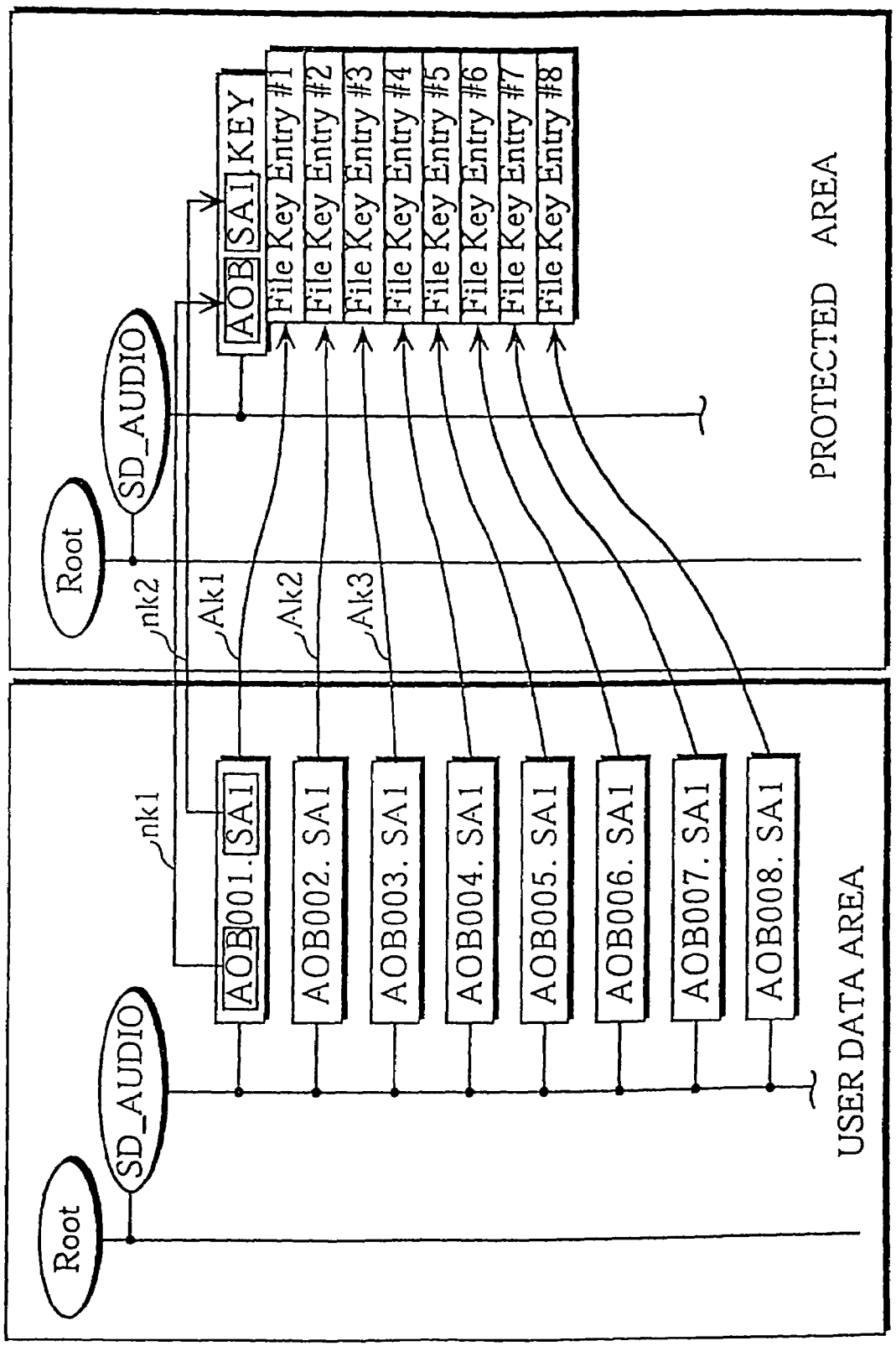
FIG. 9 shows the correspondence between the file "AOBSA1.KEY" and the AOB files in the SD_Audio directories.

FIG. 9 shows the correspondence between the "AOBSA1.KEY" file in the SD-Audio directory and the AOB files. The FileKeys used when encrypting files in the user region shown in FIG. 9 are stored in the corresponding encryption key storing file in the authentication region.

The encrypted AOB files and the encryption key storing file correspond according to the predetermined rules (1), (2), and (3) described below.

(1) The encryption key storing file is arranged into a directory with the same directory name as the directory in which the encrypted file is stored. In FIG. 9, AOB files are arranged into the SD-Audio directory in the user region and the encryption key storing file is arranged into a directory called the SD-Audio directory in the authentication region, in accordance with this rule.

(2) The encryption key storing file is given a filename produced by combining the first three letters of the filename of the AOB files in the data region with the predetermined ".key" extension. When the filename of an AOB file is "AOB001.SA1", the encryption key storing file is given the filename "AOBSA1.KEY" produced by adding the first three characters "AOB", "SA1", and the extension ".key", as shown by the arrows nk1 and nk2 in FIG. 9.

(3) The filename of an AOB file is given a serial number showing the position of the FileKey corresponding to this audio object in the sequence of encryption keys given in the encryption key storing file.

The "File Key Entries #1, #2, #3 . . . #8" show the first positions of the regions in which the respective FileKeys in the encryption key storing file are stored. Meanwhile, the filenames of AOB files are assigned the serial numbers "001", "002", "003", "004". . . . These serial numbers show the positions of the corresponding FileKeys in the encryption key sequence, so that the FileKey that was used to encrypt each AOB file will be present in the "FileKey Entry" with the same serial number. In FIG. 9, the arrows Ak1, Ak2, Ak3, . . . show the correspondence between AOB files and FileKeys. In other words, the file "AOB001.SA1" corresponds to the FileKey whose storage position is indicated by the "FileKey Entry#1", the file "AOB002.SA1" corresponds to the FileKey whose storage position is indicated by the "FileKey Entry#2", and the file "AOB003.SA1" corresponds to the FileKey whose storage position is indicated by the "FileKey Entry#3". As can be understood from rule (3), different FileKeys are used to encrypt different AOB files, with these FileKeys being stored in "FileKey Entries" with the serial numbers "001", "002", "003", "004" etc., given in the filenames of the corresponding AOB files.

Since each AOB file is encrypted using a different FileKey, the exposure of the encryption key used for one AOB file will not enable users to decrypt other AOB files. This means that when AOB files are stored in an encrypted form on a flash memory card 31, the damage caused by the exposure of one FileKey can be minimized.

{3-3_10-1} Internal Composition of an AOB File

Figure 10:
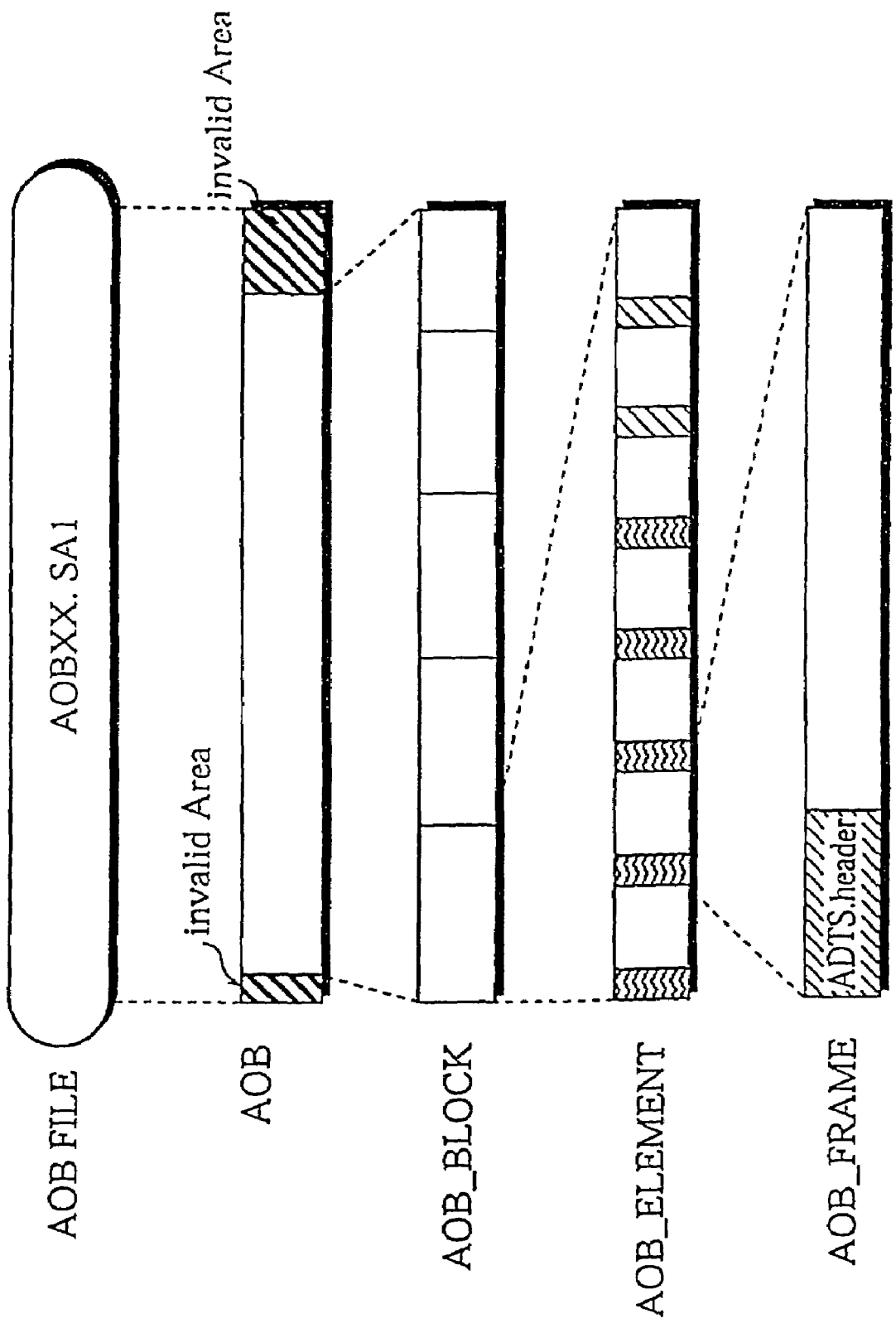
FIG. 10 shows the hierarchical composition of the data in an AOB file.

The following describes the internal composition of an AOB file. FIG. 10 shows the hierarchical data structure of an AOB file. The first level in FIG. 10 shows the AOB file, while the second level shows the audio object (AOB) itself. The third level shows the AOB_BLOCKs, the fourth level an AOB_ELEMENT, and the fifth level an AOB_FRAME.

The AOB_FRAME on the fifth level in FIG. 10 is the smallest unit composing the AOB, and is composed of audio data in ADTS (Audio Data Transport Stream) format and an ADTS header. Audio data in ADTS format is encrypted according to MPEG2-AAC (Low Complexity Profile) format and is stream data that can be played back at a transfer rate of 16 Kbps to 144 Kbps. Note that the transfer rate for PCM (Pulse Code Modulation) that is recorded on a conventional compact disc is 1.5 Mbps, so that data in ADTS format generally uses a lower transfer rate than PCM. The data construction of a sequence of AOB_FRAMEs is the same as the sequence of audio frames included in an audio data transport stream distributed by an electronic music distribution service. This means that the audio data transport stream to be stored as AOB_FRAME sequence is encoded according to MPEG2-ACC standard, encrypted, and transmitted on a public network to the consumer. AOB files are produced by dividing the transmitted audio data transport stream into a sequence of AOB_FRAMEs and storing these AOB_FRAMEs.

{3-3_10-1_1} MPEG2-AAC

MPEG2-AAC is described in detail in ISO/IEC 13818-7: 1997(E) "Information Technology—Generic Coding of Moving Pictures and Associated Audio Information—Part 7 Advanced Audio Coding (AAC)".

It should be noted that audio objects can only be compressed according to MPEG2-AAC using the parameters in the parameter table shown in FIG. 11A that is defined in ISO/IEC13818-7. This parameter table is composed of "Parameter" column, a "Value" column, and a "Comment" column.

The legend "profile" in the Parameter column shows the only LC-profile which can be used, as stipulated under ISO/IEC 13838-7. The legend "sampling_frequency#index" in the Parameter column shows that the sampling frequencies "48 kHz, 44.1 kHz, 32 kHz, 24 kHz, 22.05 kHz, and 16 kHz" can be used.

The legend "number_of_data_block_in_frame" in the Parameter column shows that the ratio of one header to one raw_data_block is used.

Note that while this explanation describes the case where AOB_FRAMEs are encoded according to MPEG-AAC format, AOB_FRAMEs may instead be encoded according to another format, such as MPEG-Layer3 (MP3) format or Windows Media Audio(WMA). When doing so, the parameters shown in the parameter tables of FIG. 11B or FIG. 11C must be used.

{3-3_10-2_12} Composition of an AOB_FRAME

While each AOB_FRAME includes audio data that is encoded according to the restrictions described above, the data length of the audio data in each AOB_FRAME is restricted to a playback time of only 20 ms. However, since MPEG2-AAC is a variable bitrate (VBR) encoding method, the data length of the audio data in each AOB_FRAME will vary. The following describes the composition of an AOB_FRAME, with reference to FIG. 12.

Figure 12:
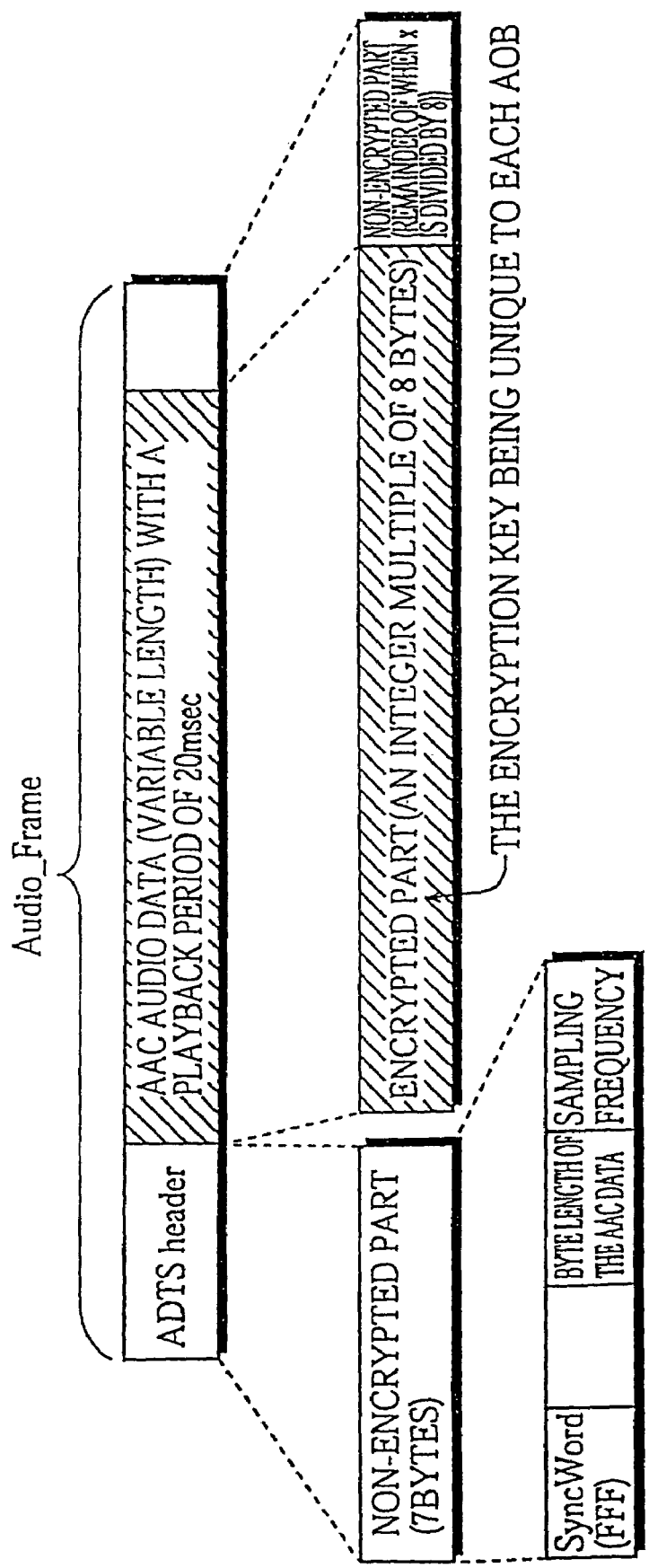
FIG. 12 shows the detailed construction of an AOB_FRAME.

The first level in FIG. 12 shows the overall composition, while the second level shows how each part of an AOB_FRAME is encrypted. As can be seen from the drawing, the ADTS header corresponds to a non-encrypted part. The audio data includes both an encrypted part and a non-encrypted part. The encrypted part of the audio data is composed of a plurality of eight-byte pieces of encrypted data, each of which is produced by encrypting an eight-byte piece of audio data using a 56-bit FileKey. When encryption is performed on 64-bit pieces of audio data, the non-encrypted part of the audio data is simply a final part of the data that cannot be encrypted due to it being shorter than 64 bits.

The third level in FIG. 12 shows the content of the ADTS header that is in the non-encrypted part of the AOB_FRAME. The ADTS header is seven bytes long, and includes a 12-bit synch word (set at FFF), the data length of the audio data in this AOB_FRAME, and the sampling frequency used when the audio data was encoded.

{3-3_10-3_13} Setting of the Byte Length of an AOB_FRAME

Figure 13:
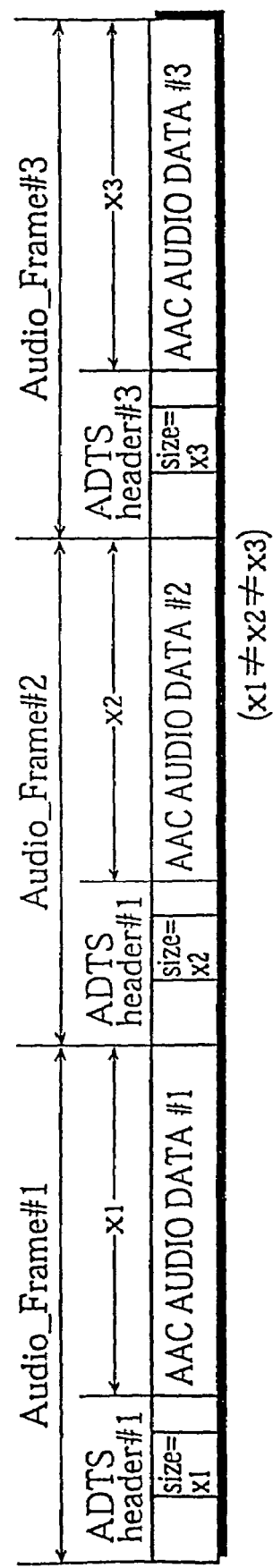
FIG. 13 shows how the byte length of the audio data in each of three AOB_FRAMEs is set.

FIG. 13 shows how the byte length of the audio data in each of three AOB_FRAMEs is set. In FIG. 13, the data length of audio data#1 included in AOB_FRAME#1 is x1, the data length of audio data#1 included in AOB_FRAME#2 is x2, and the data length of audio data#1 included in AOB_FRAME#3 is x3. When the data lengths x1, x2, and x3 are all different, the data length x1 will be written in the ADTS header of AOB_FRAME#1, the data length x2 will be written in the ADTS header of AOB_FRAME#2, and the data length x3 will be written in the ADTS header of AOB_FRAME#3.

Although the audio data is encrypted, the ADTS header is not, so that a playback device can determine the data length of the audio data in an AOB_FRAME by reading the data length given in the ADTS header of the AOB_FRAME.

This completes the explanation of an AOB_FRAME.

{3-3_10-4} AOB_ELEMENT

The following describes the AOB_ELEMENT shown on the fourth level in FIG. 10.

An "AOB_ELEMENT" is a group of consecutive AOB_FRAMEs. The number of AOB_FRAMEs in an AOB_ELEMENT depends on the value set as the sampling_frequency_index shown in FIG. 11A and the encoding method used. The number of AOB_FRAMEs in an AOB_ELEMENT is set so that the total playback time of the included AOB_FRAMEs will be around two seconds, with this number depending on the sampling frequency and encoding method used.

{3-3_10-5_14} Number of AOB_FRAMEs in an AOB_ELEMENT

FIG. 14 shows the correspondence between the sampling frequency and the number of AOB_FRAMEs included in an AOB_ELEMENT. The number N given in FIG. 14 represents the playback period of an AOB_ELEMENT in seconds. When MPEG-ACC is used as the encoding method, the value of N is "2".

When the sampling_frequency is 48 kHz, the number of AOB_FRAMEs included in an AOB_ELEMENT is given as 94(=47*2), while when the sampling_frequency is 44.1 kHz, the number of AOB_FRAMEs included in an AOB_ELEMENT is given as 86(=43*2). When the sampling_frequency is 32 kHz, the number of AOB_FRAMEs is given as 64(=32*2), when the sampling_frequency is 24 kHz, the number of AOB_FRAMEs is given as 48(=24*2), when the sampling_frequency is 22.05 kHz, the number of AOB_FRAMEs is given as 44(=22*2), and when the sampling_frequency is 16 kHz, the number of AOB_FRAMEs included in an AOB_ELEMENT is given as 32(=16*2). However, when an editing operation, such as the division of an AOB, has been performed, the number of AOB_FRAMEs included in an AOB_ELEMENT at the start or end of an AOB may be less than a number calculated in this way.

While no header or other special information is provided for each AOB_ELEMENT, the data length of each AOB_ELEMENT is instead shown by a time search table.

Figure 15:
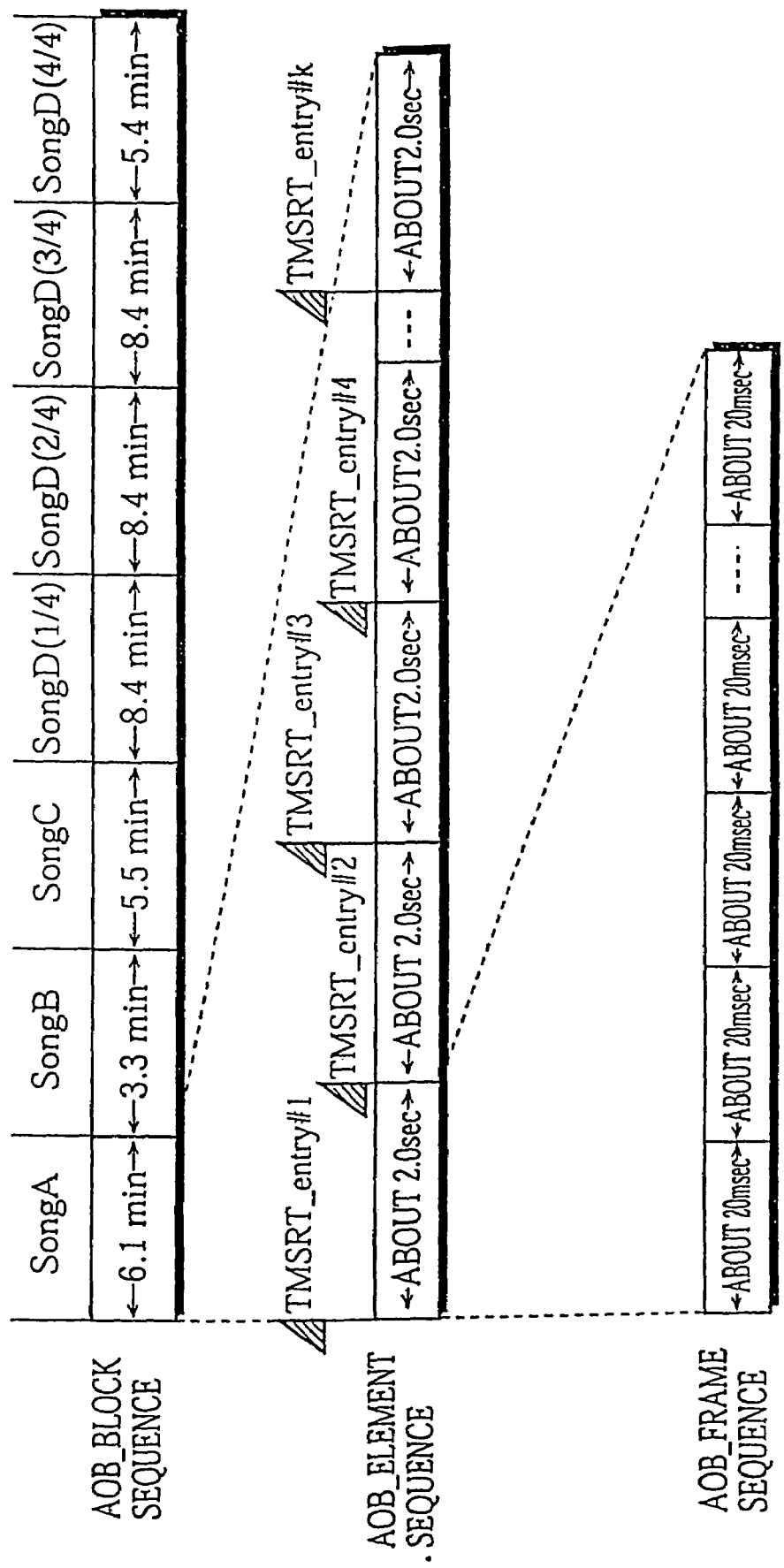
FIG. 15 shows examples of the playback periods of AOB_ELEMENTs and the playback periods of AOB_FRAMEs.

{3-3_10-6_15} One Example of the Playback Periods of AOB ELEMENTs and AOB_FRAMEs FIG. 15 shows one example of the playback periods of AOB_ELEMENTs and AOB_FRAMEs. The first level in FIG. 15 shows a plurality of AOB_BLOCKs, while the second level shows a plurality of AOB_ELEMENTs. The third level shows a plurality of AOB_FRAMES.

As shown in FIG. 15, an AOB_ELEMENT has a playback period of around 2.0 seconds, while an AOB_FRAME has a playback period of 20 milliseconds. The "TMSRT_entry" given to each AOB_ELEMENT shows that the data length of each AOB_ELEMENT is given in the time search table. By referring to the TMSRT_entries, a playback apparatus can perform a forward or backward search where, for example, intermittent bursts of music are played back by repeatedly playing back 240 milliseconds of audio data and then skipping two seconds of audio data in the desired direction.

{3-3_10-7} AOB_BLOCK

This completes the explanation of an AOB_ELEMENT. The following describes the concept of the AOB_BLOCKs shown on the third level of the data construction of an AOB file given in FIG. 10.

Each "AOB_BLOCK" is composed of valid AOB_ELEMENTs. Only one AOB_BLOCK exists in each AOB_FILE. While an AOB_ELEMENT has a playback period of around two seconds, an AOB_BLOCK has a maximum playback period of 8.4 minutes. The 8.4 minute limitation is imposed to restrict the size of the time search table to 504 bytes or less.

{3-3_10-8} Restriction of the Time Search Table

The following describes in detail why the size of the time search table is restricted by limiting the playback period.

When a playback apparatus performs a forward or backward search, the playback apparatus skips the reading of two seconds of audio data before playing back 240 milliseconds. When skipping two seconds of data, the playback apparatus could in theory refer to the data lengths shown in the ADTS headers of AOB_FRAMEs, though this would mean that the playback apparatus would have to consecutively detect 100 (2 seconds/20 milliseconds) AOB_FRAMEs just to skip two seconds of audio data. This would amount to an excessive processing load for the playback apparatus.

To reduce the processing load of a playback apparatus, the read addresses for data at two-second intervals can be written into a time search table that is then referred to by the playback apparatus when performing a forward or backward search. By writing information that enables read addresses that are two or four seconds ahead or behind to be found quickly into the time search table (such information being the data sizes of AOB_ELEMENTs), a playback apparatus will only need to refer to this information when performing a forward or backward search. The data size of audio data with a playback period of two seconds will depend on the bitrate used when playing back the audio data. As stated earlier, a bitrate in the range of 16 Kbps to 144 Kbps is used, so that the amount of data played back in two seconds will be in a range from 4 KB(=16 Kbps×2/8) to 36 KB(=144 Kbps×2/8). Since the amount of data played back in two seconds will be in a range from 4 KB to 36 KB, the data length of each entry in the time search table for writing the data length of audio data needs to be two bytes (=16 bits) long. This is because a 16-bit value is capable of expressing a number in the range 0-64 KB.

On the other hand, if the total data size of the time search table needs to be restricted to 504 bytes (this being the data size of the TKTMSRT described later), for example, the maximum number of entries in the time search table can be calculated as 504/2=252.

Since an entry is provided every two seconds, the playback time corresponding to this maximum of 252 entries is 504 seconds (=2s*252), or, in other words, 8 minutes and 24 seconds (=8.4 minutes). This means that setting the maximum playback period for an AOB_BLOCK at 8.4 minutes limits the data size of the time search table to 504 bytes.

{3-3_10-9} Regarding AOBs

This concludes the description of AOB_BLOCKs. The following describes AOBs.

The AOBs shown on the second level of FIG. 10 are regions that have invalid areas at either end. Only one AOB is present in each AOB file.

The invalid areas are regions that are read and written along with the AOB_BLOCKs and are stored in the same clusters as the AOB_BLOCKS. The start and end position of the AOB_BLOCKs within an AOB are shown by BITs included in the navigation data. These BITs are described in detail later in this specification.

This completes the explanation of what data is stored in an AOB file. The following describes what kind of content is played back when the eight AOBs and AOB_BLOCKs shown in the AOB file in FIG. 9 are successively read.

{3-3_10-10_16}

Figure 16:
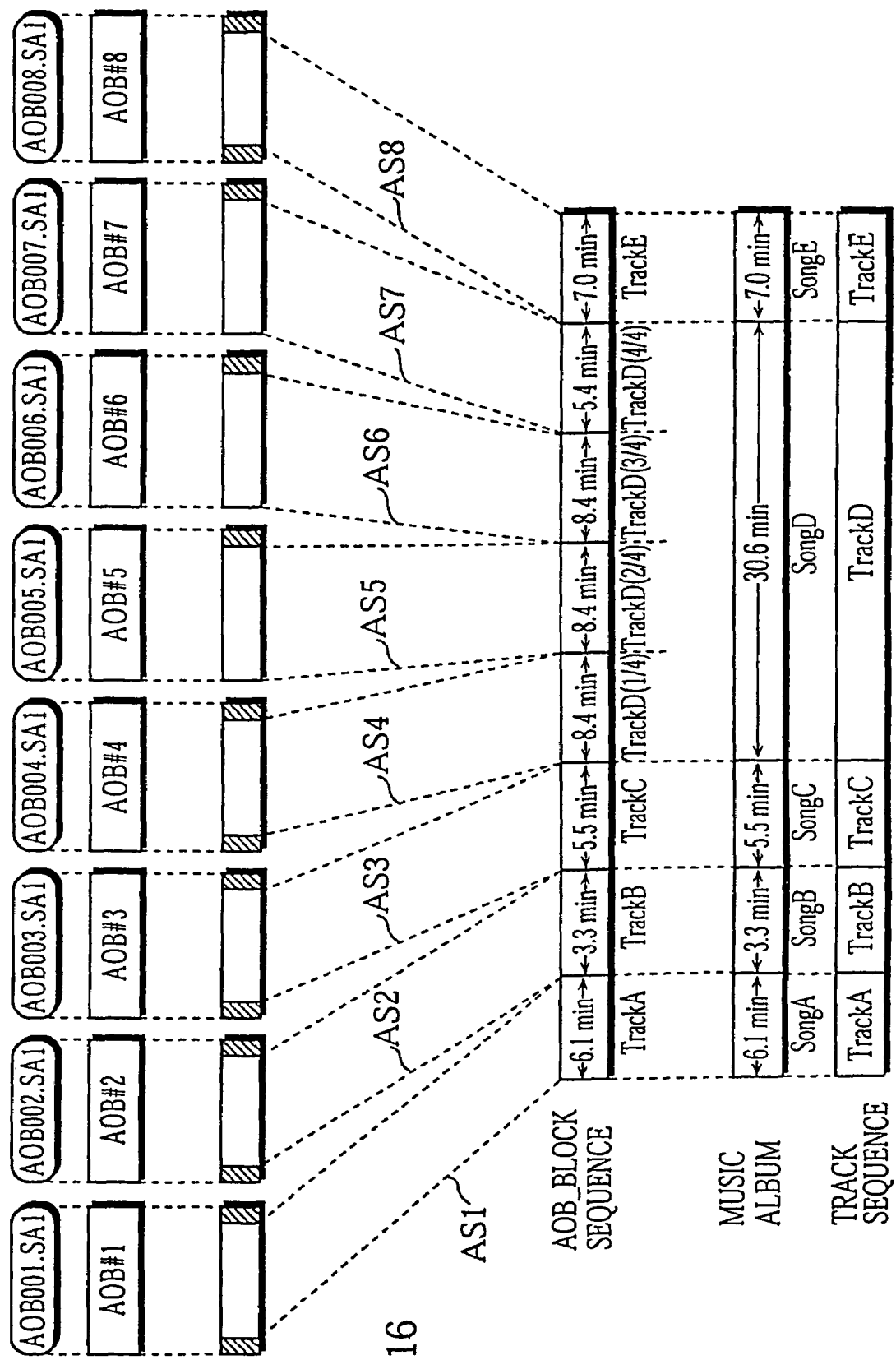
FIG. 16 shows what is reproduced when the AOBs and AOB_BLOCKs recorded in an AOB file are consecutively played back.

FIG. 16 shows the playback content when the AOBs and AOB_BLOCKs in this AOB file are successively read. The first level in FIG. 16 shows the eight AOB files in the user region, while the second level shows the eight AOBs recorded in these AOB files. The third level shows the eight AOB_BLOCKs included in these AOBs.

The fifth level shows the titles of five contents composed by these AOB files. In this example, the "contents" are the five songs SongA, SongB, SongC, SongD, and SongE, while the "title" is a music album composed of these five songs. The broken lines AS1, AS1, AS3, . . . AS7, and AS8 show the correspondence between the AOB_BLOCKs and the parts into which the album is divided, so that the fourth level in FIG. 16 shows the units used to divide the music album shown on the fifth level.

By referring to the broken lines, it can be seen that the AOB_BLOCK included in AOB#1 is a song (SongA) with a playback period of 6.1 minutes. The AOB_BLOCK included in AOB#2 is a song (SongB) with a playback period of 3.3 minutes. The AOB_BLOCK included in AOB#3 is a song (SongC) with a playback period of 5.5 minutes. In this way, "AOB001.SA1" to "AOB003.SA1" each correspond to a different song. The sixth level of FIG. 16 is a track sequence composed of tracks TrackA to TrackE. These tracks TrackA-TrackE correspond to the five songs SongA, SongB, SongC, SongD, and SongE, and are each treated as a separate playback unit.

On the other hand, AOB#4 has a playback period of 8.4 minutes and is the first (or "head") part of the song SongD that has a playback period of 30.6 minutes. The AOB_BLOCKs included in AOB#5 and AOB#6 are middle parts of the song SongD and also have playback periods of 8.4 minutes. The AOB_BLOCK included in AOB#7 is the end part of the song SongD and has a playback period of 5.4 minutes. In this way, a song that has a total playback period of 30.6 minutes is divided into (8.4+8.4+8.4+5.4-minute) parts that are each included in a different AOB. As can be seen from FIG. 16, every song included in an AOB file is subjected to a maximum playback period of 8.4 minutes.

This explanation clearly shows that limiting the playback periods of AOBs as described above restricts the data size of the time search table corresponding to each AOB. The following describes the navigation data included in each time search table.

{3-3__8A,B-2}

The navigation data is composed of the two files "SD_Audio.PLM" and"SD_Audio.TKM" mentioned earlier. The file "SD_Audio.PLM" includes the PlaylistManager, while the file "SD_Audio.TKM" includes the TrackManager.

As mentioned as part of the explanation of the presentation data, a plurality of AOB files store encoded AOBs, though no other information, such as the playback period of the AOBs, the names of the songs represented by the AOBs, or credits for the songwriter(s), is given. While a plurality of AOBs are recorded in a plurality of AOB files, no indication as to the playback order of the AOBs is provided. To inform a playback apparatus of such information, the TrackManager and PlaylistManager are provided.

The TrackManager shows the correspondence between the AOBs recorded in AOB files and tracks, and includes a plurality of pieces of track management information that each give a variety of information such as the playback period of AOBs and the song names and songwriters of the various AOBs.

In this specification, the term "track" refers to a meaningful playback unit for users, so that when copyrighted music is stored on a flash memory card 31, each song is a separate track. Conversely, when an "audio book" (i.e., copyrighted literature stored as recorded audio) is recorded on a flash memory card 31, each chapter or paragraph can be set as a separate track. The TrackManager is provided to manage a plurality of AOBs recorded in a plurality of AOB files as a group of tracks.

A Playlist sets the playback order of a plurality of tracks. A plurality of Playlists can be included in the PlaylistManager.

The following describes the TrackManager with reference to the drawings.

{17-1__18} Detailed Composition of the PlaylistManager and TrackManager

Figure 17:
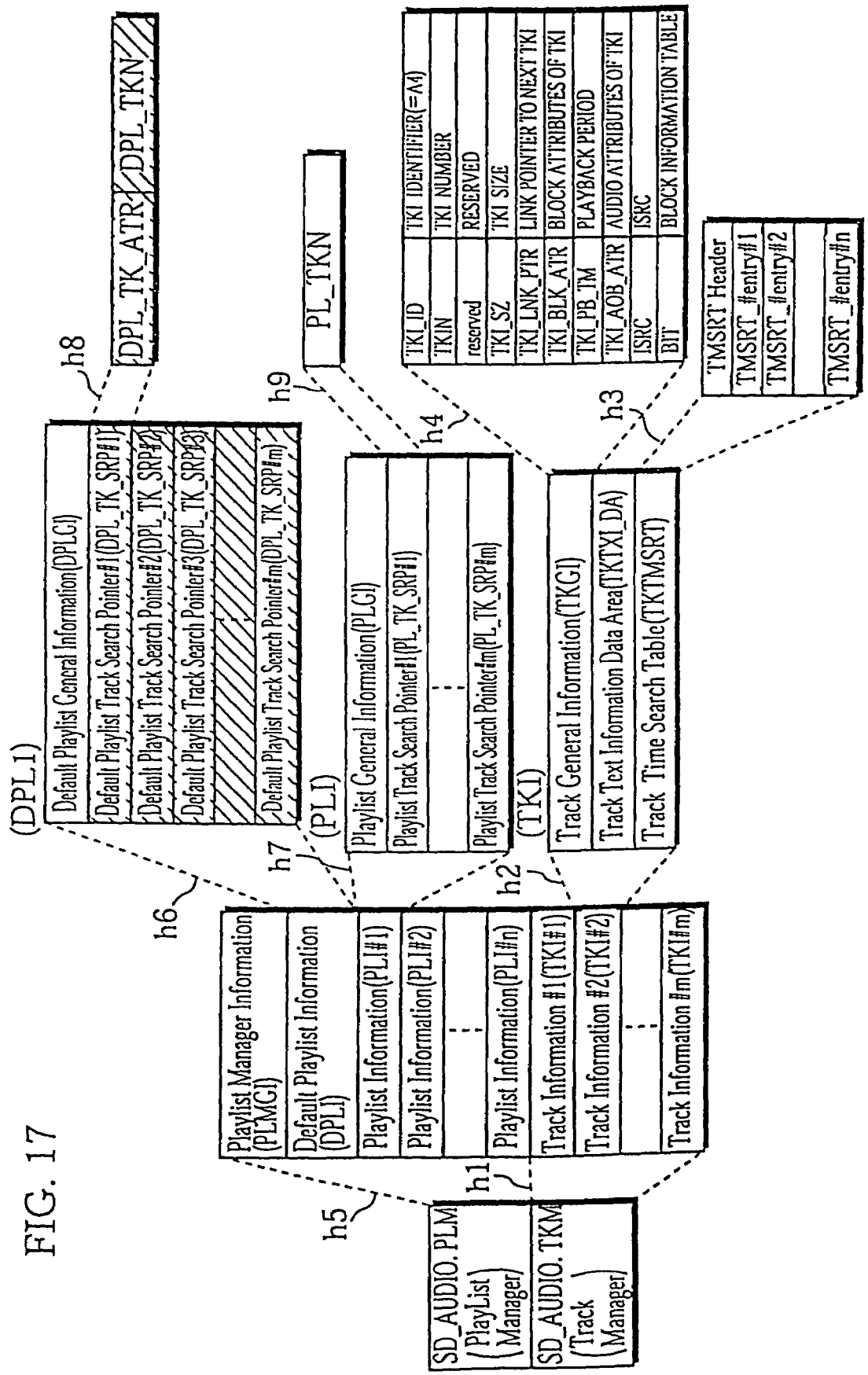
FIG. 17 shows the hierarchical composition of the PlaylistManager and TrackManager used in the embodiments in detail.
Figure 18:
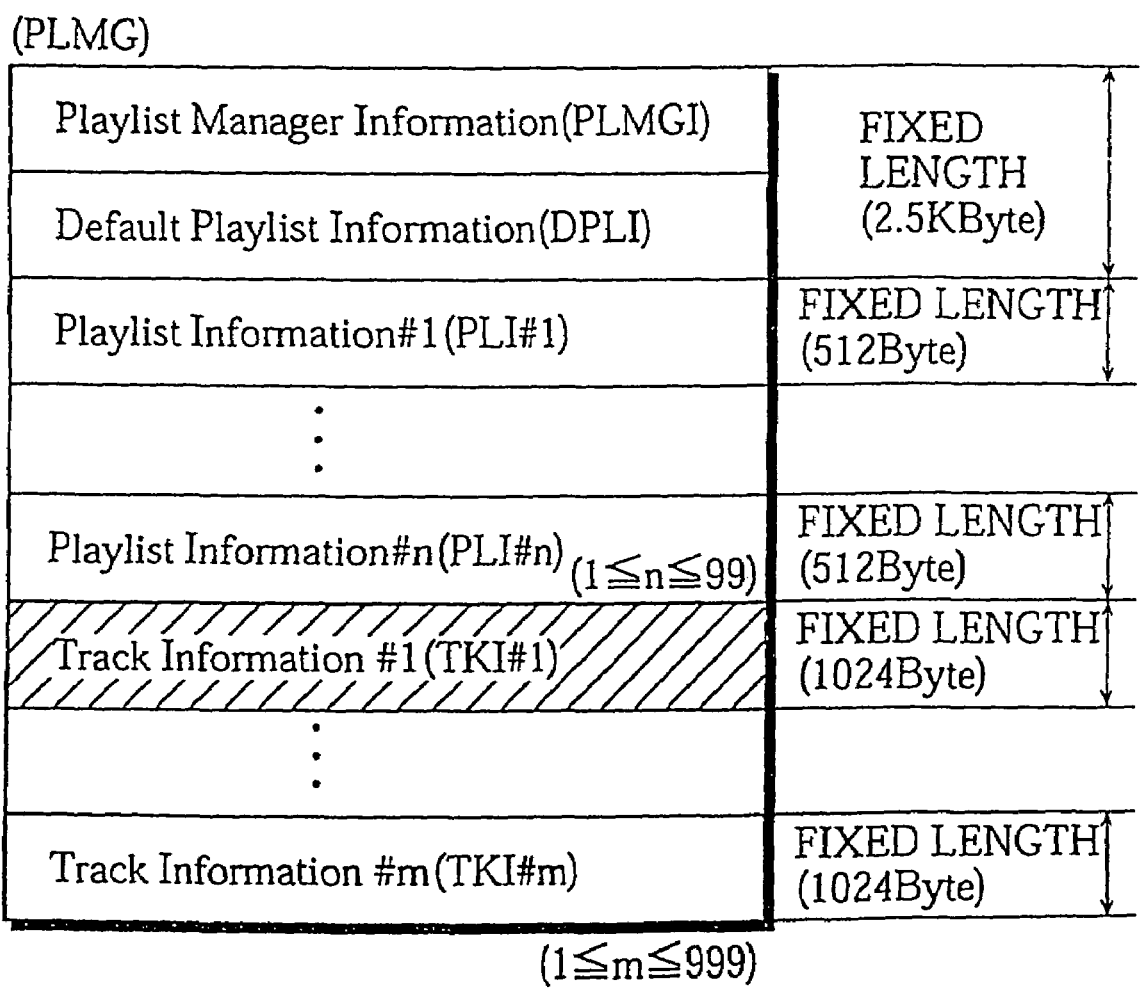
FIG. 18 shows the sizes of the PlaylistManager and the TrackManager.

FIG. 17 shows the detailed composition of the Playlist-Manager and TrackManager in this embodiment as a hierarchy. FIG. 18 shows the sizes of the PlaylistManager and the TrackManager. The right side of FIG. 17 shows the items on the left side in more detail, with the broken lines indicating which items are being shown in more detail.

As shown in FIG. 17, the TrackManager is composed of the Track Information (TKI) #1, #2, #3, #4 . . . #n, as shown by the broken line h1. These TKIs are information for managing the AOBs recorded in AOB files as tracks, and each correspond to a different AOB file. From FIG. 17, it can be seen that each TKI is composed of Track_General_Information (TKGI), Track_Text_Information (TKTXTI_DA) in which text information exclusive to a track can be written, and a Track_Time_Search_Table (TKTMSRT) that serves as a time search table.

From FIG. 18, it can be seen that each TKI has a fixed size of 1,024 bytes, which means that a total size of the TKGI and the TKTXTI_DA is fixed at 512 bytes due to the size of the TKTMSRT being fixed at 512 bytes. In the TrackManager, a total of 999 TKIs can be set.

As shown by the broken line h3, the TKTMSRT is composed of a TMSRT_Header and TMSRT_entries #1, #2, #3 . . . #n.

{17-2__19} Correspondence of TKI with AOB Files and AOBs

Figure 19:
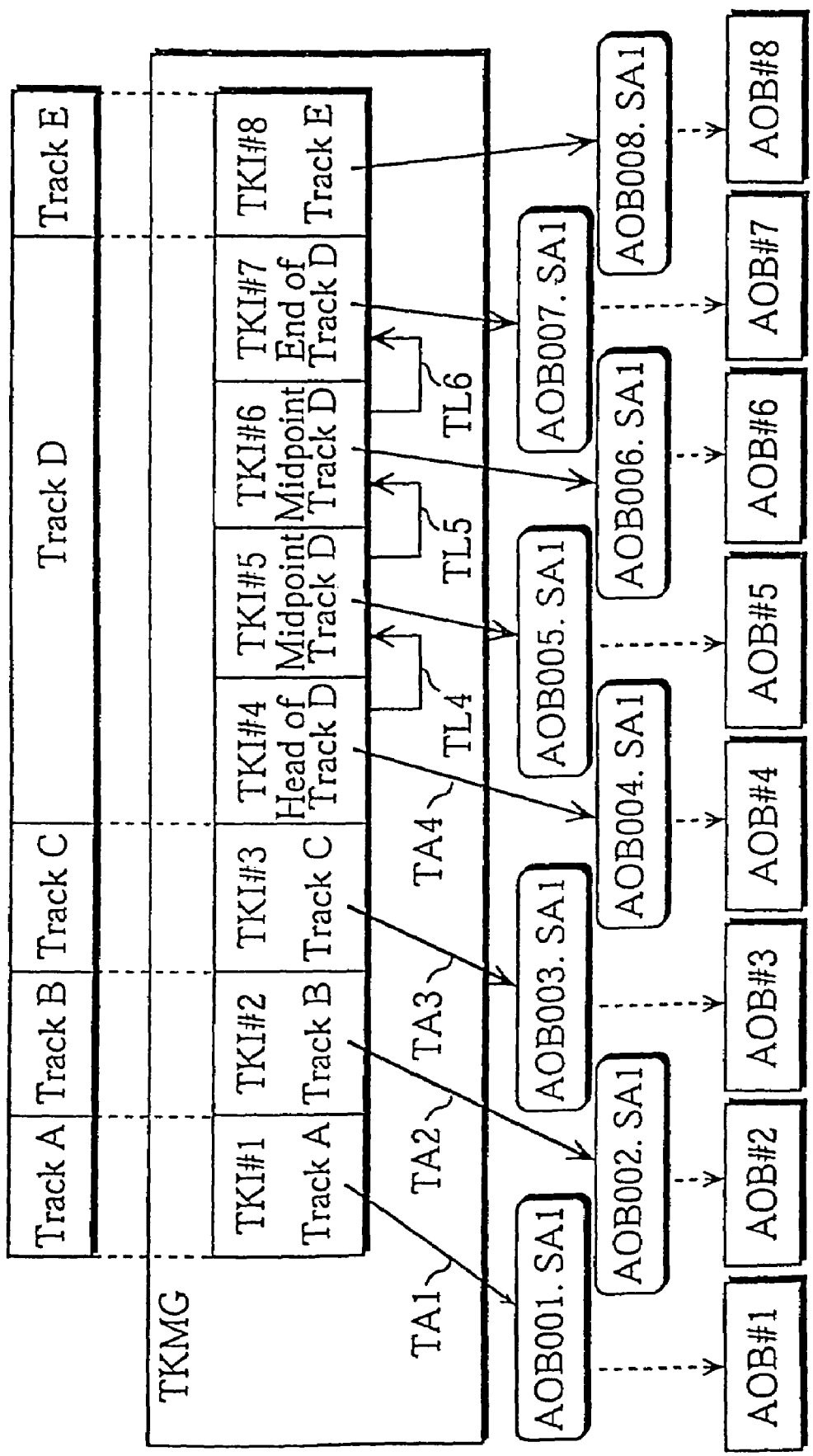
FIG. 19 shows the correspondence between the TKIs shown in FIG. 17 and the AOBs and AOB files shown in FIG. 16.

FIG. 19 shows how the TKIs shown in FIG. 17 correspond to the AOB files and AOBs shown in FIG. 16. The boxes on the first level in FIG. 19 show a sequence of tracks composed of tracks TrackA to TrackE, the large frame on the second level shows the TrackManager, while the third and fourth levels show the eight AOB files given in FIG. 16. The eight AOB files are recorded in the eight AOBs shown in FIG. 16, and compose a music album including tracks TrackA, TrackB, TrackC, TrackD, and TrackE. The second level shows the eight TKIs. The numbers "1", "2", "3", "4" assigned to each TKI are the serial numbers used to identify each TKI, with each TKI corresponding to the AOB file that has been given the same serial number 001, 002, 003, 004, 005. . . .

With this in mind, it can be seen from FIG. 19 that TKI#1 corresponds to the file "AOB001.SA1", that TKI#2 corresponds to the file "AOB001.SA1", TKI#3 corresponds to the file "AOB003.SA1", and TKI#4 corresponds to the file "AOB004.SA1". The correspondence between TKIs and AOB_FRAMEs is shown by the arrows TA1, TA2, TA3, TA4 . . . in FIG. 19.

In this way, each TKI corresponds to a different AOB recorded in an AOB file and gives detailed information that applies only to the corresponding AOB.

{17-3__20} Data Composition of a TKTMSRT

Figure 20:
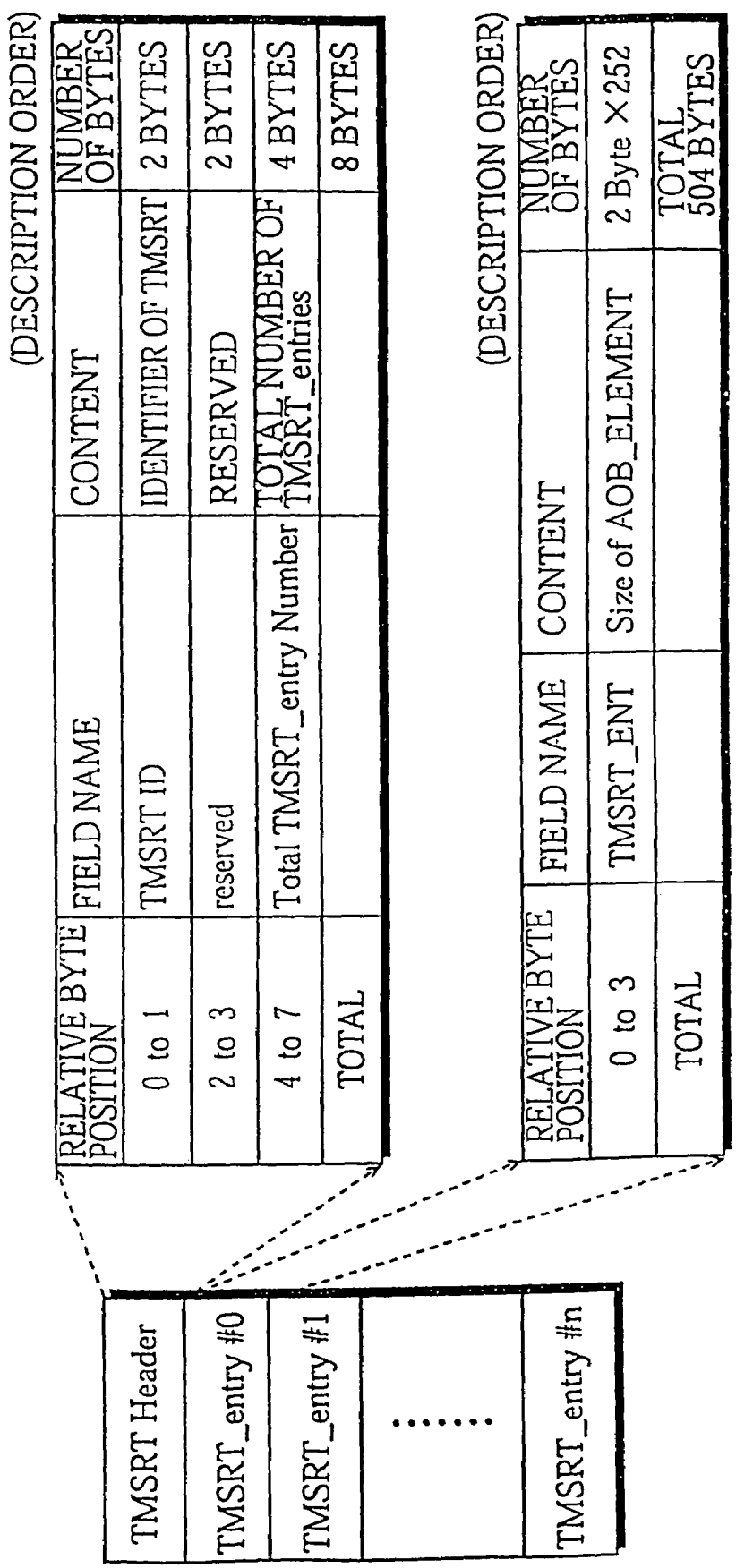
FIG. 20 shows the detailed data composition of the TKT-MSRT shown in FIG. 17.

The following describes the information that applies to single AOBs recorded in AOB files, starting with the TKTMSRT. FIG. 20 shows the data composition of the TKTMSRT in detail.

The right side of FIG. 20 shows the detailed data composition of the time search table header (TMSRT_Header). In FIG. 20, the TMSRT_Header has a data size of eight bytes, and is made up of three fields. The first two bytes are a TMSRT_ID, the next two bytes are reserved, and the final four bytes are a Total TMSRT_entry_Number.

A unique ID for identifying the TMSRT is recorded in the "TMSRT_ID". The total number of TMSRT_entries in the present TMSRT is recorded in the "Total TMSRT_entry Number".

{17-3__21-1} Specific Example of the TKTMSRT

Figure 21:
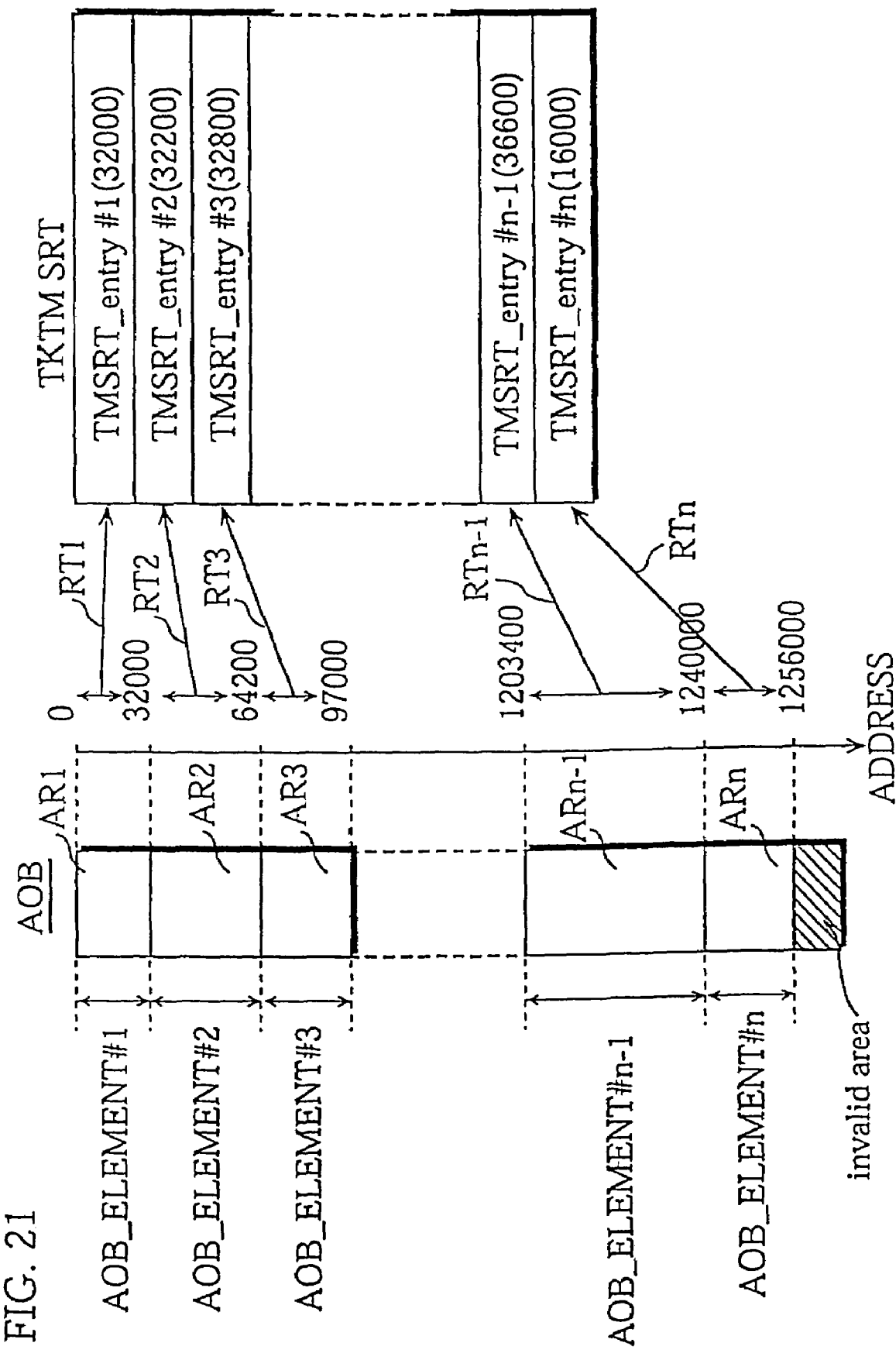
FIG. 21 shows one example of the TKTMSRT.

The following describes a TKTMSRT in detail. FIG. 21 shows one example of a TKTMSRT. The left side of FIG. 21 shows an AOB, while the right side shows the corresponding TKTMSRT. The AOB on the left side of FIG. 21 is composed of a plurality of AOB_ELEMENTs numbered #1, #2, #3 . . . #n that occupy the regions numbered AR1, AR2, AR3 . . . ARn to the right.

The numbers such as "0", "32000", "64200", "97000", "1203400", and "1240000" show the relative addresses of areas AR1, AR2, AR3, ARn−1; ARn occupied by the AOB_ELEMENTs with respect to the start of the AOB_BLOCK. As examples, AOB_ELEMENT#2 is recorded at a position that is at a distance "32000" from the start of the AOB_BLOCK, while AOB_ELEMENT#3 is recorded at a position that is at a distance "64200" from the start of the AOB_BLOCK and AOB_ELEMENT#n−1 is recorded at a position that is at a distance "1203400" from the start of the AOB_BLOCK.

It should be noted that the distance between each occupied region and the start of the AOB_BLOCK is not a multiple of a certain value, meaning that the regions occupied by AOB_ELEMENTs are not of the same size. The reason the occupied regions have different sizes is that varying amounts of data are used to encode each AOB_FRAME.

Since the size of the region occupied by each AOB_ELEMENT differs, it is necessary to inform a playback apparatus in advance of the position of each AOB_ELEMENT in an AOB when performing a jump to the start of an AOB_ELEMENT. For this purpose, a plurality of TMSRT_entries are given in the TKTMSRT. The arrows RT1, RT2, RT3 . . . RTn−1, RTn show the correspondence between the regions AR1, AR2, AR3 . . . ARn−1, ARn occupied by each AOB_ELEMENT and TMSRT_entry#1, TMSRT_entry#2, TMSRT_entry#3 . . . TMSRT_entry#n−1, TMSRT_entry#n. In other words, the size of the region AR1 occupied by AOB_ELEMENT#1 is written in the TMSRT_entry#1, while the sizes of the regions AR2 and AR3 occupied by AOB_ELEMENT#2 and AOB_ELEMENT#3 are written in the TMSRT_entries #2 and #3.

Since the occupied area AR1 takes up the region from the start of the AOB to the start of the AOB_ELEMENT#2 "32000", the size "32000" (=32000−0) is written in the TMSRT_entry#1. The occupied area AR2 takes up the region from the start of the AOB_ELEMENT#2 "32000" to the start of the AOB_ELEMENT#3 "64200", so that the size "32200" (=64200−32000) is written in the TMSRT_entry#2. The occupied area AR3 takes up the region from the start of the AOB_ELEMENT#3 "64200" to the start of the AOB_ELEMENT#4 "97000", so that the size "32800" (=97000−64200) is written in the TMSRT_entry#3. In the same way, the occupied area ARn−1 takes up the region from the start of the AOB_ELEMENT#n−1 "1203400" to the start of the AOB_ELEMENT#n "1240000", the size "36600" (=1240000−1203400) is written in the TMSRT_entry#n−1.

{17-3_21-2} How the TKTMSRT is Read

In this way, the data sizes of AOB_ELEMENTs are written in a time search table. However, since the data length of each AOB_BLOCK is restricted to a maximum of 8.4 minutes, the total number of AOB_ELEMENTs included in a single AOB is limited to a predetermined number ("252" as shown in FIG. 20) or less. Since the number of AOB_ELEMENTs is restricted, the number of TMSRT_entries corresponding to AOB_ELEMENTs is also restricted, which restricts the size of the TKTMSRT including these TMSRT_entrees to within a predetermined size. Since the size of the TKTMSRT is restricted, a playback apparatus can read and use TKIs in the following way.

The playback apparatus reads a certain AOB and on commencing playback of the AOB, reads the corresponding TKI and stores it in a memory. This corresponding TKI is kept in the memory while the playback of this AOB continues. Once the playback of the AOB ends, the following AOB is read, and when the playback of this AOB commences, the playback apparatus overwrites the TKI corresponding to this following AOB into the memory in place of the old TKI. This next TKI is kept in the memory while the playback of this following AOB continues.

By reading and storing TKIs in this way, the necessary capacity of the memory in the playback apparatus can be minimized while still enabling special playback functions such as forward and backward search to be realized. While the present embodiment describes the case where the data length from the first address of an AOB_ELEMENT to the first address of the next AOB_ELEMENT is written in the TMSRT_entry, relative addresses from the start of the AOB_BLOCK to the first addresses of AOB_ELEMENTs may be written in there instead.

{17-3_21-3} Specifying a Cluster Including an AOB_ELEMENT

The following describes how an AOB_ELEMENT may be read using the TKTMSRT. The TKTMSRT includes the size of each AOB_ELEMENT, so that when AOB_ELEMENT#y, which is the $y^{th}$ AOB_ELEMENT from the start of an AOB, is to be read, the cluster u that satisfies Equation 1 given below is calculated, and data positioned with the offset v from the start of the cluster u is read.

$$\text{Cluster } u = (\text{Total of the } TMSRT\_\text{entries from } AOB\_\text{ELEMENT\#1 to } AOB\_\text{ELEMENT\#}y-1 + \text{DATA\_Offset})/\text{Cluster size}$$

$$\text{Offset } v = (\text{Total of the } TMSRT\_\text{entries from } AOB\_\text{ELEMENT\#1 to } AOB\_\text{ELEMENT\#}y-1 + \text{DATA\_Offset}) \bmod \text{Cluster size} \quad \text{Equation 1}$$

where c=a mod b indicates that c is the remainder produced when a is divided by b The DATA_Offset is written in the BIT and is described later in this specification.

{17-4} TKTXI_DA

This completes the explanation of the time search table (TKTMSRT). The following describes the Track_Text_Information Data Area(TKTXI_DA) recorded in the upper part of the TKTMSRT.

The Track_Text_Information Data Area (TKTXTI_DA) is used to store text information showing the artist name, album name, mixer, producer, and other such information. This area is provided even when such text information does not exist.

{17-5} TKGI

The following describes the TKGI recorded in the upper part of the TKTXI_DA. In FIG. 17, several sets of information shown as the identifier "TKI_ID" of the TKI, the TKI number "TKIN", the TKI size "TKI_SZ", a link pointer to the next TKI "TKI_LNK_PTR", block attributes "TKI_BLK_ATR", a playback period "TKI_PB_TM", the audio attributes "TKI_AOB_ATR", an "ISRC", and block information "BIT". Note that only some of this information has been shown in FIG. 17 to simplify the representation.

{17-5_22-1} TKGI

Figure 22:
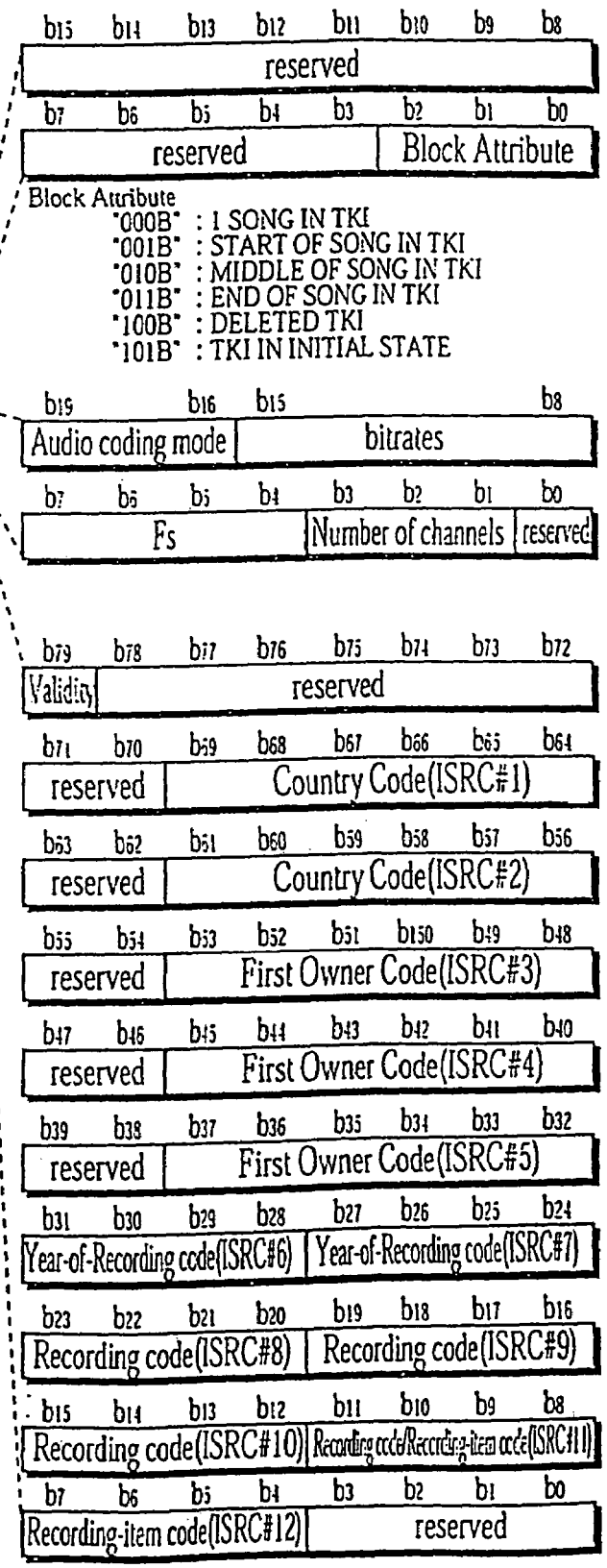
FIG. 22 shows the detailed composition of the TKGI.

The following describes the composition of a TKGI in detail, with reference to FIG. 22. The difference between FIG. 17 and FIG. 22 is that the data composition of the TKGI that was shown in FIG. 17 is arranged on the left side of this drawing, and that the bit compositions of "TKI_BLK_ATR", "TKI_AOB_ATR" and "ISRC" are clearly shown.

{17-5_22-2} TKI_ID

A unique ID for a TKI is written in the "TKI_ID". In the present embodiment, a two-byte "A4" code is used.

{17-5_22-3} TKIN

A TKI number in the range of 1 to 999 is written in the "TKIN". Note that the TKIN of each TKI is unique. In the present embodiment, the position of each TKI in the Track-Manager is used as the TKIN. This means that "1" is written as the TKI number of TKI#1, "2" is written as the TKI number of TKI#2, and "3" is written as the TKI number of TKI#3.

{17-5_22-4} TKI_SZ

The data size of the TKI in byte units is written in the "TKI_SZ". In FIG. 22, 1,024 bytes is given as the data size of the TKI so that each TKI in the present embodiment is 1,024 bytes long.

{17-5_22-5} TKI_LNK_PTR

The TKIN of the TKI to which the present TKI is linked is written in the "TKI_LNK_PTR". The following describes such links between TKIs.

When a track is composed of a plurality of AOBs which are recorded in a plurality of AOB files, these AOB files will be managed as a single track by linking the plurality of TKIs that correspond to these AOB files. To link a plurality of TKIs, it is necessary to show the TKI of the AOB file that follows after the AOB file of the present TKI. Accordingly, the TKIN of the TKI that follows the present TKI is written in TKI_LNK_PTR.

{17-5_22-6_19} TKI_LNK_PTR

The following describes the settings made for the TKI_LNK_PTR in the eight TKIs shown in FIG. 19. The track information numbered #1 to #3 and #8 each correspond to separate tracks, so no information is set in their TKI_LNK_PTR. The track information TKI#4, TKI#5, TKI#6, TKI#7 correspond to the four AOB files that compose TrackD, so that the next track information is indicated in the TKI_LNK_PTR of these TKIs. As shown by the arrows TL4, TL5, and TL6 in FIG. 19, "TKI#5" is set in the TKI_LNK_PTR of TKI#4, "TKI#6" is set in the TKI_LNK_PTR of TKI#5, and "TKI#7" is set in the TKI_LNK_PTR of TKI#6.

As a result, a playback apparatus can refer to the TKI_LNK_PTRs given in the TKIs corresponding to these four AOB files and thereby find out that the four TKIs TKI#4 to TKI#7 and the four AOB files "AOB004.SA1" to "AOB007.SA1" compose a single track, TrackD.

{17-5_22-7} TKI_BLK_ATR

The attributes of present TKI are written in the "TKI_BLK_ATR". In FIG. 22, the information shown within the broken lines extending from the TKI_BLK_ATR shows the bit composition of the TKI_BLK_ATR. In FIG. 22, the TKI_BLK_ATR is shown as being 16 bits long, with the bits from b3 to b15 being reserved for future use. The three bits from bit b2 to b0 are used to show the attributes of the TKI.

When one TKI corresponds to a complete track, the value "00b" is written in the TKI_BLK_ATR (this setting is hereafter referred to as "Track"). When several TKIs correspond to the same track, the value "001b" is written in the TKI_BLK_ATR of the first TKI (this setting is hereafter referred to as "Head_of_Track"),the value "010b" is written in the TKI_BLK_ATR of the TKIs that correspond to AOBs in the middle of the track (this setting is hereafter referred to as "Midpoint_of_Track"), and the value "011b" is written in the TKI_BLK_ATR of the TKI that corresponds to the AOB at the end of the track (this setting is hereafter referred to as "End_of_Track"). When a TKI is unused but a TKI region exists, which is to say, when there is a deleted TKI, the value "100b" is written in the TKI_BLK_ATR (this setting is hereafter referred to as "Unused"). When a TKI is unused and no TKI region exists, the value "101b" is written in the TKI_BLK_ATR.

{17-5_22-8_19} Example Setting of the TKI_BLK_ATR

The following describes the settings of the TKI_BLK_ATR for each TKI in the example shown in FIG. 19.

By referring to the TKI BLK_ATR of each TKI, it can be seen that the four pairs TKI#1 ("AOB001.SA1"), TKI#2 ("AOB002.SA1"), TKI#3 ("AOB003.SA1"), and TKI#8 ("AOB008.SA1") each correspond to separate tracks since the TKI_BLK_ATR of each of TKI#1, TKI#2, TKI#3, and TKI#8 is set as "Track".

The TLK_BLK_ATR of TKI#4 is set at "Head_of_Track", the TLK_BLK_ATR of TKI#7 is set at "End_of_Track", and the TLK_BLK_ATR of TKI#5 and TKI#6 is set at "Midpoint_of_Track". This means that the AOB file ("AOB004.SA1") corresponding to TKI#4 is the start of a track, the AOB files ("AOB005.SA1") and ("AOB006.SA1") corresponding to TKI#5 and TKI#6 are midpoints of the track, and the AOB file ("AOB007.SA1") corresponding to TKI#7 is the end of a track.

By classifying the combinations of TKI and corresponding AOB file in accordance with the settings of the TKI_BLK_ATR in the TKI, it can be seen that the combination of TKI#1 and "AOB001.SA1" composes a first track (TrackA). Likewise, the combination of TKI#2 and "AOB002.SA1" composes a second track (TrackB) and the combination of TKI#3 and "AOB003.SA1" composes a third track (TrackC). The combination of TKI#4 and "AOB004.SA1" composes the first part of the fourth track (TrackD), the combinations of TKI#5 with "AOB005.SA1" and TKI#6 with "AOB006.SA1" compose central parts of TrackD, and the combination of TKI#7 and "AOB007.SA1" composes the end part of TrackD. Finally, the combination of TKI#8 and "AOB008.SA1" composes a fifth track (TrackE).

{17-5_22-9} TKI_PB_TM

The playback period of the track (song) composed of the AOB recorded in the AOB file corresponding to a TKI is written in the "TKI_PB_TM" in the TKI.

When a track is composed of a plurality of TKIs, the entire playback period of the track is written in the TKI_PB_TM of the first TKI corresponding to the track, while the playback period of the corresponding AOB is written into the second and following TKIs for the track.

{17-5_22-10} TKI_AOB_ATR

The encoding conditions used when producing an AOB, which is to say information such as (1) the sampling frequency at which the AOB recorded in the corresponding AOB file was sampled, (2) the transfer bitrate, and (3) the number of channels, is written in the "TKI_AOB_ATR" in a TKI. The bit composition of the TKI_AOB_ATR is shown within the broken lines that extend from the "TKI_AOB_ATR" in FIG. 22.

In FIG. 22, the TKI_AOB_ATR is composed of 32 bits, with the coding mode being written in the four-bit field from bit b16 to bit b19. When the AOB is encoded according to MPEG-2 AAC (with ADTS header), the value "0000b" is written into this field, while when the AOB is encoded according to MPEG-layer 3 (MP3), the value "0001b" is written.

When the AOB is encoded according to Windows Media Audio (WMA), the value "0010b" is written in this field.

The bitrate used when encoding the AOB is written in the eight-bit field between bit b15 and bit b8. When the AOB is encoded according to MPEG-2 AAC (with ADTS header), a value between "16" and "72" is written into this field, while when the AOB is encoded according to MPEG1-layer 3 (MP3), a value between "16" and "96" is written. When the AOB is encoded according to MPEG1-layer 3 (MP3) LSF, a value between "16" and "80" is written into this field, while when the AOB is encoded according to Windows Media Audio (WMA), a value between "8" and "16" is written.

The sampling frequency used when encoding the AOB is written in the four-bit field between bit b7 and bit b4. When the sampling frequency is 48 kHz, the value "000b" is written in this field. When the sampling frequency is 44.1 kHz, the value is "0001b", when the sampling frequency is 32 kHz, the value "0010b", when the sampling frequency is 24 kHz, the value "0011b", when the sampling frequency is 22.05 kHz, the value "10100b", and when the sampling frequency is 16 kHz, the value "0101b".

The number of channels is written in the three-bit field from bit b3 to bit b1. When one channel (i.e., monaural) is used, the value "000b" is written in this field, while when two channels (i.e., stereo) is used, the value "001b" is written in this field.

The twelve-bit field from bit b31 to bit 20 is reserved for future use, as is the bit b0.

{17-5__22-11} ISRC

An ISRC (International Standard Recording Code) is written in the TKGI. In FIG. 22, the broken lines extending from the "ISRC" box show the content of the ISRC. As shown in the drawing, the ISRC is composed of ten bytes, with a Recording-item code (#12) being written into the four-bit field between bit b4 and bit b7. A Recording code/Recording-item code (#11) is written in the four-bit field between bit b8 and bit b11.

A Recording Code (ISRC#10, #9, #8) is written in the twelve-bit field between bit b12 and bit b23. A Year-of-Recording code (ISRC#6, #7) is written in the eight-bit field b24 and bit b31.

The First Owner Code (ISRC #3, #4, #5) is written in the six-bit field between bit b32 and bit b37, the six-bit field between bit b40 and bit b45, and the six-bit field between bit b48 and bit b53. The Country Code (ISRC #1, #2, #3) is written in the six-bit field between bit b56 and bit b61 and the six-bit field between bit b64 and bit b69. A one-bit Validity flag is written in a one-bit field composed of bit b79. A detailed description of ISRC can be found in ISO3901:1986 "Documentation-International Standard Recording Code (ISRC)".

{17-5__22-12__23A-1} BIT

The "Block Information Table (BIT)" is a table for managing an AOB_BLOCK, and has the detailed composition shown in FIGS. 23A and 23B.

As shown in FIG. 23A, a BIT is composed of a DATA_OFFSET field that occupies a region from the 60th byte to the 63rd byte, an SZ_DATA field that occupies a region from the 64th byte to the 67th byte, a TMSRTE_Ns field that occupies a region from the 68th byte to the 71st byte, an FNs_1st_TMSRTE field that occupies a region from the 72nd byte to the 73rd byte, an FNs_Last_TMSRTE that occupies a region from the 74th byte to the 75th byte, an FNs_Middle_TMSRTE field that occupies a region from the 76th byte to the 77th byte, and a TIME_LENGTH field that occupies a region from the 78th byte to the 79th byte.

Each of these fields is described in detail below.

{17-5__22-12__23A-2} DATA_Offset

The relative address of the start of an AOB_BLOCK from the boundary between clusters is written in the "DATA_OFFSET" as a value given in byte units. This expresses the size of an invalid area between an AOB and the AOB_BLOCK. As one example, when a user records a radio broadcast on a flash memory card 31 as AOBs and wishes to delete an intro part of a track over which a DJ has spoken, the DATA_OFFSET in the BIT can be set to have the track played back without the part including the DJ's voice.

{17-5__22-12__23A-3} SZ_DATA

The data length of an AOB_BLOCK expressed in byte units is written in "SZ_DATA". By subtracting a value produced by adding the SZ_DATA to the DATA_Offset from the file size (an integer multiple of the cluster size), the size of the invalid area that follows the AOB_BLOCK can be found.

{17-5__22-12__23A-4} TMSRTE_Ns

The total number of TMSRT_Entries included in an AOB_BLOCK is written in "TMSRTE_Ns".

{17-5__22-12__23A-5} "FNs__1st_TMSRTE", "FNs_Last_TMSRTE", "FNs_Middle_TMSRTE"

The number of AOB_FRAMEs included in the AOB_ELEMENT positioned at the start of a present AOB_BLOCK is written in "FNs__1st_TMSRTE".

The number of AOB_FRAMEs included in the AOB_ELEMENT positioned at the end of the present AOB_BLOCK is written in "FNs_Last_TMSRTE".

The number of AOB_FRAMEs included in each AOB_ELEMENT apart from those at the start and the end of the present AOB_BLOCK, which is to say AOB_ELEMENTs in the middle of the AOB_BLOCK, is written in "FNs_Middle_TMSRTE".

The playback period of an AOB_ELEMENT is written in the format shown in FIG. 23C in the "TIME_LENGTH" field to an accuracy in the order of milliseconds. As shown in FIG. 23C, the "TIME_LENGTH" field is 16-bits long. When the encoding method used is MPEG-ACC or MPEG-Layer 3, the playback period of an AOB_ELEMENT is two seconds, so that the value "2000" is written in the "TIME_LENGTH" field.

{17-5__22-13__23B}

FIG. 23B shows the number of AOB_FRAMEs indicated by "FNs_Middle_TMRTE". In the same way as FIG. 14, FIG. 23B shows the relationship between the sampling_frequency and the number of AOB_FRAMEs included in an AOB_ELEMENT in the middle of an AOB_BLOCK.

The relationship between the sampling_frequency and the number of frames included in the AOB_ELEMENT shown in FIG. 23B is the same as that shown in FIG. 14, which is to say, the number of frames in an AOB_ELEMENT depends on the sampling frequency used. The number of frames written in "FNs__1st_TMSRTE" and "FNs_Last_TMSRTE" will fundamentally be the same as the number written in "FNs Middle_TMSRTE", though when an invalid area is present in the AOB_ELEMENTs at the start and/or end of an AOB_BLOCK, the values given in "FNs__1st_TMSRTE" and/or "FNs_Last_TMSRTE" will differ from the value in "FNs_Middle_TMSRTE".

{17-5__22-14__24} Example of a Stored AOB_ELEMENT

Figure 24:
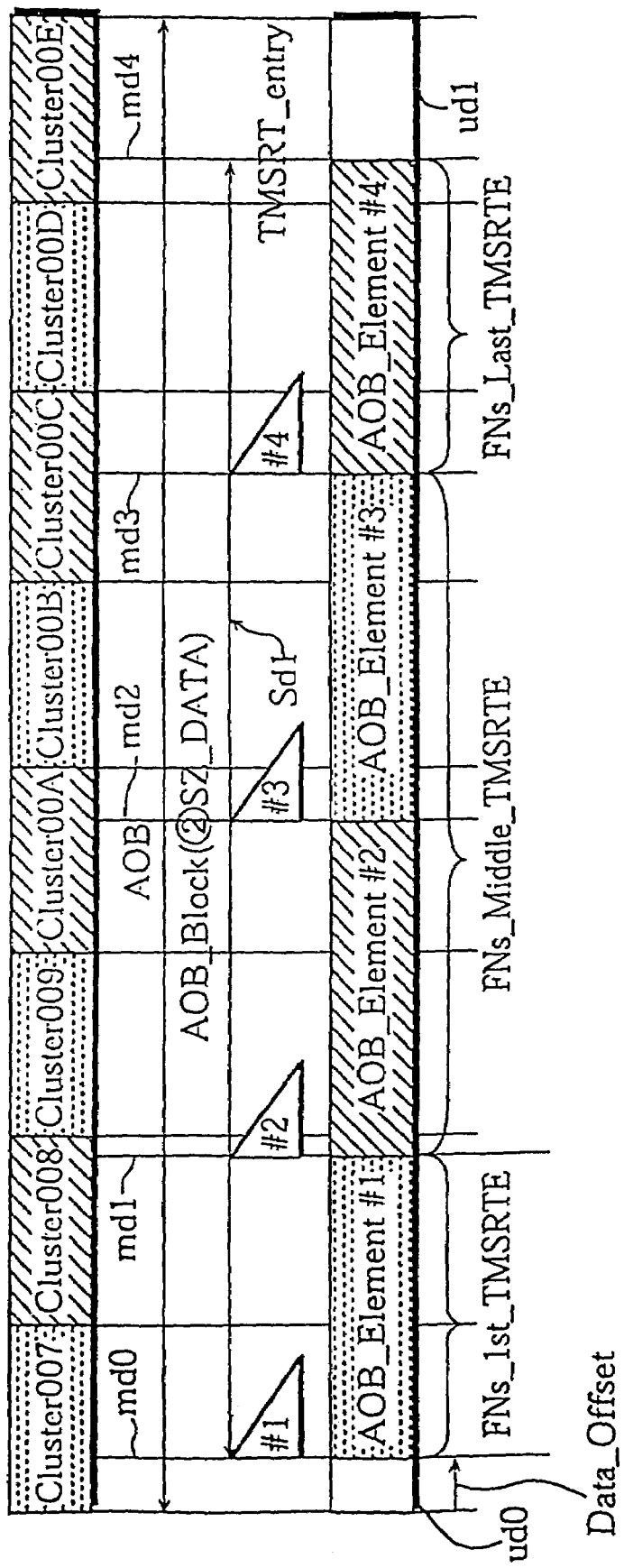
FIG. 24 shows cluster 007 to 00E into which the AOB composed of AOB_ELEMENT#1 to AOB_ELEMENT#4 are stored.

FIG. 24 shows the clusters 007 to 00E that store the AOB composed of AOB_ELEMENT#1 to AOB_ELEMENT#4. The following describes the settings in the BIT when an AOB is stored as shown in FIG. 24. AOB_ELEMENT#1 to AOB_ELEMENT#4 that are stored in cluster 007 to cluster 00E are indicated in FIG. 24 by the triangular flags, with TMSRT_entries being set in the TKI for each of AOB_ELEMENT#1 to AOB_ELEMENT#4.

In this example, the first part of AOB_ELEMENT#1 at the start of the AOB is stored in cluster 007, while the last part of AOB_ELEMENT#4 at the end of the AOB is stored in cluster 00E. The AOB_ELEMENTs #1 to #4 occupy the region between md0 in cluster 007 to md4 in cluster 00E. As shown by arrow sd1 in FIG. 24, the SZ_DATA in the BIT indicates that AOB_ELEMENTs #1 to #4 occupy a region from the start of cluster 007 to the end of cluster 00E, and so does not indicate that there are the invalid areas ud0 and ud1 in clusters 007 and 00E that are not occupied by an AOB_ELEMENT.

On the other hand, the AOB also includes the parts ud0 and ud1 that are present in clusters 007 and 00E but are not occupied by AOB_ELEMENT#1 or AOB_ELEMENT#4. The DATA_Offset given in the BIT gives the length of the unoccupied region ud0, which is to say, a position value for the start of the AOB_ELEMENT#1 relative to the start of cluster 007.

In FIG. 24, the AOB_ELEMENT#1 occupies a region from md0 in cluster 007 to md1 in cluster 008.

This AOB_ELEMENT#1 does not occupy all of cluster 008, with the remaining part of the cluster being occupied by AOB_ELEMENT#2. AOB_ELEMENT#4 occupies a region from md3 midway through cluster 00C to md4 midway through cluster 00E. In this way, AOB_ELEMENTs may be stored across cluster boundaries, or in other words, AOB_ELEMENTs can be recorded without regard for the boundaries between clusters. The "FNs_1st TMSRTE" in the BIT shows the number of frames in AOB_ELEMENT#1 that is located in clusters 007 and 008, while the "FNs_Last_TMSRTE" in the BIT shows the number of frames in AOB_ELEMENT#4 that is located in clusters 00C to 00E.

In this way, AOB_ELEMENTs can be freely positioned without regard for the boundaries between clusters. The BIT provides information showing the offset from a cluster boundary to an AOB_ELEMENT and the number of frames in each AOB_ELEMENT.

{17-5_22-14_25} Use of the Number of Frames Given in Each AOB_ELEMENT (Part 1)

The following describes how the number of frames in each AOB_ELEMENT given in the BIT is used. This number of frames given in the BIT is used when forward or backward search is performed. As mentioned earlier, such operations play back 240 milliseconds of data after first skipping data with a playback period of two seconds.

Figure 25:
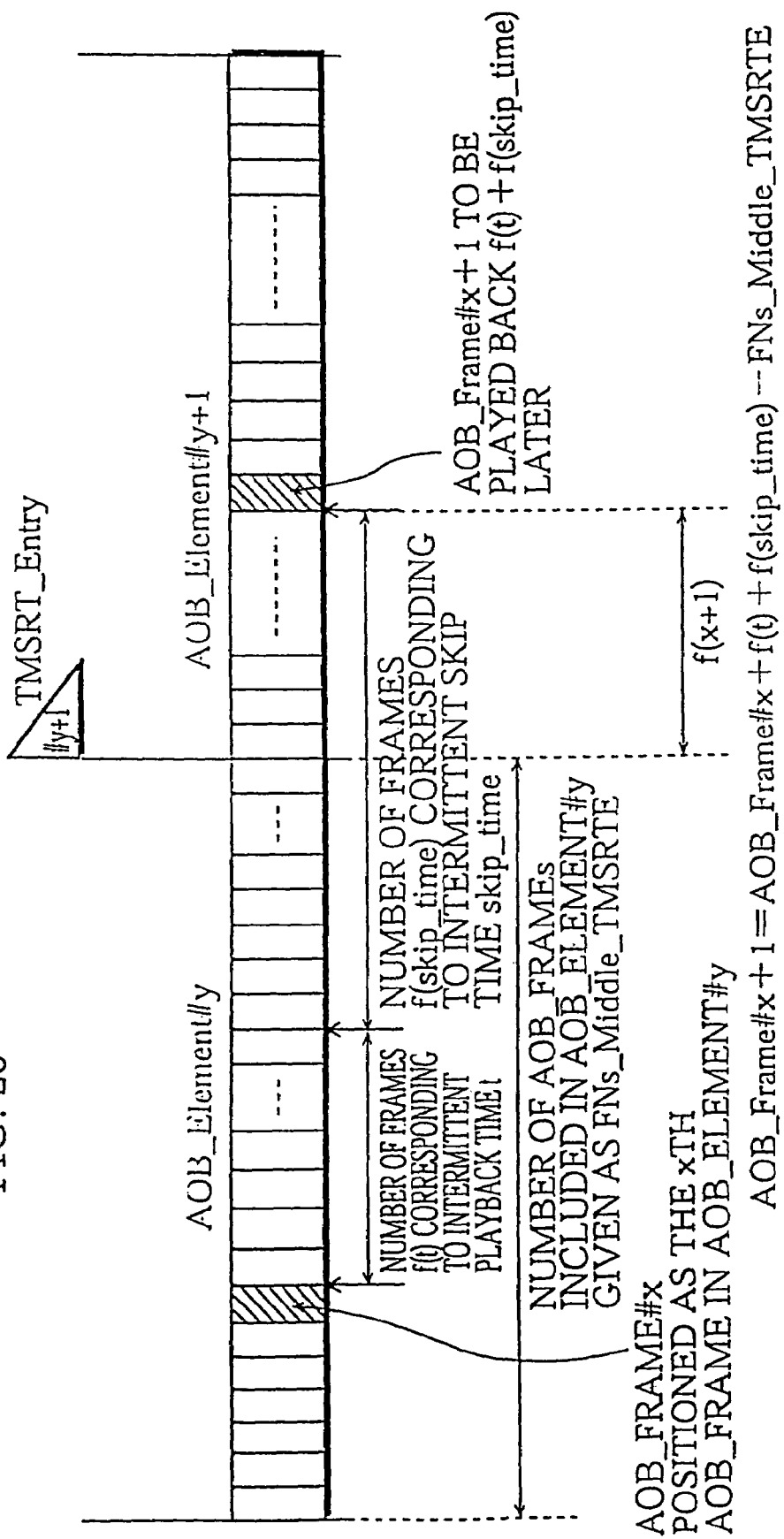
FIG. 25 shows how the next AOB_FRAME#x+1 to be played back is set when forward search is performed starting from the AOB_FRAME#x in an arbitrary AOB_ELEMENT#y in an AOB.

FIG. 25 shows how AOB_FRAME#x+1, which should be played back next, is set when performing forward search starting from an AOB_FRAME#x in an AOB_ELEMENT#y in an AOB.

FIG. 25 shows the case when a user selects forward search during the playback of AOB_FRAME#x included in AOB_ELEMENT#y. In FIG. 25, "t" represents the intermittent playback period (here, 240 milliseconds), "f(t)" shows the number of frames that correspond to this intermittent playback period, "skip_time" shows the length of the period that should be skipped between intermittent playback periods (here, two seconds), "f (skip_time)" shows the number of frames that correspond to this skip time. Intermittent playback is achieved by repeating the three procedures (1), (2), and (3) described below.

(1) The playback apparatus refers to the TMSRT_entry in the TKTMSRT and jumps to the start of the flag symbol (AOB_ELEMENT).

(2) The playback apparatus performs playback for 240 milliseconds.

(3) The playback apparatus jumps to the start of the next flag symbol (AOB_ELEMENT).

The AOB_FRAME#x+1 that exists 2s+240 ms from the AOB_FRAME#x included in the AOB_ELEMENT#y will definitely be present in the AOB_ELEMENT#y+1. When specifying the AOB_FRAME#x+1 that is 2s+240 ms from the AOB_FRAME#x, the first address of the next AOB_ELEMENT#y+1 can be immediately calculated by reading a TMSRT_entry from the TKTMSRT, though a playback apparatus cannot know the number of AOB_FRAMEs from the start address of the AOB_ELEMENT#y+1 to the AOB_FRAME#x+1 from the TMSRT_entry alone.

To calculate this number of AOB_FRAMEs, it is necessary to subtract the total number of frames included in the AOB_ELEMENT#y from the total of (1) the number#x showing the position of the AOB_FRAME#x relative to the start of the AOB_ELEMENT#y, (2) f(t) and (3) f(skip_time). To simplify the calculation of the relative frame position of AOB_FRAME#x+1 in AOB_ELEMENT#y+1; the "FNs_1st_TMSRTE", "FNs_Middle_TMSRTE", and "FNs_Last_TMSRTE" for each AOB_ELEMENT are written in the BIT, as mentioned above.

{17-5_22-15_26A} Use of the Number of Frames Given in Each AOB_ELEMENT (Part 2)

The number of frames written in the BIT is also used when the playback apparatus performs a time search function where playback starts at a point indicated using a time code. FIG. 26A shows how a playback apparatus can specify the AOB_ELEMENT and AOB_FRAME corresponding to the playback start time indicated by the user. When playback is to commence from a time indicated by the user, the indicated time (in seconds) is set in the Jmp_Entry field, and playback should begin from an AOB_ELEMENT#y and an AOB_FRAME position x that satisfy Equation 2 given below.

$$Jmp\_Entry(sec) = (FNs\_1st\_TMSRTE + FNs\_middle\_TMSRTE * y + x) * 20 \text{ msec} \quad \text{Equation 2}$$

Since the "FNs_1st_TMSRTE" and "FNs_Middle_TMSRTE" are provided in the BIT, these can be substituted into Equation 2 to calculate the AOB_ELEMENT#y and AOB_FRAME#x. Having done this, a playback apparatus can refer to the TKTMSRT of the AOB, calculate the first address of the AOB_ELEMENT#y+2 (which is the $(y+2)^{th}$ AOB_ELEMENT in this AOB), and start the search for AOB_FRAME#x from this first address. On finding the $x^{th}$ AOB_FRAME, the playback apparatus starts the playback from this frame. In this way, the playback apparatus can start the playback of data from the time indicated by Jmp_Entry (in seconds).

In this way, a playback apparatus does not have to search for the ADTS header parts of AOB_FRAMEs, and only needs to perform the search in AOB_ELEMENTs that are given in the TMSRT_entries in the TKTMSRT. This means that the playback apparatus can find a playback position corresponding to an indicated playback time at high speed.

In the same way, when the Jmp_Entry is set and the time search function is used on a track that is composed of a plurality of AOBs, the playback apparatus only needs to calculate an AOB_ELEMENT#y and AOB_FRAME#x that satisfy Equation 3 below.

$$Jmp\_Entry \text{ (in seconds)} = \text{Playback period from } AOB\#1 \text{ to } AOB\#n + (FNs\_1st\_TMSRTE(\#n+1) + FNs\_middle\_TMSRTE(\#n+1) * y + x) * 20 \text{ msec} \quad \text{Equation 3}$$

The total playback period of the AOBs from AOB#1 to AOB#n is as follows.

Total Playback Period from *AOB*#1 to *AOB*#*n*=
[*"FNs*_1st_*TMSRTE"*(#1)+*"FNs*_Middle_
*TMSRTE"*(#1)*(Number of *TMSRT*_entries(#1)−
2)+*"FNs*_Last_*TMSRTE"*(#1)+*"FNs*_1st_
*TMSRTE"*(#2)+(*"FNs*_Middle_*TMSRTE"*(#2)*
Number of *TMSRT*_entries (#2)−2)+*"FNs*_Last_
*TMSRTE"*(#2)+*"FNs*_1st_*TMSRTE"*(#3)+
(*"FNs*_Middle_*TMSRTE"*(#3)*Number of
*TMSRT*_entries (#3)−2)+*"FNs*_Last_*TMSRTE"*
(#3) . . . +*"FNs*_1st_*TMSRTE"*(#*n*)+(*"FNs*_
Middle_*TMSRTE"*(#*n*)*Number of *TMSRT*_en-
tries (#*n*)−2)+*"FNs*_Last_*TMSRTE"*(#*n*)]*20
msec Having calculated an AOB#n, an AOB_ELEMENT#y, and AOB_FRAME#x that satisfy Equation 3, the playback apparatus refers to the TKTMSRT corresponding to the AOB#n+1, searches for the $x^{th}$ AOB_FRAME from the address at which the $(y+2)^{th}$ AOB_ELEMENT (i.e., AOB_ELEMENT#y+2) is positioned, and starts the playback from this $x^{th}$ AOB_FRAME.

{17-5_22-16_27A,B} Deletion of an AOB File and a TKI

This completes the explanation of all of the information included in the TKI. The following describes how the TKI is updated in the following four cases. In the first case (case1), a track is deleted. In the second case (case2), a track is deleted and a new track is recorded. In the third case (case3), two out of a plurality of tracks are selected and combined into a single track. Finally, in the fourth case (case4), one track is divided to produce two tracks.

The following describes case1 where a track is deleted.

FIGS. 27A and 27B show the partial deletion of a track. The example in FIGS. 27A and 27B corresponds to the TrackManager shown in FIG. 19, and assumes that the user has indicated the partial deletion of Track B. The AOB corresponding to TrackB is recorded in "AOB002.SA1", which is associated with TKI#2. This means that the deletion of "AOB002.SA1" is accompanied by the setting of "Unused" into the TKI_BLK_ATR of TKI#2. This state where "AOB002.SA1" has been deleted and "Unused" has been set into the TKI_BLK_ATR of TKI#2 is shown in FIG. 27B. Since "AOB002.SA1" has been deleted, the region that was formerly occupied by "AOB002.SA1" is freed to become an unused region. As mentioned above, the other change is that "Unused" is set in the TKI_BLK_ATR of TKI#2.

{17-5_22-17_28A,B} Assignment of TKIs When a New AOB is Recorded

The following describes case2 where a new track is recorded after the deletion of a track.

FIG. 28A shows the TrackManager after the deletion of tracks has been performed several times. As shown in FIG. 28A, if the tracks corresponding to TKI#2, TKI#4, TKI#7, and TKI#8 have been deleted, then "Unused" is set in the TKI_BLK_ATR of these TKI. While AOB files are deleted in the same way as conventional data files, the TrackManager is updated by merely setting "Unused" in the TKI_BLK_ATR of the corresponding TKI. These means that TKIs whose TKI_BLK_ATRs are set at "Unused" can appear at different places in the TrackManager.

FIG. 28B shows how a new TKI and AOB file are written when a TKI whose TKI_BLK_ATR is "Unused" is present in the TrackManager. Like in FIG. 28A, the TKI#2, TKI#4, TKI#5, TKI#7, and TKI#8 in FIG. 28B are set as "Unused".

In FIG. 28B, the new track to be written is composed of four AOBs. The unused TKIs used to record these AOBs are determined according to the DPL_TK_SRPs or can be freely chosen. In the present example, the unused TKIs numbered TKI#2, TKI#4, TKI#7, and TKI#8 are used to record the TKIs for the new track.

Since these four AOBs compose one track, "Head_of_Track" is set in the TKI_BLK_ATR of TKI#2, "Middle_of_Track" is set in the TKI_BLK_ATR of TKI#4 and TKI#7, and "End_of_Track" is set in the TKI_BLK_ATR of TKI#8. The TKI_LNK_PTR in each of the four TKIs, TKI#2, TKI#4, TKI#7, and TKI#8, used to compose the new TrackD is set so as to show the TKI forming the next part of TrackD, so that as shown by the arrows TL2, TL4, and TL7, TKI#4 is set in the TKI_LNK_PTR of TKI#2, TKI#7 is set in the TKI_LNK_PTR of TKI#4, and TKI#8 is set in the TKI_LNK_PTR of TKI#7.

After this, the files "AOB002.SA1", "AOB004.SA1", "AOB007.SA1", and "AOB008.SA1" having the same numbers as TKI#2, TKI#4, TKI#7, TKI#8 are produced, and the four AOBs composing TrackD are stored in these four files.

By appropriately setting the TKI_LNK_PTRs and TKI_BLK_ATRs, this fourth track TrackD can be managed using TKI#2, TKI#4, TKI#7, and TKI#8.

As described above, when a new track is written onto the flash memory card 31, TKIs in the TrackManager that are set as "Unused" are assigned as the TKIs to be used for tracks that are to be newly recorded.

{17-5_22-18_29A,B} Setting of TKI When Combining Two Tracks

The following describes the updating of the TKI when combining tracks (case3).

Figure 29A:
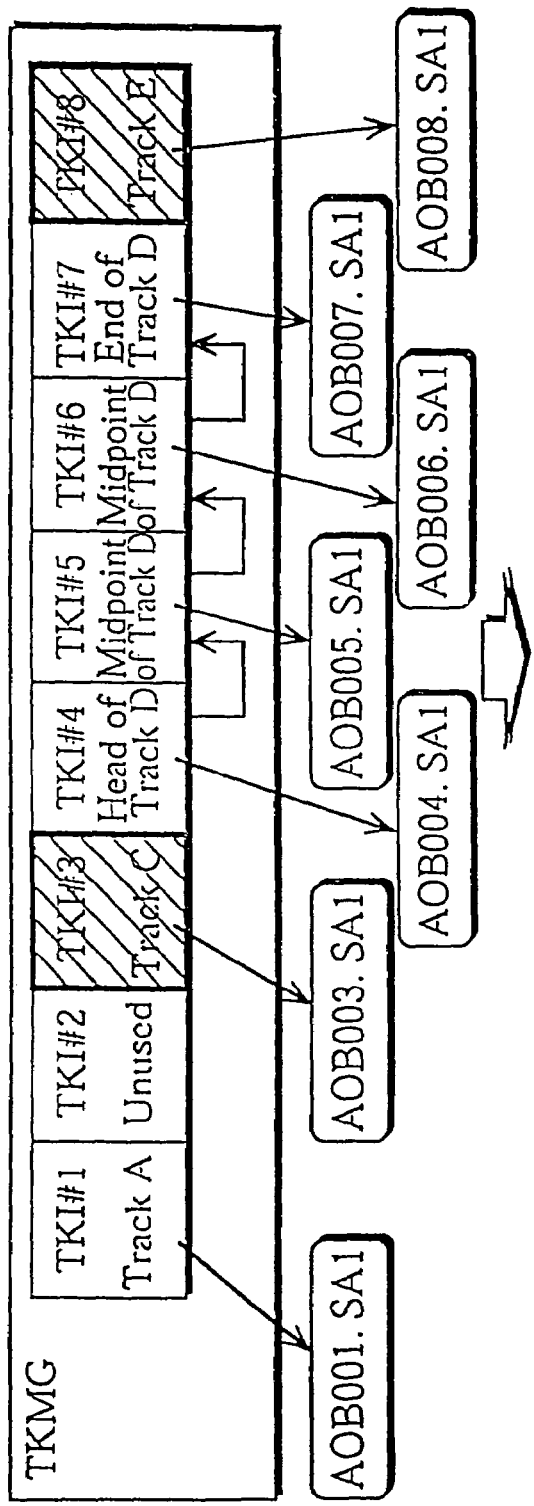
FIGS. 29A and 29B show the TKIs are set when two tracks are combined to produce a new track.
Figure 29B:
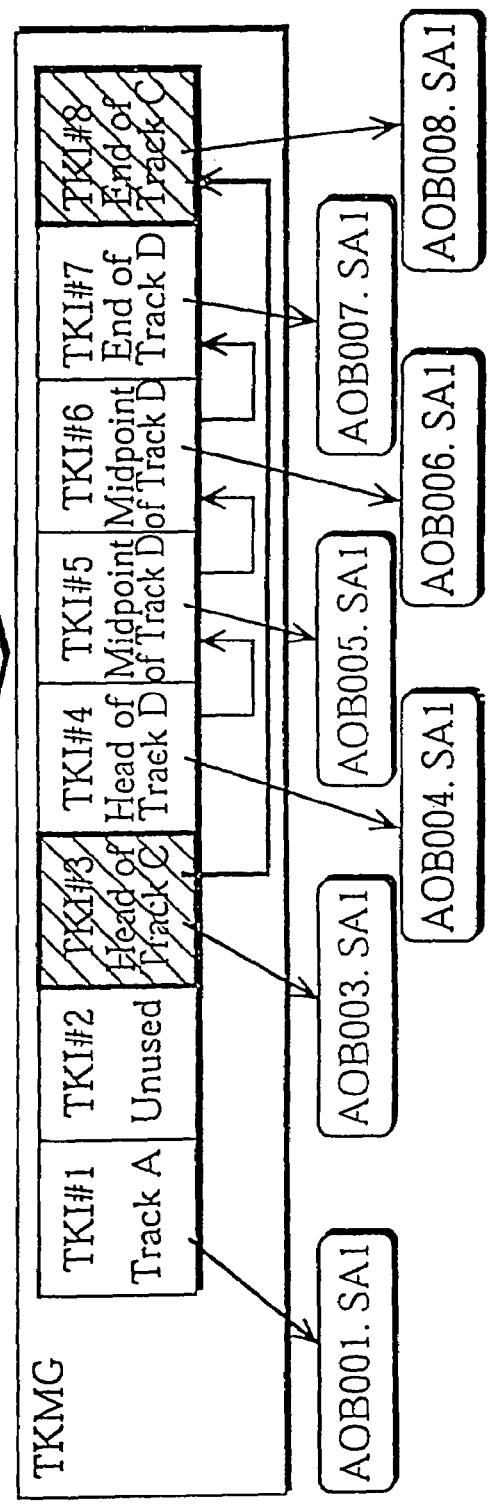

FIGS. 29A and 29B show how the TKIs are set when two tracks are combined to produce a new track. The example in FIG. 29A uses the same TrackManager as FIG. 19 and shows the case when the user performs an editing operation to combine TrackC and TrackE into a single track.

In this case, the AOBs that correspond to TrackC and TrackE are recorded in the AOB files "AOB003.SA1" and "AOB008.SA1" which correspond to TKI#3 and TKI#8, so that the TKI_BLK_ATRs of TKI#3 and TKI#8 are rewritten. FIG. 29B shows the TKI_BLK_ATR of these TKIs after rewriting. In FIG. 29A, the TKI_BLK_ATRs of TKI#3 and TKI#8 is written as "Track", but in FIG. 29B the TKI_BLK_ATR of TKI#3 is rewritten to "Head_of_Track" and the TKI_BLK_ATR of TKI#8 is rewritten as "End_of_Track". By rewriting the TKI_BLK_ATRs in this way, the AOB files "AOB003.SA1" and "AOB008.SA1" which correspond to TKI#3 and TKI#8 end up being treated as parts of a single track, the new TrackC. This operation is accompanied by the TKI_LNK_PTR of TKI#3 being rewritten to indicate TKI#8.

It should be particularly noted here that while the TKI_BLK_ATRs in the TKI are rewritten, no processing is performed to physically combine the AOB files "AOB003.SA1" and "AOB008.SA1". This is because AOB files are each encrypted using different FileKeys, so that when combining AOB files, it would be necessary to perform two processes for each AOB file to first decrypt the encrypted AOB file and then to re-encrypt the result, resulting in an excessive processing load. Also, an AOB file combined in this way would be encrypted using a single FileKey, which would make the combined track less secure that the tracks used to produce it.

The TKI is originally designed so as to suppress the size of the TKTMSRT, so that the physical combining of AOB files by an editing operation would also carry the risk of the TKI becoming too large.

For the reasons given above, editing operations that combine tracks leave the AOB files in their encrypted state and are achieved by merely changing the attributes given by the TKI_BLK_ATRs.

{17-5_22-18_29A,B-1_30,31} Conditions That Should be Satisfied When Combining Tracks The combining of tracks is performed by changing the TKI_BLK_ATR attributes as described above, but the AOBs that are included in the combined tracks should satisfy the conditions given below.

A first condition is that the AOB that is to compose a latter part of a new track needs to have the same audio attributes (audio coding mode, bitrate, sampling frequency, number of channels, etc.) as the AOB that is to compose the first part of the new track. If an AOB has different audio attributes to the preceding or succeeding AOB, the playback apparatus will have to reset the operation of the decoder, which makes seamless (i.e., uninterrupted) playback of consecutive AOBs difficult.

The second condition is that in the track produced by the combining, three or more AOBs made up of only AOB_ELEMENTs whose number of AOB_FRAMEs is below the required number for an "FNs_Middle_TMSRTE" cannot be linked.

AOBs are classified into two types depending on whether at least one AOB_ELEMENT includes a same number of AOB_FRAMEs as the number of frames stipulated for an "FNs_Middle_TMSRTE". The Type1 AOB includes at least one AOB_ELEMENT having this number of AOB_FRAMEs, while the Type2 AOB includes no AOB_ELEMENT having this number of AOB_FRAMEs.

In other words, AOB_ELEMENTs in a Type2 AOB have fewer AOB_FRAMEs than "FNs_Middle_TMSRTE", and the second condition stipulates that three Type2 AOBs cannot be linked together.

The reason for the second condition is as follows. When the playback apparatus reads AOBs successively, it is preferable for a sufficient number of AOB_FRAMEs to accumulate in the buffer of the playback apparatus, though this cannot be achieved when there are consecutive Type2 AOBs. In such case, an underflow is likely to occur in the buffer of the playback apparatus, so that uninterrupted playback by the playback apparatus can no longer be guaranteed. Therefore, in order to avoid such underflows, the second condition stipulating that three or more Type2 AOBs cannot be linked continuously is used.

FIG. 30A shows a Type1 AOB, while FIG. 30B shows two examples of Type2 AOBs. In FIG. 30B, both AOBs are composed of less than two AOB_ELEMENTs, with none of the AOB_ELEMENTs including a number of AOB_FRAMEs that is set for an "FNs_Middle_TMSRTE". Since the absence of an AOB_ELEMENT with the number of AOB_FRAMEs set for an "FNs_Middle_TMSRTE" is the condition by which an AOB is classified as a Type2 AOB, this means that all of the AOBs shown in this drawing are classified as Type2 AOBs.

Figure 31A:
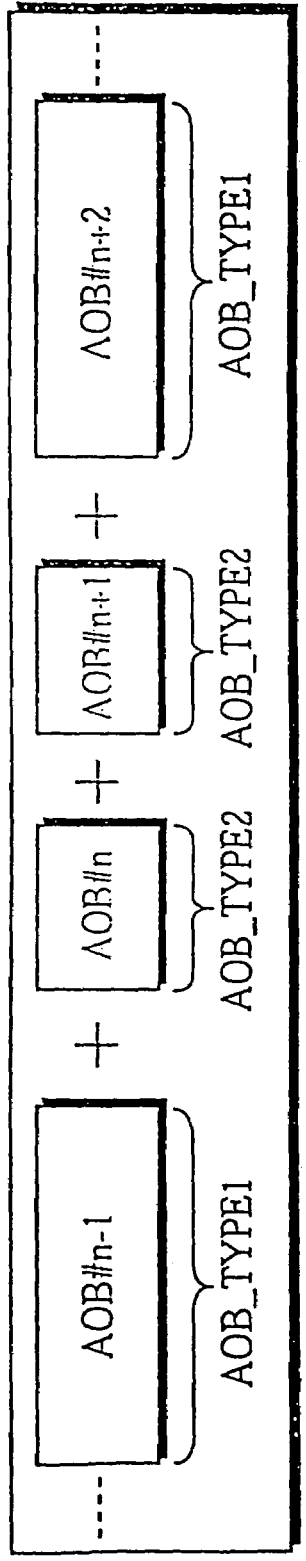
FIG. 31A shows the combining of a plurality of tracks into a single track for a combination of a Type1+Type2+Type2+Type1 AOB.

In FIG. 31A, a combining of Type1+Type2+Type2+Type1 AOBs into a single track is shown. As this combining does not involve the linking of three Type2 AOBs, these AOBs may be linked to form a single track.

Figure 31B:
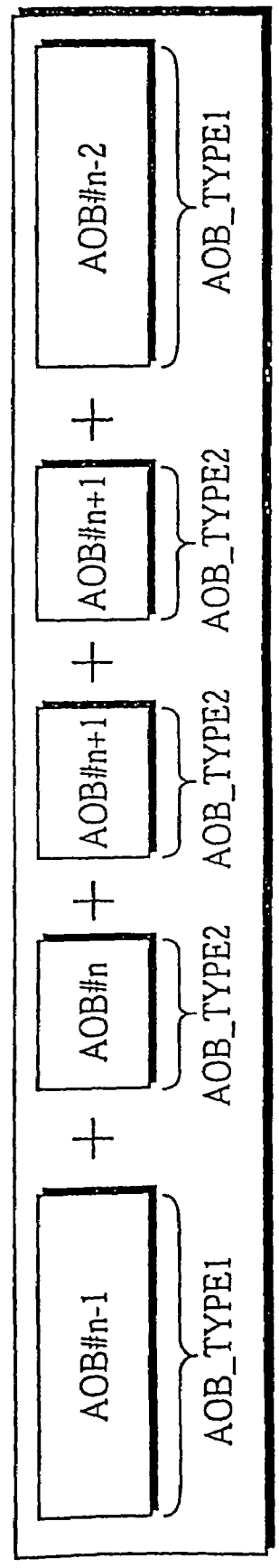
FIG. 31B shows the combining of a plurality of tracks into a single track for a combination of a Type1+Type2+Type2+Type2+Type1 AOB.

FIG. 31B shows the linking of Type1+Type2+Type2+Type2+Type1 AOBs into a single track. This combining would result in there being three consecutive Type2 AOBs, and so is prohibited.

Figure 32A:
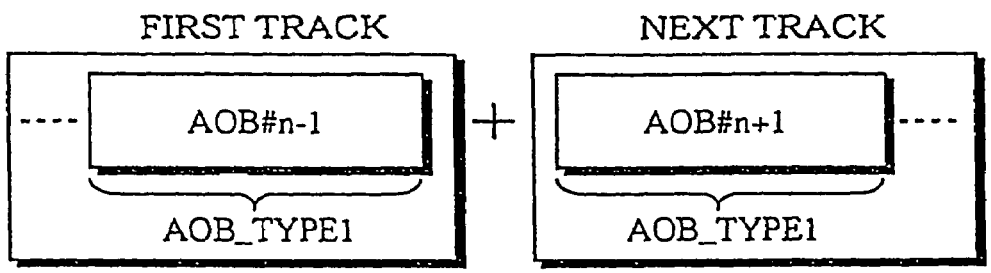
FIG. 32A shows a pattern where a Type1 AOB is present at the end of a preceding track and a Type1 AOB is present at the start of a next track.
Figure 32B:
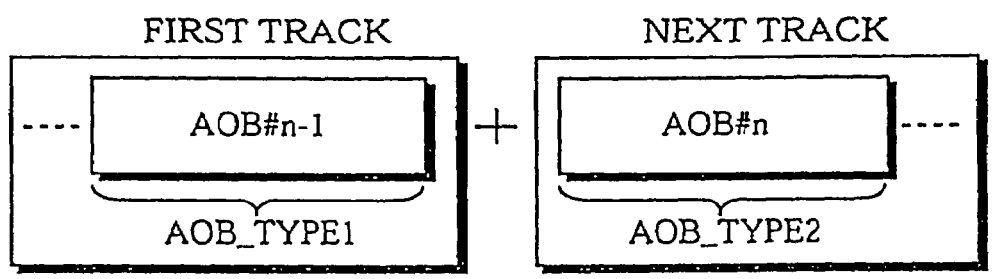
FIG. 32B shows a pattern where a Type1 AOB is present at the end of a first track and a Type2 AOB is present at the start of a next track.

{17-5_22-18_29A,B-1_32} Combining of Tracks With Respect to Combinations of Type1 and Type2 AOBS In the combining of AOBs into a single track shown in FIG. 31A, if the last AOB in the first track is a Type1 AOB, the combining can be performed regardless of whether the first part of this track is a Type1 AOB or a Type2 AOB. FIG. 32A shows the case where the last AOB in the first track is a Type1 AOB and the first AOB in the next track is also a Type1 AOB. FIG. 32B shows the case where the last AOB in the first track is a Type1 AOB and the first AOB in the next track is a Type2 AOB. As the second condition is satisfied in both of these cases, the illustrated tracks can be combined into a single track.

When the last AOB in the first track is a Type2 AOB and the preceding AOB in the first track is a Type1 AOB, this first track can be combined with a following track that starts with a Type1 AOB regardless of whether the first AOB in the first track is a Type1 AOB or a Type2 AOB.

Figure 32C:
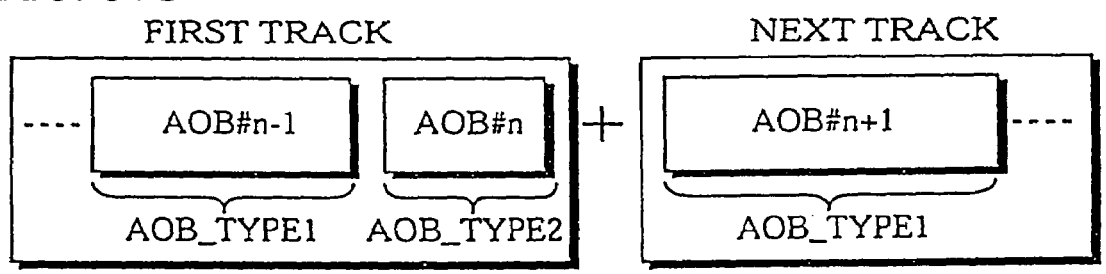
FIG. 32C shows a pattern where a Type1 and Type2 AOB are present at the end of a first track and a Type1 AOB is present at the start of a next track.
Figure 32D:
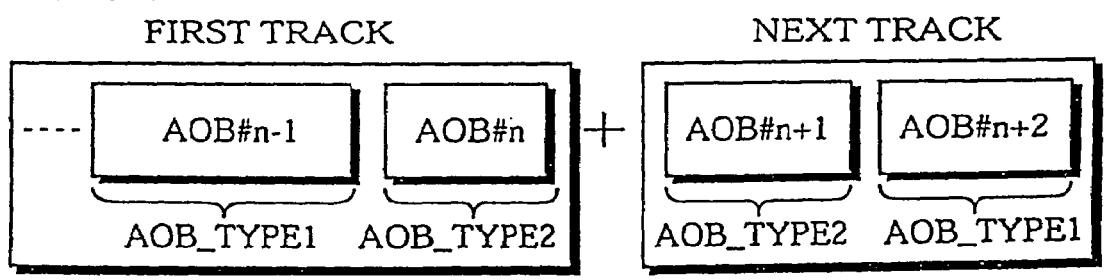
FIG. 32D shows a pattern where a Type1 and Type2 AOB are present at the end of a first track and a Type2 and a Type1 AOB is present at the start of a next track.

FIG. 32C shows the case where the first track ends with a Type1 AOB and a Type2 AOB in that order and the second track starts with a Type1 AOB. FIG. 32D shows the case where the first track ends with a Type1 AOB and a Type2 AOB in that order and the second track starts with a Type2 AOB and a Type1 AOB in that order. As the second condition is satisfied in both of these cases, the illustrated tracks can be combined into a single track.

Figure 32E:
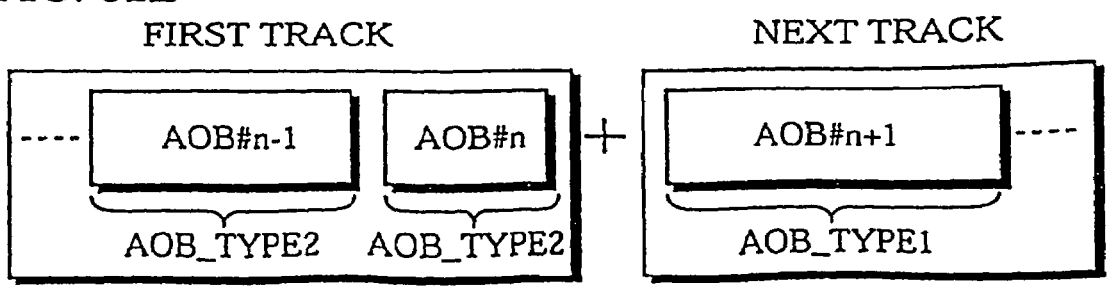
FIG. 32E shows a pattern where two Type2 AOBs are present at the end of a first track and a Type1 is present at the start of a next track.

When the first track ends with a Type2 AOB and the immediately preceding AOB is also a Type2 AOB, this first track can be combined with a following track that starts with a Type1 AOB. FIG. 32E shows the case where the first track ends with two Type2 AOBs and the second track starts with a Type1 AOB. As the second condition is satisfied in this case, the illustrated tracks can be combined into a single track. In this way, when two tracks are to be combined, an investigation is performed to see whether the two tracks satisfy the first and second conditions and the two tracks are only combined if they are judged to satisfy these conditions.

The following describes the updating of the TKI for case4 where a track is divided.

{17-5_22-19_33A,B} Settings for the TKI When a Track is Divided

Figure 33A:
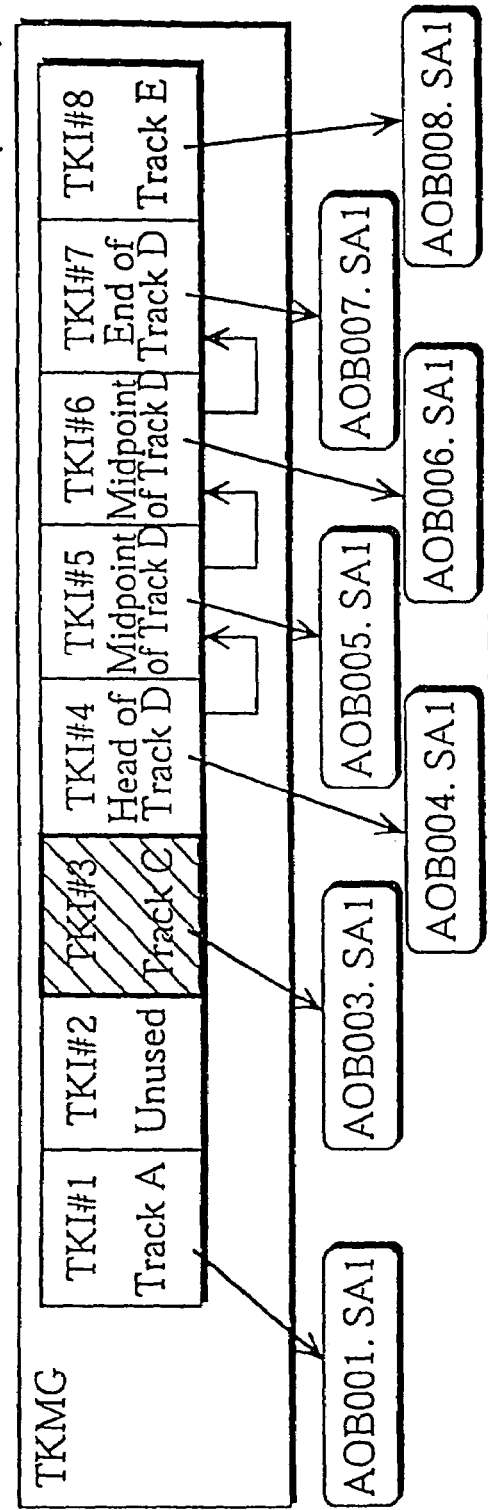
FIGS. 33A and 33B show the division of a track to produce two tracks.
Figure 33B:
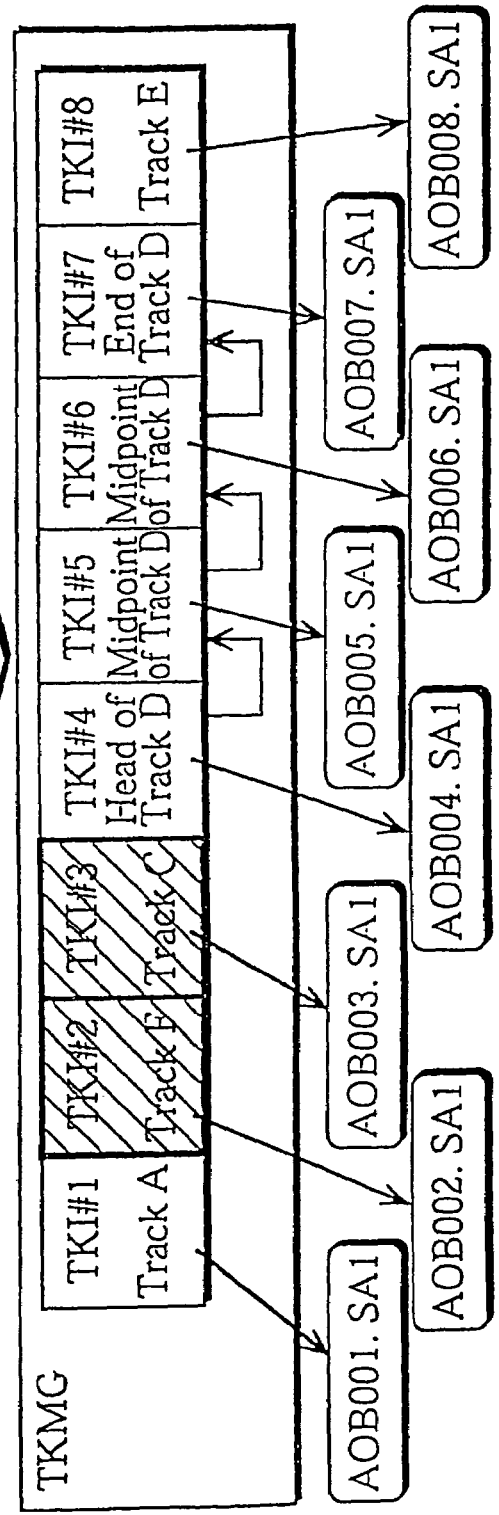

FIGS. 33A and 33B show examples of when a single track is to be divided to produce two new tracks. For these examples, the content of the TrackManager is the same as in FIG. 27, with the user being assumed to have performed an editing operation that divides TrackC into two new tracks, TrackC and TrackF. When TrackC is to be divided into a new TrackC and TrackF, the AOB file "AOB002.SA1" is generated corresponding to TrackF. FIG. 33A shows that TKI#2 is set as "Unused", with this TKI#2 being assigned to the newly generated AOB file "AOB002.SA1".

{17-5_22-19_33A,B-1_34A,B} Updating of the Directory Entries and the FAT Values

Figure 34A:
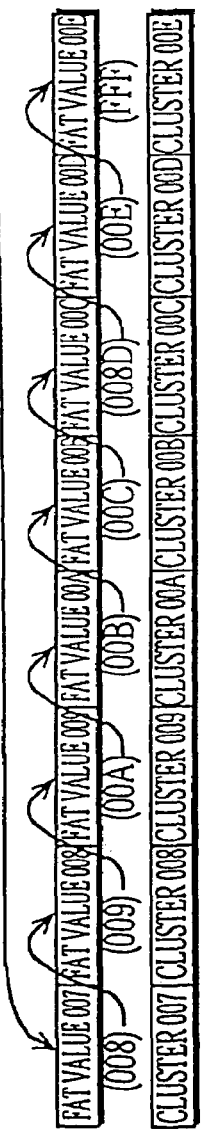
FIGS. 34A and 34B show the content of the SD_Audio directory entries in the SD_Audio directory including the AOB file "AOB003.SA1" before and after the division of the track.

When the AOB file "AOB003.SA1" is divided to produce "AOB002.SA1" the directory entries and FAT values have to be updated. This updating is explained below. FIG. 34A shows how the SD-Audio Directory Entry in the SD-Audio Directory to which the AOB file "AOB003.SA1" belongs is written before the file is divided.

The AOB file "AOB003.SA1" is divided into a plurality of parts that are stored in clusters 007, 008, 009, 00A . . . 00D, 00E. In this case, the first cluster number for the AOB file "AOB003.SA1" given in the directory entry is written as "007". The values (008), (009), (00A) . . . (00D), (00E) are also written in the FAT values 007, 008, 009, 00A . . . 00D corresponding to the clusters 007, 008, 009, 00A . . . 00D.

Figure 34B:
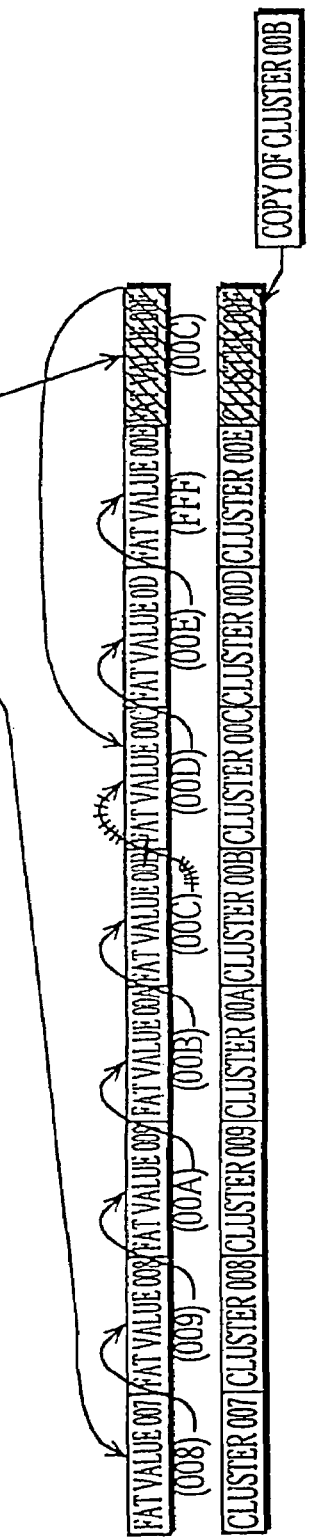

When the AOB file "AOB003.SA1" is divided so that its latter part becomes the new AOB file "AOB002.SA1", a "filename", a "filename extension" and a "number of first clusters in file" for the new AOB file "AOB002.SA1" are added to the SD-Audio directory entry. FIG. 34B shows how the SD-Audio Directory Entry in the SD-Audio. Directory to which the AOB file "AOB003.SA1" belongs is written after the AOB file "AOB003.SA1" has been divided.

In FIG. 34B, the cluster 00F stores a copy of cluster 00B that includes the boundary indicated by the user when dividing the file. The parts of the AOB file "AOB002.SA1" that follow the part included in the cluster 00B are stored in the clusters 00C, 00D, 00E as before. Since the first part of the AOB file "AOB002.SA1" is stored in the cluster 00F and the remaining parts are stored in the clusters 00C, 00D, 00E, "00F" is written into the "number of first cluster in file" for the new AOB file "AOB002.SA1", while (00C), (00D), (00E) are written into the FAT values 00F, 00C, 00D, 00E corresponding to the clusters 00F, 00C, 00D, and 00E.

{17-5__22-19__33A,B-2__35A,B} Setting of the Information Fields in the TKI

The following describes how the information fields in the TKI are set for the AOB file "AOB002.SA1" once this file has been obtained by updating the directory entries and the FAT values. When generating a TKI for a divided track, there are two kinds of information fields in the TKI. These are (1) information that can be copied from the original TKI and (2) information obtained by updating the information in the original TKI. The TKTXTI_DA and ISRC are the former type, while the BIT, the TKTMSRT and other information fields are the latter type. Since both types of information exist, the present embodiment generates a TKI for a divided track by copying the original TKI to produce a template for the new TKI, and then dividing/updating the TKTMSRT and BIT in this template and updating the remaining information fields.

Figure 35A:
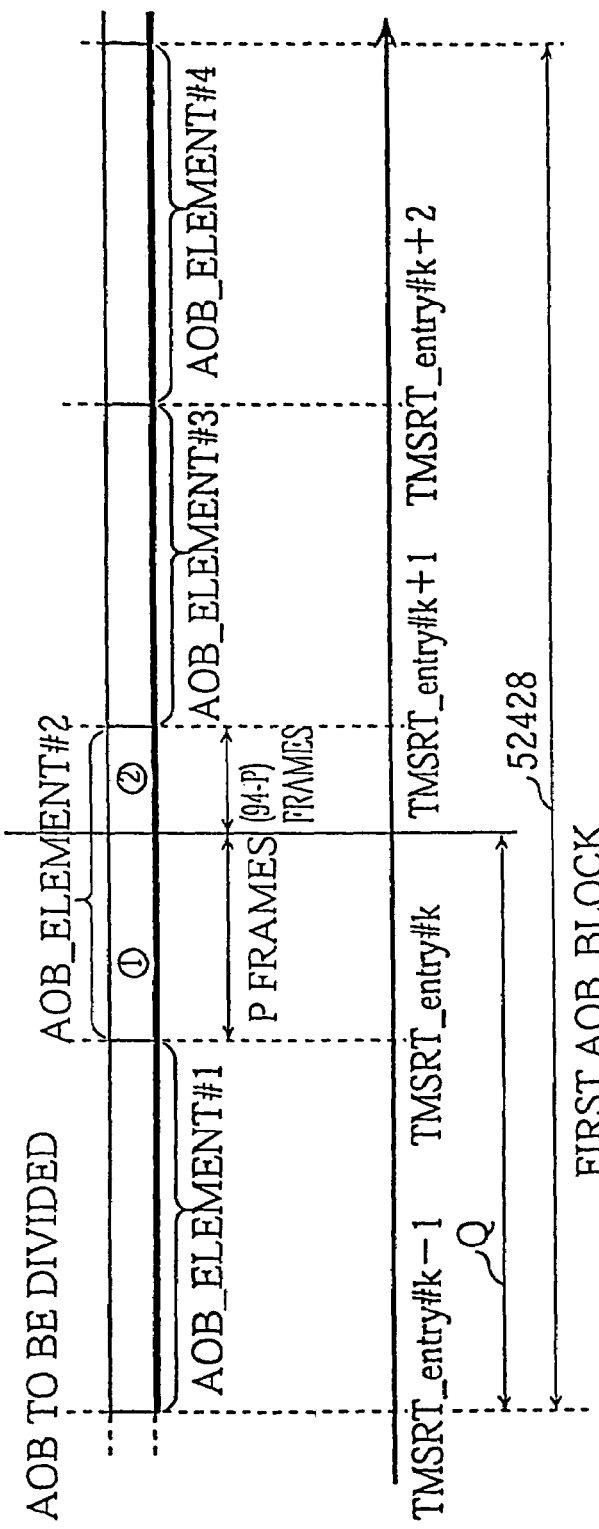
FIG. 35A shows the division of an AOB midway through AOB_ELEMENT#2.
Figure 35B:
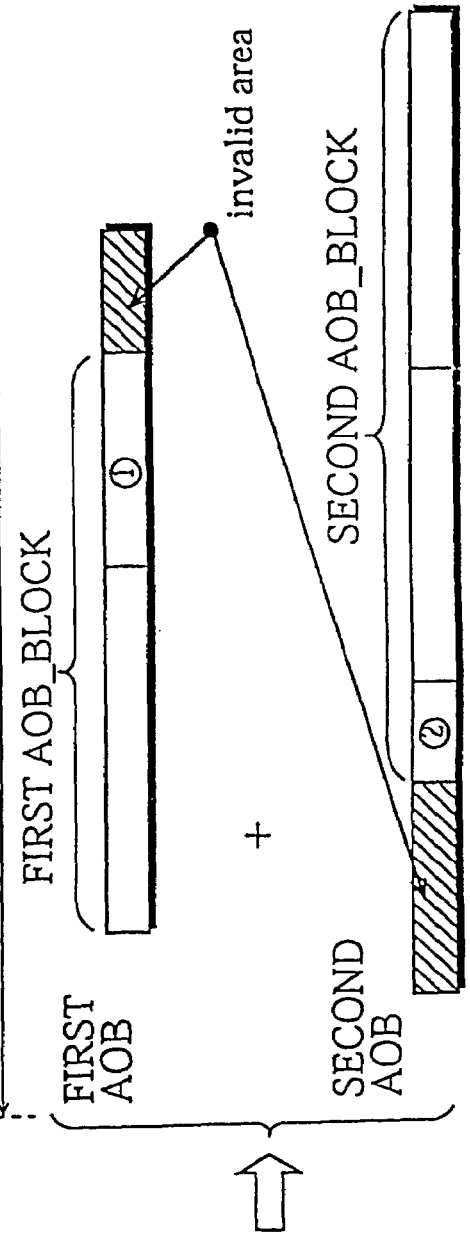
FIG. 35B shows the two AOBs, AOB#1 and AOB#2, obtained by dividing an AOB midway through AOB_ELEMENT#2.

FIG. 35A shows the case where an AOB_FRAME in an AOB is divided. The first level in FIG. 35A shows the four AOB_ELEMENTS, AOB_ELEMENT#1, AOB_ELEMENT#2, AOB_ELEMENT#3, and AOB_ELEMENT#4. The data lengths of these AOB_ELEMENTs are set in the TKTMSRT as the four TMSRT_entries #1, #2, #3, and #4. If the boundary bd1 for the division is set in AOB_ELEMENT#2 in FIG. 35A, AOB_ELEMENT#2 is divided into a first region (1) made up of the frames located before the boundary bd1 and a second region (2) composed of the frames located after the boundary bd1. FIG. 35B shows the two AOBs AOB#1 and AOB#2 obtained by dividing the AOB midway though AOB_ELEMENT#2.

{17-5__22-19__33A,B-3__36} Setting of the BIT

Figure 36:
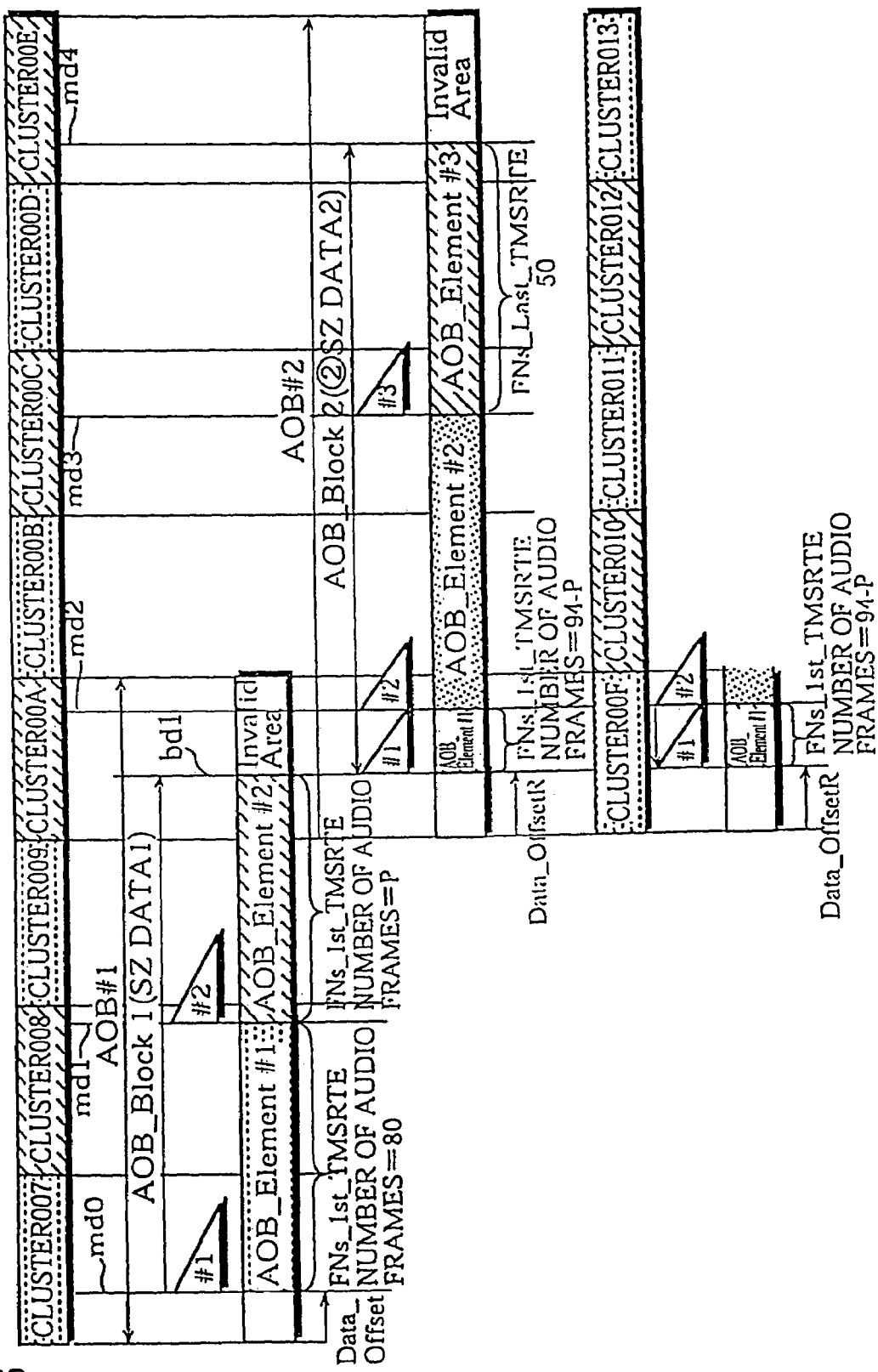
FIG. 36 shows how the BIT is set when an AOB is divided as shown in FIG. 35.

FIG. 36 shows how the BIT is set when an AOB is divided as shown in FIG. 35. The AOB shown in FIG. 35 is divided at the boundary bd1. The AOB#1 produced by this division includes the two AOB_ELEMENTs, AOB_ELEMENT#1 and AOB_ELEMENT#2, while the other AOB#2 produced by this division includes the three AOB_ELEMENTs, AOB_ELEMENT#1, AOB_ELEMENT#2, and AOB_ELEMENT#3.

In FIG. 36, these AOB_ELEMENTs have also been given the triangular flags to shows the settings of the TMSRT_entries included in the TKIs corresponding to these AOBS. The explanation will first focus on AOB#1 which is obtained by this division. AOB_ELEMENT#1 and AOB_ELEMENT#2 that are included in AOB#1 occupy cluster 007 to cluster 00A, so that AOB#1 is handled as being the composite of cluster 007 to cluster 00A. AOB_ELEMENT#2 in AOB#1 has a data length that ends not at the end of cluster 00A, but at the boundary bd1 that is present within cluster 00A, so that the SZ_DATA for AOB#1 is given as the amount of data from the region md0 to the boundary bd1 in cluster 00A. The "FNs__1st_TMSRTE" for AOB#1 is the same as before division, while the "FNs_Last_TMSRTE" for AOB#1 differs from the value used before division in that it now indicates the number of frames from the start of AOB_ELEMENT#2 before division to the boundary bd1.

The following describes AOB#2 which is obtained by this division. AOB_ELEMENT#1, AOB_ELEMENT#2, and AOB_ELEMENT#3 that are included in AOB#2 occupy cluster 00B to cluster 007. Cluster 00F includes a copy of the content of cluster 00A. The reason cluster 00F stores a copy of cluster 00A is that cluster 00A is occupied by AOB_ELEMENT#2 in AOB#1, so that it is necessary to assign a different cluster to AOB_ELEMENT#1 in AOB#2.

AOB_ELEMENT#1 in AOB#2 has a data length that starts not at the beginning of cluster 00F, but at the boundary bd1 that is present within cluster 00F, so that the SZ_DATA for AOB#2 is given as the amount of data from the start of cluster 00B to a point midway through cluster 00E plus the data length of the part of cluster 00F occupied by AOB_ELEMENT#1.

The part of AOB_ELEMENT#2 in AOB#1 that is included in the copy of cluster 00A stored in cluster 00F needs to be excluded from AOB#2, so that the DATA_Offset field in the BIT of AOB#2 is set at the size of the part of AOB_ELEMENT#2 in AOB#1 included in cluster 00F.

As can be seen from FIG. 36, the division of the AOB result in only the AOB_ELEMENT that includes the boundary for the division being divided into two and in the other AOB_ELEMENTs positioned before and after the divided AOB_ELEMENT remaining unchanged. As a result, the "FN_Last_TMSRTE" of AOB#2 is set at the same value for the "AOB_ELEMENT#4" before the division, and the "FNs__1st_TMSRTE" of AOB#2 is set at AOB_ELEMENT#1 of AOB#2, which is to say, the number of frames included in the part that follows the boundary once AOB_ELEMENT#2 has been divided.

{17-5__22-19__33A,B-4__37} Setting of the BIT

Figure 37:
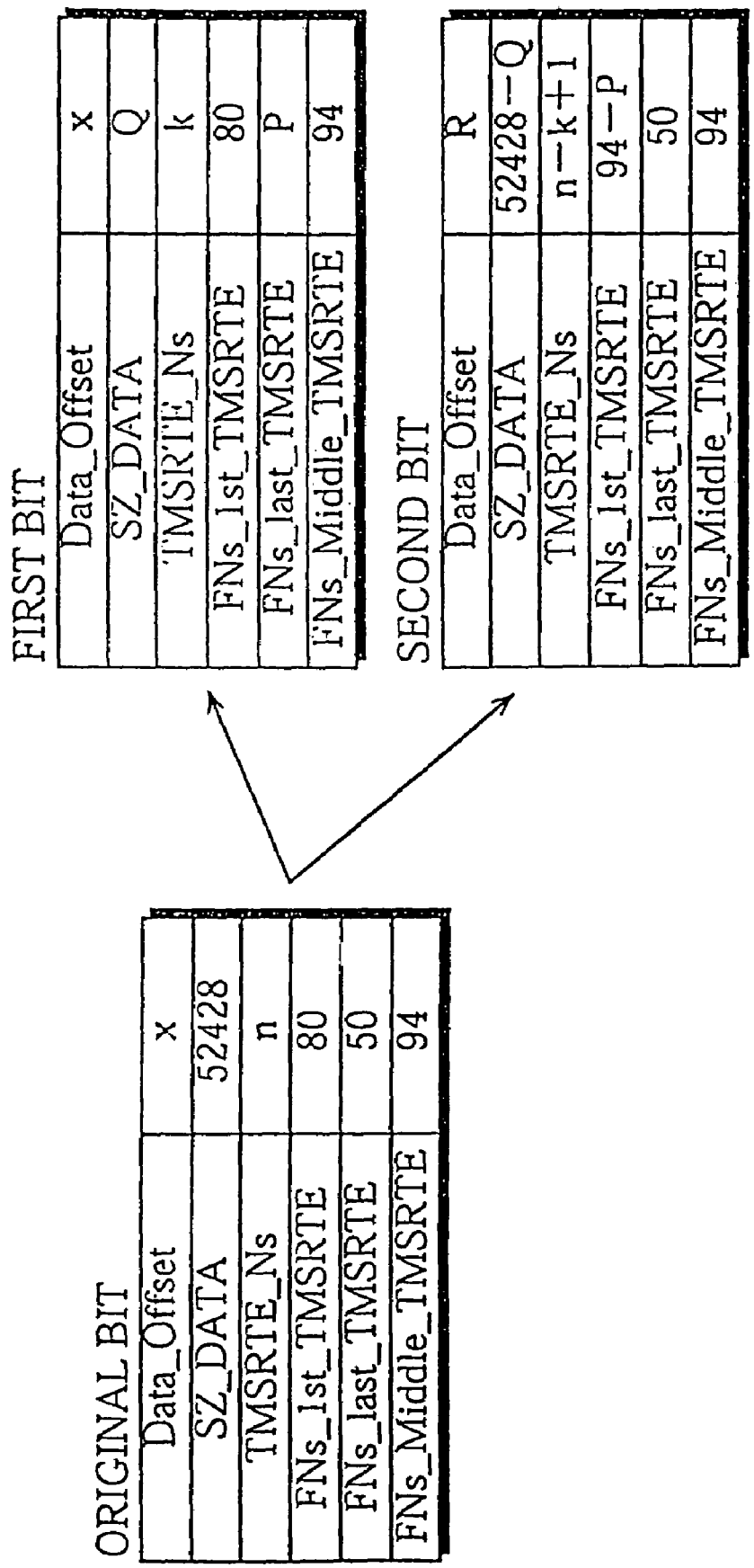
FIG. 37 shows a specific example of changes in the BIT before and after division.

FIG. 37 shows a more specific example of changes in the BITs as a result of the division of a track. The left side of FIG. 37 shows an example of the settings of the BIT before division. In this BIT, the Data_Offset is set as "X", the SZ_DATA is set at "52428", and the TMSRTE_Ns is set at "n". The FNs__1st_TMSRTE is set at "80 frames", the FNs_Middle_TMSRTE is set at "94 frames", and the FNs_Last_TMSRTE is set at "50 frames".

The right side of FIG. 37 shows the settings of two BITs produced by the division of a track. When the AOB corresponding to the BIT on the left side of FIG. 37 is divided as shown in FIG. 35A, the Data_Offset in the BIT of the first track produced by the division is set at "X" like the track before division", the "SZ_DATA" is updated to the data length "Q" from the start to the division point Q, and the TMSRTE_Ns is set at "k" which shows the number of TMSRT_entries from the first TMSRT_entry to the $k^{th}$ TMSRT_entry. The FNs__1st_TMSRTE and FNs_Middle_TMSRTE are respectively set at "80" and "94" frames in the same way as the BIT before division, but since the final AOB_ELEMENT in the AOB of the first track produced by the division includes "p" AOB_FRAMES, the FNs_Last_TMSRTE is set at "p frames."

In the BIT of the second track produced by the division, the "Data_Offset" is set at "R", the "SZ_DATA" is set at (original SZ#DATA "52428"-data length up to division point Q) ,and the TMSRTE_Ns is set at "n−k+1" produced by adding one (for the kth TMSRT_entry that is newly added as a result of the division) to the number of TMSRT_entries from the k<sup>th</sup> TMSRT_entry to the n<sup>th</sup> TMSRT_entry.

The FNs_Middle_TMSRTE and FNs_Last_TMSRTE are set at the same values as the BIT before division, which is to say, "94 frames" and "50 frames", respectively.

The first AOB_ELEMENT in the AOB of this second track includes "94-p" AOB_FRAMEs, so that "94-p" is set in the FNs_1st_TMSRTE of the BIT corresponding to this track.

{17-5_22-19_33A,B-5_38} Setting of the BIT

Figure 38:
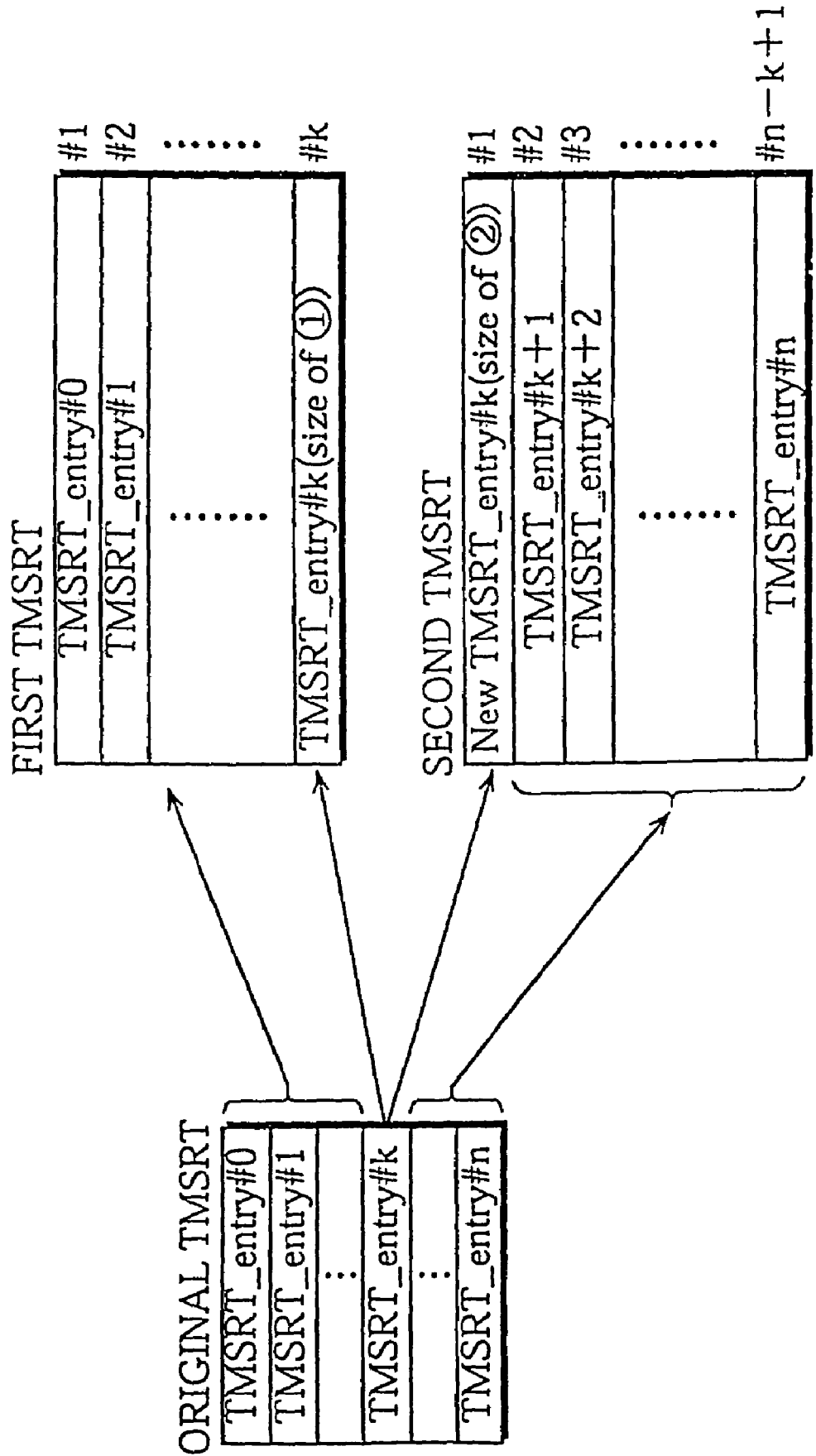
FIG. 38 shows a specific example of changes in the TKTMSRT before and after division.

FIG. 38 shows the TKTMSRT after division. The following explains the settings of the TMSRT first. The TMSRT of the first track includes the TMSRT_entries from the first TMSRT_entry of the AOB before division to the kth TMSRT_entry, which is to say, the TMSRT_entries #1 to #k.

It should be noted here that the AOB_ELEMENT#k that includes the boundary for the division only includes region (1), so that the k<sup>th</sup> TMSRT_entry only includes a data size corresponding to this region (1). The TMSRT of the second track includes the TMSRT_entries from the kth TMSRT_entry of the AOB before division to the n<sup>th</sup> TMSRT_entry, which is to say, the TMSRT_entries #k to #n. It should be noted here that the AOB_ELEMENT#k that includes the boundary for the division only includes region (2), so that the k<sup>th</sup> TMSRT_entry only includes a data size corresponding to this region (2).

The copying of the TKI is accompanied by the division and updating of the TKTMSRT and the BIT, and once the remaining information has been updated, the TKIs for the new tracks produced by the division will be complete. In the same way as when combining tracks, the AOB files are not decrypted, so that two tracks can be produced by dividing an AOB file in its encrypted state. Since the division of an AOB file does not involve decryption and re-encryption, the processing load of dividing a track can be suppressed. This means that tracks can be edited even by a playback apparatus with limited processing power.

This completes the explanation of the TKI. The following describes the Playlists.

{17-6} PlaylistManager

As shown by the broken lines h5 in FIG. 17, the PlaylistManager shown is made up of PlaylistManager_Information (PLMGI) for managing the Playlists stored in the flash memory card 31, Default_Playlist_Information (DPLI) for managing all of the track stored in the flash memory card 31, and PlaylistInformation (PLI) #1, #2, #3, #4 ... #m. Each PLI is information for a user-defined Playlist. As shown by the broken lines h6, the DPLI is composed of Default_Playlist_General_Information (DPLGI) and Default_Playlist_Track_Search_Pointers (DPL_TK_SRP) #1, #2, #3, #4 ... #m. As shown by the broken lines h7, each PLI is composed of Playlist_General_Information (PLGI), and Playlist_Track_Search_Pointers (PL_TK_SRP) #1, #2, #3, #4 ... #m.

The DPLI referred to here differs from each PLI in the following way. While the DPLI has to indicate all of the tracks stored in the flash memory card 52, a PLI does not have this restriction and can indicate any number of the tracks. This opens up various possibilities for the user. As representative examples, the user can generate Playlist_Information indicating only his (her) favorite tracks and store this Playlist_Information in the flash memory card 31, or can have a playback apparatus automatically generate Playlist_Information that only indicates tracks of a certain genre, out of a plurality of tracks stored in the flash memory card 31, and store the resulting Playlist Information in the flash memory card 31.

{17-7_18} Number of Playlists and Their Data Sizes

As shown in FIG. 18, a maximum of 99 Playlists can be stored on one flash memory card 31. The combined data size of the PlaylistManager_Information (PLMGI) and the Default Playlist Information (DPLI) is also fixed at 2,560 bytes. Each PLI has a fixed length of 512 bytes. The "DPL_TK_SRP" included in the Default Playlist Information includes a "DPL_TK_ATR" and a "DPL_TKIN". On the other hand, the "PL_TK_SRP" field included in a PLI includes only a "PL_TK_SRP". The format of the DPL_TK_ATR, DPL_TKIN, and PL_TKIN fields is shown in FIG. 39.

{17-8_39-1} Format of DPL_TK_SRP

Figures 39A, 39B:
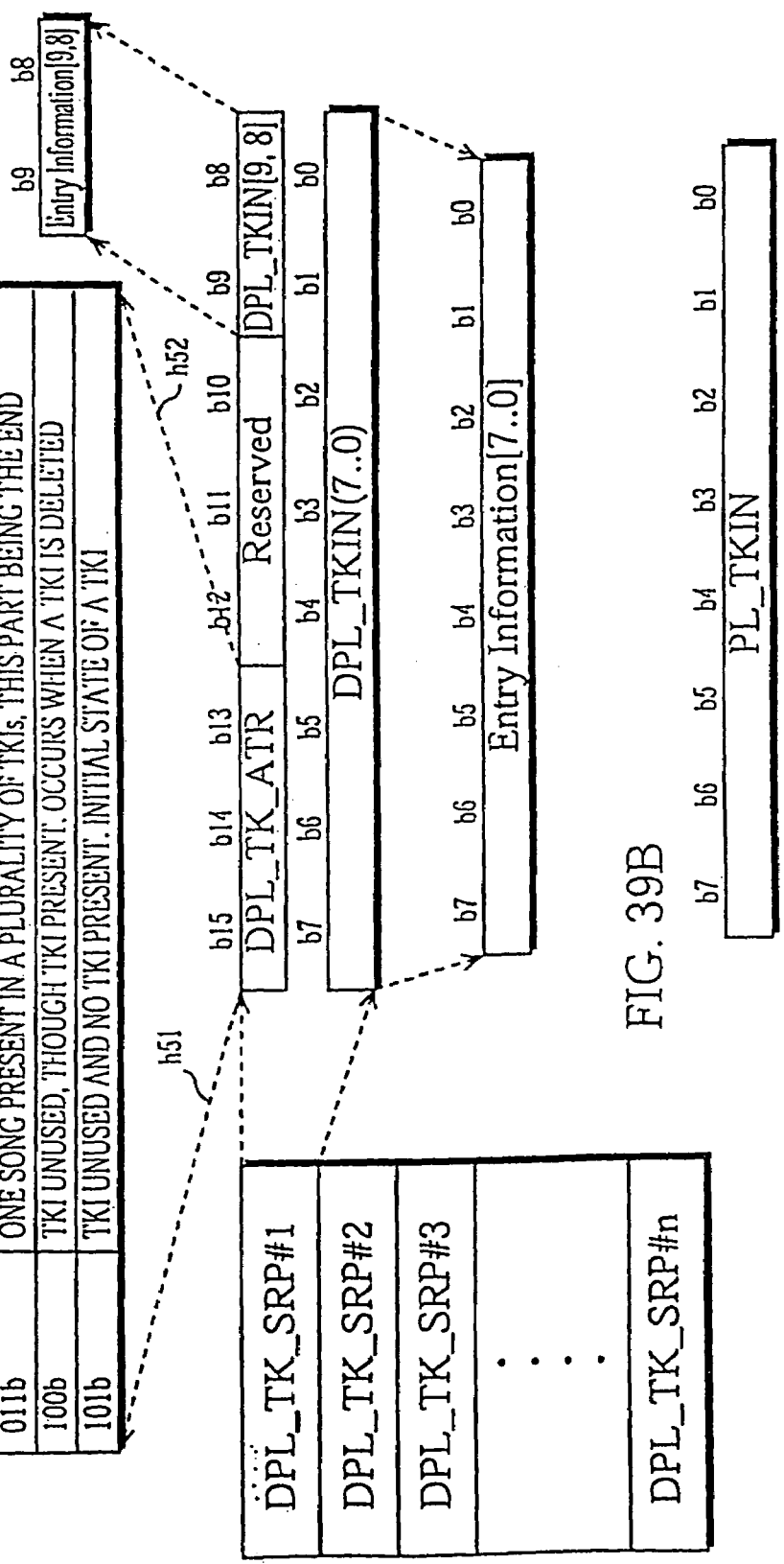
FIG. 39A shows the format of a DPL_TK_SRP.
FIG. 39B shows the format of a PL_TK_SRP.

FIG. 39A shows the format of the DPL_TK_SRP. In FIG. 39A, the DPL_TKIN is written in the 0th to 9th bits in the DPL_TK SRP, while the DPL_TK_ATR is written in the 13th to 15th bits. The 10th to 12th bits in the DPL_TK_SRP are reserved for future use.

The TKI number is written in the DPL_TKIN that occupies the 0th to 9th bits in the DPL_TK_SRP. This enables a TKI to be specified.

{17-9_39B} Format of the PL_TK_SRP

FIG. 39B shows the format of the PL_TK_SRP. This is a ten-bit field in which PL_TKIN, which is to say, a TKI number, is written.

{17-8_39A-2} Composition of DPL_TK_ATR

The broken lines h51 and h52 that extend from the DPL_TK_ATR in FIG. 39A show an example setting of the DPL_TK_ATR. As can be seen from this drawing, the DPL_TK_ATR is set for a DPL_TK_SRP in the same way as TKI_BLK_ATR is set for a TKI, which is to say, the DPL_TK_ATR is set at one of "Track", "Head_of_Track" "Midpoint_of_Track", and "End_of_Track".

In more detail, when the TKI indicated by the TKIN is used and an Audio Object (AOB) corresponding to one complete track is recorded in the AOB file corresponding to the indicated TKI (i.e., when the TKI_BLK_ATR of the TKI is "Track"), the value "00b" is set in the "DPL_TK_ATR".

When the TKI indicated by the TKIN is used and an Audio Object (AOB) corresponding to only the start of a track is recorded in the AOB file corresponding to the indicated TKI (i.e., when the TKI_BLK_ATR of the TKI is "Head_of_Track"), the value "001b" is set in the "DPL_TK_ATR". When the TKI indicated by the TKIN is used and an Audio Object (AOB) corresponding to a midway part track is recorded in the AOB file corresponding to the indicated TKI (i.e., when the TKI_BLK_ATR of the TKI is "Midpoint_of_Track"), the value "010b" is set in the "DPL_TK_ATR". When the TKI indicated by the TKIN is used and an Audio Object (AOB) corresponding to an end part of a track is recorded in the AOB file corresponding to the indicated TKI (i.e., when the TKI_BLK_ATR of the TKI is "End_of_Track"), the value "011b" is set in the "DPL_TK_ATR".

Conversely, when the TKI indicated by the TKIN is unused and the TKI region is merely established, which corresponds to when a TKI has been deleted (i.e., when the TKI_BLK_ATR of the TKI is "Unused"), the value "100b" is set in the DPL_TK_ATR.

When the TKI indicated by the TKIN is unused and no TKI region has been established, which is to say, when a TKI is in an initial state, the value "101b" is set in the "DPL_TK_ATR".

Since the number of a TKI is written in the DPL_TKIN, it is clear which of the plurality of TKI corresponds to each DPL_TK_SRP. The position of the DPL_TK_SRP in the Default_Playlist_Information shows when the AOB corresponding to the TKI that in turn corresponds to the DPL_TK_SRP will be played back, i.e., the ordinal position of the AOB in the Default_Playlist. As a result, the order of the DPL_TK_SRP items in the Default_Playlist denotes the order in which a plurality of tracks will be played, or in other words, determines the playback order of tracks.

Figure 40:
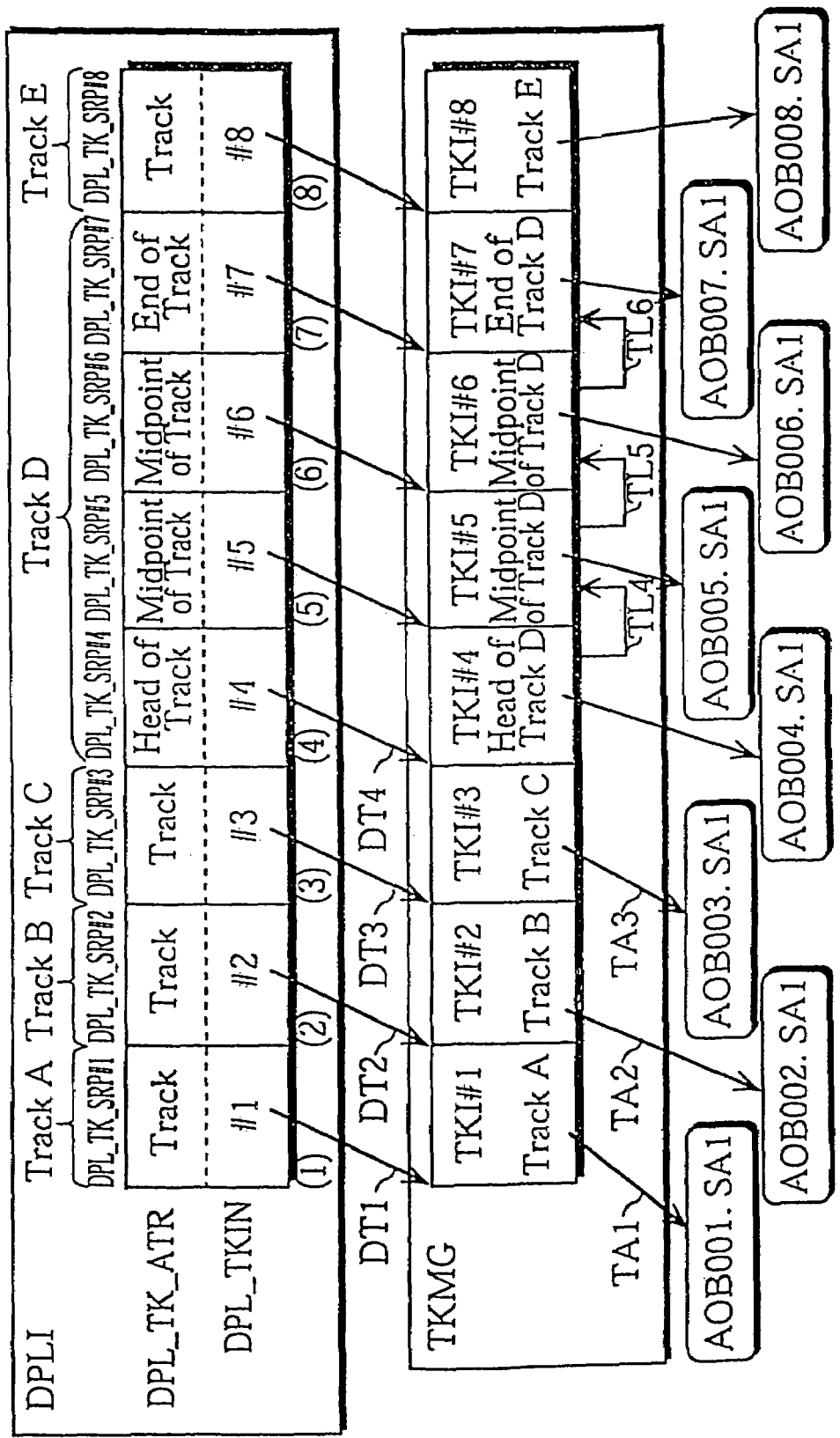
FIG. 40 shows the interrelation between the Default_Playlist_Information, the TKIs, and the AOB files.

{17-9_40-1} Interrelationship Between the Default Playlist_Information, TKI, and AOB Files FIG. 40 shows the interrelationship between the Default_Playlist_Information, the TKI, and the AOB files. The second, third, and fourth levels in this drawing are the same as the first, second, and third levels in FIG. 19, and also show a Track-Manager including eight TKI and eight AOB files. FIG. 40 differs from FIG. 19 in that a box showing the Default_Playlist_Information is given on the first level. The eight small divisions shown in this box show the eight DPL_TK_SRP included in the Default_Playlist_Information. The upper part of each division shows the DPL_TK_ATR, while the lower part shows the DPL_TKIN.

As shown by the arrows DT1, DT2, DT3, DT4 . . . in FIG. 40, DPL_TK_SRP#1 and TKI#1 are related, as are DPL_TK_SRP#2 and TKI#2, DPL_TK_SRP#3 and TKI#3, and DPL_TK_SRP#4 and TKI#4.

Looking at the DPL_TK_ATR fields in the DPL_TK_SRP, it can be seen that "Track" has been set for each of DPL_TK_SRP#1, DPL_TK_SRP#2, DPL_TK_SRP#3, and DPL_TK_SRP#8. In other words, the four combinations
DPL_TK_SRP#1→TKI#1 ("AOB001.SA1"),
DPL_TK_SRP#2→TKI#2 ("AOB002.SA1"),
DPL_TK_SRP#3→TKI#3 ("AOB003.SA1"),
DPL_TK_SRP#8→TKI#8 ("AOB008.SA1") correspond to four separate tracks.

Meanwhile, none of DPL_TK_SRP#4, DPL_TK_SRP#5, DPL_TK_SRP#6, and DPL_TK_SRP#7 has a DPL_TK_ATR set as "Track". Instead, the DPL_TK_SRP#4 of DPL_TK_ATR is set at "Head_of_Track", the DPL_TK_ATR of DPL_TK_SRP#7 is set at "End_of_Track" and the DPL_TK_ATRs of DPL_TK_SRP#5 and DPL_TK_SRP#6 are set at "Midpoint_of_Track".

This means that TKI#4 ("AOB004.SA1"), which is related to DPL_TK_SRP#4, is the start of a track, TKI#5 ("AOB005.SA1") and TKI#6 ("AOB006.SA1"), which are respectively related to DPL_TK_SRP#5 and DPL_TK_SRP#6, are middle parts of a track, and TKI#7 ("AOB007.SA1"), which is related to DPL_TK_SRP#7, is the end of a track.

The DPL_TK_SRP entries in the DefaultPlaylist show in what order the AOBs corresponding to each TKI are to be played back. The DPL_TKINs of DPL_TK_SRP#1, #2, #3, #4 . . . #8 in the DefaultPlaylist of FIG. 40 indicate TKI#1, #2, #3, #4 . . . #8. As shown by the arrows (1) (2) (3) (4) . . . (8), the AOB file "AOB001.SA1" corresponding to TKI#1 will be played back first, "AOB002.SA1" corresponding to TKI#2 will be played back second, "AOB003.SA1" corresponding to TKI#3 will be played back third, and "AOB004.SA1" corresponding to TKI#4 will be played back fourth.

{17-10_41} Example Settings for the DefaultPlaylist and Playlist_Information

Figure 41:
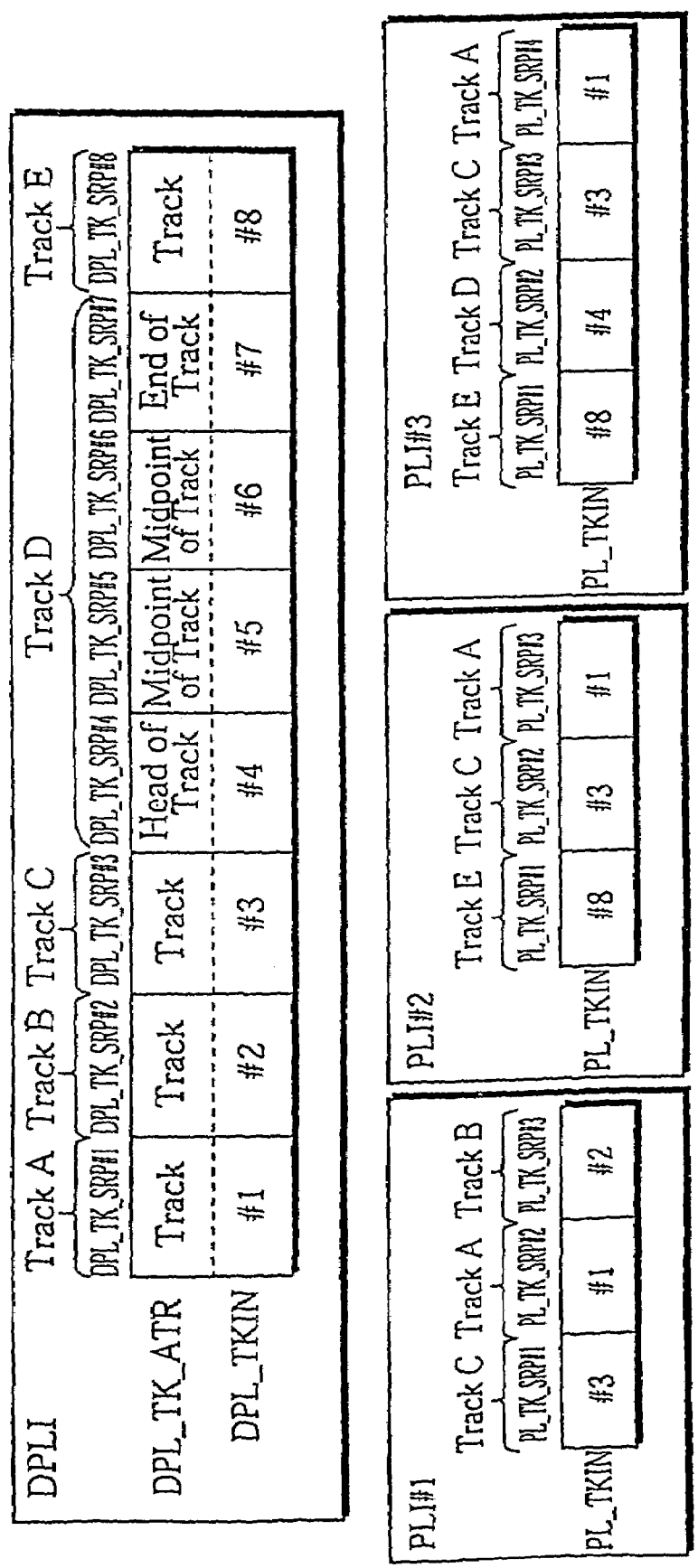
FIG. 41 shows example settings for the Default_Playlist and several PLIs.

FIG. 41 shows example settings for the Default_Playlist and the Playlist_Information using the same notation as FIG. 40. In FIG. 41, the box on the first level shows the Default_Playlist, while the three boxes on the second level show the PLIs.

The small divisions in the box showing the Default_Playlist shows the eight DPL_TK_SRP values included in the Default_Playlist, while the small divisions in the boxes illustrating each PLI show three or four PL_TK_SRP values. The setting of the TKIN of each DPL_TK_SRP included in the Default_Playlist_Information is the same as in FIG. 40. However, the settings of the TKIN of the PL_TK_SRP included in each PLI are completely different to those in the DPL_TK_SRP.

{17-10_42} Correspondence Between the DPL_TK_SRP and the TKI

Figure 42:
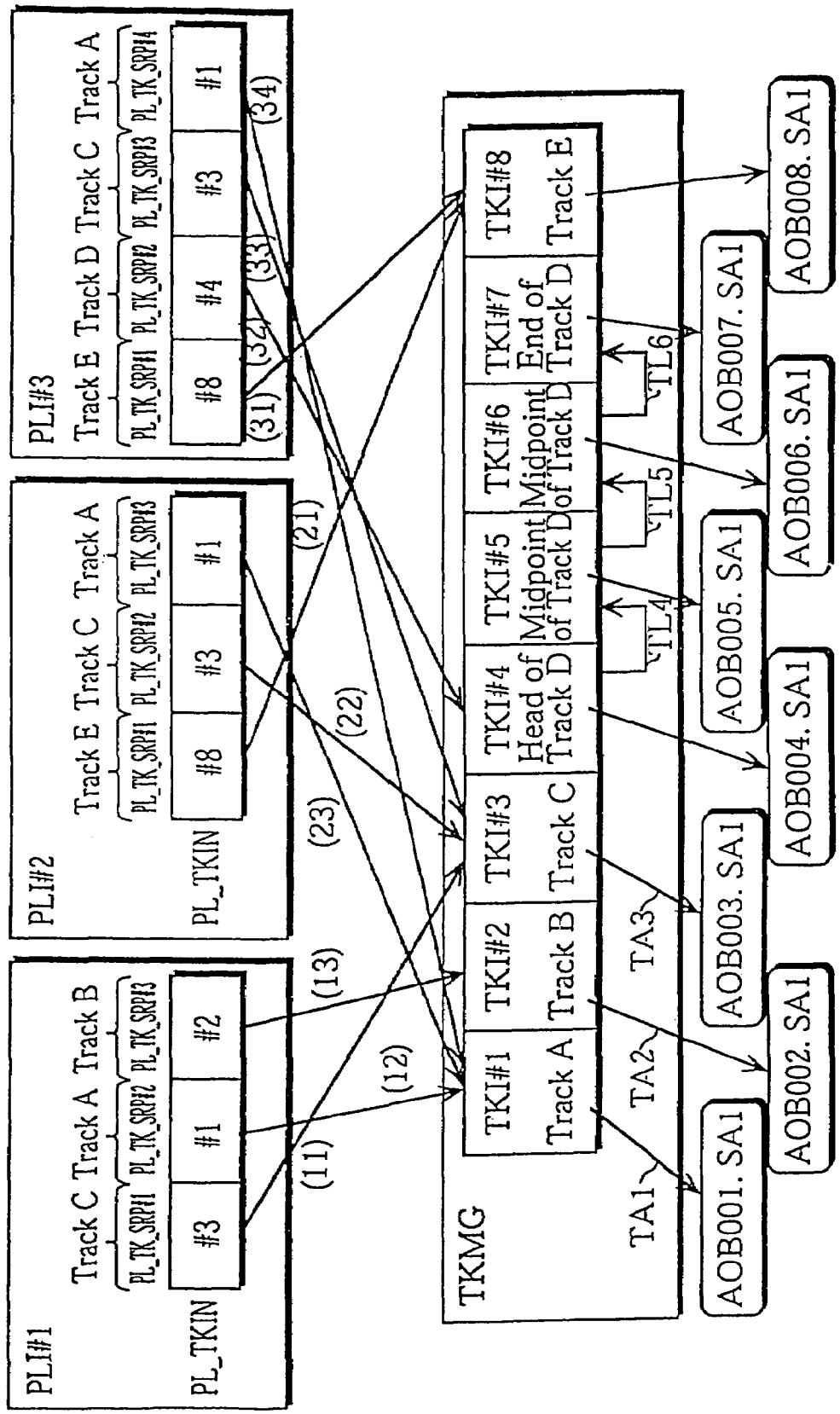
FIG. 42 shows how the DPL_TK_SRPs correspond to TKIs using the same notation as FIG. 40.

FIG. 42 shows the correspondence between the DPL_TK_SRP and the TKI using the same notation as in FIG. 40. In FIG. 42, Playlist#1 is composed of PL_TK_SRP#1, #2, #3. Of these, #3 is written as the PL_TKIN of PL_TK_SRP#1, while #1 is written as the PL_TKIN of PL_TK_SRP#2 and #2 as the PL_TKIN of PL_TK_SRP#3. This means that when tracks are played back according to Playlist#1, a plurality of AOBs will be played back as shown by the arrows (11) (12) (13) in the order AOB#3, AOB#1, AOB#2.

Playlist#2 is composed of PL_TK_SRP#1, #2, #3. Of these, #8 is written as the PL_TKIN of PL_TK_SRP#1, while #3 is written as the PL_TKIN of PL_TK_SRP#2 and #1 as the PL_TKIN of PL_TK_SRP#3. This means that when tracks are played back according to Playlist#2, a plurality of AOBs will be played back, as shown by the arrows (21) (22) (23) in the order AOB#8, AOB#3, AOB#1, which is to say, in a completely different order to Playlist#1.

Playlist#3 is composed of PL_TK_SRP#1, #2, #3, #4. the PL_TKIN of these PL_TK SRP#1 to #4 are respectively set as #8, #4, #3, and #1. This means that when tracks are played back according to Playlist#3, a plurality of AOBs will be played back as follows. First, AOB#8 that composes TrackE is played back as shown by the arrow (31). Next, AOB#4, AOB#5, AOB#6, and AOB#7 that compose TrackD are played back as shown by the arrow (32). After this, AOB#3 and AOB#1 that respectively compose TrackC and TrackA are played back as shown by the arrows (33) and (34).

Of special note here is that when a track is composed of a plurality of TKI, only the TKI number of the start of the track is written into the PL_TK_SRP entry. In more detail, while the DPL_TK_SRP values given in the Default_Playlist_Information specifies the four TKIs (TKI#4, TKI#5, TKI#6, TKI#7) that compose TrackD, the PL_TK_SRP given in a set of Playlist_Information does not need to indicate all four TKIs. For this reason, PL_TK_SRP#2 in Playlist#3 only indicates TKI#4 out of TKI#4 to TKI#7.

On the other hand, a DPLI including a plurality of DK_TK_SRP has a data size that is no greater than one sector and is always loaded into the RAM of a playback apparatus. When tracks are played back according to a Playlist, the playback apparatus refers to the DK_TK_SRPs that are loaded into its RAM and so can search for TKIs at high speed. To play back TKIs (AOBS) using a PL_TK_SRP that only indicates the TKI number of the first TKI, a playback apparatus searches the DPL_TK_SRP loaded in its RAM based on the TKI indicated by the PL_TK_SRP and judges whether the current track is composed of a plurality of TKI. If so, the playback apparatus executes the appropriate procedure for playing back all of the corresponding TKIs (AOBs).

As described above, the Default_Playlist and a plurality of PLIs are written in the Playlist_Manager. If different playback orders are written in the DPL_TKINs and PL_TKINs of the DPL_TK_SRPs and PL_TK_SRPs composing such playlists, it becomes possible to play back AOBs in different orders. By offering a variety of playback orders to the user in this way, the user can be given the impression of there being a number of music albums stored in the flash memory card 31.

Of special note here is that the data size of the DPL_TK_SRP corresponding to an AOB file is small (at no more than two bytes), while the data size of the TKI corresponding to an AOB file is large (at up to 1,024 bytes). When reordering the TKI in the TrackManager, a large number of accesses need to be made to the flash memory card 31, but when the DPL_TK_SRPs are reordered in the Default_Playlist_Information or a PLI, this can be performed with fewer accesses to the flash memory card 31.

In view of this, when the navigation data is edited, the order of the DPL_TK_SRPs in the Default_Playlist is actively changed in accordance with the editing operation, while the order of the TKI in the TrackManager is left unchanged in spite of the editing operation.

{17-9_40-2_43A,B} Reordering of the DPL_TK_SRP

Figure 43A:
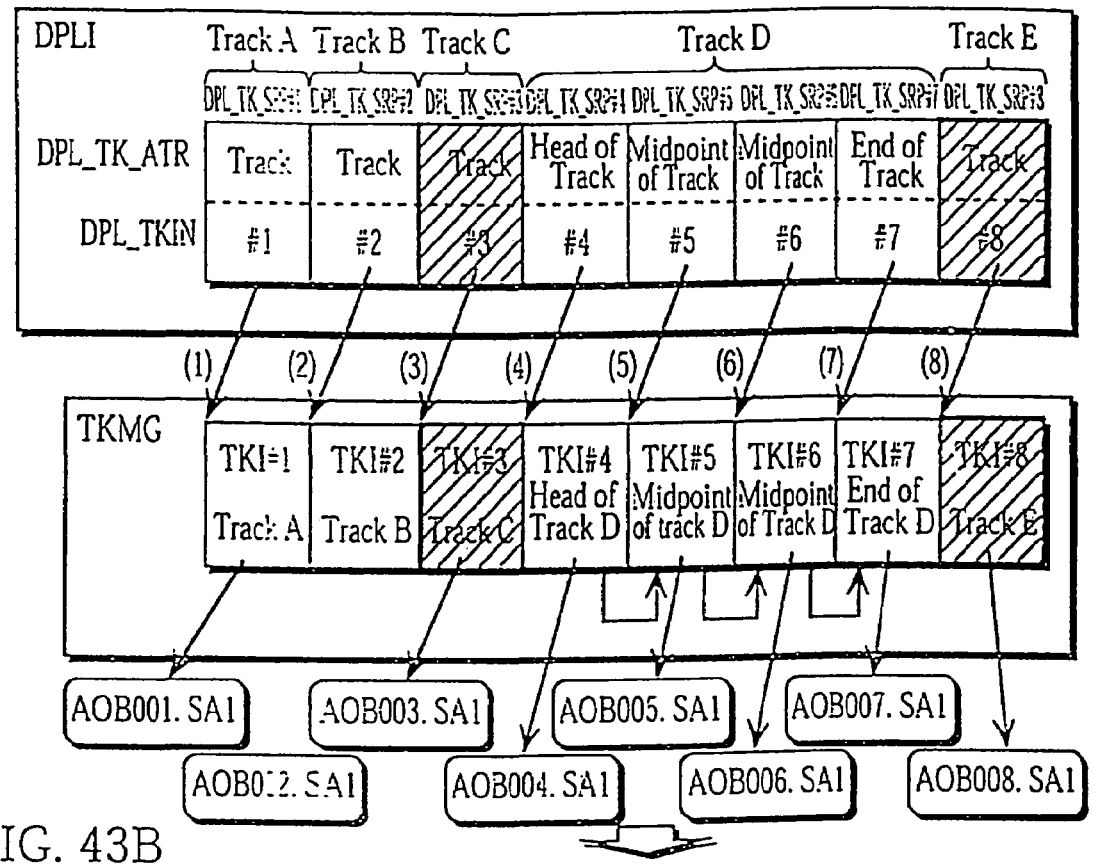
FIGS. 43A and 43B show how the order of tracks is rearranged.
Figure 43B:
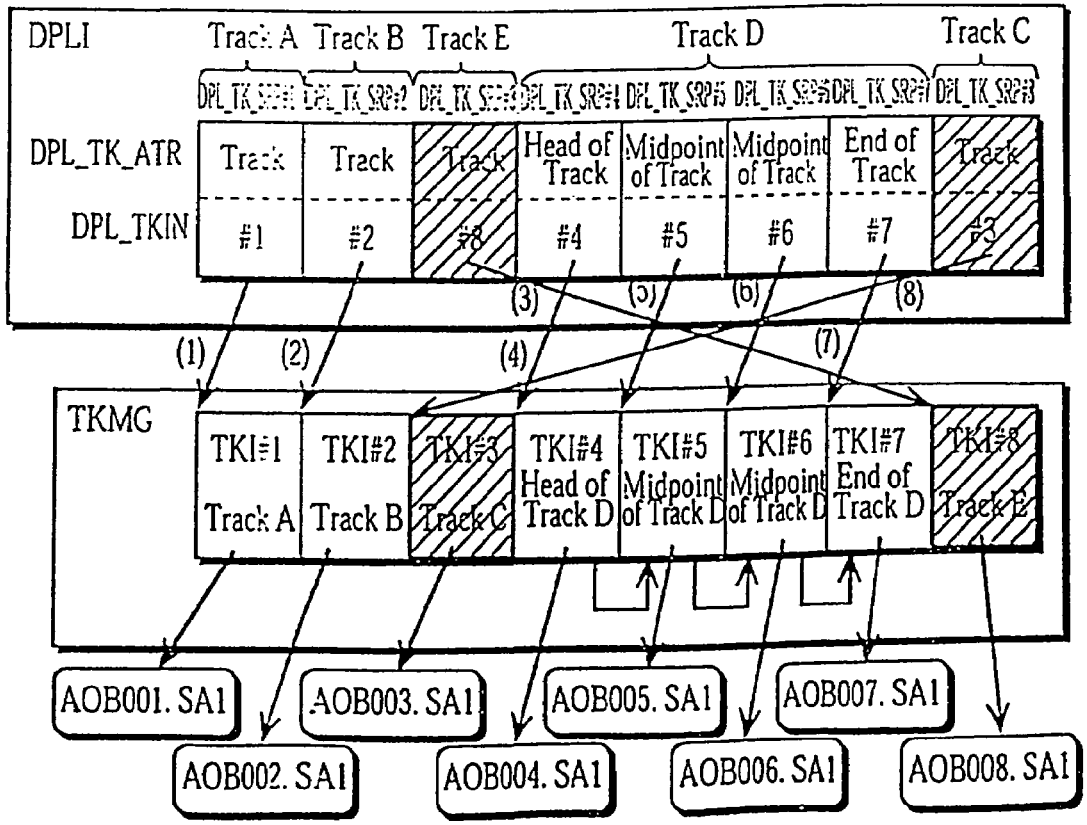

The following describes an editing operation that changes the playback order of tracks by reordering the DPL_TK_SRPs in the Default_Playlist_Information. FIGS. 43A and 43B show one example of the reordering of tracks. The settings of the DPL_TK_SRPs and TKIs in FIG. 43A are the same as in FIG. 40.

In FIG. 40A, the DPL_TKIN in DPL_TK_SRP#3 is set at TKI#3, while the DPL_TKIN in DPL_TK_SRP#8 is set at TKI#8. The following describes the case when these DPL_TK_SRPs with the thick outlines in FIG. 40A are interchanged.

The numbers (1)(2)(3)(4)(5)(6)(7)(8) in FIG. 43B show the playback order of tracks after this editing operation. It should be noted here that while the playback order shown in FIG. 43A is TrackA, TrackB, TrackC, TrackD, TrackE, in FIG. 43B the DPL_TKINs of DPL_TK_SRP#3 and DPL_TK_SRP#8 are interchanged in the Default_Playlist_Information, so that the tracks will be played back in the order TrackA, TrackB, TrackE, TrackD, TrackC. In this way, the playback order of tracks can be easily changed by changing the order of the DPL_TK_SRPs in the Default_Playlist_Information.

While the above explanation deals with an editing operation that changes the order of tracks, the following will describe the following four operations that were explained with respect to the changes in the TKIs. These operations are a first case (case1) where a track is deleted, a second case (case2) where a new track is recorded, a third case (case3) where two freely selected tracks are combined to produce a new track, and a fourth case (case4) where a track is divided to produce two new tracks.

{17-9_40-3 44A,B} Deletion of a Track

The following describes case1 where a track is deleted.

Figure 44A:
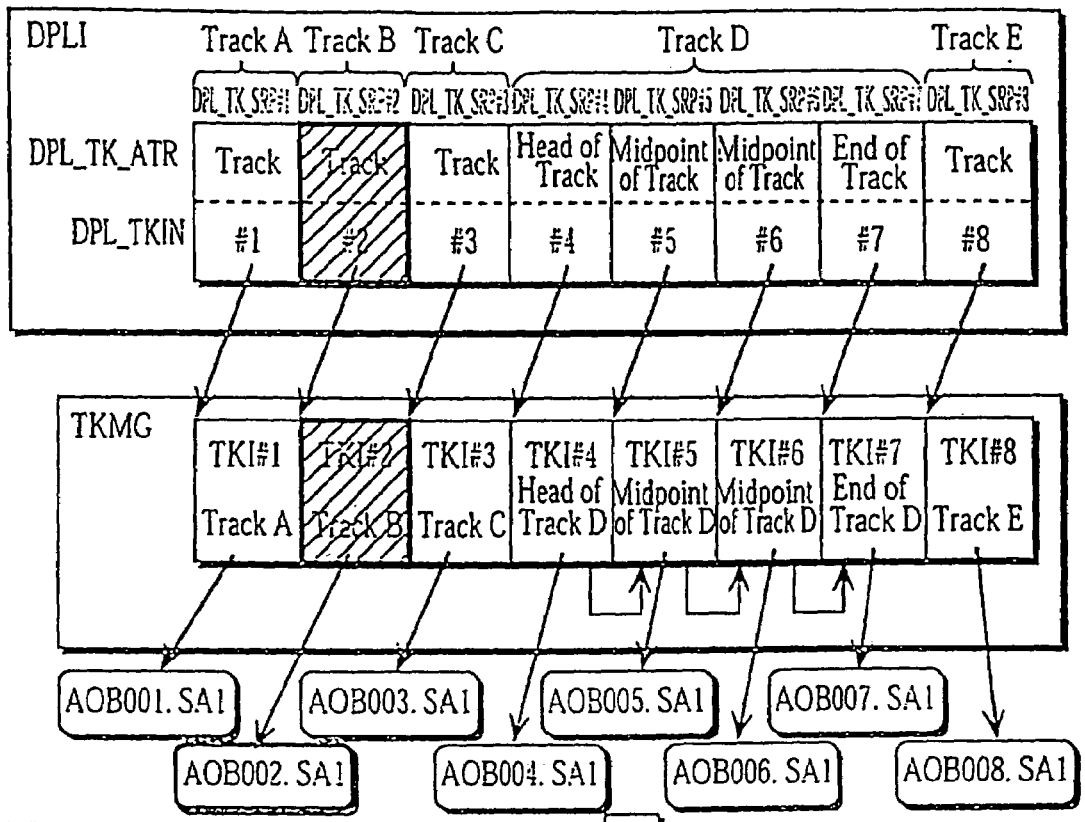
FIGS. 44A and 44B show how the Default_Playlist, TrackManager, and AOB files will be updated when DPL_TK_SRP#2 and TKI#2 are deleted from the Default_Playlist shown in FIG. 40.
Figure 44B:
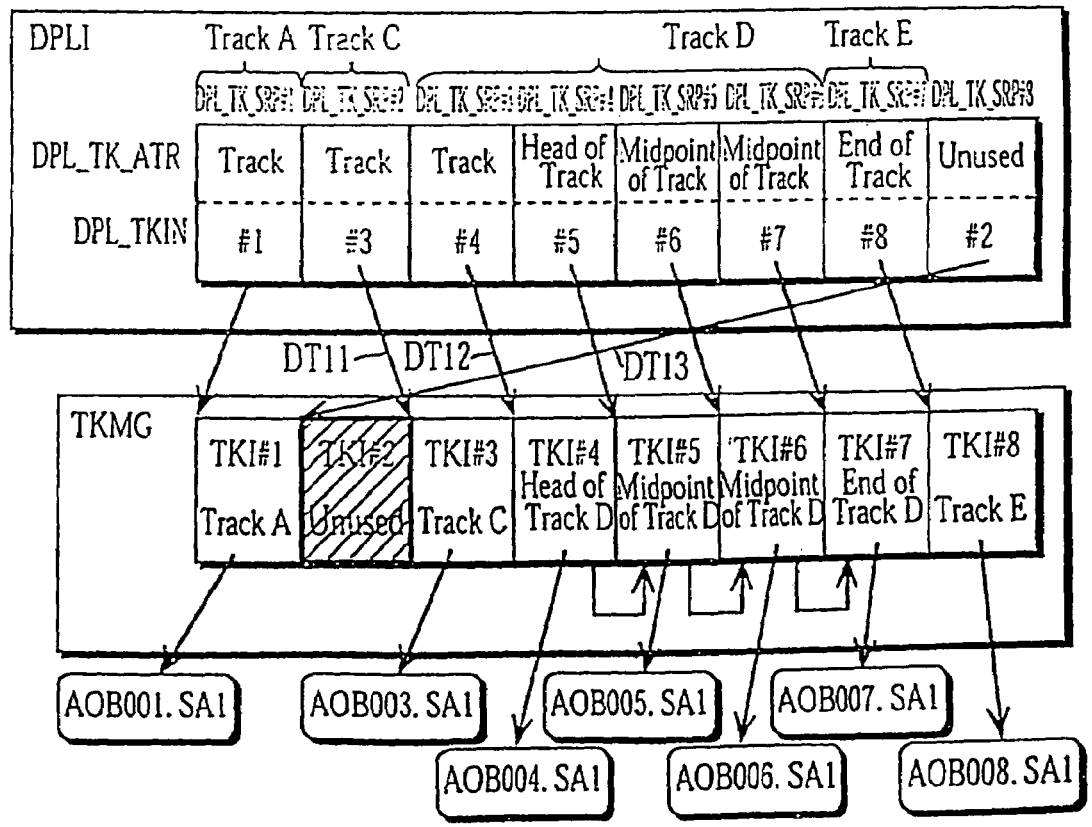

FIGS. 44A and 44B show how the Default_Playlist, TrackManager, and AOB files are updated when, out of the Default-Playlist shown in FIG. 40, DPL_TK_SRP#2 and TKI#2 are deleted. In these drawings, the same part of an AOB is deleted as in FIG. 27 that was used to describe the deletion of a TKI. As a result, the second, third, and fourth levels in FIG. 44A and 44B are the same as in FIG. 27. The difference with FIG. 27 is that Default_Playlist_Information including a plurality of DPL_TK_SRPs is given on the first level, in the same way as FIG. 40.

The present example deals with the case when the user deletes TrackB composed of DPL_TK_SRP#2→TKI#2 ("AOB002.SA1") that is shown with the thick outline in FIG. 44A. In this case, DPL_TK_SRP#2 is deleted from Default_Playlist_Information and DPL_TK_SRP#3 to DPL_TK_SRP#8 are each moved up by one place in the playback order so as to fill the place in the order freed by the deletion of DPL_TK_SRP#2.

When the DPL_TK_SRPs are moved up in this way, the final DPL_TK_SRP#8 is set as "Unused". On the other hand, the TKI corresponding to the deleted part is set as "Unused" as shown in FIGS. 27A and 27B without other TKIs being moved to fill the gap created by the deletion. Deletion of the TKI is also accompanied by the deletion of the AOB file "AOB002.SA1".

In this way, DPL_TK_SRPs are moved up in the playback order but TKIs are not moved, so that in FIG. 44B only the DPL_TKINs in the DPL_TK_SRPs are updated. For this example, the DPL_TKIN in DPL_TK_SRP#2 is set so as to indicate TKI#3 as shown by the arrow DT11, the DPL_TKIN in DPL_TK_SRP#3 is set so as to indicate TKI#4 as shown by the arrow DT12, the DPL_TKIN in DPL_TK_SRP#4 is set so as to indicate TKI#5, and the DPL_TKIN in DPL_TK_SRP#5 is set so as to indicate TKI#6. The DPL_TKIN in DPL_TK_SRP#8 that has been set at "Unused" is set so as to indicate TKI#2, as shown by the arrow DT13.

When a track is deleted, the DPL_TK_SRP used for following tracks in the playback order are moved up, while the TKI corresponding to the deleted track is set at "Unused" while remaining in its present position. In this way, an editing operation is not accompanied by movement of TKIs, which suppresses the processing load when editing tracks.

{17-9_40-4_45A,B} Assignment of TKIs When Recording Tracks

Figure 45A:
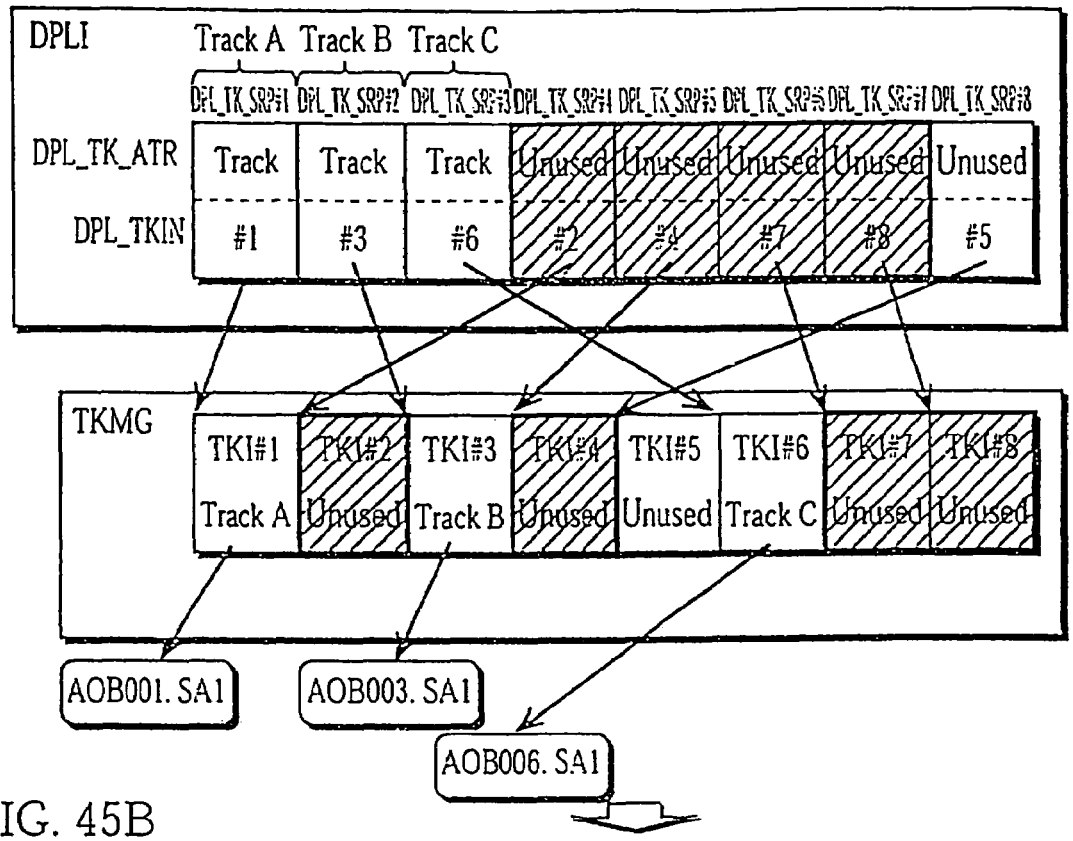
FIGS. 45A and 45B show how a new TKI and DPL_TK_SRP are written when an "Unused" TKI and DPL_TK_SRP are present.
Figure 45B:
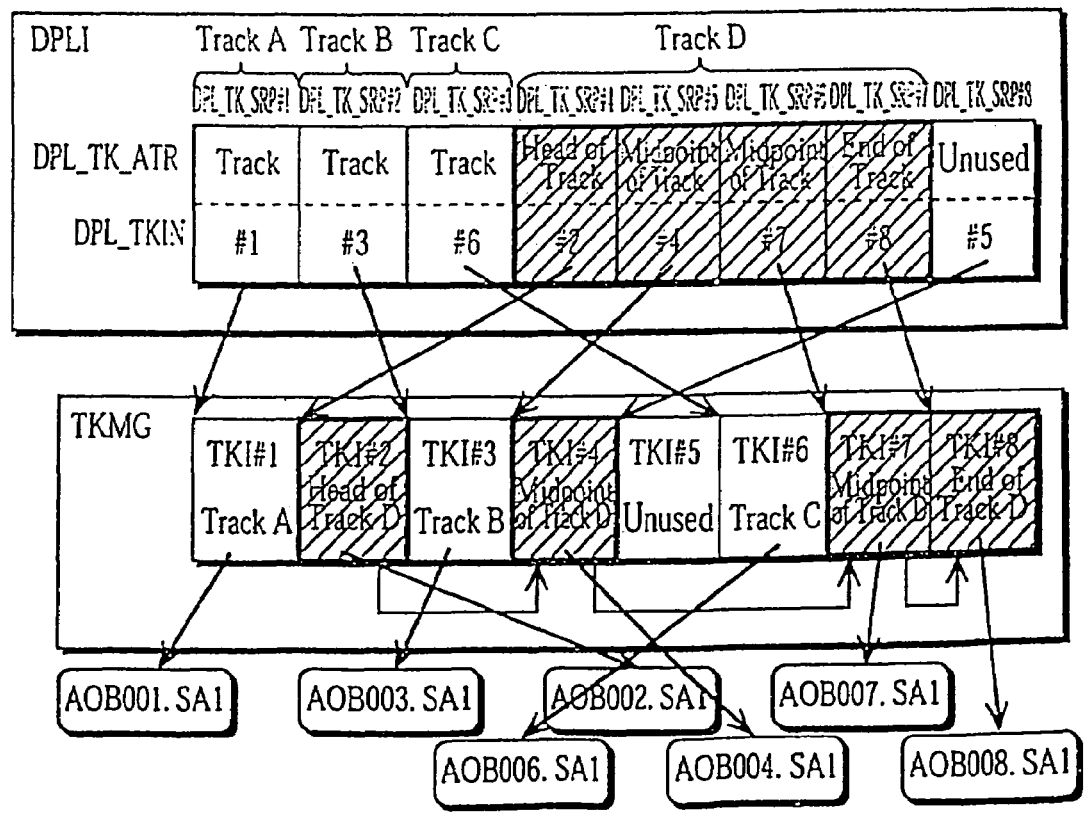

The following describes case2 when a new track is recorded following the partial deletion of a track. FIGS. 45A and 45B show how an operation that writes a new TKI and DPL_TK_SRP is performed when an "Unused" TKI and DPL_TK_SRP are present.

These drawings are largely the same as FIGS. 28A and 28B that were used to explain the assignment of a new TKI to a TKI set at "Unused". The second, third, and fourth levels in FIGS. 45A and 45B are the same as the first three levels in FIGS. 28A and 28B. The difference between these drawings is that the first levels in FIGS. 45A and 45B show the Default_Playlist_Information composed of a plurality of DPL_TK_SRP. In FIG. 45A, the DPL_TK_SRP#4 to DPL_TK_SRP#8 are set as "Unused". On the other hand, in FIG. 28 the TKI#2, TKI#4, TKI#5, TKI#7, TKI#8 are set as "Unused".

While TKIs set at "Unused" are present here and there in the TrackManager, the "Unused" DPL_TK_SRPs are positioned next to one another in the Default_Playlist_Information. This results from the used DPL_TK_SRPs being moved up in the Default_Playlist_Information as described above, while no such moving up is performed for TKIs.

The following explanation describes the case when TrackD composed of four AOBs is written. The TKIs for these four AOBs are respectively written into the following "Unused" TKIs in the TrackManager: TKI#2; TKI#4; TKI#7; and TKI#8.

The DPL_TK_SRPs for these four AOBs are written in DPL_TK_SRP#4 to DPL_TK_SRP#7 in the Default_Playlist_Information. Since these four AOBs compose a single track, the DPL_TK_ATR of DPL_TK_SRP#4 is set at "Head_of_Track", the DPL_TK_ATRs of DPL_TK_SRP#5 and DPL_TK_SRP#6 are set at "Middle_of_Track", and the DPL_TK_ATR of DPL_TK_SRP#7 is set at "End_of_Track".

The DPL_TKIN of DPL_TK_SRP#4 is set at TKI#2, the DPL_TKIN of DPL_TK_SRP#5 at TKI#4, the DPL_TKIN of DPL_TK_SRP#6 at TKI#7, and the DPL_TKIN of DPL_TK_SRP#7 at TKI#8.

By setting the DPL_TKINs and DPL_TK_ATRs in this way, TKI#2, TKI#4, TKI#7 and TKI#8 are managed as the fourth track TrackD.

In the above processing, a write is performed for "Unused" TKIs, though this has no effect on the other TKIs TKI#1, TKI#2, TKI#3, and TKI#4, as was also the case in FIGS. 28A and 28B.

{17-9_40-5_46A,B} Case3: Combining Tracks

Figure 46A:
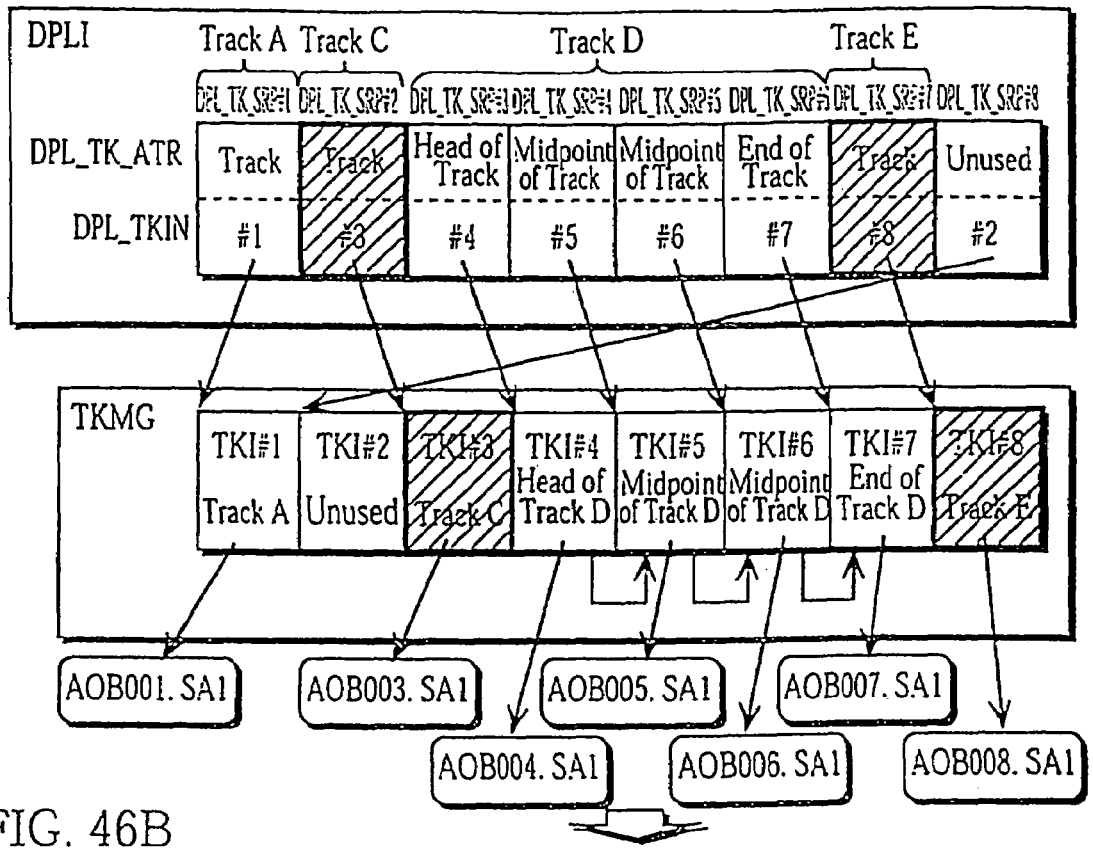
FIGS. 46A and 46B show how tracks are combined.
Figure 46B:
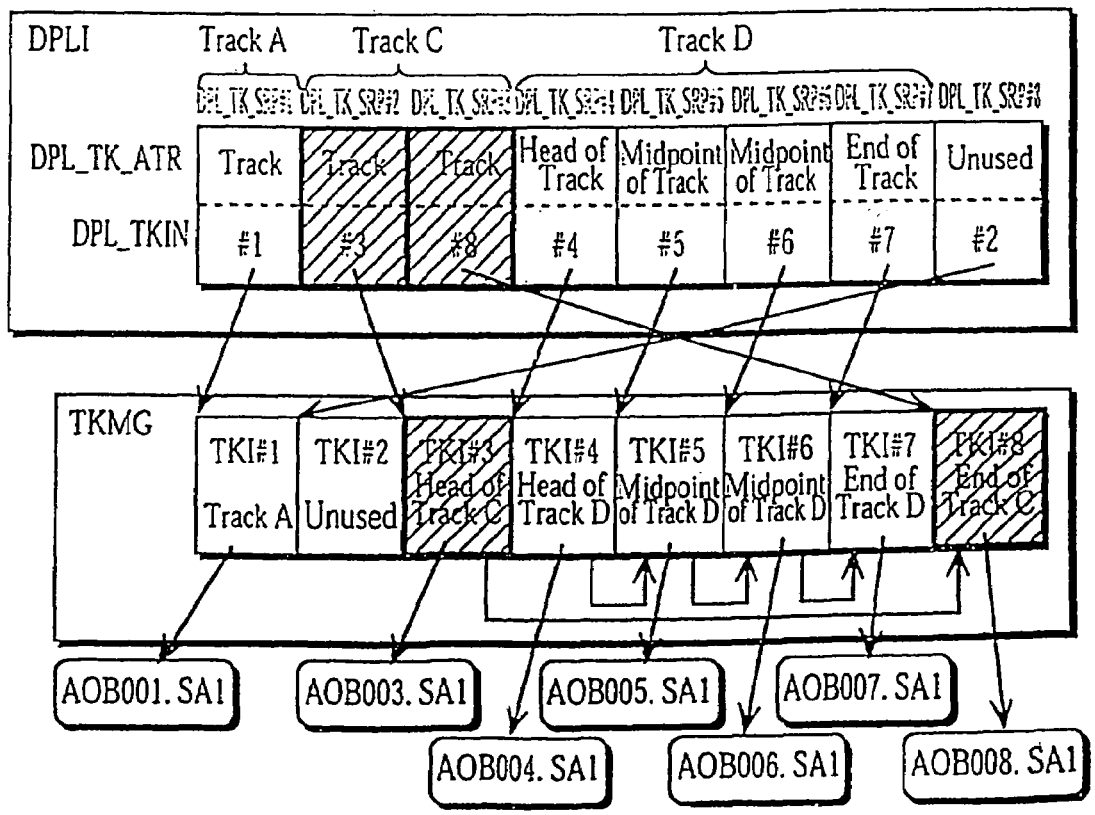

The following describes the updating of the Default_Playlist_Information when tracks are combined (i.e., in case3). FIGS. 46A and 46B show one example of the combining of tracks.

These drawings are largely the same as FIGS. 29A and 29B that were used to explain the combining of TKIs. The second, third, and fourth levels in FIGS. 46A and 46B are the same as the first two levels in FIGS. 29A and 29B. The difference between these figures is that the first levels in FIGS. 46A and 46B show Default_Playlist_Information, in which DPL_TK_SRP#8 is set at "Unused" and is related to TKI#2 that is also set at "Unused". When an editing operation combining tracks is performed for AOB files and TKIs as shown in FIGS. 29A and 29B, the contents of DPL_TK_SRP#3 to DPL_TK_SRP#6 are each moved down by one and the content of DPL_TK_SRP#7 that is shown with the thick outline is copied into DPL_TK_SRP#3 as shown in FIGS. 46A and 46B. The TKIs are also updated, as shown in FIGS. 29A and 29B.

{17-9_40-6_47A,B} Case4: Division of a Track

The following describes the updating of the Default_Playlist_Information when a track is divided (case4).

Figure 47A:
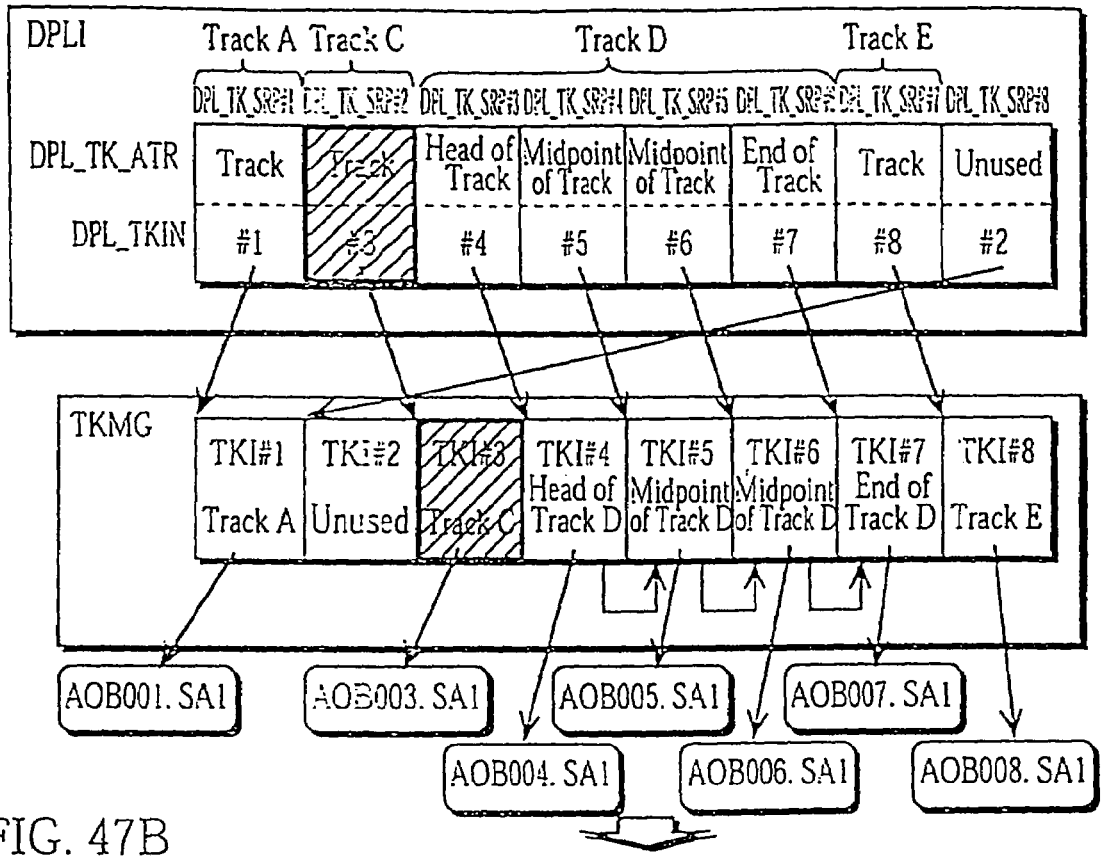
FIGS. 47A and 47B show how a track is divided.
Figure 47B:
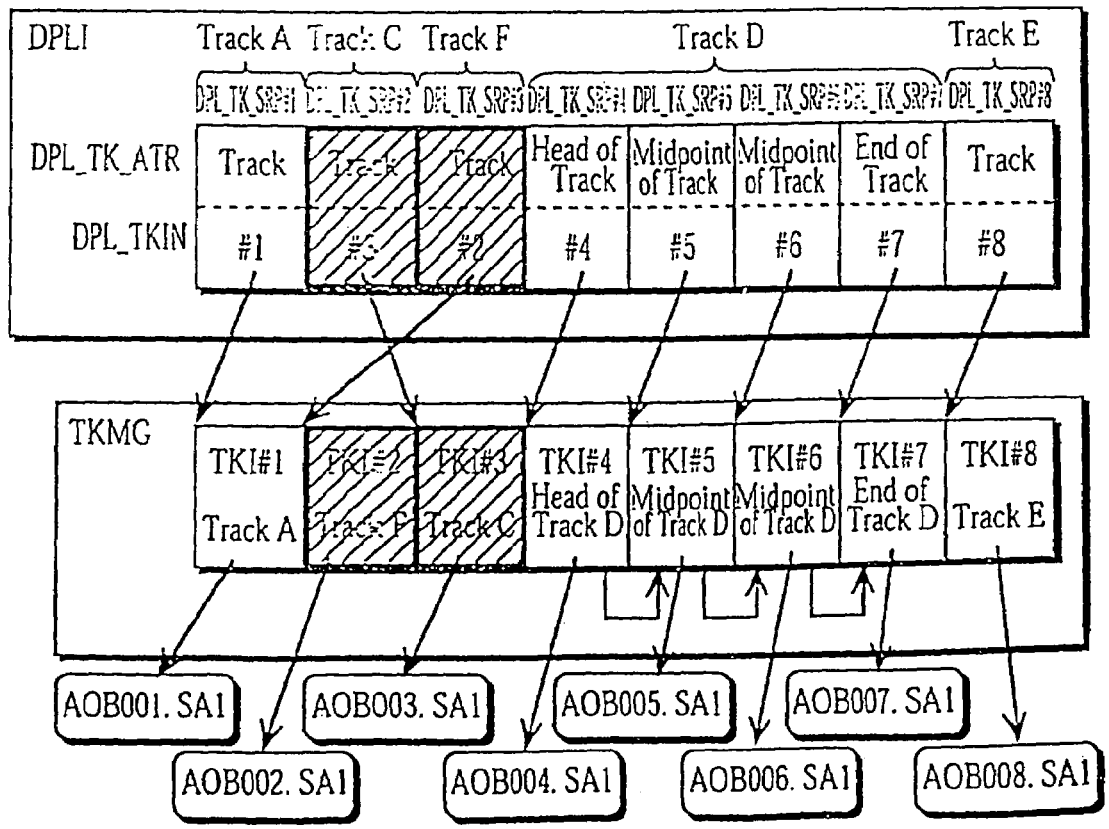

FIGS. 47A and 47B show one example of the division of a track. These drawings are largely the same as FIGS. 33A and 33B that were used to explain the division of TKIs. The second and third levels in FIGS. 47A and 47B are the same as the first two levels in FIGS. 33A and 33B. The difference between these figures is that the first level in FIGS. 47A and 47B shows Default_Playlist_Information, in which DPL_TK_SRP#8 is set at "Unused" and is related to TKI#2 that is also set at "Unused".

If, as in FIGS. 33A and 33B, the user indicates the division of TKI#3 ("AOB003.SA1") shown with the thick outline into two, the positions of DPL_TK_SRP#3 to DPL_TK_SRP#7 are each moved down by one in the order, and a DPL_TK_SRP set at "Unused" is moved within the Default_Playlist_Information to the former position of DPL_TK_SRP#3.

This new DPL_TK_SRP#3 is associated with the TKI, TKI#2, newly produced by the division. The AOB file "AOB002.SA1" associated with TKI#2 stores what was originally the latter part of the AOB file "AOB003.SA1". DPL_TK_SRP#2 is present before the DPL_TK_SRP#3 that is associated with TKI#2 and is associated with TKI#2 and "AOB002.SA1".

This is to say, "AOB002.SA1" and "AOB003.SA1" respectively store the latter and former parts of the original "AOB003.SA1", with the DPL_TK_SRP#2 and DPL_TK_SRP#3 corresponding to these files indicating that these AOBs are to be played back in the order "AOB003.SA1" and "AOB002.SA1". As a result, the latter and former parts of the original "AOB003.SA1" will be played back in the order former part, latter part in accordance with the playback order given in the DPL_TK_SRP.

{17-9_40-8} Application of the Editing Processing

By combining the above four editing processes, a user can perform a great variety of editing operations. When, for example, a recorded track has an intro over which a disc jockey has talked, the user can first divide the track to separate the part including the disc jockey's voice. The user can then delete this track to leave the part of the track that does not include the disc jockey.

This completes the explanation of the navigation data. The following describes a playback apparatus with a suitable composition for playing back the navigation data and presentation data described above.

{48-1} External Appearance of the Playback Apparatus

Figure 48:
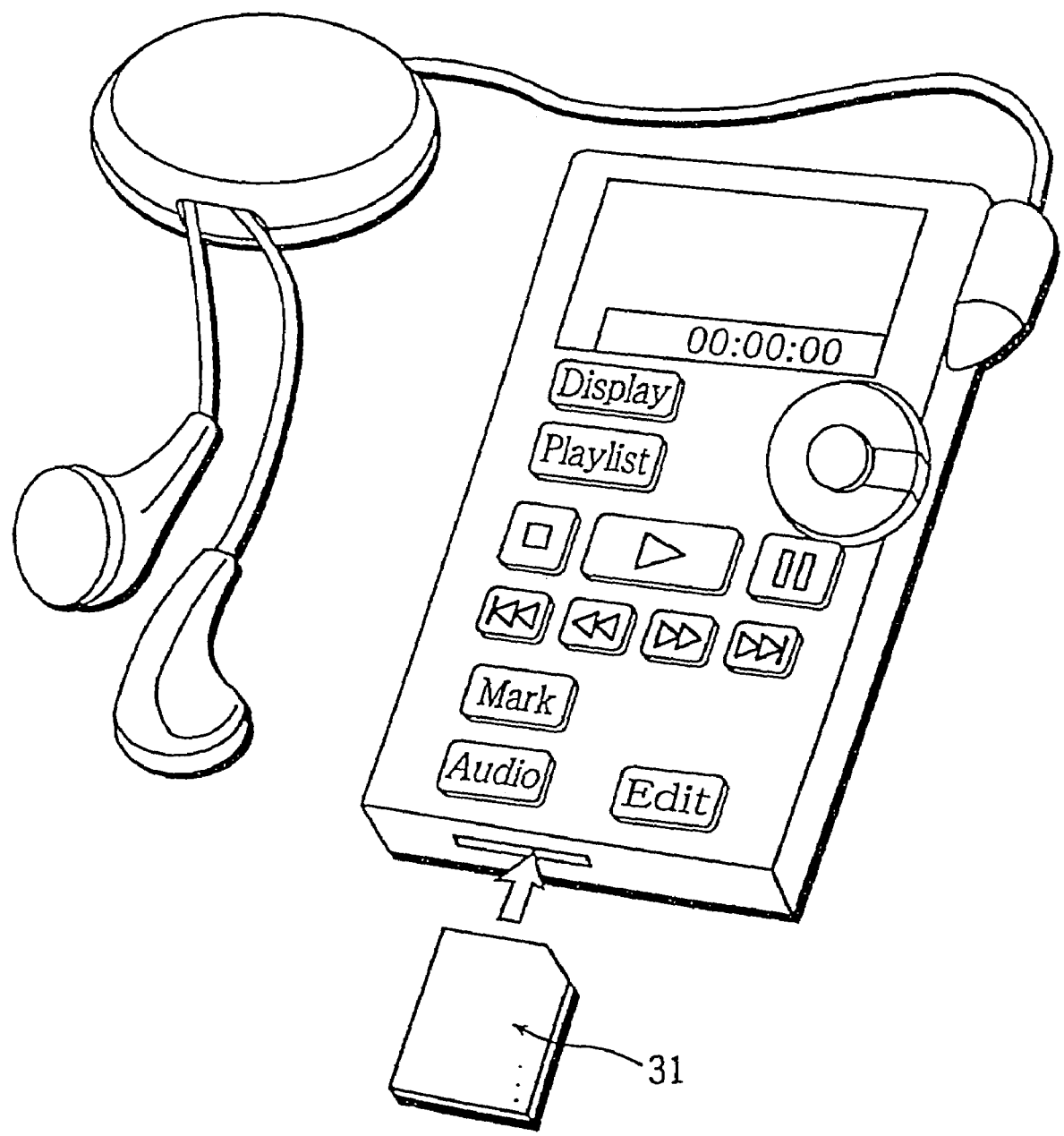
FIG. 48 shows the appearance of a portable playback apparatus for the flash memory card 31 of the present embodiments.

FIG. 48 shows a portable playback apparatus for the flash memory card 31 of the present invention. The playback apparatus shown in FIG. 48 has an insertion slot for inserting the flash memory card 31, a key panel for receiving user indications for operations such as playback, forward search, backward search, fast forward, rewind, stop etc., and an LCD (liquid crystal display) panel. In terms of appearance, this playback apparatus resembles other kinds of portable music players.

The key panel includes:
- a "Playlist" key that receives the selection of a playlist or a track;
- a "|<<" key that receives a skip operation that moves the playback position to a start of the current track;
- a ">>|" key that receives a skip operation that moves the playback position to a start of the next track;
- a "<<" key and a ">>" key that respectively receive a backward search operation and a forward search operation to enable the user to have the playback move quickly through the current track;
- a "Display" key that receives an operation to have still images stored on the flash memory card 31 displayed;

{48-2} Improvements Made in This Portable Playback Apparatus for the Flash Memory Card 31

The differences between this portable playback apparatus of the flash memory card 31 and a conventional portable music player lie in the following four improvements (1) to (4).

(1) A list of playlist and tracks is shown on the LCD panel to allow the user to indicate the Default_Playlist_Information, a PLI, or separate tracks.

(2) Keys on the key panel are assigned to the playlists and/or tracks displayed on the LCD panel to allow the user to select a track or playlist that is to be played back or edited.

(3) A time code showing a position in a track is displayed on the LCD panel 5 when a track is played back.

(4) A jog dial is provided to enable the user to set a time code for use as a playback start time when using the time search function or as a division boundary when dividing a track.

{48-2_49_50} Improvement (2)

Figure 49:
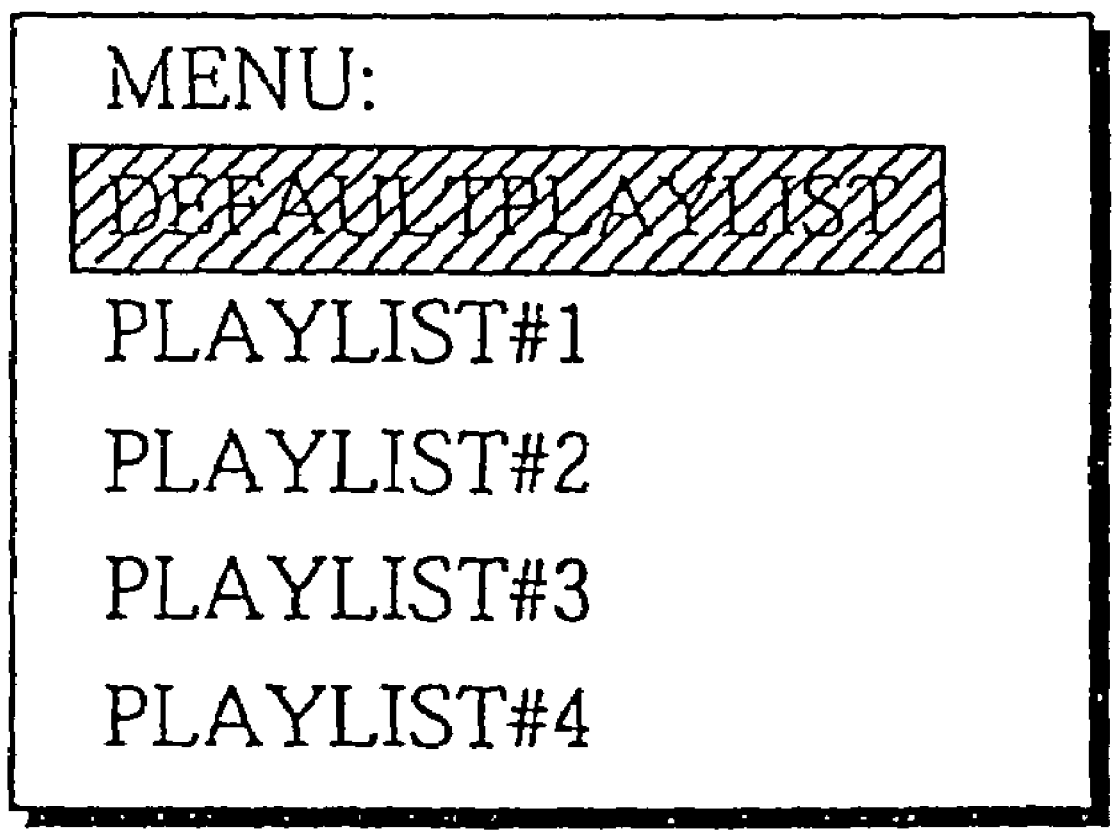
FIG. 49 shows one example of the display on the LCD panel when a playlist is selected.

The following describes improvement (2) in detail. FIG. 49 shows one example of a display screen shown on the LCD panel when the user selects a playlist, while FIGS. 50A to 50E show examples of the displayed content when the user selects a track.

In FIG. 49, the ASCII character strings "DEFAULTPLAYLIST", "PLAYLIST#1", "PLAYLIST#2", "PLAYLIST#3", and "PLAYLIST#4" represent the default playlist and the four playlists stored in the flash memory card 31.

Meanwhile, the ASCII character strings "Track#1", "Track#2", "Track#3", "Track#4", "Track#5" represent the five tracks that are indicated in the playback order given by the default playlist stored in the flash memory card 31. In FIGS. 49 and 50A, the highlighted Playlist and track show the track or Playlist that is currently indicated for playback or editing.

If the user presses the ">>" key when Track#1 is indicated for playback within a playback order given by the default Playlist displayed on the LCD panel, Track#2 will be indicated for playback within the list of tracks, as shown in FIG. 50B. If the user presses the ">>" key again, Track#3 will be indicated for playback within the list of tracks, as shown in FIG. 50C.

If the user presses the "<<" key when Track#3 is indicated for playback within a playback order given by the default Playlist displayed on the LCD panel, Track#2 will be indicated for playback within the list of tracks, as shown in FIG. 50D. As shown in FIG. 50E, if the user presses the "Play" key when any of the tracks is indicated, the playback of the indicated track will begin, while if the user presses the "Edit" key, the indicated track will be selected for editing.

{48-3_51} Improvement (4)

Figure 51A:
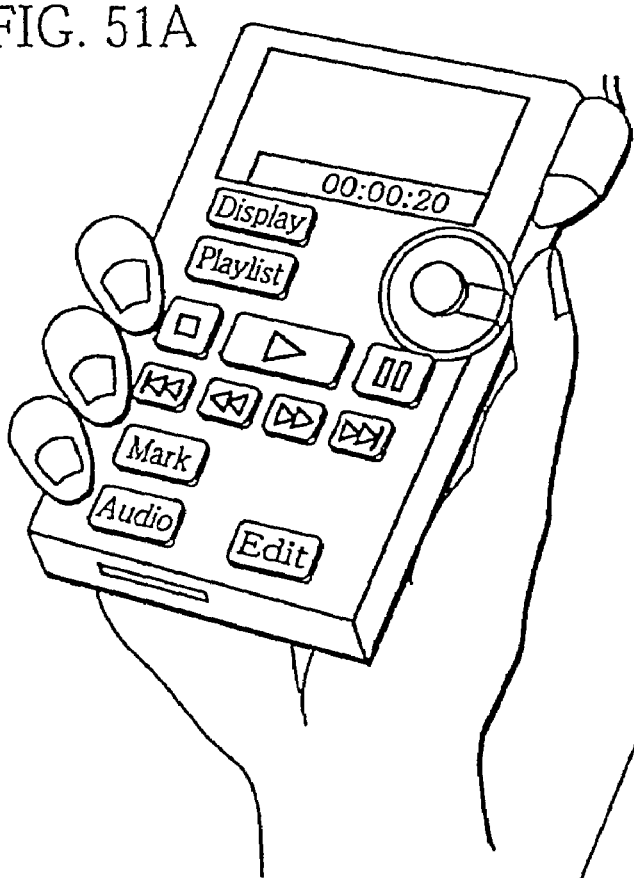
FIGS. 51A to 51C show example operations of the jog dial.
Figure 51C:
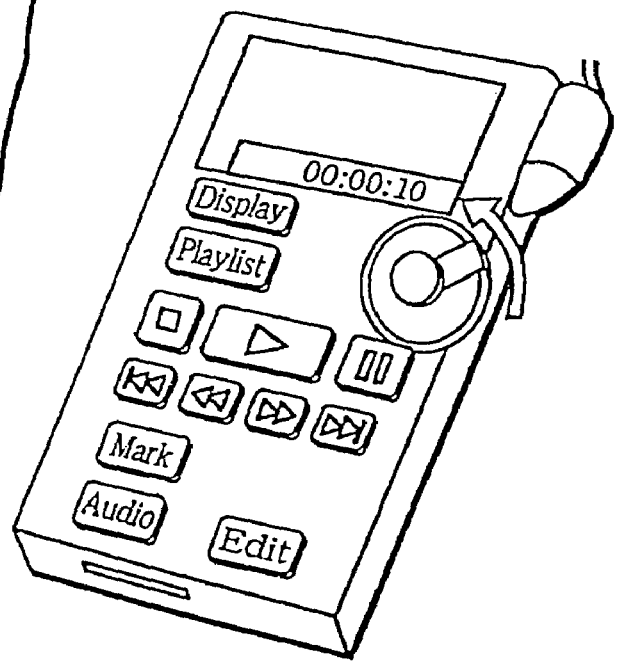
Figure 51B:
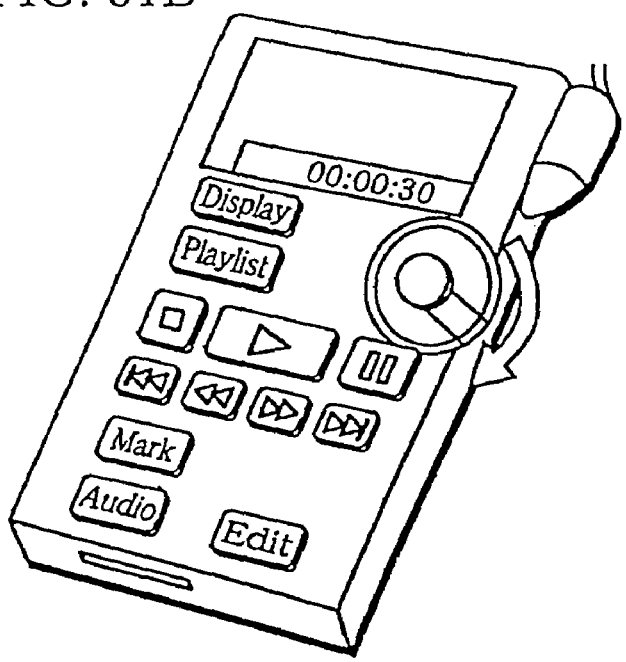

The following describes improvement (4) in detail. FIGS. 51A to 51C show an example operation of the jog dial. When the user rotates the jog dial by a certain amount, the playback time code displayed on the LCD panel will be increased or decreased in accordance with this certain amount. The example in FIG. 51A shows the case where the playback time code that is initially displayed on the LCD panel is "00:00:20".

When the user rotates the jog dial counterclockwise as shown in FIG. 51B, the playback time code is reduced to "0:00:10" in keeping with the amount by which the jog dial was rotated. Conversely, when the user rotates the jog dial clockwise as shown in FIG. 51C, the playback time code is increased to "0:00:30" in keeping with the amount by which the jog dial was rotated.

By allowing the user to change the playback time code in this way, the playback apparatus enables the user to indicate any playback time code in a track by merely rotating the jog dial. If the user then presses the "Play" key, AOBs will be played back starting from a position found according to Equation 2 and Equation 3.

By using the jog dial during a track dividing operation, the user can make fine adjustments to the playback time code used as the division boundary.

{52-1} Internal Construction of the Playback Apparatus

The following describes the internal construction of the playback apparatus. This internal construction is shown in FIG. 52.

Figure 52:
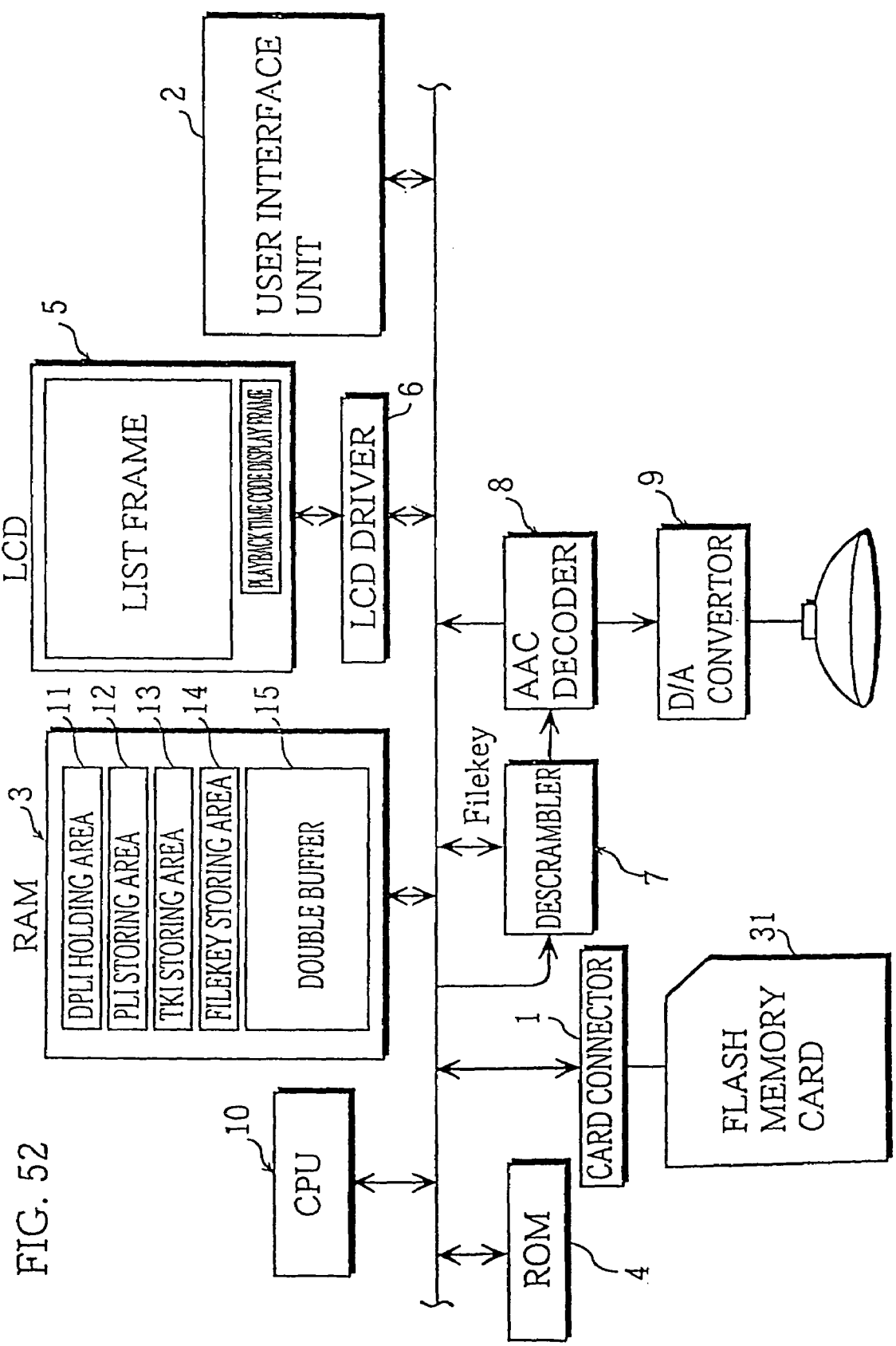
FIG. 52 shows the internal construction of the reproduction apparatus.

As shown in FIG. 52, the playback apparatus includes a card connector 1 for connecting the playback apparatus to the flash memory card 31, a user interface unit 2 that is connected to the key panel and the jog dial, a RAM 3, a ROM 4, a LCD panel 5 having a list frame for displaying a list of tracks or playlists and a playback time code frame for displaying a playback time code, an LCD driver 6 for driving the first LCD panel 5, a descrambler 7 for decrypting AOB_FRAMEs using a different FileKey for each AOB file, an AAC decoder 8 for referring to the ADTS of an AOB_FRAME descrambled by the descrambler 7 and decoding the AOB_FRAME to obtain PCM data a D/A converter 9 for D/A converting the PCM data and outputting the resulting analog signals to a speaker or headphone jack, and a CPU 10 for performing overall control over the playback apparatus.

As can be understood from this hardware construction, the present playback apparatus has no special hardware elements for processing the TrackManager and Default_Playlist_Information. To process the TrackManager and Default_Playlist_Information, a DPLI holding area 11, a PLI storing area 12, a TKI storing area 13, a FileKey storing area 14, and a double buffer 15 are provided in the RAM 3, while a playback control program and an editing control program are stored in the ROM 4.

{52-2} DPLI Holding Area 11

The DPLI holding area 11 is an area for continuously holding Default_Playlist_Information that has been read from a flash memory card 31 connected to the card connector 1.

{52_12} PLI Storing Area 12

The PLI storing area 12 is an area that is reserved for storing Playlist_Information that has been selected for playback by the user.

{52-3} TKI Storing Area 13

The TKI storing area 13 is an area that is reserved for storing only the TKI corresponding to the AOB file that is currently indicated for playback, out of the plurality of TKI included in the TrackManager. For this reason, the capacity of the TKI storing area 13 is equal to the data size of one TKI.

{52-4} FileKey Storing Area 14

The FileKey storing area 14 is an area that is reserved for storing only the FileKey corresponding to the AOB file that is currently indicated for playback, out of the plurality of FileKeys included in "AOBSA1.KEY" in the authentication region.

{52-5} Double Buffer 15

The double buffer 15 is an input/output buffer that is used when an input process, which successively inputs cluster data (data that is stored in one cluster) read from the flash memory card 31, and an output process, which reads AOB_FRAMEs from cluster data and successively outputs the AOB_FRAMEs to the descrambler 7, are performed in parallel.

The double buffer 15 successively frees the regions that were occupied by cluster data that has been outputted as AOB_FRAMEs and so secures regions for storing the next clusters to be read. This is to say, regions in the double buffer 15 are cyclically secured for storing cluster data using ring pointers.

{52-5_53_54A,B} Input and Output by the Double Buffer 15

Figure 53:
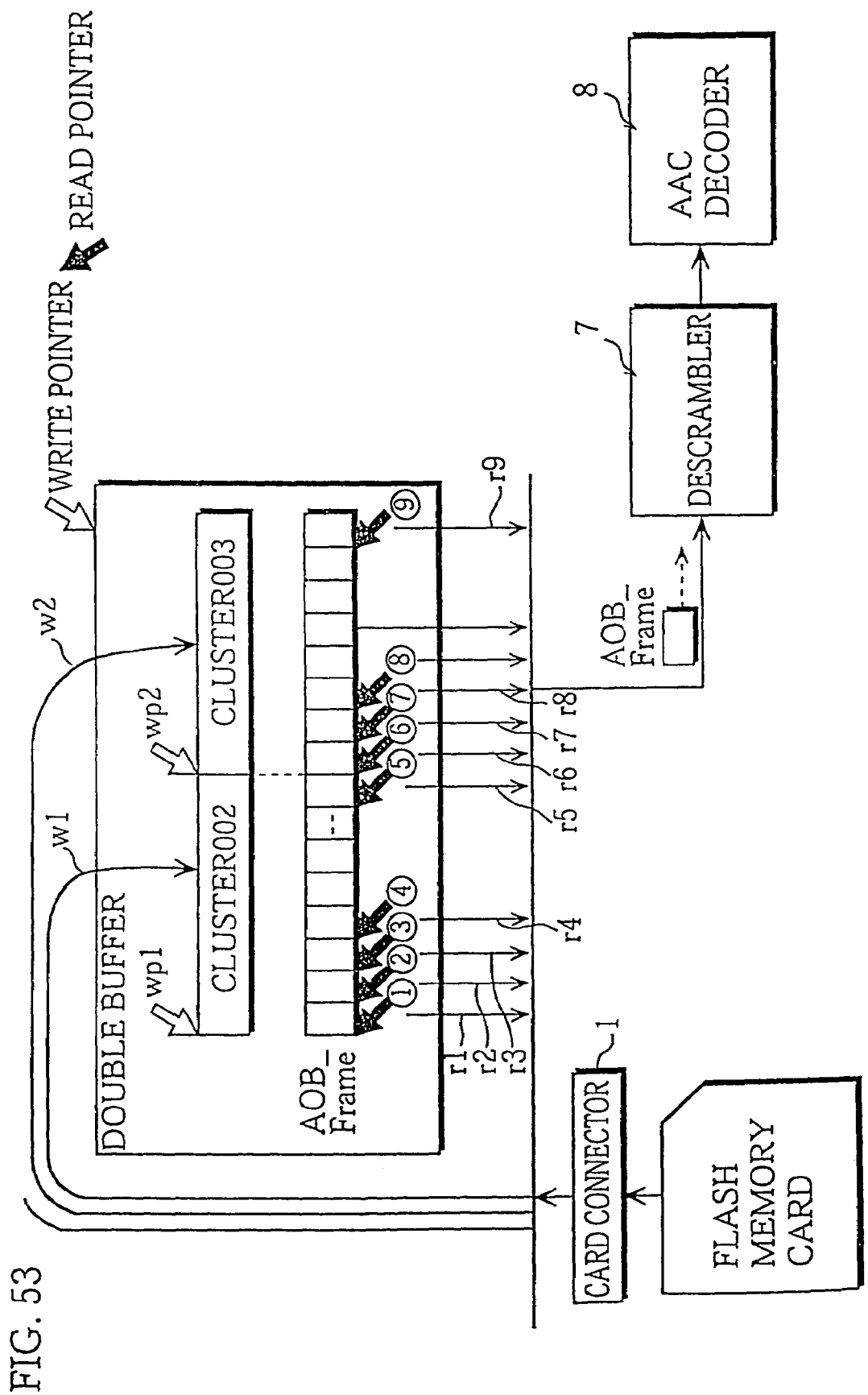
FIG. 53 shows how data is transferred in and out of the double buffer 15.
Figure 54A:
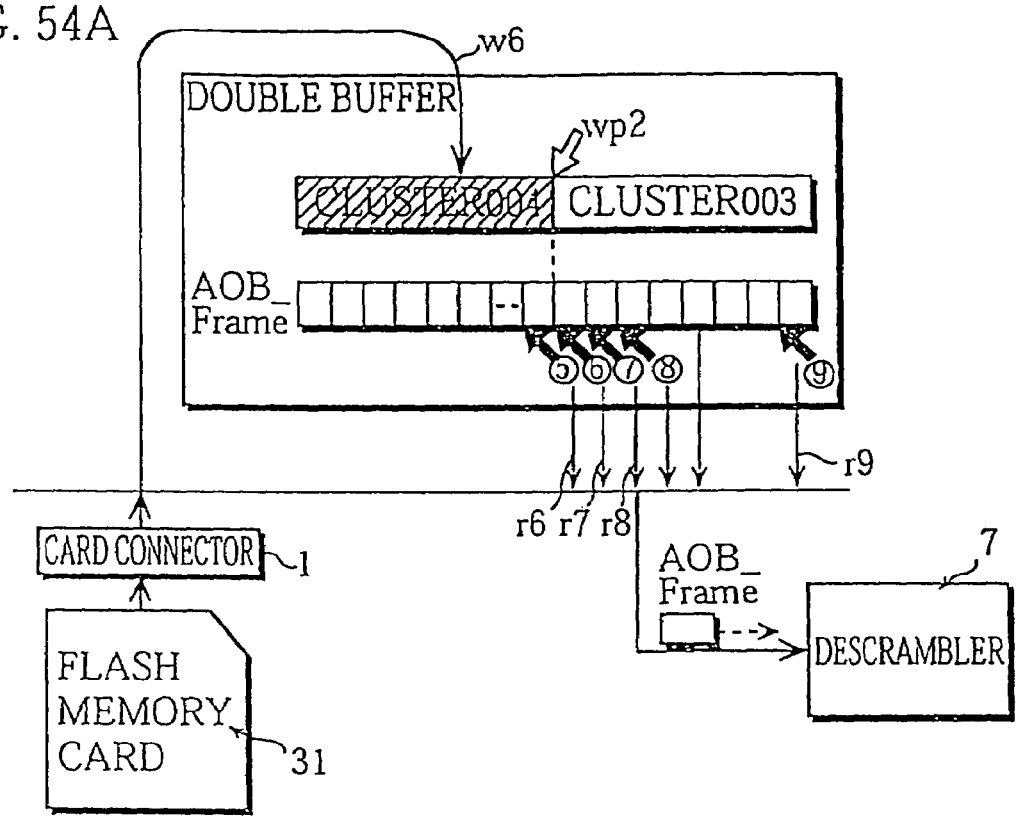
FIGS. 54A and 54B show how areas in the double buffer 15 are cyclically allocated using ring pointers.
Figure 54B:
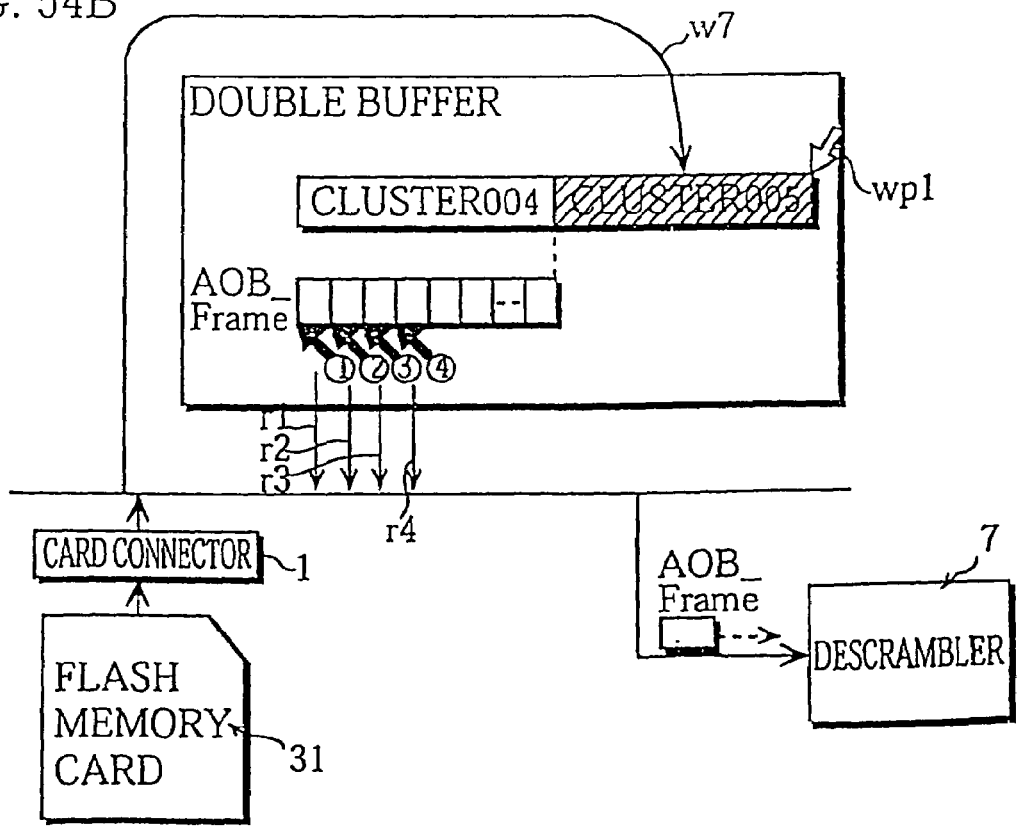

FIG. 53 shows how input and output are performed for the double buffer 15. FIGS. 54A and 54B show how regions in the double buffer 15 are cyclically secured for storing cluster data using ring pointers.

The arrows pointing downward and to the left are pointers to write addresses for cluster data, which is to say, the write pointer. The arrows pointing upward and to the left are pointers to read addresses for cluster data, which is to say, the read pointer. These pointers are used as the ring pointer.

{54-6_53}

When a flash memory card 31 is connected to the card connector 1, cluster data in the user region of the flash memory card 31 is read out and stored in the double buffer 15 as shown by the arrows w1 and w2.

The read cluster data is successively stored into the positions in the double buffer 15 shown by the write pointers wp1 and wp2.

{52-7_54A}

Of the AOB_Frames included in the cluster data stored in this way, the AOB_Frames present at the positions ①②③④⑤⑥⑦⑧⑨ that are successively indicated by the read pointer are outputted one at a time to the descrambler 7 as shown by the arrows r1, r2, r3, r4, r5 . . . .

In the present case, the cluster data 002 and 003 is stored in the double buffer 15 and the read positions ①②③④ are successively indicated by the read pointer, as shown in FIG. 53. When the read pointer reaches the read position ⑤, all of the AOB_FRAMEs included in cluster 002 will have been read, so that cluster 004 is read and, as shown by the arrow w6 in FIG. 54A, is overwritten into the region that was previously occupied by cluster 002.

{52-8__54B}

The read pointer then advances to the read positions ⑥ and ⑦, and eventually reaches the read position ⑨, at which point all of the AOB_FRAMEs included in cluster 003 will have been read, so that cluster 005 is read and, as shown by the arrow w7 in FIG. 54B, is overwritten into the region that was previously occupied by cluster 003.

The output of an AOB_FRAME and the overwriting of cluster data are repeatedly performed as described above, so that the AOB_FRAMEs included in an AOB file are all successively outputted to the descrambler 7 and AAC decoder 8.

{52-9__55-58} Playback Control Program Stored in the ROM 4

The following describes the playback control program stored in the ROM 4.

Figure 55:
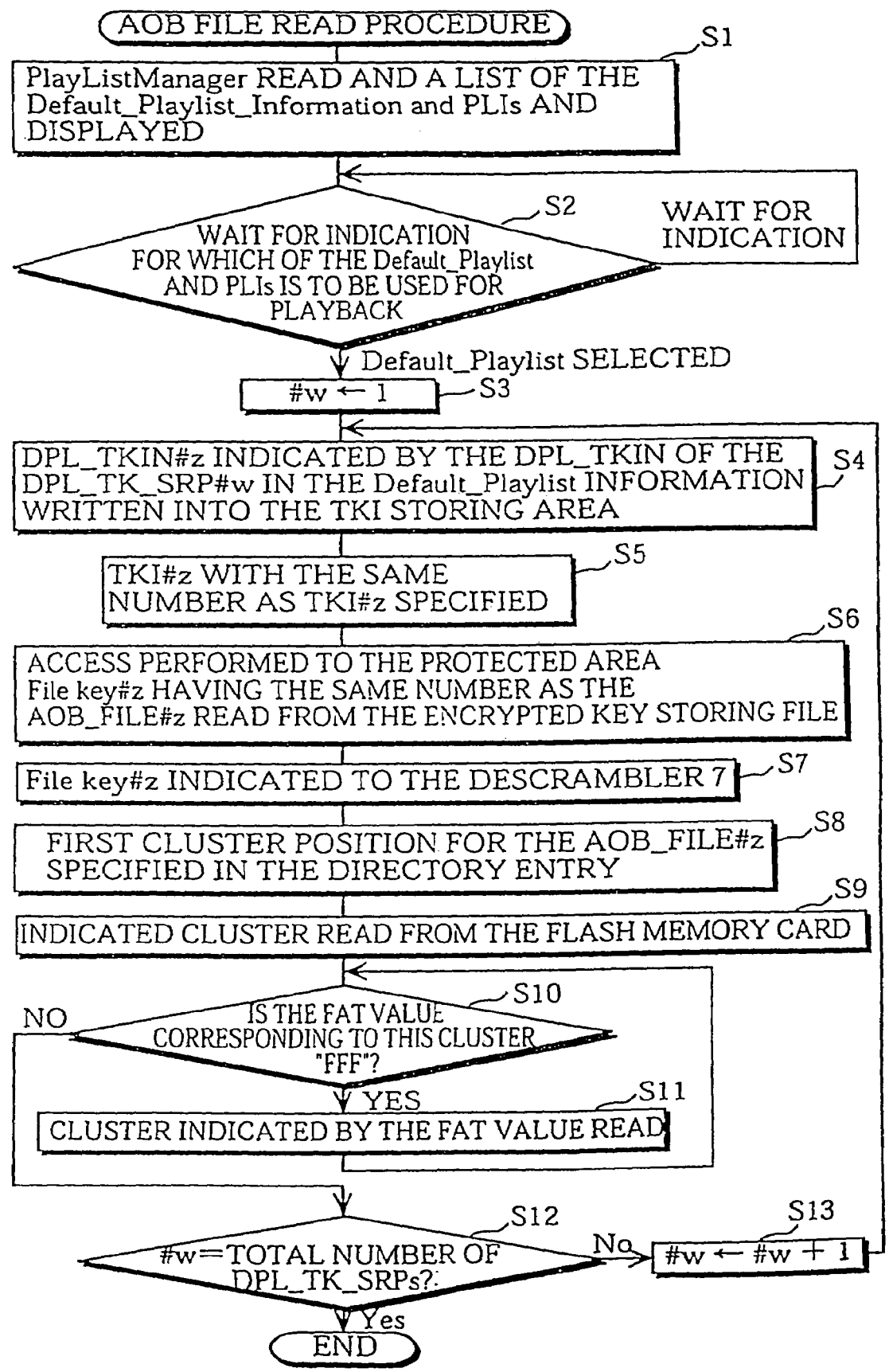
FIG. 55 is a flowchart showing the AOB file read procedure.
Figure 56:
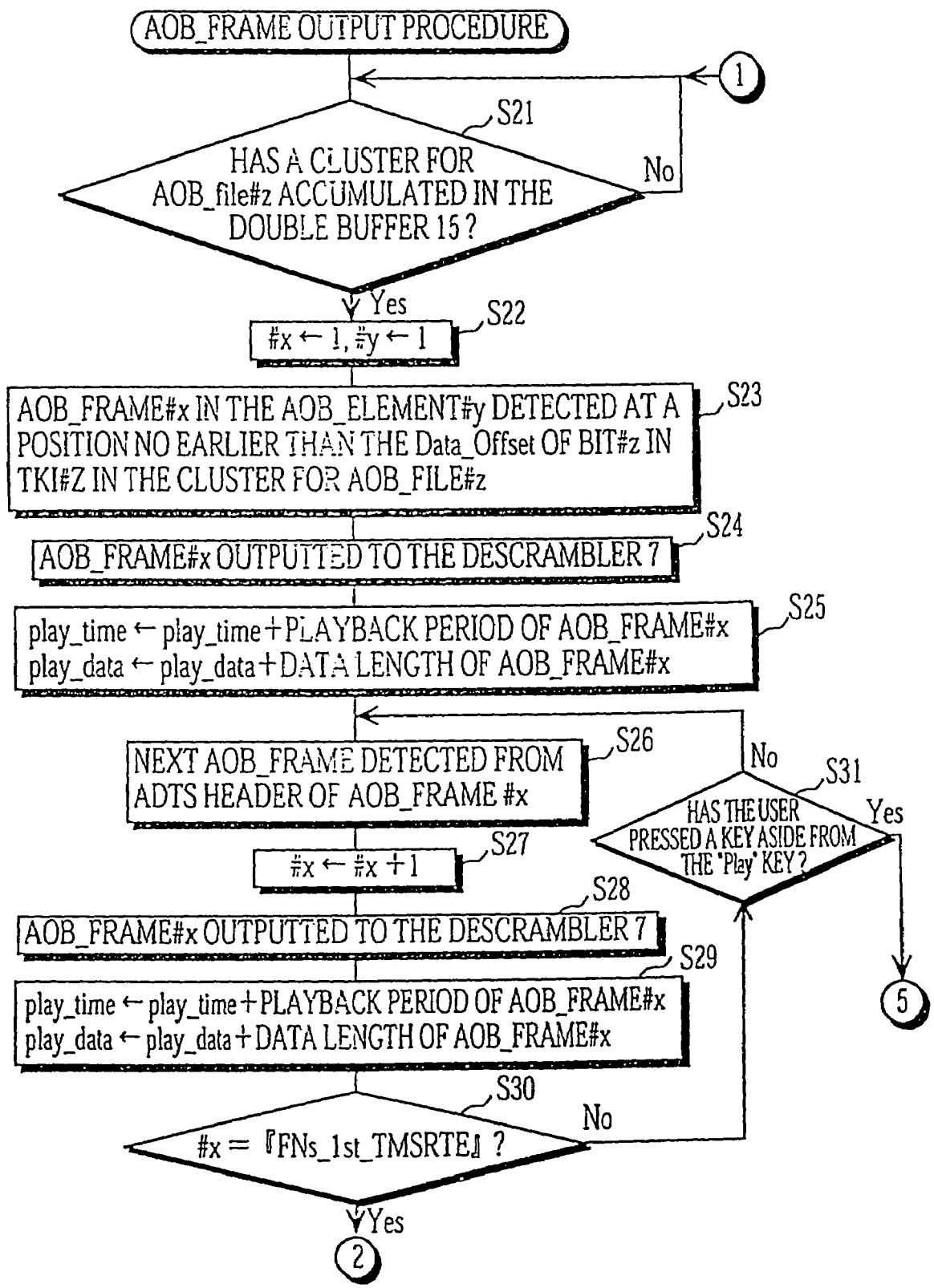
FIG. 56 is a flowchart showing the AOB file output procedure.
Figure 57:
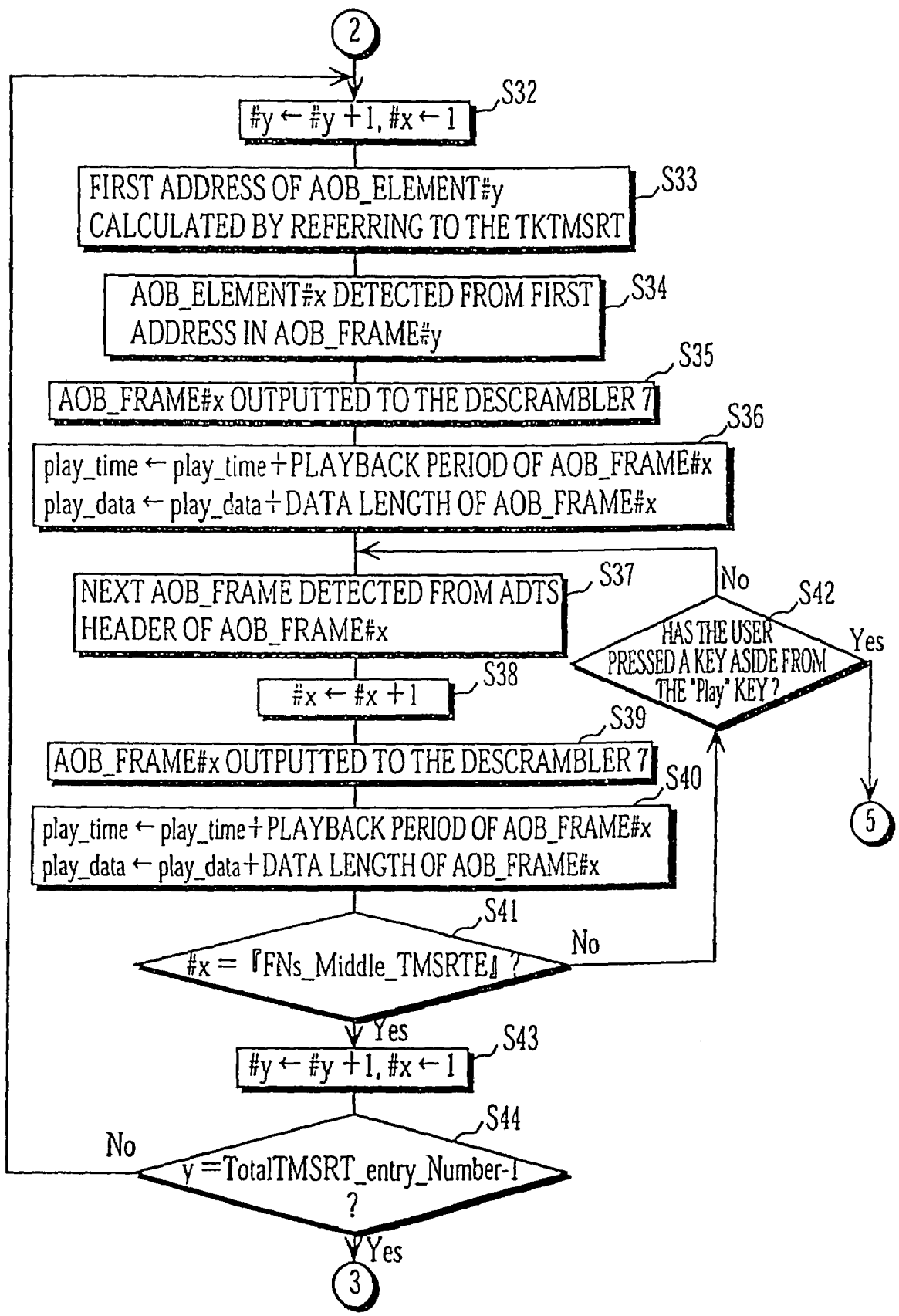
FIG. 57 is a flowchart showing the AOB file output procedure.
Figure 58:
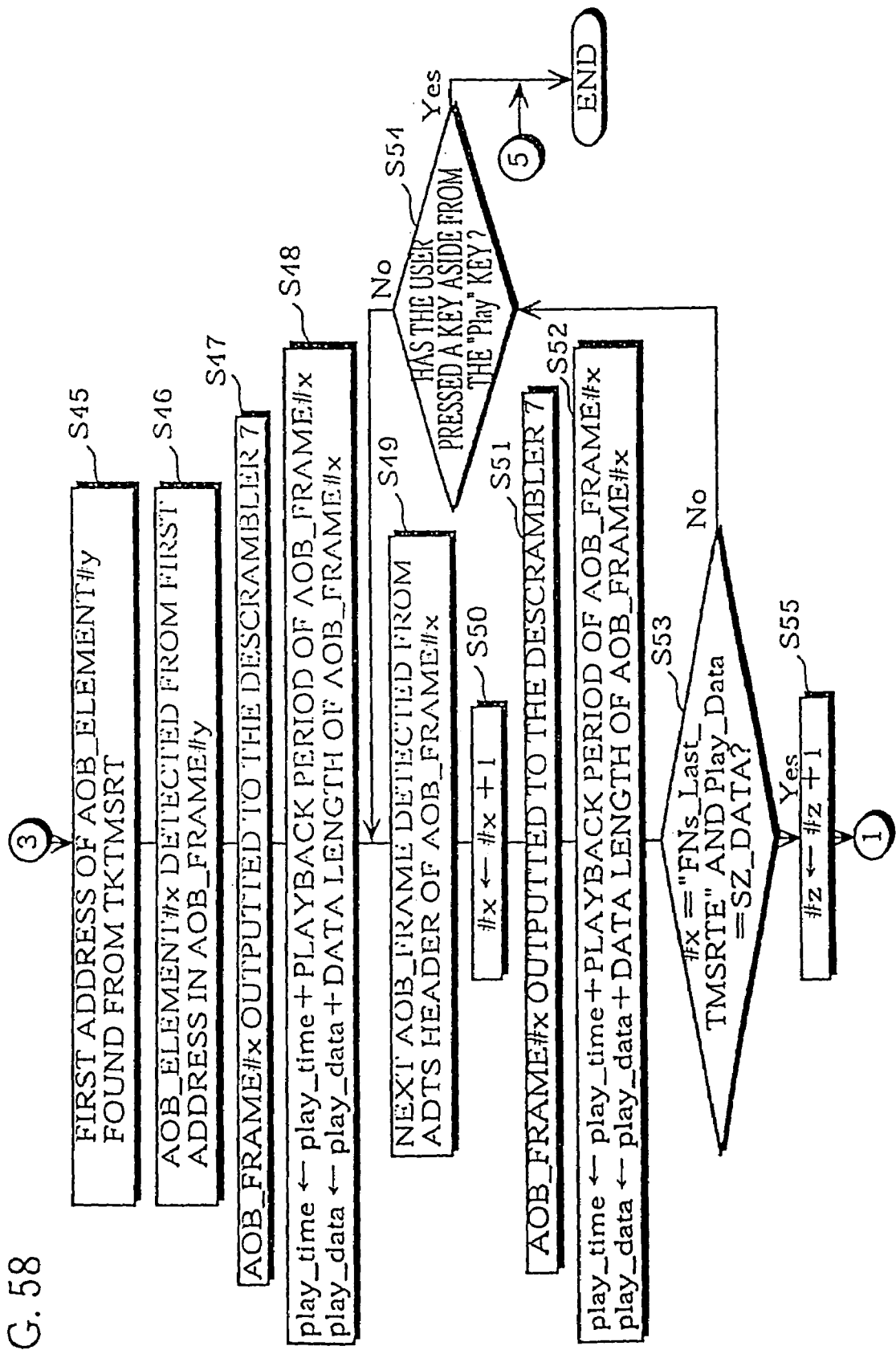
FIG. 58 is a flowchart showing the AOB file output procedure.

FIG. 55 is a flowchart showing the processing in the AOB file reading procedure. FIGS. 56, 57, and 58 are flowcharts showing the processing in the AOB_FRAME output procedure.

{52-9__55-1}

These flowcharts use the variables w, z, y, and x. The variable w indicates one of the plurality of DPL_TL_SRPs. The variable z indicates an AOB file recorded in the user region, the TKI corresponding to this AOB file, and the AOB included in this AOB file. The variable y indicates an AOB_ELEMENT included in the AOB#z indicated by the variable z. The variable x indicates an AOB_FRAME included in the AOB_ELEMENT#y indicated by the variable y. The following first explains thee processing in the AOB file read procedure, with reference to FIG. 55.

{52-9__55-2}

In step S1, the CPU 10 reads the PlaylistManager and displays a list including the Default_Playlist_Information and the PLIs.

In step S2, the CPU 10 waits for an indication to play back AOBs in accordance with either the Default_Playlist_Information or one of the PLIs.

When the Default_Playlist_Information is indicated, the processing moves from step S2 to step S3 where the variable w is initialized (#w←1) and then to step S4 where the TKI#z indicated by the DPL_TKIN corresponding to DPL_TK_SRP#w in the Default_Playlist_Information is specified and only this TKI#z is read from the flash memory card 31 and stored into the TKI storing area 13.

In step S5, an AOB file#z with the same number as TKI#z is specified. In this way, the AOB file that is to be played back is finally specified.

The specified AOB file is in an encrypted state and needs to be decrypted, so that steps S6 and S7 are performed. In step S6, the playback apparatus accesses the authentication region and reads the FileKey#z that is stored in a FileKey_Entry#z in the encryption key storing file, the FileKey_Entry#z having the same number as the specified AOB file. In step S7, the CPU 10 sets the FileKey#z in the descrambler 7. This operation results in the FileKey being set in the descrambler 7, so that by successively inputting AOB_FRAMEs included in the AOB file into the descrambler 7, the AOB_FRAMEs can be successively played back.

{52-9__55-3}

After this, the playback apparatus successively reads the clusters that store the AOB file. In step S8, the "first cluster number in the file" is specified for the AOB_file#z in the directory entry. In step S9, the CPU 10 reads the data stored in this cluster from the flash memory card 31. In step S10, the CPU 10 judges whether the cluster number in the FAT value is "FFF". If not, in step S11 the CPU reads the data stored in the cluster indicated by the FAT value, before returning to step S10.

When the playback apparatus reads the data stored in any of the clusters and refers to the FAT value corresponding to this cluster, the processing in steps S10 and S11 will be repeated so long as the FAT value is not set at "FFF". This results in the playback apparatus successively reading clusters indicated by the FAT values. When the cluster number given by a FAT value is "FFF", this means that all of the clusters composing the AOB file#z have been read, so that the processing advances from step S10 to step S12.

{52-9__55-4}

In step S12, the CPU 10 judges whether the variable#w matches the total number of DPL_TK_SRPs. If not, the processing advances to step S13, where the variable#w is incremented (#w←#w+1) before the processing returns to step S4. In step S4, the playback apparatus specifies TKI#z which is indicated by the DPL_TKIN#w of DPL_TK_SRP#w in the Default_Playlist_Information, and writes only TKI#z into the TKI storing area 13. The TKI that was used up to this point will still be stored in the TKI storing area 13, though this current TKI will be overwritten by TKI#z that is newly read by the CPU 10.

This overwriting results in only the latest TKI being stored in the TKI storing area 13. Once the TKI has been overwritten, the processing in steps S5 to S12 is repeated for the AOB file#z. Once this processing has read all of the TKI and AOB files corresponding to all of the DPL_TK_SRPs included in the Default_Playlist_Information, the variable #z will match the total number of DPL_TK_SRP so that the judgement "Yes" is given in step S12 and the processing in this flowchart ends.

{52-9__56__57__58} Output Processing for an AOB_FRAME

In parallel with the AOB file reading procedure, the CPU 10 performs the AOB_FRAME output procedure in accordance with the flowcharts shown in FIGS. 56, 57, and 58. In these flowcharts, the variable "play_time" shows how long playback has been performed for a current track, which is to say, the playback time code. The time displayed in the playback time code frame on the LCD panel 5 is updated in accordance with changes to this playback time code. Meanwhile, the variable "play_data" represents the length of the data has been played back for the current track.

{52-9__56-1}

In step S21, the CPU 10 monitors whether cluster data for the AOB file#z has accumulated in the double buffer 15. This step S21 will be repeatedly performed until cluster data has accumulated, at which point the processing advances to step S22 where the variables x and y are initialized (#x←1, #y←1). After this, in step S23 the CPU 10 searches the clusters for AOB file #z and detects the AOB_FRAME#x in the AOB_ELEMENT#y that is positioned no earlier than the Data_Offset given in the BIT#z included in TKI#z. In this example, it is assumed that the seven bytes starting from the SZ_DATA are occupied by the ADTS header. By referring to the ADTS header, the data length indicated by the ADTS header can be recognized as audio data. The audio data and ADTS header are read together and are outputted to the descrambler 7. The descrambler 7 decrypts the AOB_FRAMEs, which are then decoded by the AAC decoder 8 and reproduced as audio.

{52-9_56-2}

After this detection, in step S24 the AOB_FRAME#x is outputted to the descrambler 7, and in step S25 the variable play_time is incremented by the playback period of the AOB_FRAME#x and the variable play_data is incremented the amount of data corresponding the AOB_FRAME#x. Since the playback time of AOB_FRAME is 20 msec in the present case, 20 msec is added to the variable "play_time".

Once the first AOB_FRAME has been outputted to the descrambler 7, in step S26 the playback apparatus refers to the ADTS header of AOB_FRAME#x and specifies where the next AOB_FRAME is. In step S27, the playback apparatus increments the variable #x (#x←#x+1) and sets AOB_FRAME#x as the next AOB_FRAME. In step S28, AOB_FRAME#x is inputted into the descrambler 7. After this, in step S29, the variable play_time is incremented by the playback period of the AOB_FRAME#x and the variable play_data is incremented the amount of data corresponding the AOB_FRAME#x. After incrementing AOB_FRAME#x, in step S30 the CPU 10 judges whether the variable #x has reached the value given in FNs__1st_TMSRTE.

If the variable #x has not reached the value in FNs__1st_TMSRTE, in step S31 the playback apparatus checks whether the user has pressed any key aside from the "Play" key, and then returns to step S26. The playback apparatus hereafter repeats the processing in steps S26 to S31 until the variable #x reaches the value in FNs__1st_TMSRTE or until the user presses any key aside from the "Play" key.

When the user presses a key aside from the "Play" key, the processing in this flowchart ends and suitable processing for the pressed key is performed. When the pressed key is the "Stop" key, the playback procedure stops, while when the pressed key is the "Pause" key, the playback is paused.

{52-9_57-1}

On the other hand, when the variable #x reaches the value in FNs__1st_TMSRTE, the judgement "Yes" is made in step S30, and the processing proceeds to step S32 in FIG. 57. Since all of the AOB_FRAMEs included in the present AOB_ELEMENT will have been inputted into the descrambler 7 in the processing between step S26 to S30, in step S32 the variable #y is incremented to set the next AOB_ELEMENT as the data to be processed and the variable #x is initialized (#y←#y+1,#x←1).

After this, in step S33 the playback apparatus refers to the TKTMSRT and calculates the first address of the AOB_ELEMENT#y.

The playback apparatus then performs the procedure made up of steps S34 to S42. This procedure reads the AOB_FRAMEs included in an AOB_ELEMENT one after another, and so can be said to resemble the procedure made up of steps S24 to S31. The difference with the procedure made up of steps S24 to S31 is the condition by which the procedure made up of steps S24 to S31 ends is whether the variable #x has reached the value shown by "FNs__1st_TMSRTE", while the condition by which procedure made up of steps S34 to S42 ends is whether the variable #x has reached the value shown by "FNs_Middle_TMSRTE".

When the variable #x reaches the value shown by "FNs_Middle_TMSRTE", the loop procedure made up of steps S34 to S42 ends, the judgement "Yes" is given in step S41 and the processing advances to step S43. In step S43, the CPU 10 increments the variable #y and initializes the variable #x (#y←#y+1, #x←1). After this, in step S44 the variable y judges whether the variable #y has reached a value that is equal to one less than the TotalTMSRT_entry_Number in the TMSRT_Header in the TKI#z.

When the variable #y is lower than (TotalTMSRT_entry_Number−1), the AOB_ELEMENT#y is not the final AOB_ELEMENT, so that the processing returns from step S44 to step S32 and the loop procedure of step S32 to step S42 is performed. When the variable #y reaches (TotalTMSRT_entry_Number−1) the read procedure can be assumed to have proceeded as far as the penultimate AOB_ELEMENT, so that the judgement "Yes" is given in step S44 and the processing advances to step S45 in FIG. 58.

{52-9_57-2}

The procedure composed of steps S45 to S54 resembles the procedure composed of steps S33 to S42 in that each of the AOB_FRAMEs in the final AOB_ELEMENT are read.

The difference with the procedure composed of steps S33 to S42 is that while the loop procedure composed of steps S33 to S42 ends when it is judged in step S41 that the variable #x has reached the value in "FNs_Middle_TMSRTE", the loop procedure composed of steps S45 to S54 ends when it is judged in step S53 that the variable #x has reached the value in "FNs_Last_TMSRTE" and the variable play_data showing the size of the data that has hitherto been read has reached the value given as "SZ_DATA".

The procedure composed of steps S49 to S54 is repeated until the conditions in step S53 are satisfied, at which point the judgement "Yes" is given in step S53 and the processing advances to step S55. In step S55, the CPU 10 increments the variable #z (#z←#z+1) before the processing returns to step S21 where the CPU 10 waits for the next AOB file to accumulate in the double buffer 15. Once this happens, the processing advances to step S22 and the procedure composed of steps S22 to step S54 is repeated. This means that the TKI indicated by the DPL_TKIN of the next DPL_TK_SRP is specified and the AOB file corresponding to this TKI, which is to say, the AOB file with the same number as the TKI, is specified.

After this, the playback apparatus accesses the authentication region and specifies the FileKey, out of the FileKeys in the encryption key storing file, that has the same number as the TKI, before reading this FileKey and setting it in the descrambler 7. As a result, the AOB_FRAMEs included in the AOB file having the same number as the TKI are successively read and played back.

{52-9_57-3_59} Updating of the Playback Time Code

Figure 59A:
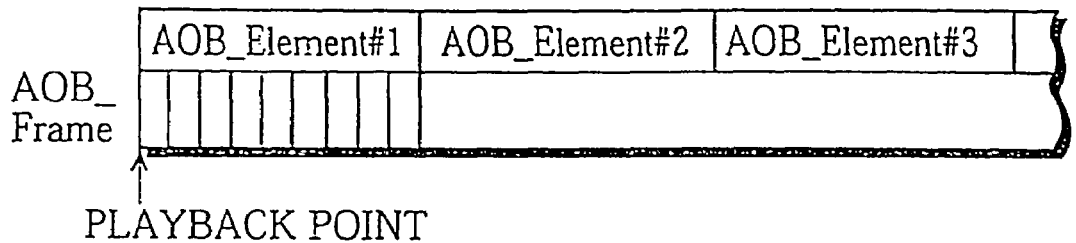
FIGS. 59A to 59D show how the playback time code displayed in the playback time code frame on the LCD panel 5 is updated in accordance with the updating of the variable Play_time.
Figure 59B:
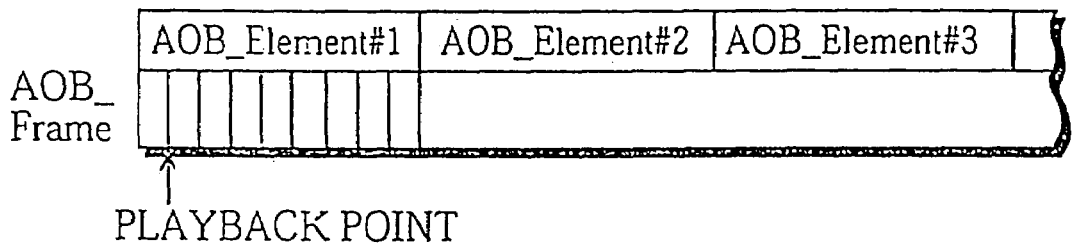
Figure 59C:
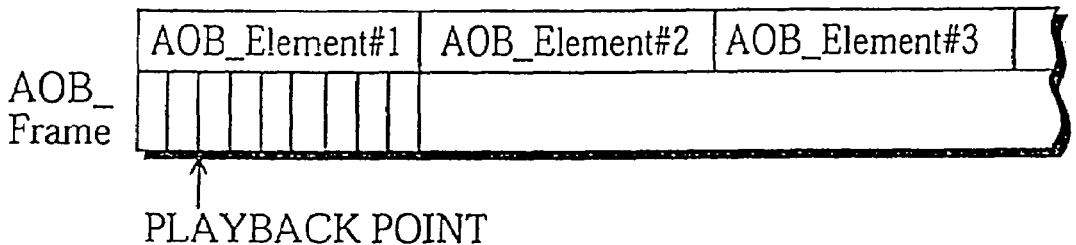
Figure 59D:
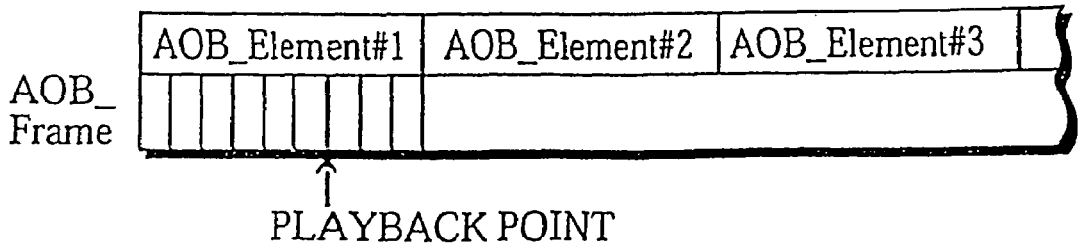

FIGS. 59A to 59D show how the playback time code displayed in the playback time code display frame of the LCD panel 5 is increased in accordance with the updating of the variable play_time. In FIG. 59A, the playback time code is "00:00:00.000", though when the playback of AOB_FRAME#1 ends, the playback period 20 msec of AOB_FRAME#1 is added to the playback time code to update it to "00:00:00.020", as shown in FIG. 59B. When the playback of AOB_FRAME#2 ends, the playback period 20 msec of AOB_FRAME#2 is added to the playback time code to update it to "00:00:00.040", as shown in FIG. 59C. In the same way, when the playback of AOB_FRAME#6 ends, the playback period 20 msec of AOB_FRAME#6 is added to the playback time code to update it to "00:00:00.120", as shown in FIG. 59D.

This completes the description of the AOB_FRAME output procedure.

In step S31 of the flowchart in FIG. 56, if the user presses a key aside from the "Play" key, the processing in this flowchart is terminated. The processing that accompanies a pressing of "Stop" or "Pause" key has already been described, though when the user presses one of the keys provided to have the playback apparatus perform special playback, the processing in this flowchart, or in the flowcharts shown in FIGS. 56, 57, or 58 is terminated and suitable processing for the pressed key is performed.

The following describes the procedure executed by the CPU 10 (1) when performing the forward search function in response to the user pressing the ">>" key and (2) when performing the time search function in response to the user operating the jog dial after pressing the "Pause" or "Stop" key.

{52-10_60} Forward Search Function

Figure 60:
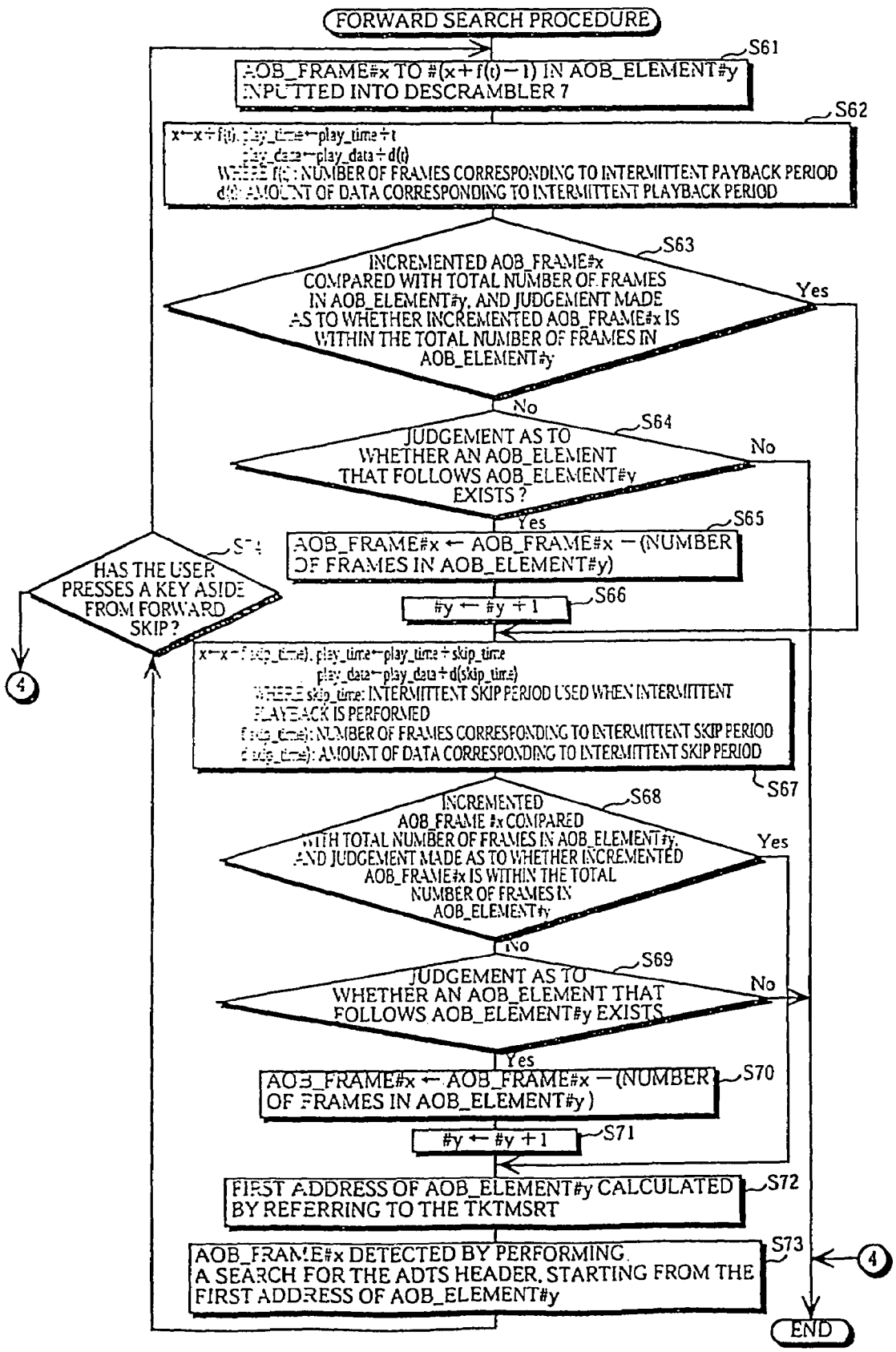
FIG. 60 is a flowchart showing the processing of the CPU 10 when the forward search function is used.

FIG. 60 is a flowchart showing the procedure executed by the CPU 10 when performing the forward search function. When the user presses the ">>" key, the judgement "Yes" is given in step S31, step S42 or step S54 in the flowcharts in FIGS. 56, 57 and 58 and the CPU 10 performs the processing in the flowchart of FIG. 60.

In step S61, the AOB_FRAMEs #x to #(x+f(t)−1) are inputted into the descrambler 7. Here "t" represents the intermittent playback period, f(t) represents the number of frames corresponding to the intermittent playback period, and d(t) represents the amount of data corresponding to the intermittent playback period. In step S62, the variable play_time showing the playback elapsed time, and the variable play_data showing the playback data amount are respectively updated using intermittent playback period "t", the number of frames f(t) corresponding to intermittent playback period, and the amount of data d(t) corresponding to the intermittent playback period (x←x+f(t), play_time←play_time+t, play_data←play_data+d(t)). Note that the intermittent playback period will generally be 240 msec (equivalent to the playback period of twelve AOB_FRAMEs).

{52-10_60-1_61A,B}

Figure 61A:
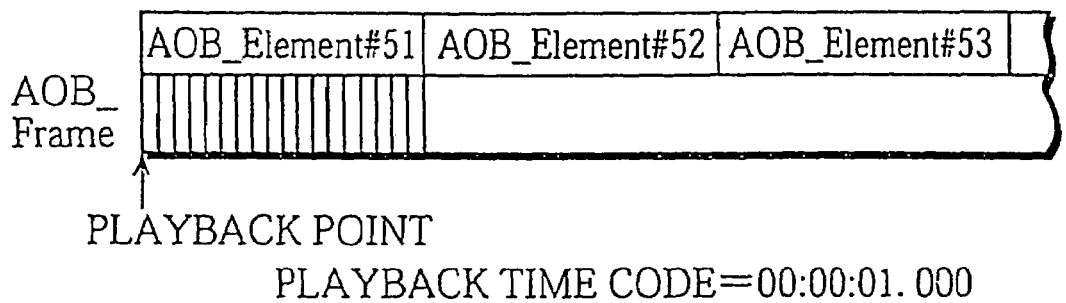
FIGS. 61A to 61D show how the playback time code is incremented when the forward search function is used.
Figure 61B:
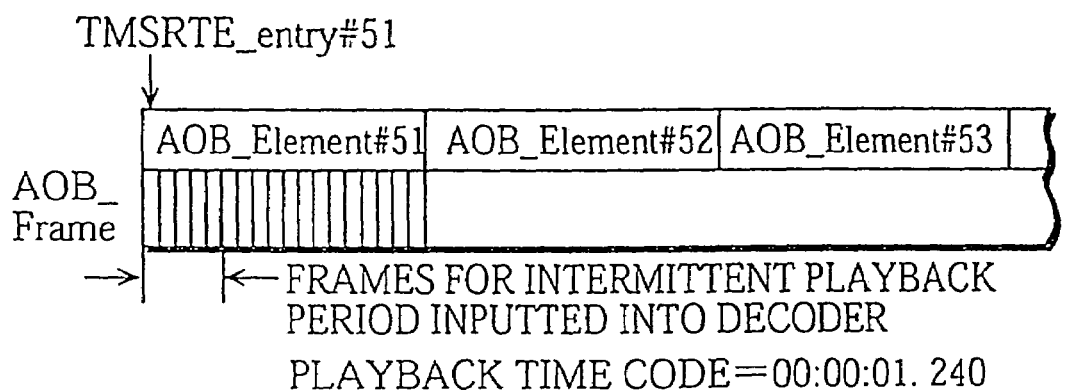

FIGS. 61A and 61B show the incrementing of the playback time code during a forward search operation. FIG. 61A shows the initial value of the playback time code, with the playback point being the AOB_FRAME#1 in AOB_ELEMENT#51.

The playback time code in this case is "00:00:01.000". When the first to twelve AOB_FRAMEs have been inputted into the descrambler 7 as the intermittent playback period, the playback period of twelve AOB_FRAMEs (i.e., 240 msec) is added to the playback time code so that the playback time code becomes "00:00:01.240", as shown in FIG. 61B.

{52-10_60-2}

After this updating, in step S63 the CPU 10 compares the incremented variable #x with the total number of frames in AOB_ELEMENT#y and judges whether the incremented variable #x is within the total number of frames in AOB_ELEMENT#y.

As mentioned earlier, the number of frames in an AOB_ELEMENT positioned at the start of an AOB is "FNs_1st_TMSRTE", the number of frames in an AOB_ELEMENT positioned in a central part of an AOB is "FNs_Middle_TMSRTE", and the number of frames in an AOB_ELEMENT positioned at the end of an AOB is "FNs_Last_TMSRTE".

The CPU 10 performs the above judgement by comparing an appropriate one of these values with the variable #x. When the variable x is not within the present AOB_ELEMENT#y, the CPU 10 then judges in step S64 whether there is an AOB_ELEMENT that follows the AOB_ELEMENT#y.

When the AOB_ELEMENT#y is the final AOB_ELEMENT in an AOB_BLOCK, there will be no AOB_ELEMENT that follows the AOB_ELEMENT#y, so that the judgement "No" is given in step S64 and the processing in the present flowchart ends. Conversely, when an AOB_ELEMENT that follows the AOB_ELEMENT#y exists, in step S65 the variable #x is reduced by the number of AOB_FRAMEs in the AOB_ELEMENT#y and in step S66 the variable #y is updated (#y←#y+1). As a result, the variable #x will now indicate the frame position of a frame in the next AOB_ELEMENT#y indicated by the updated variable #y. Conversely, when the variable #x indicates an AOB_FRAME that is present in the current AOB_ELEMENT (S63:Yes), the processing in steps S64-S66 is skipped and the processing advances to step S67.

{52-10_60-3}

After this, the variables #x, play_time, and play_data are updated in accordance with the intermittent skip period. The period "skip_time" that is equivalent to the intermittent skip period is two seconds, the number of frames that are equivalent to this skip_time is given as f(skip_time) and the amount of data that is equivalent to this skip_time is given as d(skip_time). In step S67, these values are used to update the variables #x, play_time, and play_data (#x←#x+f(skip_time), play_times←play_time+skip_time, and play_data←play_data+d(skip_time)).

{52-10_60-4_61C}

Figure 61C:
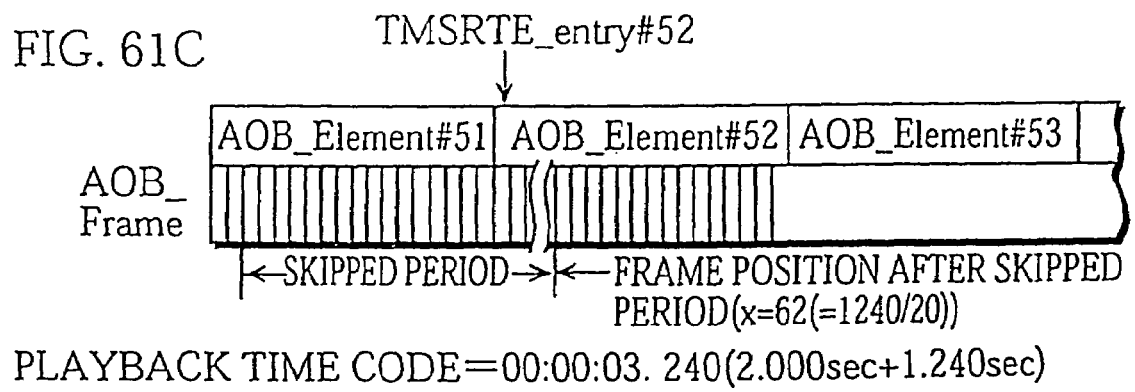

As shown in FIG. 61C, the intermittent skip period is added to the variable#x showing a frame position within the AOB_ELEMENT#51. When the updated variable #x exceeds the number of frames in AOB_ELEMENT#51, the variable #y is updated to indicate the next AOB_ELEMENT and the number of frames in the AOB_ELEMENT#51 is subtracted from the variable #x. As a result, the variable #x will now indicate a frame position within the AOB_ELEMENT#52 indicated by the updated variable #y. The value 2.000 (=2 sec) is then added to the present value "00:00:01.240" of the playback time code so that it becomes "00:00:03.240". The variable #x is updated by calculating (3240 msec−2000 msec)/20 msec) to give the value "62", and so indicates the AOB_FRAME#62 in the AOB_ELEMENT#52.

{52-10_60-5_61(d)}

Figure 61D:
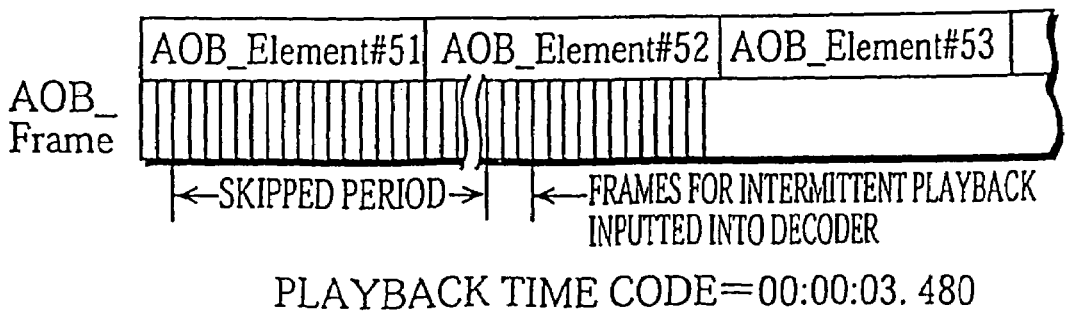

Once the AOB_FRAME#62 in the AOB_ELEMENT#52 has been inputted into the descrambler 7, the playback time code is updated as shown in FIG. 61D by adding "0.240" to the present value of "00:00:03.240" to give "00:00:03.480".

In step S67, the variables are updated in accordance with the intermittent skip time and then the processing in steps S68 to S71 are performed. This processing in steps S68 to S71 is the same as the processing in steps S63 to S66 and so updates the variable#x by a number of frames that is equivalent to the intermittent skip time "skip_time", before checking whether the variable#x still indicates an AOB_FRAME within the present AOB_ELEMENT#y. If not, the variable #y is updated so that the next AOB_ELEMENT is set as the AOB_ELEMENT#y and the variable#x is converted so as to indicate a frame position in this next AOB_ELEMENT.

Once the variables #x and #y have been in accordance with the intermittent playback time and intermittent skip time, in step S72 the CPU 10 refers to the TKTMSRT and calculates the start address for the AOB_ELEMENT#y. Then, in step S73, the CPU 10 starts to search for an ADTS header starting from the start address of, the AOB_ELEMENT#y to detect the AOB_FRAME#x. In step S74, the CPU 10 judges whether the user has pressed any key aside from the forward search key. If not, the AOB_FRAMEs from the AOB_FRAME#x to the AOB_FRAME#x+f(t)−1 are inputted into the descrambler 7, and the processing in steps S62 to S73 is repeated.

The above procedure increments the variables #x and #y that indicate the AOB_FRAME#x and AOB_ELEMENT#y, and so advances the playback position. After this, if the user presses the "Play" key, the judgement "No" is given in FIG. 74 and the processing in the present flowchart ends.

{52-11} Execution of the Time Search Function

The following describes the processing performed when the time search function is used. First, the tracks in the Default_Playlist_Information are displayed and the user indicates a desired track. When this track has been indicated and the user has operated the jog dial, the playback time code is updated. If the user then presses the "Play" key, the playback time code at that point is used to set a value in the variable "Jmp_Entry" in seconds.

A judgement is then made as to whether the indicated track is composed of a plurality of AOBs or a single AOB. When the track is composed of a single AOB, the variables #y and #x are calculated so as to satisfy Equation 2. After this, a search for the AOB_FRAME#x is started from the address in the $(y+2)^{th}$ position in the TKTMSRT corresponding to this AOB. Once this AOB_FRAME#x has been found, playback starts from AOB_FRAME#x.

{52-12}

When the track is composed of a plurality of AOBs, the variables #n (indicating an AOB), #y and #x are calculated so as to satisfy Equation 3. After this, a search for the AOB_FRAME#x is started from the address in the $(y+2)^{th}$ position in the TKTMSRT corresponding to AOB#n. Once this AOB_FRAME#x has been found, playback starts from AOB_FRAME#x.

The following describes the case when playback is commenced from an arbitrary position with an AOB where the "FNs_1st_TMSRTE" in the BIT is "80 frames". "FNs_Middle_TMSRTE" in the BIT is "94 frames", and the "FNs_Last_TMSRTE" in the BIT is "50 frames".

{52-13__62A,B}

As one specific example of when the time search function is used, the following describes how the AOB_ELEMENT and frame position from which playback should start are specified when a playback time code is indicated using the jog dial.

Figure 62A:
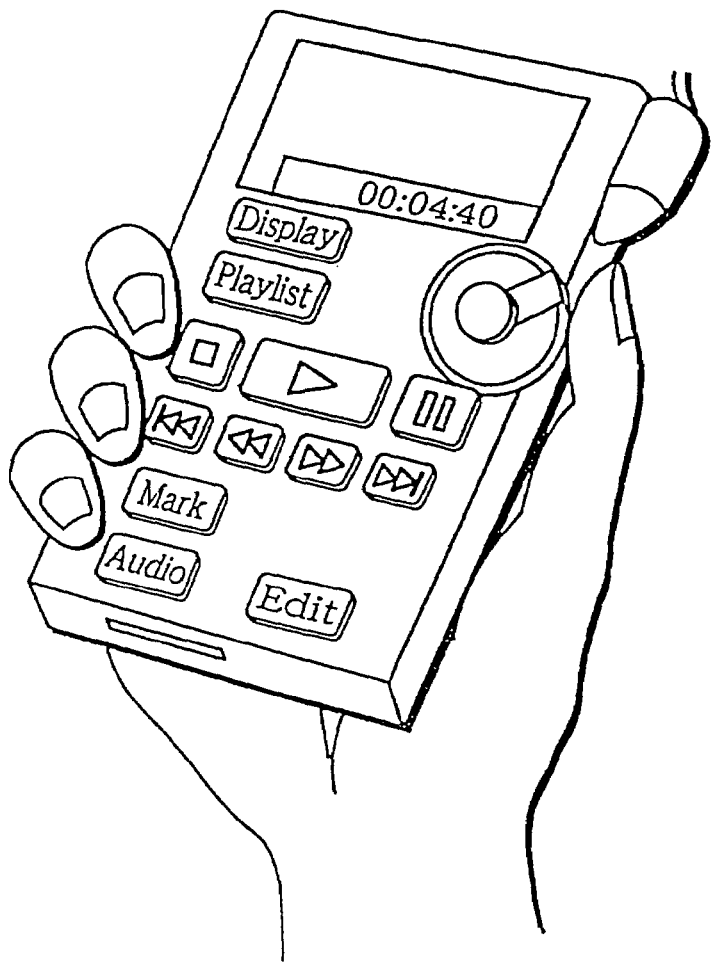
FIGS. 62A and 62B show specific examples of how the time search function is used.
Figure 62B:
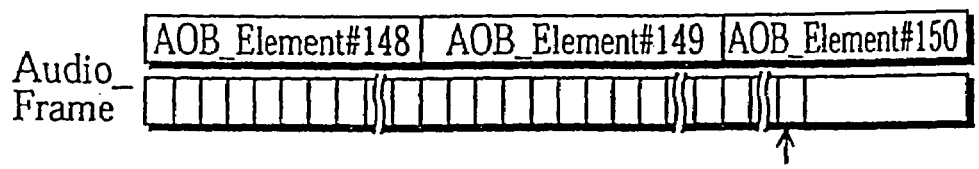

As shown in FIG. 62A, the user holds the playback apparatus in his/her hand and rotates the jog dial with his/her right thumb to indicate the playback time code "00:04:40.000 (=280 sec)". When the BIT in the TKI for this AOB is as shown in FIG. 62B, Equation 2 is used as follows $$280 \text{ sec} = (FNs\_1st\_TMSRTE + (FNs\_Middle\_TMSRTE*y)+x)*20 \text{ msec} = (80+(94*148)+8)*20 \text{ msec}$$

so that the Equation 2 is satisfied for the values y=148 and x=8.

Since y=148, the entry address of the AOB_ELEMENT#150 (=148+2) is obtained from the TKTMSRT. Playback from the indicated playback time code 00:04:40.000 (=280.00 sec) can then be performed by starting the playback at the eighth AOB_FRAME from this entry address.

{52-14__63__64__65}

This completes the explanation of the processing of the CPU 10 in response to the user pressing the "Play" key. The following describes the editing control program stored in the ROM 4. This editing control program is executed when the user presses the "Edit" key, and contains the procedures shown in FIGS. 63, 64, and 65. The following describes the processing in this program with the flowcharts shown in these drawings.

{52-14__63-1} Editing Control Program

Figure 63:
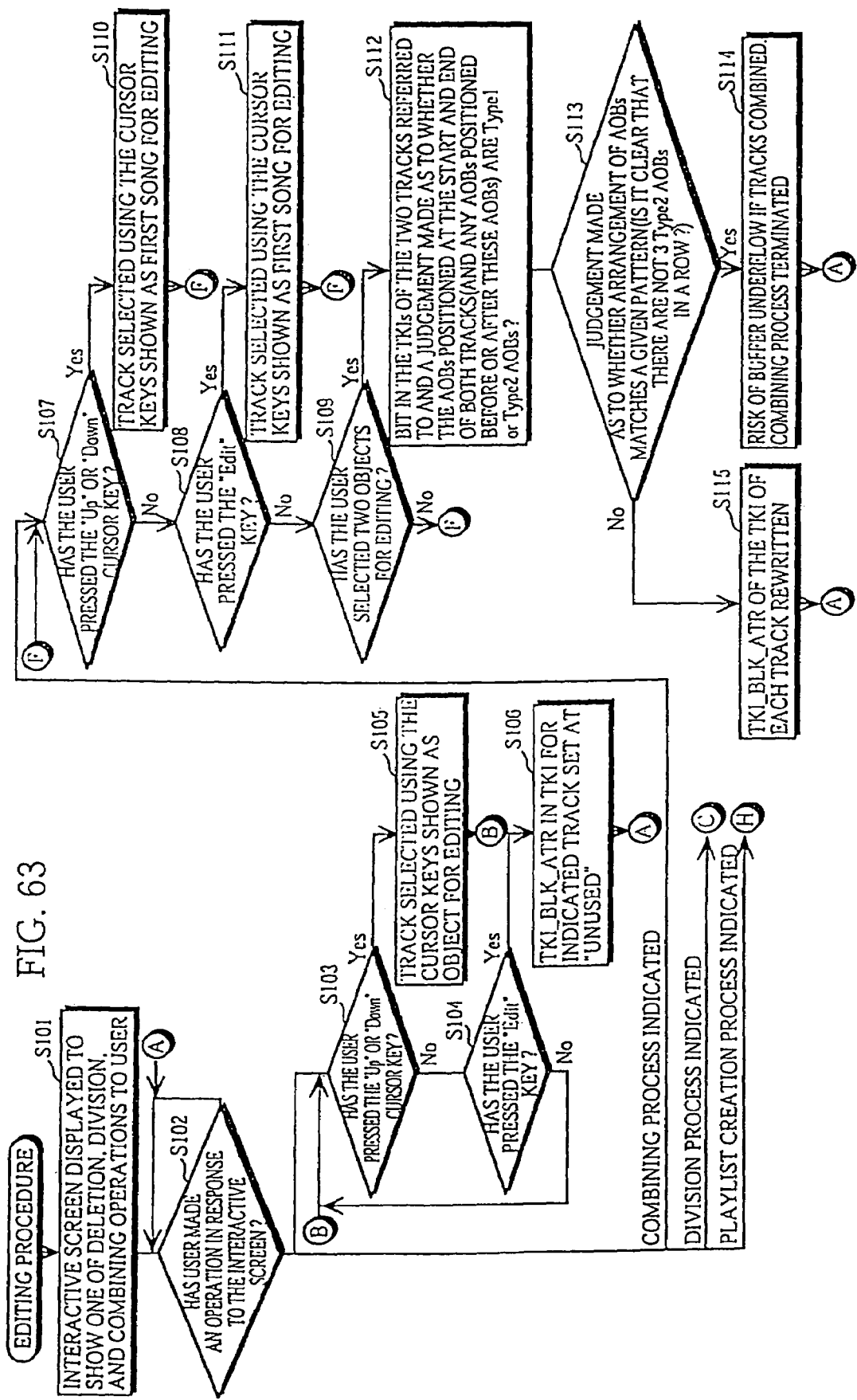
FIG. 63 is a flowchart showing the processing in the editing control program.
Figure 64:
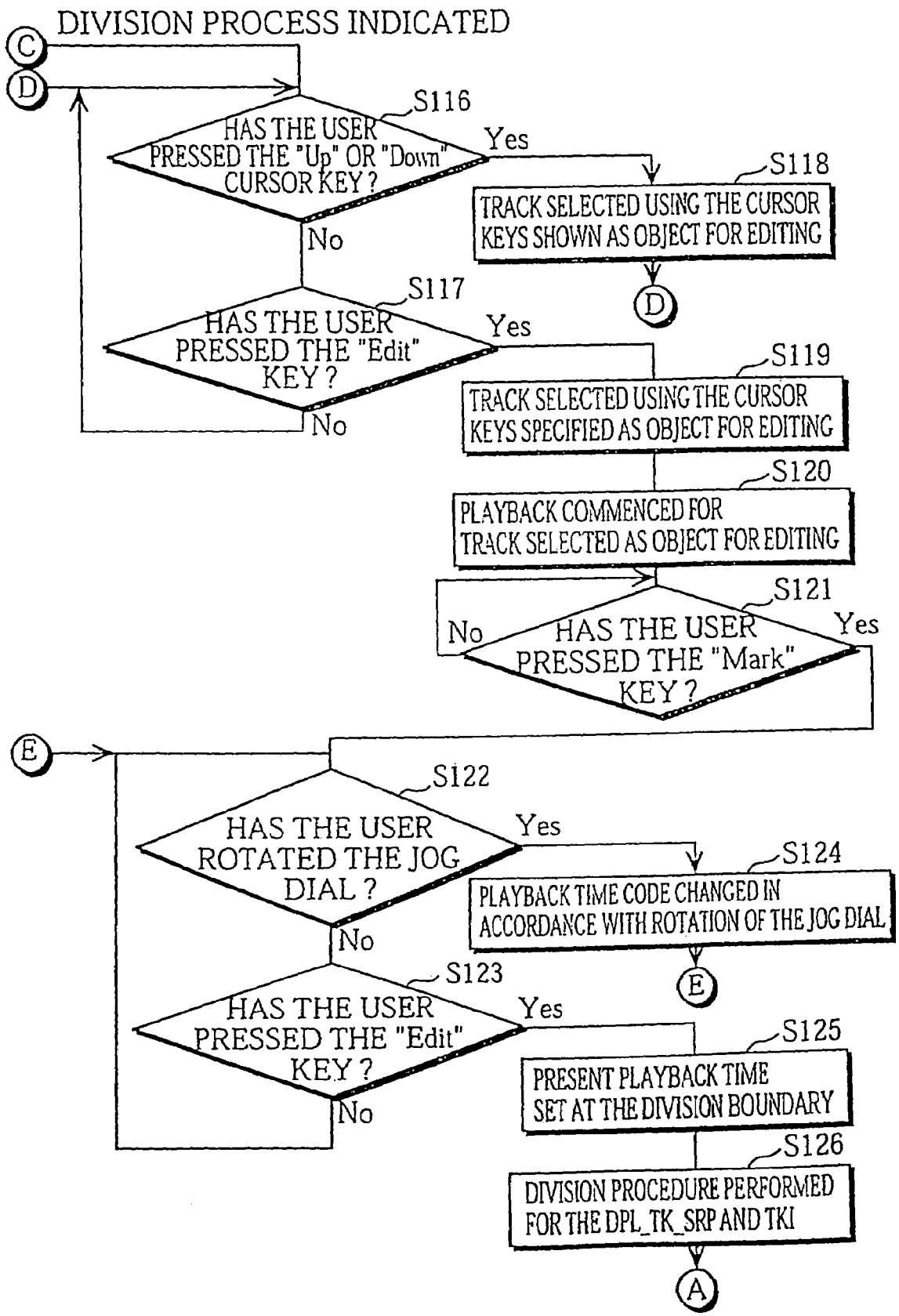
FIG. 64 is a flowchart showing the processing in the editing control program.

When the user presses the "Edit" key, an interactive screen is displayed in step S101 in FIG. 63 to ask the user which of the three fundamental editing operations "deletion", "division" and "combining" is to be performed. In step S102, the CPU 10 judges what operation has been made by the user in response to the interactive screen. In the present example, it is assumed that the "|<<" and ">>|" keys on the key panel are also used as indicating "Up" and "Down" cursor operations, (i.e., these keys are used as "Up" and "Down" cursor keys). When the user indicates a "deletion" operation, the processing proceeds to the loop procedure composed of steps S103 and S104.

In step S103, the CPU 10 judges whether the user has pressed the "|<<" or ">>|" key. In step S104, the CPU 10 judges whether the user has pressed the "Edit" key. When the user has pressed the "|<<" or ">>|" key, the processing advances from step S103 to S105, where the indicated track is set as the track to be edited. On the other hand, when the user has pressed the "Edit" key, the indicated track is set as a track to be deleted. The processing shown in FIG. 44 is executed, so that the TKI_BLK_ATR of each TKI for the indicated track is set at "Unused" to delete the indicated track.

{52-14__63-2} Combining Process

When the user selects the combining process, the processing proceeds from step S102 to the loop procedure composed of steps S107 to S109. In the loop procedure composed of steps S107 to S109, the playback apparatus receives user inputs via the "|<<", ">>|", and "Edit" keys. When the user presses the "|<<" or ">>|" key, the processing advances from step S107 to step S110 where the indicated track is highlighted on the display. When the user presses the "Edit" key, the judgement "Yes" is given in step S108 and the processing advances to step S111. In step S111, the currently indicated track is set as the first track to be used in this editing process and the processing returns to the loop procedure composed of steps S107 to S109.

When a second track has been selected for editing, the judgement "Yes" is given in step S109, and the processing advances to step S112. In step S112, the CPU 110 refers to the BITs in the TKIs of the former and the latter tracks and judges what kind of AOBs (Type1 or Type2) are present at the respective start and end of each of these tracks and tracks on either side of these tracks, if present.

After identifying the type of each relevant AOB, in step S113 the CPU 10 judges whether the arrangement of AOBs matches a certain pattern. When the arrangement of AOBs matches one of the four patterns shown in FIG. 32A to 32D where it is clear that three Type2 AOBs will not be present consecutively after the combining, the former and latter tracks are combined into a single track in step S115.

In the other words, the operation shown in FIG. 46 is performed for the TKI and DPL_TK_SRP corresponding to these AOBs. By rewriting the TKI_BLK_ATRs in the TKIs, the plurality of tracks selected for editing are combined into a single track. When the arrangement of AOBs does not match any of the patterns in FIGS. 32A to 32D, meansing that there will be three or more Type2 AOBs after the combining, the CPU 10 judges that the combined track may cause a buffer underflow and so terminates the combining process.

{52-14_64-1} Track Division Process

When the user indicates that a track is to be divided, the processing advances from step S102 to the loop procedure composed of steps S116 to S117. In the loop procedure composed of steps S116 to S117, the playback apparatus receives user inputs via the "|<<", ">>|", and "Edit" keys.

When the user presses the "|<<" or ">>|" key, the processing advances from step S116 to step S118 where the indicated track is set as the track to be edited. When the user presses the "Edit" key, the judgement "Yes" is given in step S117 and the processing advances to step S119.

In step S119, the indicated track is determined as the track to be edited and the processing advances to step S120 where the playback of this track is commenced. In step S121, the playback apparatus receives a user input via the "Mark" key.

When the user presses the "Mark" key, the playback of the track is paused and the processing advances to the loop procedure composed of steps S122 and S123. In step S122, the playback apparatus receives user operations made via the jog dial. When the user rotates the jog dial, the playback time code is updated in step S124 in accordance with the rotation of the jog dial.

After this, the loop procedure composed of steps S122 and Sl23 is repeated. If the user presses the "Edit" key, the processing proceeds from step S123 to step S125, where the playback time code displayed when the user pressed the "Edit" key is set as the division boundary. Note that an "Undo" function may be provided for this setting of the division boundary to allow the user to invalidate the selected division boundary.

After this, the processing explained with reference to FIG. 47 is executed in step S126 to update the DPLI and TKI so as to divide the selected track.

{52-14_65-1} Process Setting a Playlist

Figure 65:
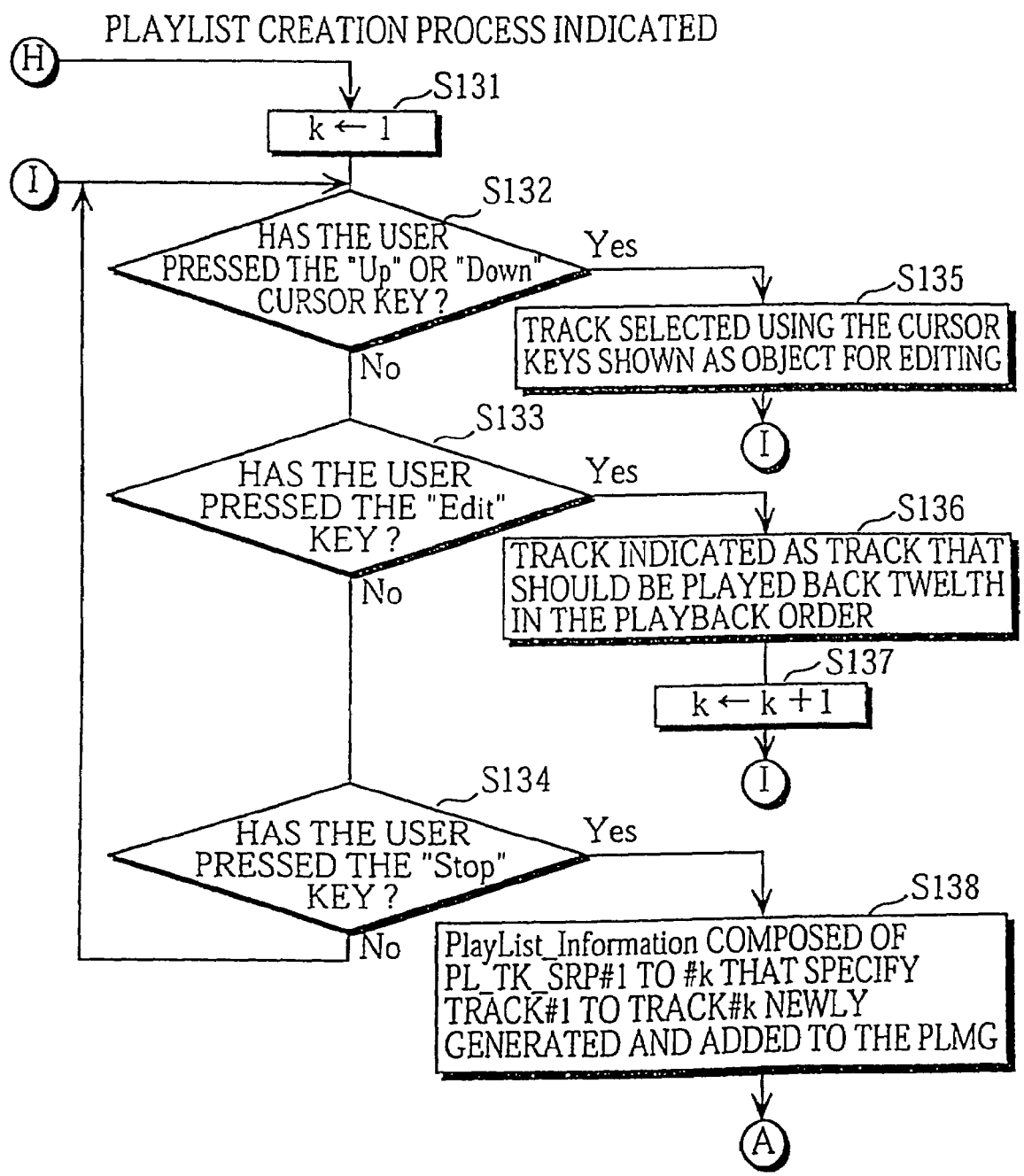
FIG. 65 is a flowchart showing the processing in the editing control program.

When the user chooses to set a Playlist, the processing switches to the procedure shown by the flowchart in FIG. 65. In this flowchart, the variable k given in this flowchart is used to indicate the position of a track in the playback order given by the Playlist that is being edited. The flowchart in FIG. 65 starts with this variable k being initialized to "1" in step S131, before the processing advances to the loop procedure composed of steps S132 to S134.

In the loop procedure composed of steps S132 to S134, the playback apparatus receives user operations made via the "|<<", ">>|", "Edit", and "Stop" keys. When the user presses the "|<<" or ">>|" key, the processing advances from step S132 to step S135 where a new track is indicated in accordance with the pressing of the "|<<" or ">>|" key. If the user presses the "Edit" key, the judgement "Yes" is given in step S133 and the processing advances to step S136.

In step S136, the track indicated when the user presses the "Edit" key is selected as the kth track in the playback order. After this, in step S137 the variable k is incremented and the processing returns to the loop procedure composed of steps S132 to S134. This procedure is repeated so that the second, third, and fourth tracks are successively selected. If the user presses the "Stop" key after having specified several tracks that are to be played back in the specified order as a new Playlist, the processing advances from step S134 to step S138 where a PLI composed of PL_TK_SRPs that specify the TKIs corresponding to these tracks is generated.

{66-1} Recording Apparatus

Figure 66:
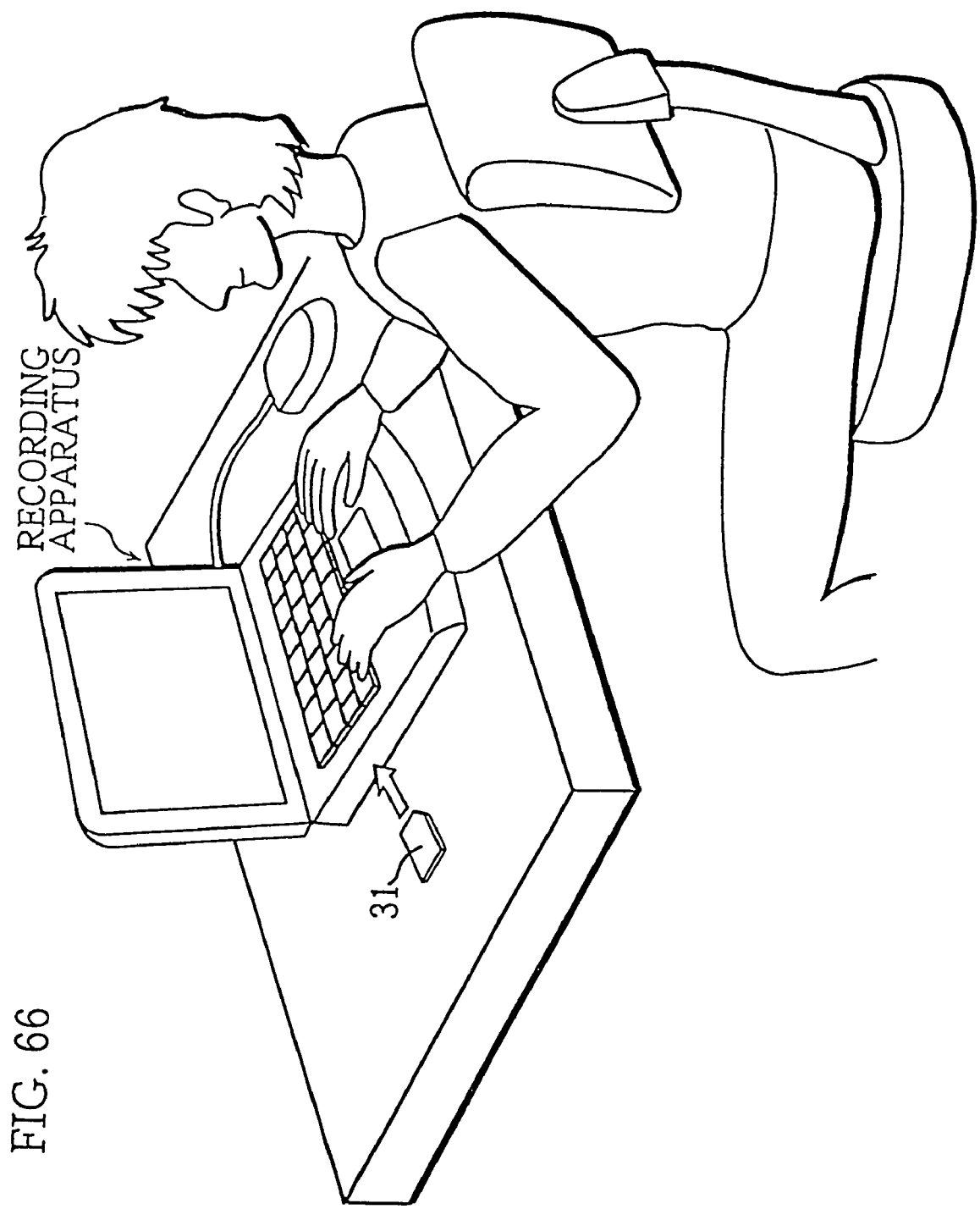
FIG. 66 shows one example of a recording apparatus for recording data onto the flash memory card 31.

The following describes one example of a recording apparatus for the flash memory card 31. FIG. 66 shows one example of a recording apparatus. This recording apparatus can be connected to the Internet, and is a standard personal computer that can perform reception when an encrypted SD-Audio directory is sent via communication lines to the recording apparatus by an electronic music distribution service, or when an audio data transport stream is sent via communication lines to the recording apparatus by an electronic music distribution service.

{67-1} Hardware Composition of the Recording Apparatus

Figure 67:
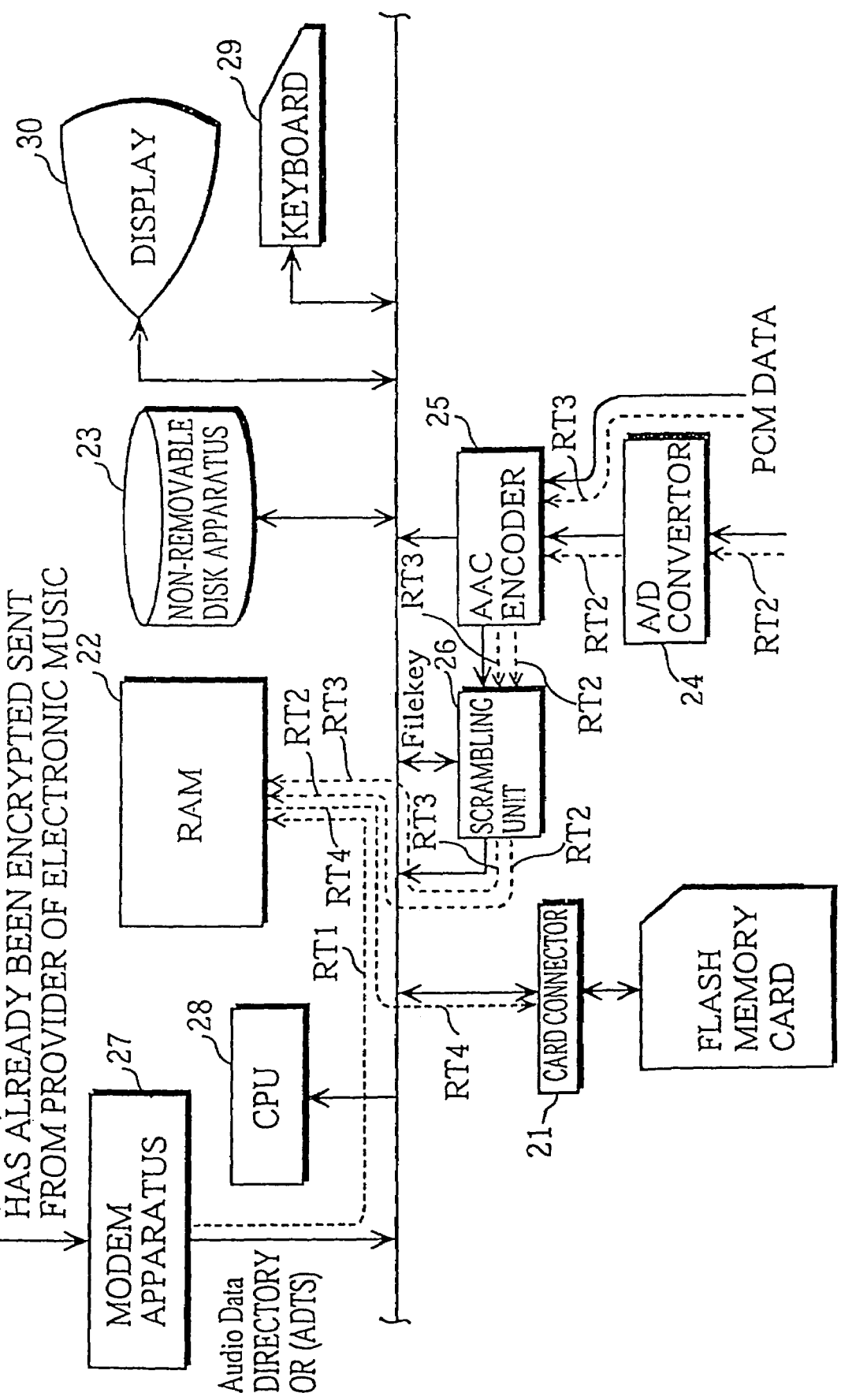
FIG. 67 shows the hardware configuration of the recording apparatus.

FIG. 67 shows the hardware composition of the present recording apparatus.

As shown in FIG. 67, the recording apparatus includes a card connector 21 for connecting the recording apparatus to the flash memory card 31, a RAM 22, a non-removable disk apparatus 23 for storing a recording control program that performs overall control over the recording apparatus, an A/D converter 24 that A/D converts audio inputted via a microphone to produce PCM data, an ACC encoder 25 for encoding the PCM data in units of a fixed time and assigning ADTS headers to produce AOB_FRAMEs, a scrambling unit 26 for encrypting the AOB_FRAMEs using a different FileKey for each AOB_BLOCK, a modem apparatus 27 for receiving an audio data transport stream when an encrypted SD-Audio directory is sent via communication lines to the recording apparatus by an electronic music distribution service, or when an audio data transport stream is sent via communication lines to the recording apparatus by an electronic music distribution service, a CPU 28 for performing overall control over the recording apparatus, a keyboard 29 for receiving inputs made by the user, and a display 30.

{67-2} Input Circuits RT1 to RT4

When an encrypted SD-Audio directory, which is to be written in the data region and the authentication region, is sent via communication lines to the recording apparatus by an electronic music distribution service, the recording apparatus can write the encrypted SD-Audio directory into the data region and authentication region of the flash memory card 31 as soon as the encrypted SD-Audio directory has been properly received.

However, (1) when an audio data transport stream that is not in the form of SD-Audio directory is sent to the recording apparatus by an electronic music distribution service, (2) when data is inputted into the recording apparatus in PCM format, or (3) when analog audio is recorded by the recording apparatus, the recording apparatus uses the following four input routes to write an audio data transport stream onto the flash memory card 31.

As shown in FIG. 67, the four input routes RT1, RT2, RT3, and RT4 are used to input an audio data transport stream when an audio data transport stream is stored in the flash-memory card 31.

{67-3} Input Route RT1

The input route RT1 is used when an encrypted SD-Audio directory is sent via communication lines to the recording apparatus by an electronic music distribution service, or when an audio data transport stream is sent via communication lines to the recording apparatus by an electronic music distribution service. In this case, the AOB_FRAMEs included in the transport stream are encrypted so that a different FileKey is used for the AOB_FRAMEs in different AOBs. Since there is no need to encrypt or encode an encrypted transport stream, the SD-Audio directory or audio data transport stream can be stored directly into the RAM 22 in its encrypted state {67-4} Input Route RT2

Input route RT2 is used when audio is inputted via a microphone. In this case, the audio inputted via the microphone is subjected to A/D conversion by the A/D converter 24 to produce PCM Data. The PCM data is then encoded by the AAC encoder 25 and assigned ADTS headers to produce AOB_FRAMEs. After this, the scrambling unit 26 encrypts the AOB_FRAMEs using a different FileKey for each AOB_FRAMEs in different AOB_FILEs to produce encrypted audio data. After this, the encrypted audio data is stored in the RAM 22.

{67-5} Input Route RT3

Input route RT3 is used when PCM data read from a CD is inputted into the recording apparatus. Since data is inputted in PCM format, the data can be inputted as it is into the AAC encoder 25. This PCM data is encoded by the ACC encoder 25 and assigned ADTS headers to produce AOB_FRAMEs.

After this, the scrambling unit 26 encrypts the AOB_FRAMEs using a different FileKey for the AOB_FRAMEs in different AOBs to produce encrypted audio data. After this, the encrypted audio data is stored in the RAM 22.

{67-6} Input Route RT4

The input route RT4 is used when a transport stream inputted via one of the three input routes RT1, RT2, and RT3 is written into the flash memory card 31.

This storing of audio data is accompanied by the generation of TKIs and Default_Playlist_Information. In the same way as the playback apparatus, the main functioning of the recording apparatus is stored in the ROM. This is to say, a recording program that includes the characteristic processing of the recording apparatus, which is to say, the recording of AOBs, the TrackManager, and the PlaylistManager, is stored in the non-removable disk apparatus 23.

{67-7_68} Processing of the Recording Apparatus

Figure 68:
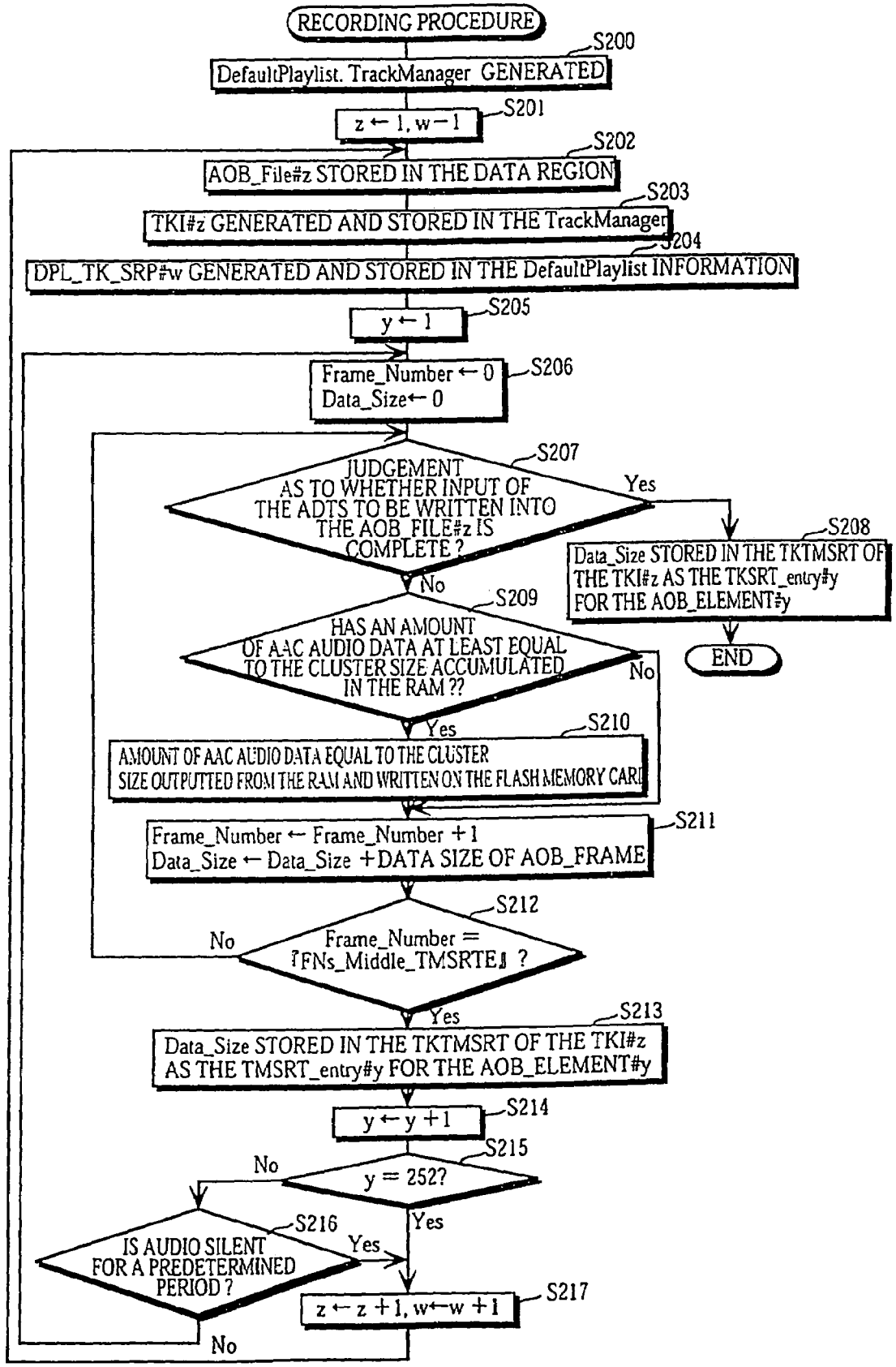
FIG. 68 is a flowchart showing the processing during recording.

The following describes the processing in the recording procedure that writes a transport stream in the flash memory card 31 via the input routes RT1, RT2, RT3 and RT4, with reference to the flowchart in FIG. 68 that shows this processing.

The variables "Frame_Number" and "Data_Size" used in this flowchart are as follows. The variable Frame_Number is used to manage the total number of AOB_FRAMEs that have already been recorded in an AOB_FILE. The variable Data_Size is used to manage the data size of the AOB_FRAMEs that have already been recorded in the AOB_FILE.

The processing in this flowchart starts in step S200 with the CPU 28 generating the DefaultPlaylist and the TrackManager. In step S201, the CPU 28 initializes the variable #z (z←1). In step S202, the CPU 28 generates the AOB_FILE#z and stores it in the data region of the flash memory card 31. At this point, the filename, filename extension, and first cluster number for the AOB_FILE#z will be set in a directory entry in the SD_Audio Directory in the data region. After this, in step S203, the CPU 28 generates TKI#z and stores it in the TrackManager. Instep S204, the CPU 28 generates the DPL_TK_SRP#w and stores it in the Default_Playlist_Information. After this, in step S205 the CPU 28 initializes the variable #y (#y←1) and in step S206, the CPU 28 initializes the Frame_Number and Data_Size (Frame_Number←0, Data_Size←0).

In step S207, the CPU 28 judges whether the input of the audio data transport stream that should be written in the AOB_FILE# has ended. When the input of an audio data transport stream that has been encoded by the AAC encoder 25 and encrypted by the scrambling unit 26 into the RAM 22 continues and it is necessary to continue the writing of cluster data, the CPU 28 gives the judgement "No" in step S207 and the processing advances to step S209.

In step S209, the CPU judges whether the amount of AAC audio data that has accumulated in the RAM 22 is at least equal to the cluster size. If so, the CPU 28 gives the judgement "Yes" and the processing advances to step S210 where an amount of AAC audio data equal to the cluster size is written into the flash memory card 31. The processing then advances to step S211.

When sufficient AAC audio data has not accumulated in the RAM 22, step S210 is skipped and the processing advances to step S211. In step S211, the CPU increments the Frame_Number (Frame_Number←Frame_Number+1) and increases the value of the variable Data_Size by the data size of the AOB_FRAME.

After this updating, in step S212 the CPU 28 judges whether the value of Frame_Number has reached the number of frames that is set in "FNs_Middle_TMSRTE", the value of "FNs_Middle_TMSRTE" is set in accordance with the sampling frequency used when encoding the audio data transport stream. When the value of Frame_Number has reached the number of frames set in "FNs_Middle_TMSRTE", the CPU 28 gives the judgement "Yes" in step S212. If not, the CPU 28 gives the judgement "No" and the processing returns to step S207. The processing in steps S207 to S212 is therefore repeated until the judgement "Yes" is given in either step S207 or in step S212.

When the variable Frame_Number reaches the value of "FNs_Middle_TMSRTE", the CPU 28 gives the judgement "Yes" in step S212 and the processing advances from step S212 to step S213 where Data_Size is stored in the TKTMSRT of TKI#z as the TMSRT_entry#y for the AOB_ELEMENT#y. In step S214, the CPU 28 increments the variable #y (#y←#y+1) before checking in step S215 whether the variable #y has reached "252".

The value "252" is used since this is the maximum number of AOB_ELEMENTs that can be stored in a single AOB. If the variable #y is below 252, the processing advances to step S216, where the CPU 28 judges whether a silence of a predetermined length is present in the encoded audio, which is to say that the audio data has reached a gap present between tracks. When no such continuous silence is present, the processing composed of steps S206 to S215 is repeated. When the variable #y has reached the value 252, or a silence of a predetermined length is present in the encoded audio, the judgement "Yes" is given in one of steps S215 and S216 and the processing advances to step S217 where the variable #z is incremented (#z←#z+1).

After this, the processing in steps S202 to S216 is repeated for the incremented variable #z. By repeating this processing, the CPU 28 can have AOBs including a plurality of AOB_ELEMENTs recorded one after the other into the flash memory card 31.

When the transfer of an audio data transport stream by the AAC encoder 25, the scrambling unit 26, and the modem apparatus 27 is complete, this means that the input of the audio data transport stream to be written into the AOB_FILE#z will also be complete, so that the judgement "Yes" is given in step S207 and the processing advances to step S208. In step S208, the CPU 28 stores the value of the variable Data_Size in the TKTMSRT of the TKI#z as the TMSRT_Entry#y for the AOB_ELEMENT#y. After storing the audio data accumulated in the RAM 22 in the AOB file corresponding to the AOB#z, the processing in this flowchart ends.

The above processing results in an encrypted audio data transport stream being stored in the flash memory card 31. The following procedure is then used to store the FileKey required for decrypting this encrypted audio data transport stream in the authentication region.

When the audio data transport stream has been inputted via input route RT1, the AOB file(s), the file storing the TKMG, the file storing the PLMG, and the encryption key storing file storing a different FileKey for each AOB are sent to the recording apparatus by a provider of the electronic music distribution service. The CPU 28 receives these files and writes the AOB file(s), the file storing the TKMG, and the file storing the PLMG into the user region of the flash memory card 31. On the other hand, the CPU 28 writes only the encryption key storing file storing a different FileKey for each AOB into the authentication region.

When the audio is inputted via the input route RT2 or RT3, the CPU 28 generates a different FileKey every time the encoding of a new AOB commences and sets the generated key in the scrambling unit 26. In addition to being used by the scrambling unit 26 to encrypt the present AOB, this FileKey is stored following the FileKey Entry in the encryption key storing file present in the authentication region.

With the present embodiment described above, the files storing AOBs are encrypted using different encryption keys, so that if the encryption key used to encrypt one file is decoded and exposed, the exposed encryption key can only be used to decrypt a file storing one AOB, with such exposure having no effect on other AOBs that are stored in other files. This minimizes the damage caused when one encryption key is exposed.

Note that while the above description focuses on an example system that is thought to be the most effective embodiment of the present invention, the invention is not limited to this system. Various modifications are possible within the scope of the invention, with examples of the such being given as (a) to (e) below.

(a) The above embodiment describes a semiconductor memory (flash memory card) as the recording medium used, though the present invention can be applied to other media including optical discs, such as DVD-RAM, or a hard disk.

(b) In the above embodiment, the audio data was described as being in AAC format, though the present invention can also be applied to audio data in another format such as MP3 (MPEG 1 Audio Layer 3), Dolby-AC3, or DTS (Digital Theater System).

(c) While the file storing the TKMG and the file storing the PLMG were described as being received from the provider of the electronic music distribution service in a complete form, the main information used to create the TKMG and PLMG can be transmitted together with the encryption key storing file that stores a different encryption key for each AOB. The recording apparatus may then process this information to obtain the TKMG and PLMG which it then records in the flash memory card.

(d) For ease of explanation, the recording apparatus and playback apparatus were described as being separate devices, though a portable playback apparatus can be equipped with the functioning of the recording apparatus and a recording apparatus in the form of a personal computer can be equipped with the functions of the playback apparatus. Aside from the portable playback apparatus and personal computer recording apparatus, the functions of the playback apparatus and recording apparatus can also be provided to a communication device that is capable of downloading content from a network.

As one example, a mobile telephone capable of Internet access may be provided with the functions of the playback apparatus and recording apparatus described in the above embodiment. This mobile telephone may store contents downloaded via a wireless network in the flash memory card 31 in the same way as in the above embodiment. Also, while the recording apparatus described in the above embodiment is provided with the modem apparatus 27 for connecting to the Internet, any other device capable of connecting to the Internet, such as a terminal adapter for an ISDN line, may be provided instead.

(e) The procedures shown in the flowcharts shown in FIGS. 55 to 58, FIG. 60, FIG. 63 to FIG. 65, and FIG. 68 can be achieved by executable programs that may be distributed and sold having been recorded on a recording medium. This recording medium may be an IC card, an optical disc, a floppy disk, or the like, with the programs recorded on the recording medium being used having first been installed into standard computer hardware. By performing processing in accordance with such installed programs, standard computer hardware can perform the same functioning as the playback apparatus and recording apparatus described in the above embodiment.

(f) While the above embodiment describes the case where a plurality of AOBs and a plurality of FileKeys are stored on the flash memory card 31, only one AOB and one FileKey need be stored. Also, it is not essential for the AOBs to be encrypted, so that AOBs may be stored on the flash memory card 31 in ACC format.

Second Embodiment

The second embodiment of the present invention relates to an improvement in the storage of still images together with the AOB files described in the first embodiment. These still images are to be displayed when the AOB files are played back.

{69-1} Hierarchical Construction of the Flash Memory Card of the Second Embodiment FIG. 69 shows the hierarchical construction of the flash memory card 31 of this second embodiment. The hierarchical construction for the flash memory card 31 described in this embodiment differs from that of the first embodiment in that POBs (picture objects) have been added to the presentation data and a POBManagers has been added to the navigation data. POBs are pieces of still image data in JPEG (Joint Photographic Experts Group) format and are referred to by the PlaylistManager and the TrackManager. The POBManager is management information that describes how the POBs should be referred to by the PlaylistManager and the TrackManager.

{69-1_70A-1} Composition of the User Data Area in the File System Layer

Since extra information is added to the presentation data and navigation data in this embodiment, the internal compositions of the user data area and the protected area in the file system layer are modified to those shown in FIGS. 70A and 70B. The user data area shown in FIG. 70A differs from that shown in FIG. 8A in that files named "POBXXX.JPG" and "POBXXX.SP1" have been added, in addition to the POBManager file "POB000.POM".

The files "POBXXX.JPG" and "POBXXX.SP1" correspond to the POBs shown in FIG. 69, while the file "POB000.POM" corresponds to the POBManager. The difference between the files "POBXXX.JPG" and "POBXXX.SP1" lies in whether copyright protection is necessary. Files with a "JPG" filename extension are merely files containing still image data in JPEG format, while files with an "SP1" filename extension have been encrypted to protect the copyrights over the still images. Here, "SP" is an abbreviation for "Secure Picture" and shows that copyright protection is necessary.

Still images such as family photographs or memorial pictures taken by users can be recorded onto a flash memory card to allow users to personalize the stored content. Since copyright protection is generally unnecessary for such images, they can be recorded on a flash memory card in JPEG format without encryption. On the other hand, artist photographs and album artwork are generally the property of the artist or record label. Since there is the risk of users illegally copying images that have been provided by an electronic music distribution service, these images are recorded on a flash memory card as "Secure Picture" files.

The numbers "001", "002", "003", . . . assigned to the filenames "POBXXX.SP1" and "POBXXX.JPG" are the POB numbers that are assigned to individual picture objects (POBs). This means that picture objects (POBs) can be specified using POB numbers.

{69-2_70B-3} Composition of the User Data Area in the File System Layer

FIG. 70B shows the composition of the protected area in this second embodiment. When compared with the protected area shown in FIG. 8B, the protected area in this second embodiment further includes an encryption key storing file named "POBSP1.key". This file stores the FileKeys used for decrypting the (encrypted) files "POBXXX.SP1". When a file "POBXXX.SP1" is read, a FileKey needs to be extracted from this encryption key storing file "POBSP1.key".

A server computer operated by a record label that uses electronic music distribution stores the SD_Audio directories shown in FIGS. 70A and 70B. When a user orders a music content, the server computer compresses the appropriate SD_Audio directory, encrypts it, and then sends it to the user who issued the order.

The user's computer receives the SD_Audio directory, decrypts it, decompresses it, and so obtains the original SD_Audio directory. Note that the computer may instead download tracks (AOBs) with the accompanying still images (POBs) from the server computer, and then generate the SD-Audio directories shown in FIGS. 70A and 70B by itself on the flash memory card 31.

{69-3_71A,B,C-1} Internal Composition of "POBXXX.JPG" and "POBXXX.SP1" Files

The following describes the internal composition of "POBXXX.JPG" and "POBXXX.SP1" files. FIG. 71A shows the internal composition of a "POBXXX.JPG" file. This file includes still image data that has not been encrypted, and so has the same composition as a standard JPEG file.

FIG. 71B shows the internal composition of a "POBXXX.SP1" file. As shown in the drawing, such files include a POB_Header (POB_H) and encrypted still image data in JPEG format.

The broken lines hP1 shown in FIG. 71B show the internal composition of the POB_H. As shown in the drawing, the POB_H is composed of a two-byte POB_ID set at the value "FFE0" to show the present file is a POB file, a one-byte reserved region, a one-byte POB_ATR that shows whether encrypted data is present in the "POBXXX.SP1", and a four-byte POB_SZ showing the data size of the POB.

When encrypted data is present in the file "POBXXX.SP1", the value "0" is set, in the POB_ATR to show the "data body exists" (i.e., the file "POBXXX.SP1" does not make indirect reference to another file). Conversely, when encrypted data is not present in the file "POBXXX.SP1", the file will instead store the file path of a file including still image data (i.e., the file."POBXXX.SP1" indirectly refers to another file). FIG. 71C shows an example of a POB file that stores a file path instead of an encrypted data body.

The filename "photo001.JPG" given in the path "¥DCIM¥Ctg_001¥photo001.JPG" indicates a file storing still image data for a digital photograph taken using a digital still camera. When a directory path and filename are indicated in a POB file in this way, indirect reference is made to image data stored in the file "photo001.JPG" with the path "¥DCIM¥Ctg_001¥photo001.JPG". In this "POBXXX.SP1", the POB_ATR in the POBManager is set at the value "1" to show that there is "no data body".

As one example, when the device driver of a digital still camera has a requirement that the still image data recorded with the camera is recorded in a particular file in a particular directory, a POB file such as that shown in FIG. 71C can specify a JPG file storing still image data using an indirect reference file path (in FIG. 71C the device driver for the digital still camera requires files to be stored with the path "¥DCIM¥Ctg_001¥photo001.JPG" etc.). As a result, even if still image data recorded by the digital camera is recorded in a particular file and a particular directory in accordance with the needs of a device driver, such image data can still be displayed during playback of a music content.

This completes the explanation of the presentation data in this second embodiment of the present invention.

{72-1} PlayListManager and TrackManager

Figure 72:
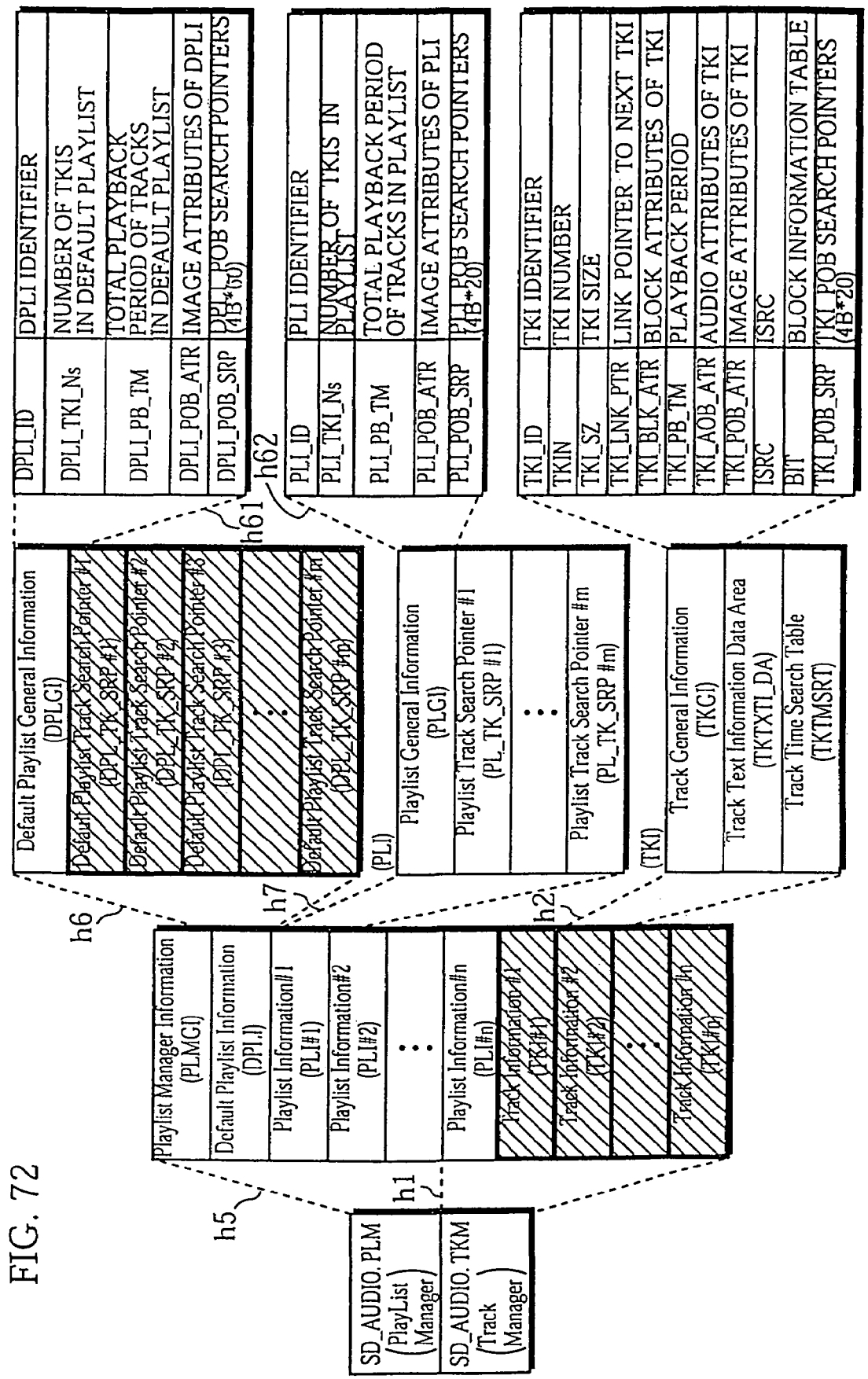
FIG. 72 shows the detailed compositions of the PlaylistManager and TrackManager in the second embodiment.

The files "POBXXX.JPG" and "POBXXX.SP1" in the presentation data are displayed in synchronization with the playback of tracks that was described in the first embodiment. To achieve such synchronous display of images with tracks, the PlaylistManager and TrackManager of the second embodiment have the compositions shown in FIG. 72. FIG 72 shows the detailed compositions of the PlaylistManager and the TrackManager in this second embodiment. The Playlist-Manager and the TrackManager in this embodiment differ from those of the first embodiment that were shown in FIG. 17 in that, unlike before, the contents of the Default_Playlist_General_Information (DPLGI) and the Playlist_General_Information (PLGI) are clearly shown, and that the TKI_POB_ATR and twenty TKI_POB_SRPs are newly provided in the TKGI.

{72-2} DPLGI

As shown by the broken lines h61, the Default_Playlist_General_Information (DPLGI) includes a DPLI_ID field in which a unique identifier for the DPLI is written, a DPLI_T-K_Ns field in which the number of tracks referred to by the DPLI is written, a DPLI_PB_TM field in which the total playback time of all of the tracks referred to by the default playlist is written in millisecond units, a DPLI_POB_ATR field, and sixty DPLI_POB_SRP fields.

{72-3} PLGI

As shown by the broken lines h62, each piece of Playlist_General_Information (PLGI) is composed of a PLI_ID field in which a unique identifier for the PLI is written, a PLI_T-K_Ns field in which the number of tracks (where the maximum is "99") referred to by the PLI is written, a PLI_PB_TM field in which the total playback time of all of the tracks referred to by the playlist is written in millisecond units, a PLI_POB_ATR field, and twenty PLI_POB_SRP fields.

{72-4_73} Overview of the Additions and Improvements Made in the Second Embodiment As can be understood from the preceding explanation, the TKGI in this second embodiment further includes two kinds of information, the TKI_POB_ATR and TKI_POB_SRPs. In the same way, the DPLGI further includes two kinds of information, the DPLI_POB_ATR and DPLI_POB_SRPs, and each PLGI further includes two kinds of information, the PLI_POB_ATR and PLI_POB_SRPs.

Figure 73:
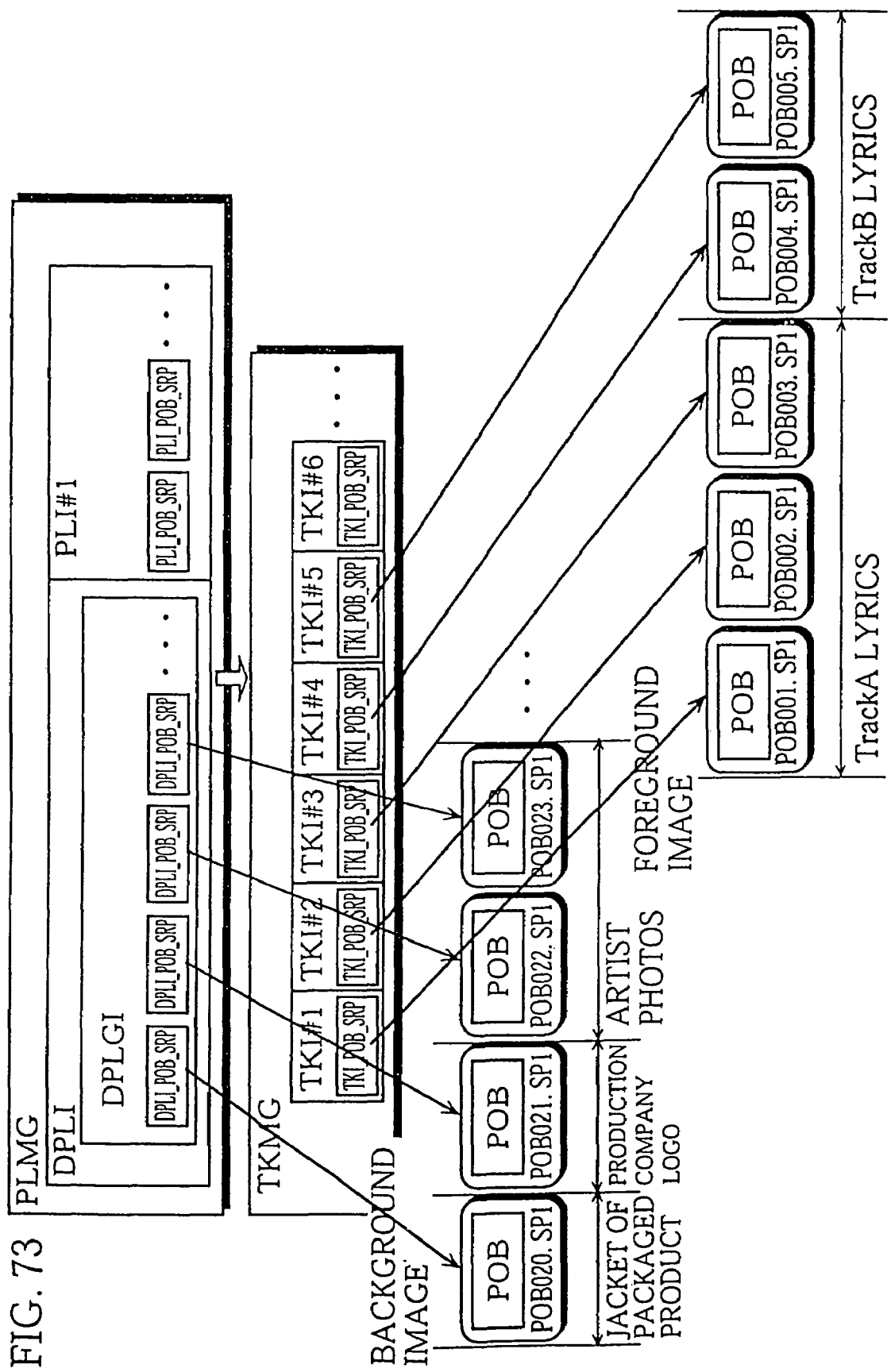
FIG. 73 shows how the POB files shown in FIG. 70 are specified by TKI_POB_SRPs, PLI_POB_SRPs, and DPLI_POB_SRPs.

The TKI_POB_SRPs, PLI_POB_SRPs, and DPLI_POB_SRPs each have the same composition and are used to specify a POB. FIG. 73 shows how POB files, such as those shown in FIG. 70A, are specified by the TKI_POB_SRPs, PLI_POB_SRPs, and DPLI_POB_SRPs. The following describes the data construction of the TKI_POB_ATR (DPLI_POB_ATR, PLI_POB_ATR) and the TKI_POB_ SRPs. (DPLI_POB_SRPs, PLI_POB_SRPs).

{74-1} TKI_POB_SRPs

A TKI_POB_SRP is a field that specifies a POB to be displayed during the playback period of a specific AOB, out of the entire playback period of the tracks indicated in order for playback by the Default_Playlist_Information or a PLI. In other words, by setting the TKI_POB_SRP in the TrackManager, a POB to be displayed during a track can be specified.

Figure 74:
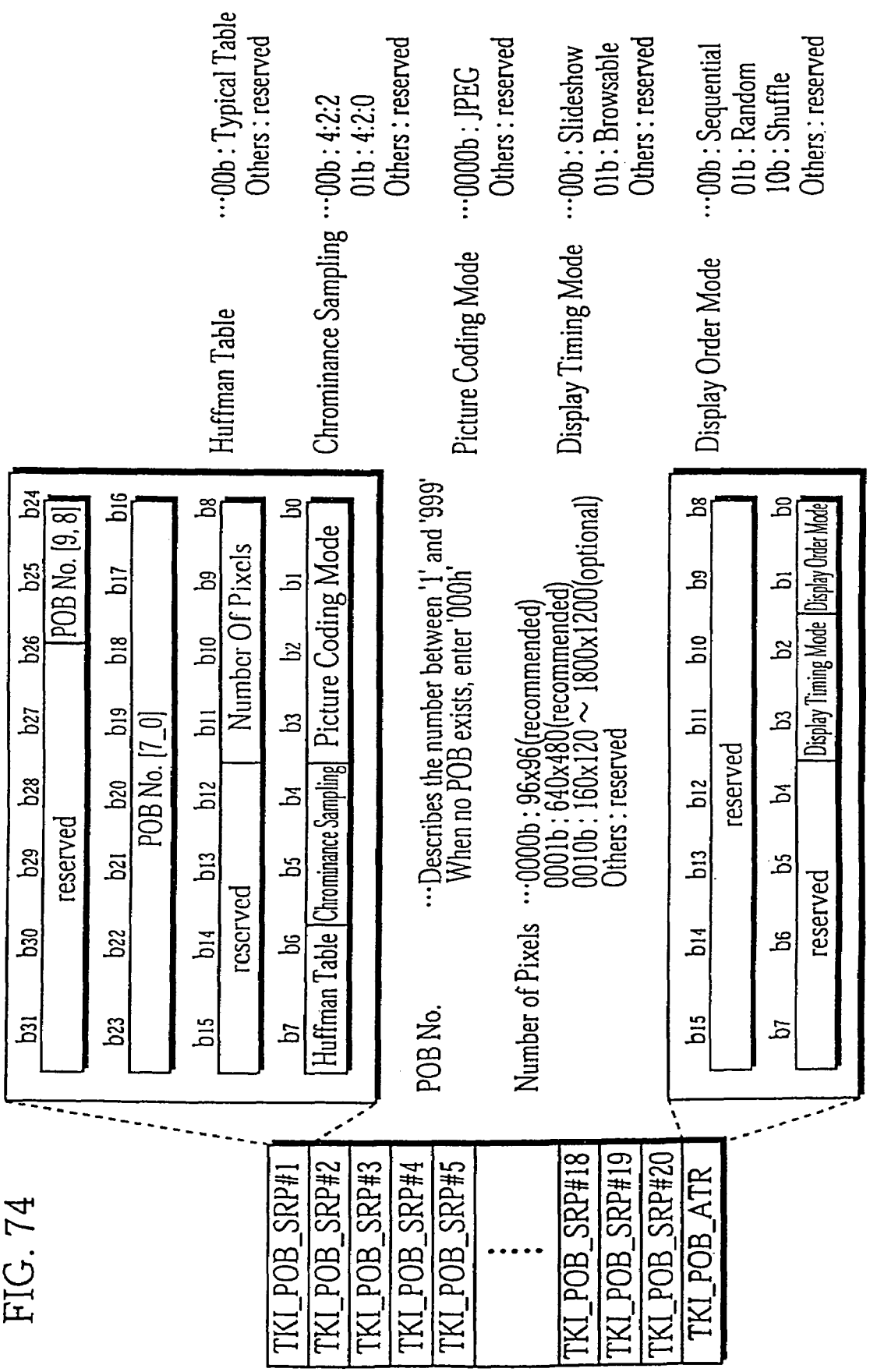
FIG. 74 shows the data compositions of the TKI_POB_ATR and a TKI_POB_SRP.

FIG. 74 shows the data construction of the TKI_POB_SRPs and TKI_POB_ATR.

As shown in the drawing, a TKI_POB_SRP is composed of a "POB specifying field" (shown as the "POB_No." in the drawing) between the bit number b25 and the bit number b16, a "Number Of Pixels" field between the bit number b11 and the bit number b8, a "Huffman Table" field between the bit number b7 and the bit number b6, a "Chrominance Sampling" field between the bit number b5 and the bit number b4, and a "Picture Coding Mode" field between the bit number b3 and the bit number b0. The fields between the bit number b12 and the bit number b15 and between the bit number b26 and the bit number b31 are reserved regions.

The "POB specifying field" is used for storing a number between "1" and "999" as the number of the POB to be displayed during the playback period of the AOB file corresponding to this TKI. When no still image is to be displayed during the playback period of the AOB file corresponding to this TKI, the "POB specifying field" is set at "0".

The "Picture Coding Mode" is a field that is used to inform a playback apparatus of the encoding method used for the still image specified by the "POB Specifying Field".

The "Chrominance Sampling" field is used to show the ratio used for the luminance sampling and the chrominance sampling of two colors when the still image specified by the "POB Specifying Field" was encoded. The binary value "00" is set in this field to indicate the ratio is "4:2:2", while the value "01" is set to indicate the ratio is "4:2:0".

The "Huffman Table" field shows whether a typical Huffman table should be used when displaying the still image specified by the "POB Specifying Field". This field is set at "00" when a Huffman table should be used.

The "Number Of Pixels" field is a field in which the size of the still image specified by the "POB specifying field" is written in pixels. The binary value "0000" is written in this field when the still image specified by the "POB Specifying Field" is 96*96 pixels, the "0001" is written when the image is 640*480 pixels, and the value "0010" is written when the image is another size that is in a range of 160*120 pixels to 1800*1200 pixels.

The TKGI includes twenty TKI_POB_SRPs with this construction, so that a maximum of twenty still images can be displayed during the playback of a track. When a track is composed of several TKIs, only the TKI_POB_SRPs in the first TKI are valid.

{74-2} TKI_POB_ATR

The "TKI_POB_ATR" is provided to specify how the POBs specified by the twenty TKI_POB_SRPs in a TKGI should be displayed. The "TKI_POB_ATR" includes a "Display Order Mode" between bit number b0 and bit number b1 and a "Display Timing Mode" between bit number b2 and bit number b3.

The "Display Order Mode" field is set to show the order in which the POBs specified by the twenty TKI_POB_SRPs in a TKGI are to be displayed. In this embodiment, POBs are displayed in one of three modes during the playback period of an AOB.

The first mode is called "Sequential Mode" and is where the POBs specified by a maximum of twenty TKI_POB_SRPs in a TKGI are displayed in the order in which the TKI_POB_SRPs are given in the TKGI.

The second mode is called "Random Mode" and is where the POBs specified by a maximum of twenty TKI_POB_SRPs in a TKGI are displayed in a random order.

The third mode is called "Shuffle Mode" and is where the POBs specified by a maximum of twenty TKI_POB_SRPs in a TKGI are displayed in a random order without repetition.

To indicate sequential mode, the binary value "00" is set in the "Display Order Mode" field. Conversely, the binary value "01" is set to indicate random mode and the binary value "10" is set to indicate shuffle mode.

The "Display Timing Mode" field is set to show whether the display of POBs specified by a maximum of twenty TKI_POB_SRPs in a TKGI should be synchronized with the playback of the AOB file corresponding to the TKI. The mode where images are synchronized with audio is called "Slideshow Mode". During "Slideshow Mode", the user is unable to skip through the images being displayed without skipping through the audio being played back.

On the other hand, the mode where images and audio are not synchronized is called "Browser Mode". In browser mode, the user can skip through images without skipping through the audio.

In this way, information showing which POBs should be displayed during the playback of the corresponding AOB file, in what order such POBs should be displayed, and whether display of POBs should be synchronized with the playback of the corresponding AOB file is set in a TGKI.

{74-3_75} Example Setting of the TKI_POB_SRPs Included in TKI#1 to TKI#3

Figure 75:
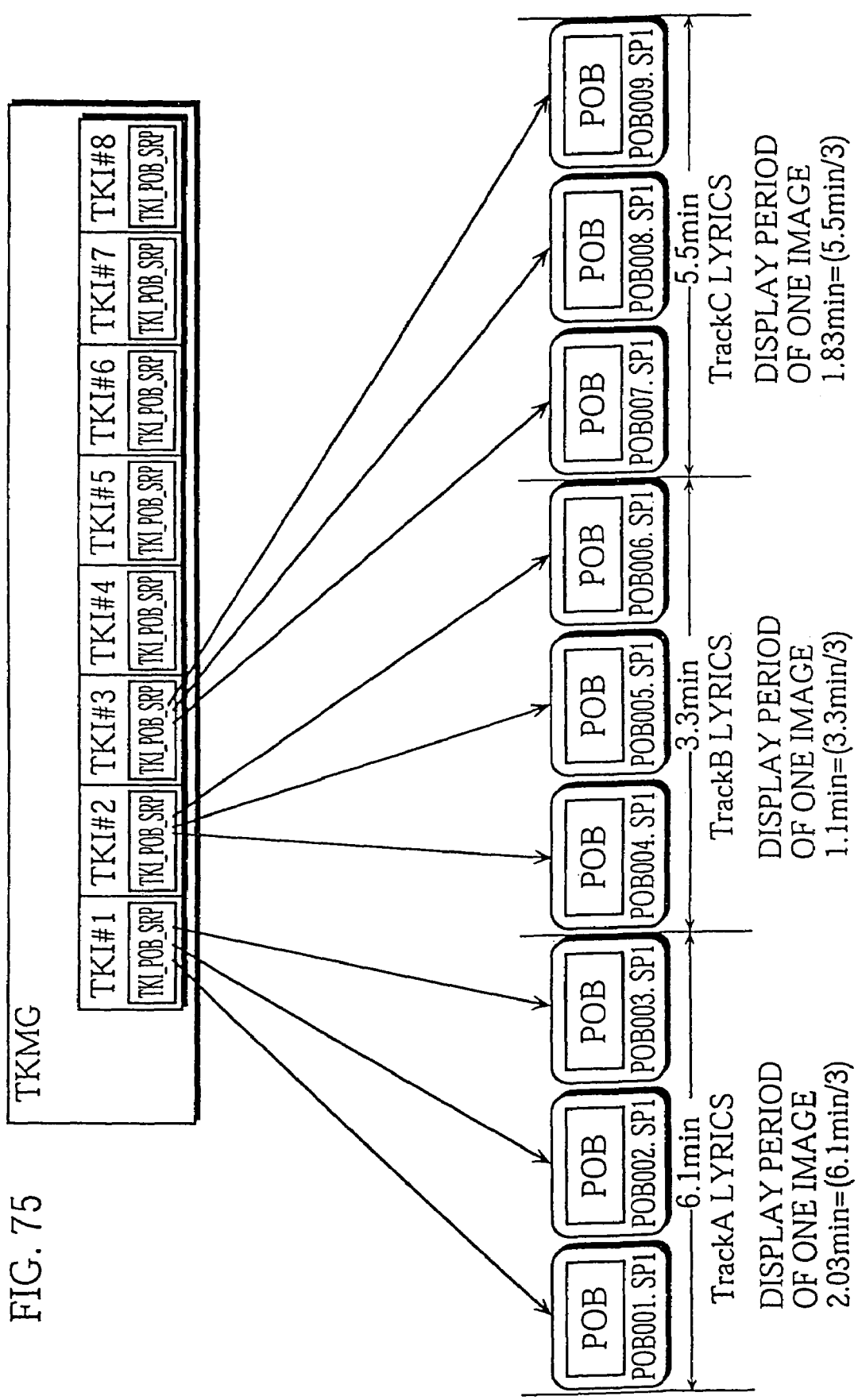
FIG. 75 shows example settings of the TKI_POB_SRPs for TKI#1 to TKI#3 in the TrackManager.

FIG. 75 shows an example setting of the TKI_POB_SRPs for TKI#1 to TKI#3 included in the TrackManager.

The first level in FIG. 75 shows the TrackManager, while the second level shows nine POB files. The TrackManager on the first level includes eight TKIs, with the arrows showing which POB files are referred to by the TKI_POB_SRPs in these eight TKIs.

As shown by the arrows, TKI#1 includes three TKI_POB_SRPs that specify POB001 to POB003, TKI#2 includes three TKI_POB_SRPs that specify POB004 to POB006 and TKI#3 includes three TKI_POB_SRPs that specify POB007 to POB009.

In this embodiment, POB001 to POB009 are assumed to JPEG image data composed of song lyrics arranged onto a plain background. The words composing the lyrics are shown using a suitable font for the mood of the song and can be subject to embellishments, such as the addition of bold outlines.

The lowest level in FIG. 75 shows the content of each POB. The content of POB001 to POB003 is the lyrics for TrackA, the content of POB004 to POB006 is the lyrics for TrackB, and the content of POB007 to POB009 is the lyrics for TrackC. Since these images will be meaningless unless they are displayed during the playback of the corresponding tracks, the TKI_POB_SRPs included in the TKIs are set so that these images are displayed during such playback.

The playback period of each track is the same as in FIG. 16 that was referred to in the first embodiment. This means that the playback period of "AOB001.SA1" corresponding to TKI#1 is 6.1 minutes, the playback period of "AOB002.SA1" corresponding to TKI#2 is 3.3 minutes, and the playback period of "AOB003.SA1" corresponding to TKI#3 is 5.5 minutes. During these playback periods, the TKI_POB_SRPs given in the TKIs will become valid, so that a playback apparatus can display POBs in accordance with these valid TKI_POB_SRPs.

The playback period of "AOBSA1.001" corresponding to TKI#1 is 6.1 minutes, so that if POB001 to POB003 are to be displayed for the same time during this period, each image will be displayed for 2.03 (=6.1/3) minutes. The playback period of "AOBSA2.001" corresponding to TKI#2 is 3.3 minutes, so that POB004 to POB006 will each be displayed for 1.1 (=3.3/3) minutes. The playback period of "AOBSA3.001" corresponding to TKI#3 is 5.5 minutes, so that POB007 to POB009 will each be displayed for 1.83 (=5.5/3) minutes.

{74-4_76} Example Setting of the TKI_POB_SRPs Included in TKI#4 to TKI#8

Figure 76:
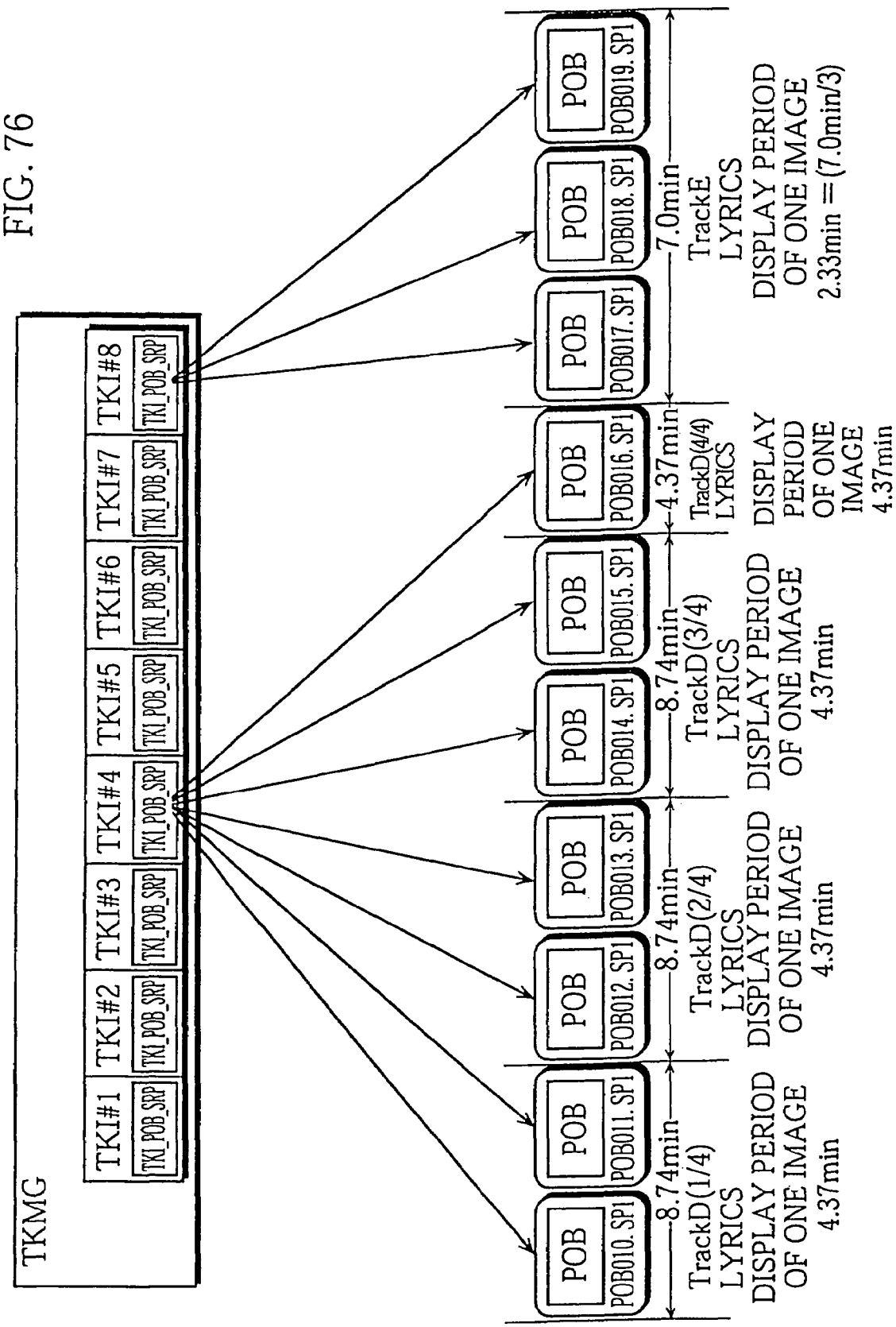
FIG. 76 shows example settings of the TKI_POB_SRPs for TKI#4 to TKI#8 in the TrackManager.

FIG. 76 shows one example of the setting of the TKI_POB_ SRPs in TKI#4 to TKI#8 included in the TrackManager. The first level shows the TrackManager, while the second level shows ten POB files. As shown by the arrows in the drawing, TKI#4 includes seven TKI_POB_SRPs that respectively specify POB010 to POB016.

In the same way, TKI#8 includes three TKI_POB_SRPs that specify POB017 to POB019. In the present embodiment, POB010 to POB019, like POB001 to POB009, are JPEG image data composed of song lyrics arranged onto a plain background. The reason that TKI_POB_SRPs are only set for TKI#4 and not for any of TKI#5 to TKI#7 is that when a single track is composed of a plurality of TKIs, only the TKI_POB_SRPs in the first TKI are valid, as stated earlier.

The content of POB010 to POB016 is the lyrics for TrackD that is shown in FIG. 16 of the first embodiment, while the content of POB017 to POB019 is the lyrics for TrackE. The total playback period of "AOB004.SA1" to "AOB007.SA1" corresponding to TKI#4 to TKI#7 is 30.6 minutes, so that the display period of each of POB010 to POB016 is 4.37 (=30.6/7) minutes. As a result, each POB can be displayed for the same period during the playback period of TrackD. Since the playback period of "AOBSA8.SA1" corresponding to TKI#8 is 7.0 minutes, the display period of each of POB017 to POB019 is 2.33 (=7.0/3) minutes.

{77-1} DPLI_POB_SRP and DPLI_POB_ATR included in the DPLGI

While the TKI_POB_SRPs can specify which POBs are to be displayed during which track, the DPLI_POB_SRPs given in the DPLGI specify the POBs that should be displayed during the playback period of a plurality of AOBs in accordance with the order specified by the Default_Playlist_Information.

Figure 77:
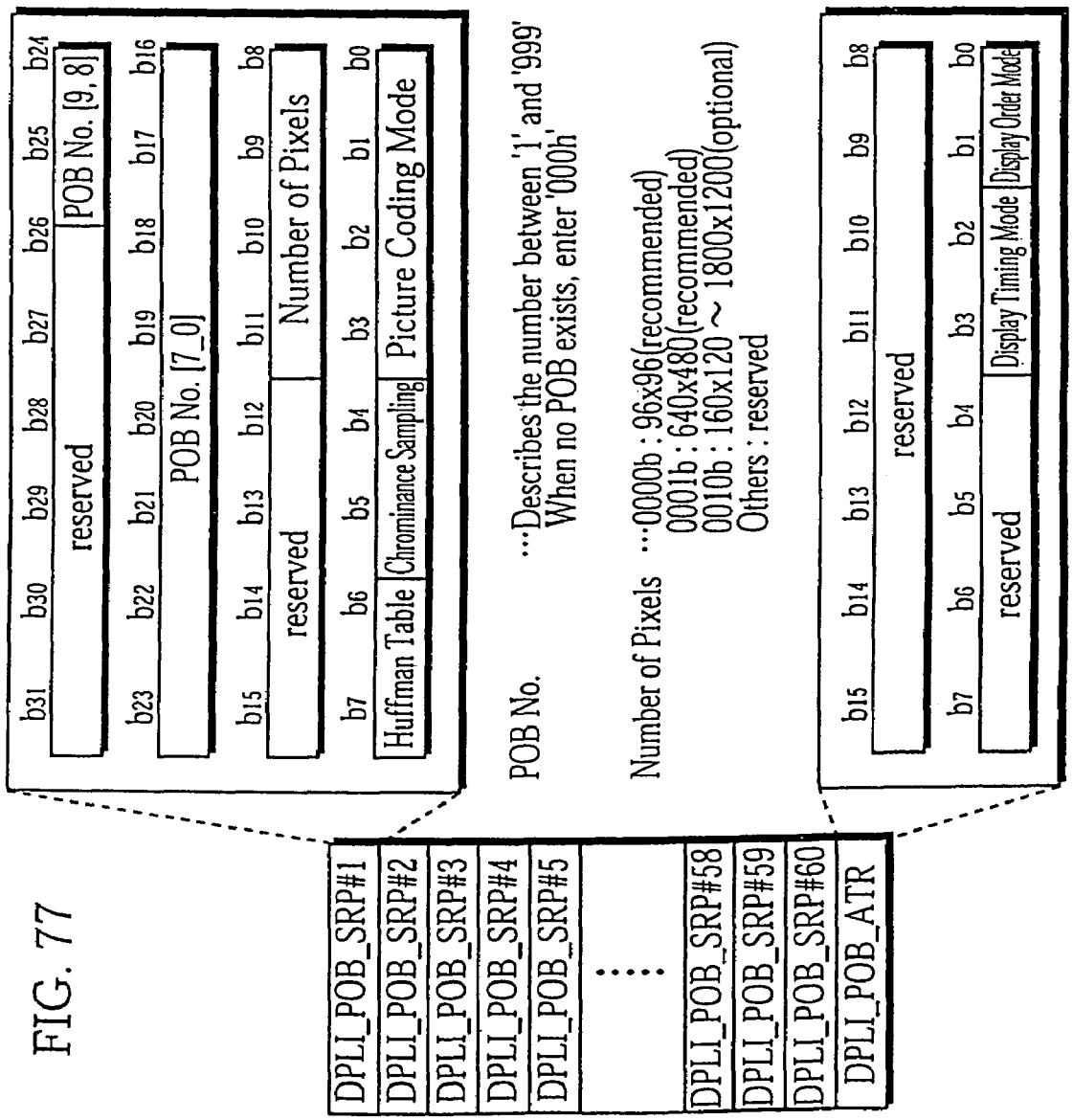
FIG. 77 shows the DPLI_POB_SRPs and DPLI_POB_ATR included in the DPLGI.

FIG. 77 shows the DPLI_POB_SRPs and DPLI_POB_ATRs included in the DPLGI. As can be seen from this drawing, the DPLI_POB_SRPs and DPLI_POB_ATRs included in the DPLGI have the same data constructions as the TKI_POB_SRPs and TKI_POB_ATRs.

Since the Default_Playlist_Information sets the playback order for a plurality of AOB files, the DPLI_POB_SRPs and DPLI_POB_ATRs given in FIG. 77 can be set to show (1) which POBs should be displayed during the playback period of the plurality of AOB files indicated by the playback order in the Default_Playback_Information, (2) in what order such POBs should be displayed, and (3) whether the display of POBs is to be synchronized with the playback of the AOB corresponding to the TKIs.

{77-2_78} Example Setting of Twenty DPLI_POB_SRPs

Figure 78:
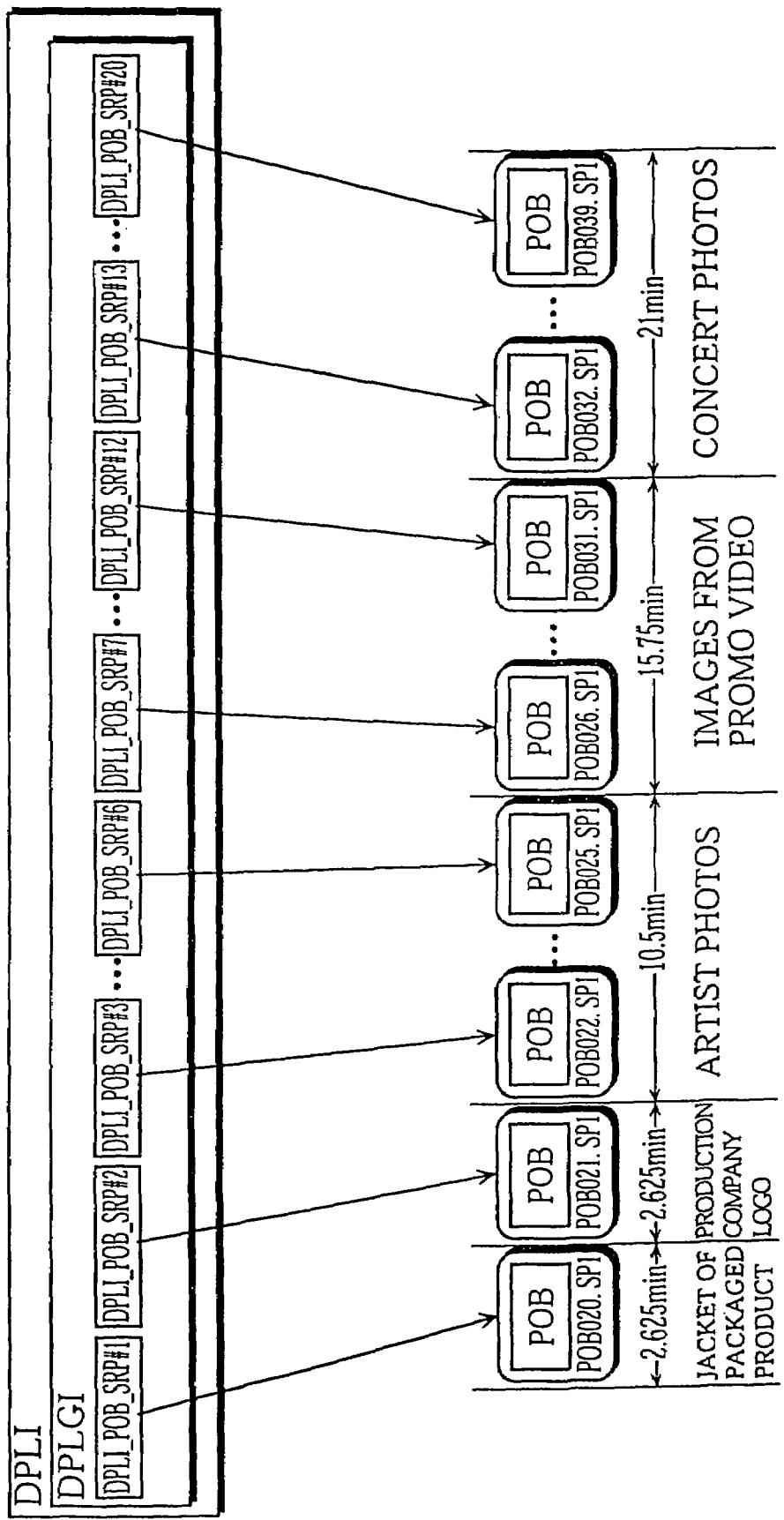
FIG. 78 shows an example setting of twenty DPLI_POB_SRPs included in the Default_Playlist_Information.

FIG. 78 shows an example setting of twenty DPLI_POB_SRPs included in the Default_Playlist_Information. The first level in the drawing shows the Default_Playlist_Information, with the inner frames showing the DPLGI and twenty DPLI_POB_SRPs. The second level shows the twenty POB files POB020 to POB039. As shown by the arrows, the twenty DPLI_POB_SRPs respectively specify the twenty POB files POB020 to POB039.

POB020 is an image used as the jacket image for the packaged version of the music album composed of TrackA to TrackE, while POB021 is a logo of the production company that produced this music album. POB022 to POB025 are artist photos, POB026 to POB031 are images taken from a promotional (promo) video, and POB032 to POB039 are photos of the artist performing TrackA to TrackE during a concert. The DPLI_POB_SRPs in the Default_Playlist_Information are defined by the producer of the music contents, and so can be set so as to have images for the tracks represented by the music contents, artist photos, etc. displayed during playback.

During the playback period of the AOB files specified by the playback order in the Default_Playlist_Information, the POB files specified by the DPLI_POB_SRPs included in the DPLGI will be displayed. For the example shown in FIG. 40, the Default_Playlist_Information specifies a playback order for the five tracks TrackA to TrackE via the eight TKIs composing these tracks. Meanwhile, in the example shown in FIG. 78, the DPLI_POB_SRPs included in this Default_Playlist_Information specify twenty POB files, with these specifications being valid during the 52.5-minute playback period of TrackA to TrackE. When this 52.5-minute playback period is to be divided equally among the POB020 to POB039, each image will be displayed for 2.625 (=52.5/20) minutes.

Figure 79:
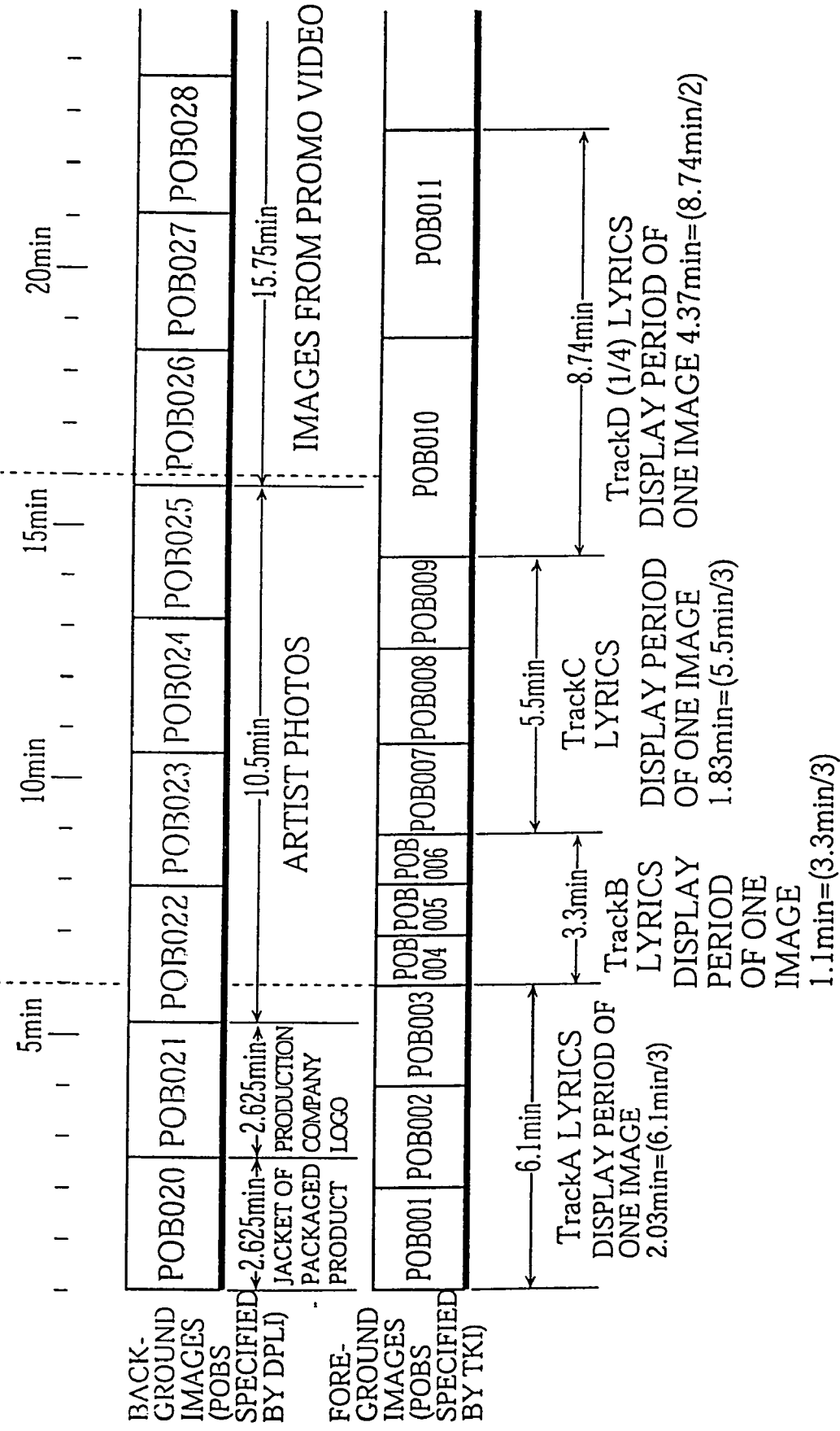
FIG. 79 is a timing chart showing how a combined image is formed when a POB specified by a DPLI_POB_SRP included in the Default_Playlist_Information is used as a background image and a POB specified by a TKI_POB_SRP included in the TrackManager is used as a foreground image.

{77-3_79} Changes in the Foreground and Background Images as Playback Progresses FIG. 79 is a timing chart showing what images are combined when the POBs specified by the DPLI_POB_SRPs included in the Default_Playlist_Information are used as background images and the POBs indicated by the TKI_POB_SRPs included in the TrackManager are used as foreground images.

The first level in the drawing shows the same POBs as the second level in FIG. 78, while the second level shows the same POBs as the second level in FIGS. 75 and 76. The scale that extends horizontally across the top of FIG. 79 shows the playback time in units of one minute. The horizontal width of each POB in FIG. 79 therefore shows the continuous display time for each POB.

By referring to the time scale in FIG. 79, it can be seen that during the period from the start of playback the point at 6.1 minutes, POB001 to POB003 (the lyrics for TrackA) are displayed are successively displayed as the foreground image, while POB020 (the jacket image), POB021 (the production company logo), and POB022 (an artist photo) are successively displayed as the background image.

In the playback period between the point 6.1 minutes after the start of playback and the point 14.9 (=6.1+3.3+5.5) minutes after the start, POB004 to POB009 (the lyrics to TrackB and TrackC) are successively displayed as foreground images while POB022 to POB025 (artist photos) are successively displayed as background images.

In the period following the point 14.9 minutes from the start of playback, POB010 to POB011 (the lyrics for TrackD) are successively displayed as foreground images while POB026 to POB028 (images taken from a promo video) are successively displayed as the background image.

{77-4_80}

In the timing chart in FIG. 79, a combined image composed of POB004 (the lyrics to TrackB) in the foreground and POB022 (an artist photo) in the background will be displayed starting from the point 6.1 minutes after the start of playback according to the Default_Playlist_Information. FIG. 80 shows how the foreground image and background image are combined at this point 6.1 minutes after the start of playback according to the Default_Playlist_Information.

{77-5_81}

In the same way, a combined image composed of POB010 (the lyrics to TrackD) in the foreground and POB026 (a shot from a promo video) in the background will be displayed starting from the point 16 minutes after the start of playback according to the Default_Playlist_Information. FIG. 81 shows how the foreground image and background image are combined at this point 16 minutes after the start of playback according to the Default_Playlist_Information.

As described above, if a combined image is produced by combining a POB file specified by a DPLI_POB_SRP in the Default_Playlist_Information as the foreground image and a POB file specified by a TKI_POB_SRP in the Default_Playlist_Information as the background image, the lyrics to the track being played back can be displayed with an artist photo, an image from the promo video of the track, a concert photo, or the like. The settings of what POB files should be displayed at what time can also be easily changed by rewriting the TKI_POB_SRPs and DPLI_POB_SRPs in the TrackManager and Default_Playlist_Information.

{82-1} PLI_POB_SRPs and PLI_POB_ATR in a PLGI

Figure 82:
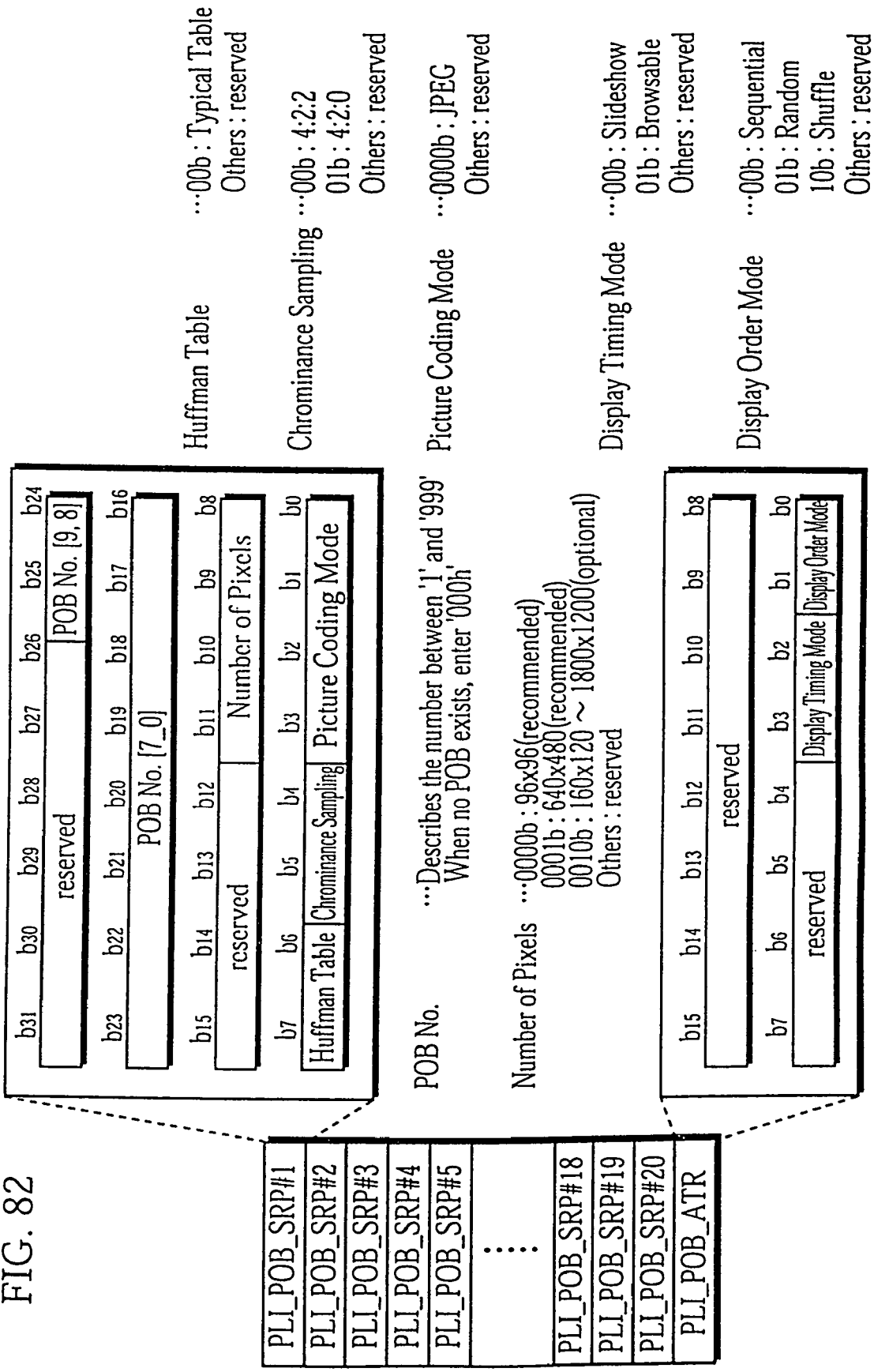
FIG. 82 shows the PLI_POB_SRPs and PLI_POB_ATR included in a PLGI.

The PLI_POB_SRPs and PLI_POB_ATR included in a PLGI have the same data constructions as the DPLI_POB_SRPs and DPLI_POB_ATR included in the DPLGI, and as the TKI_POB_SRPs and TKI_POB_ATR in a TKI. FIG. 82 shows the PLI_POB_SRPs and PLI_POB_ATRs included in a PLGI. As in the first embodiment, a PLI differs from the Default_Playlist_Information in that it shows a user-defined playback order, so that the PLI_POB_SRPs and PLI_POB_ATR show which POBs should be displayed during the playback of the plurality of AOB files specified in this user-defined playback order, in what order such POBs should be displayed, and whether display of POBs should be synchronized with the playback of the corresponding AOB files. Note that while the PLI_POB_SRPs in the Default_Playlist_Information were described as being set by the producer of the music contents, these DPLI_POB_SRPs may be freely set by users.

{82-2_83} Example Settings of the PLI_POB_SRPs included in a PLI

The following describes example settings of the PLI_POB_SRPs included in a PLI.

Figure 83:
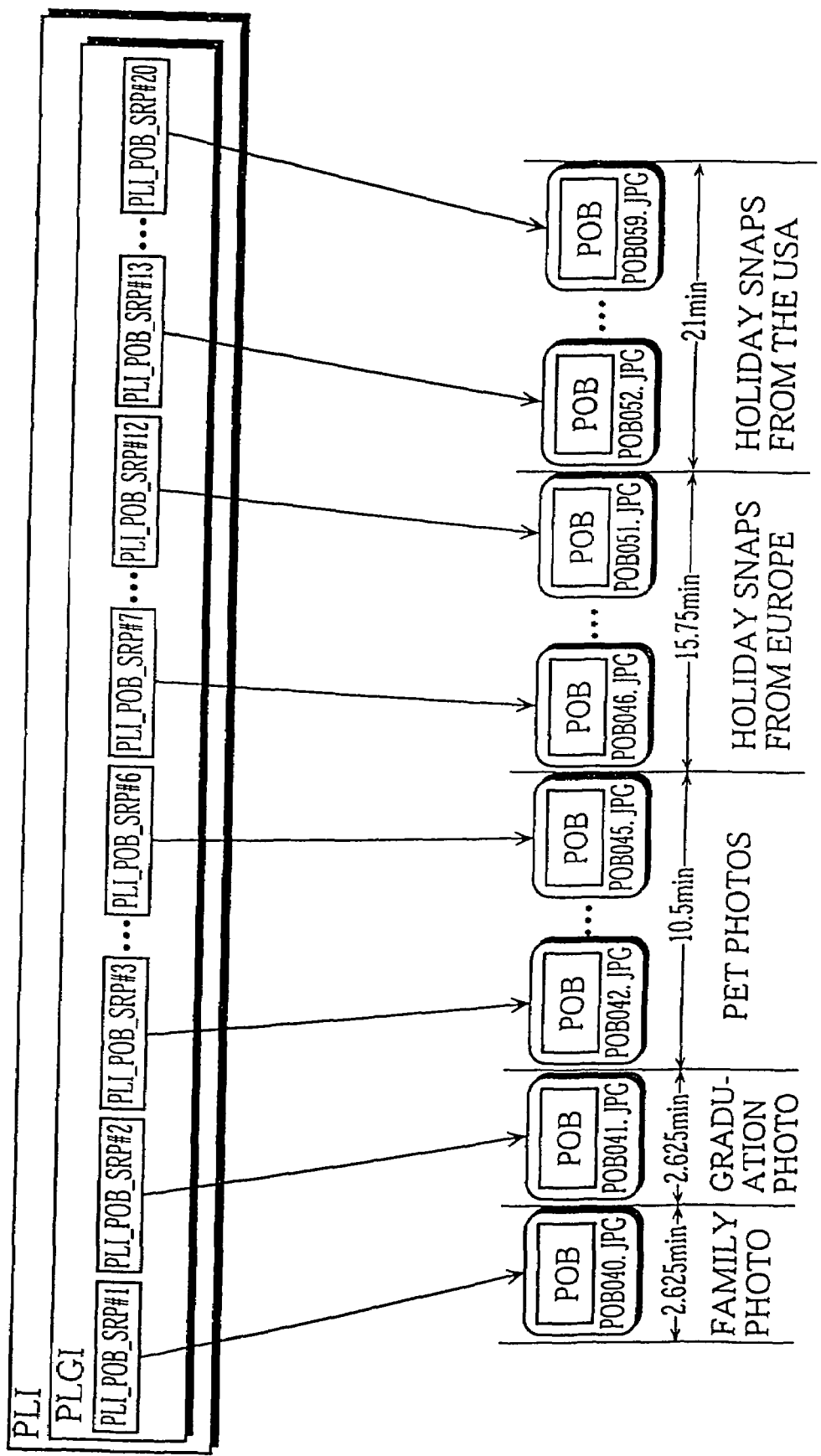
FIG. 83 shows an example setting of twenty PLI_POB_SRPs included in a PLI.

FIG. 83 shows one example of the settings of twenty PLI_POB_SRPs in a PLI. The first level in the drawing shows a PLI, with the inner frames showing the PLGI and twenty PLI_POB_SRPs. The second level shows the twenty POB files POB040 to POB059. As shown by the arrows, the twenty PLI_POB_SRPs respectively specify the twenty POB files POB040 to POB059.

While POB020 to POB039 are still image data that is provided by the producer of the music contents, POB040 to POB059 are still image data for personal photos provided by the user. As examples, POB040 is a photo of the user's family, while POB041 is a photo of the user's graduation ceremony, POB042 to POB051 are photos of the user's pet, POB046 to POB051 are holiday snaps from the user's trip to Europe, and POB052 to POB059 are holiday snaps from the user's trip to the USA. To simplify the explanation, the total playback period of the AOB files specified by this PLI and the number of POBs specified for display by this PLI are the same as the Default_Playlist_Information. This means that the total playback period of TrackA to TrackE specified by this PLI is 52.5 minutes, and that the display period for each of POB040 to POB059 will be 2.625 (=52.5/20) minutes if each image is to be displayed for the same time during this playback period.

Figure 84:
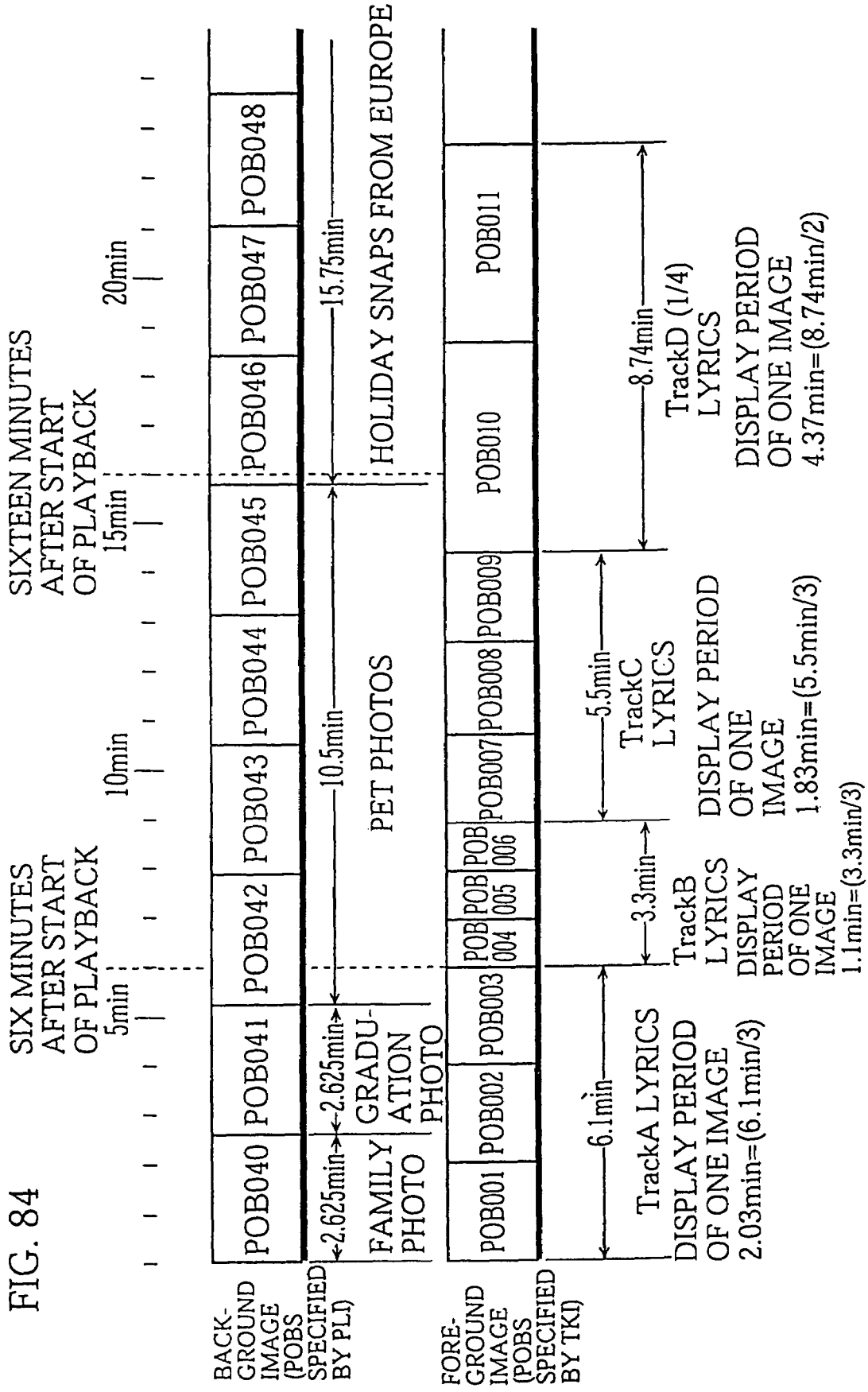
FIG. 84 is a timing chart showing how a combined image is formed when a POB specified by a PLI_POB_SRP included in a PLI is used as a background image and a POB specified by a TKI_POB_SRP included in the TrackManager is used as a foreground image.

{82-3_84} Changes in the Foreground and Background Images as Playback Progresses FIG. 84 is a timing chart showing what images are combined when the POBs specified by the PLI_POB_SRPs included in the Playlist_Information described above are used as background images and the POBs indicated by the TKI_POB_SRPs included in the TrackManager are used as foreground images.

The first level in the drawing shows the same POBs as the second level in FIG. 83, while the second level shows the same POBs as the second level in FIGS. 75 and 76. The scale that extends horizontally across the top of FIG. 84 shows the playback time in units of one minute. The horizontal width of each POB in FIG. 84 therefore shows the continuous display time for each POB.

By referring to the time scale in FIG. 79, it can be seen that during the period from the start of playback to the point at 6.1 minutes, POB001 to POB003 (the lyrics for TrackA) are successively displayed as the foreground image, while POB040 (a family photo), POB041 (a graduation photo), and POB042 (a pet photo) are successively displayed as the background image.

In the playback period between the point 6.1 minutes after the start of playback and the point 14.9 minutes after the start, POB004 to POB009 (the lyrics to TrackB and TrackC) are successively displayed as foreground images while POB042 to POB045 (pet photos) are successively displayed as background images.

In the period following the point 14.9 minutes from the start of playback, POB010 to POB011 (the lyrics for TrackD) are successively displayed as foreground images while POB045, and POB046 to POB048 (holiday snaps of European holiday) are successively displayed as the background image.

In this way, while the POBs specified by the Default_Playlist_Information are chosen by the record label that produces the music contents and so generally correspond to artist images and images related to the music contents, the POBs specified by a PLI can be freely selected by the user and so can have a high personal value.

{82-4_85}

In the timing chart in FIG. 84, a combined image composed of POB004 (the lyrics to TrackB) in the foreground and POB042 (a pet photo) in the background will be displayed starting from the point 6.1 minutes after the start of playback according to the Playlist_Information described above. FIG. 85 shows how the foreground image and background image are combined at this point 6.1 minutes after the start of playback according to this Playlist_Information.

{82-5_86}

In the same way, a combined image composed of POB010 (the lyrics to TrackD) in the foreground and POB046 (a holiday snap from Europe) in the background will be displayed starting from the point 16 minutes after the start of playback according to this Playlist_Information. FIG. 86 shows how the foreground image and background image are combined at this point 16 minutes after the start of playback according to this Playlist_Information. The song lyrics that form part of these combined images are the same as in FIGS. 80 and 81, though since the background images are different, the combined images in FIGS. 85 and 86 give a completely different impression to those in FIGS. 80 and 81.

As described above, the PLI_POB_SRPs in a PLI defined by the user himself/herself can specify POB files that differ from those specified by the Default_Playlist_Information, so that the user can have his/her favorite images displayed during the playback of his/her favorite tracks.

{82-6_87} Example Setting of the Same POBs in the DPLI_POB_SRPs in the Default_Playlist_Information In the examples in FIGS. 78, 79, 82, and 83, all of the DPLI_POB_SRPs included in the Default_Playlist_Information specify different POB files, though it is possible for two or more DPLI_POB_SRPs in the Default_Playlist_Information to specify the same POB file. By doing so, the same POB file can be displayed during the playback period of a plurality of tracks, making it possible to reduce the number of POB files that need to be provided by the title producer. This reduces the time and cost required to produce a title.

Figure 87:
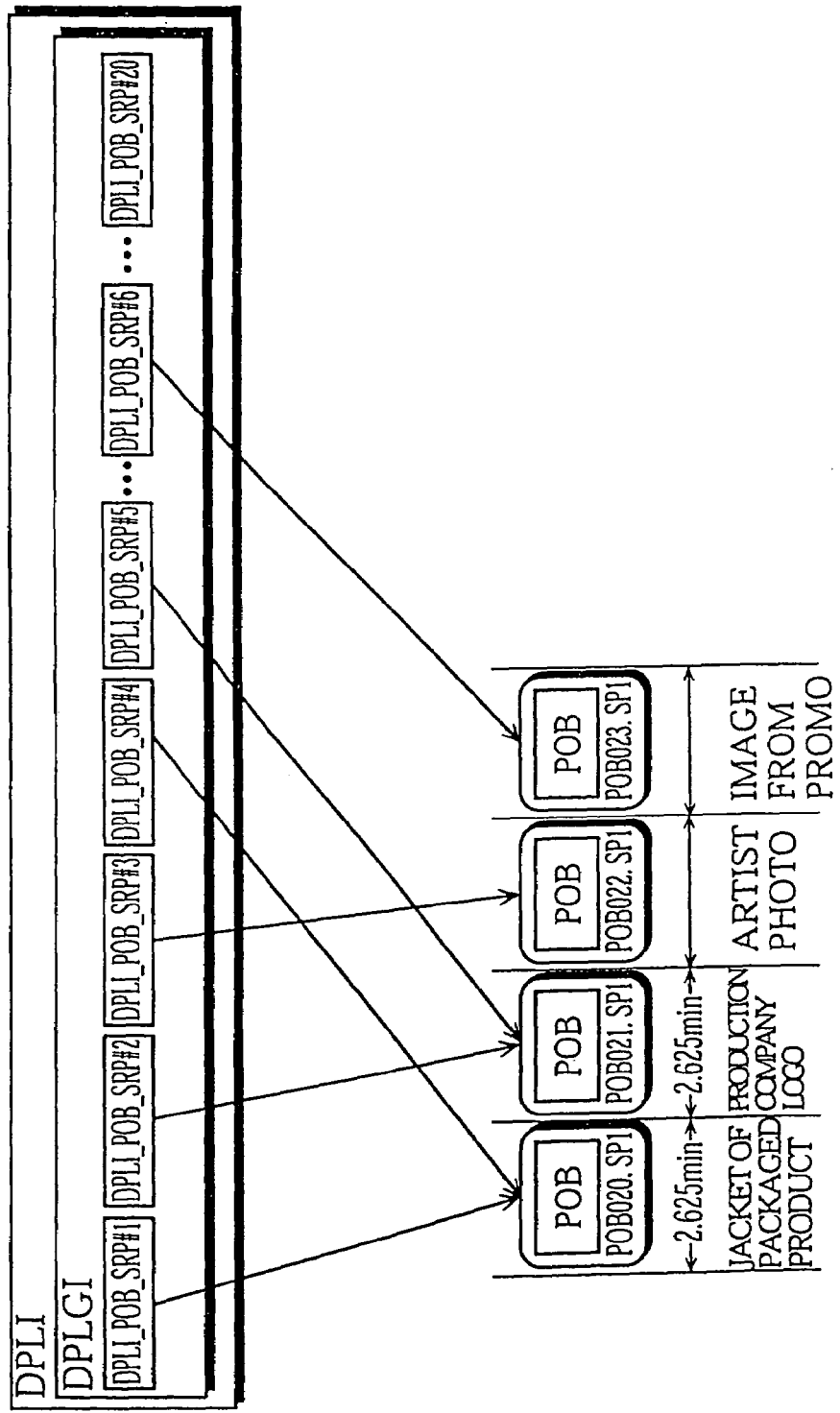
FIG. 87 shows an example where the number of POB files is reduced by having a number of DPLI_POB_SRPs in the Default_Playlist_Information specify the same POB files.

FIG. 87 shows one example where the number of POB files is reduced by having some of the DPLI_POB_SRPs in the Default_Playlist_Information specify the same POB file. In this drawing, both DPLI_POB_SRP#1 and DPLI_POB_SRP#4 specify POB020, while both DPLI_POB_SRP#2 and DPLI_POB_SRP#5 specify POB021.

Figure 88:
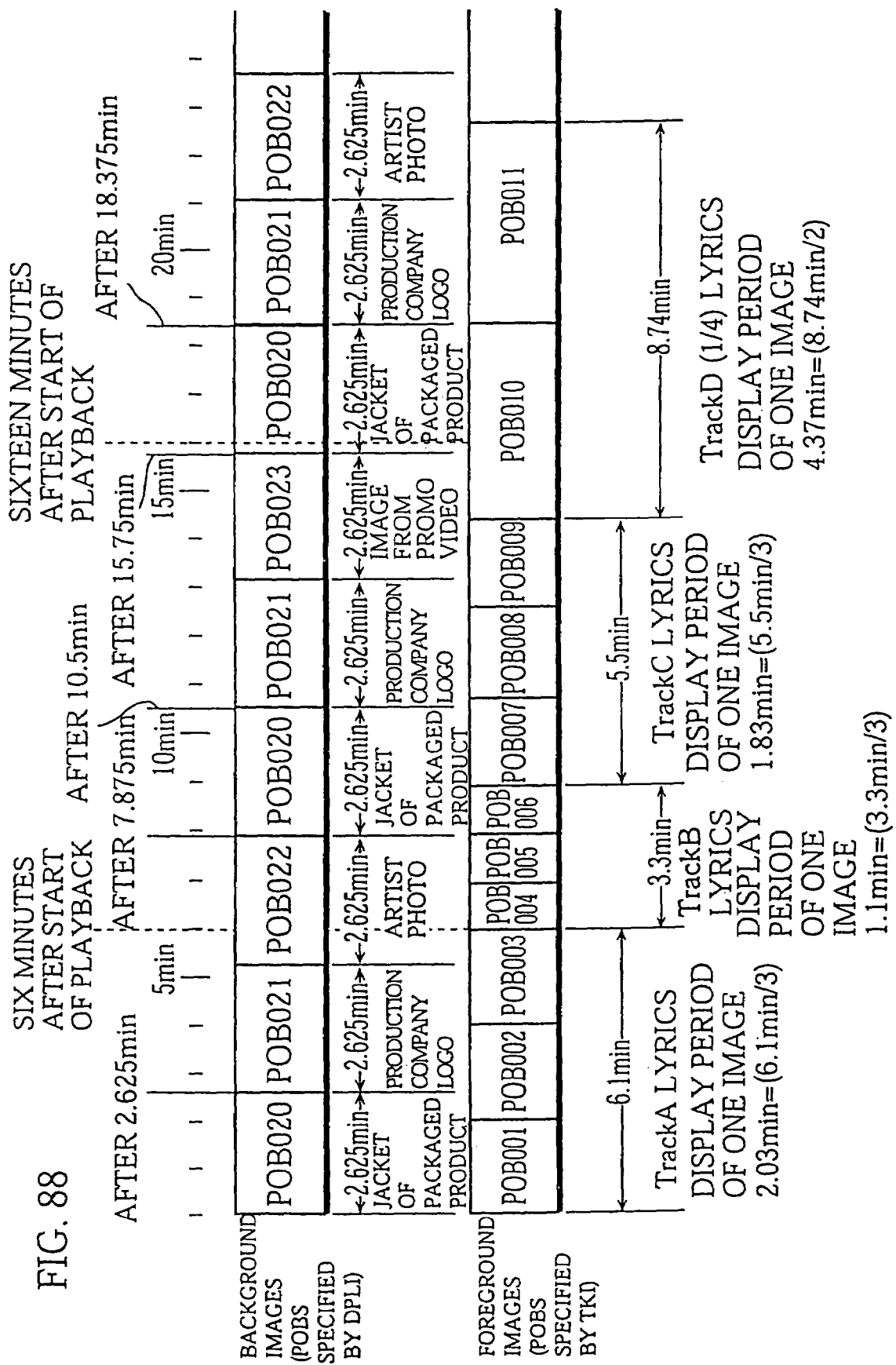
FIG. 88 is a timing chart showing how a combined image is formed when a POB specified by a DPLI_POB_SRP included in the Default_Playlist_Information is used as a background image and a POB specified by a TKI_POB_SRP included in the TrackManager is used as a foreground image.

{82-7_88} Changes in the Foreground and Background Images as Playback Progresses FIG. 88 is a timing chart showing what images are combined when the POBs specified by the DPLI_POB_SRPs included in the Default_Playlist_Information described above are used as background images and the POBs indicated by the TKI_POB_SRPs included in the TrackManager are used as foreground images.

As can be seen from this timing chart, POB020 that shows the jacket image of the packaged product is displayed a total of three times that are at the start of playback, 7.875 minutes after the start of playback, and 15.75 minutes after the start of playback. In the same way, POB021 that shows the logo of the record label is displayed a total of three times that are 2.625 minutes, 10.5 minutes, and 18.375 minutes after the start of playback. When the DPLI_POB_SRPs are set as shown in FIG. 87, the same POB is repeatedly displayed, so that reusable images such as the jacket image or record label logo can be repeatedly displayed.

This completes the explanation of the TGKI, DPLGI, and PLGIs.

{69-4_89} POBMG

Figure 89:
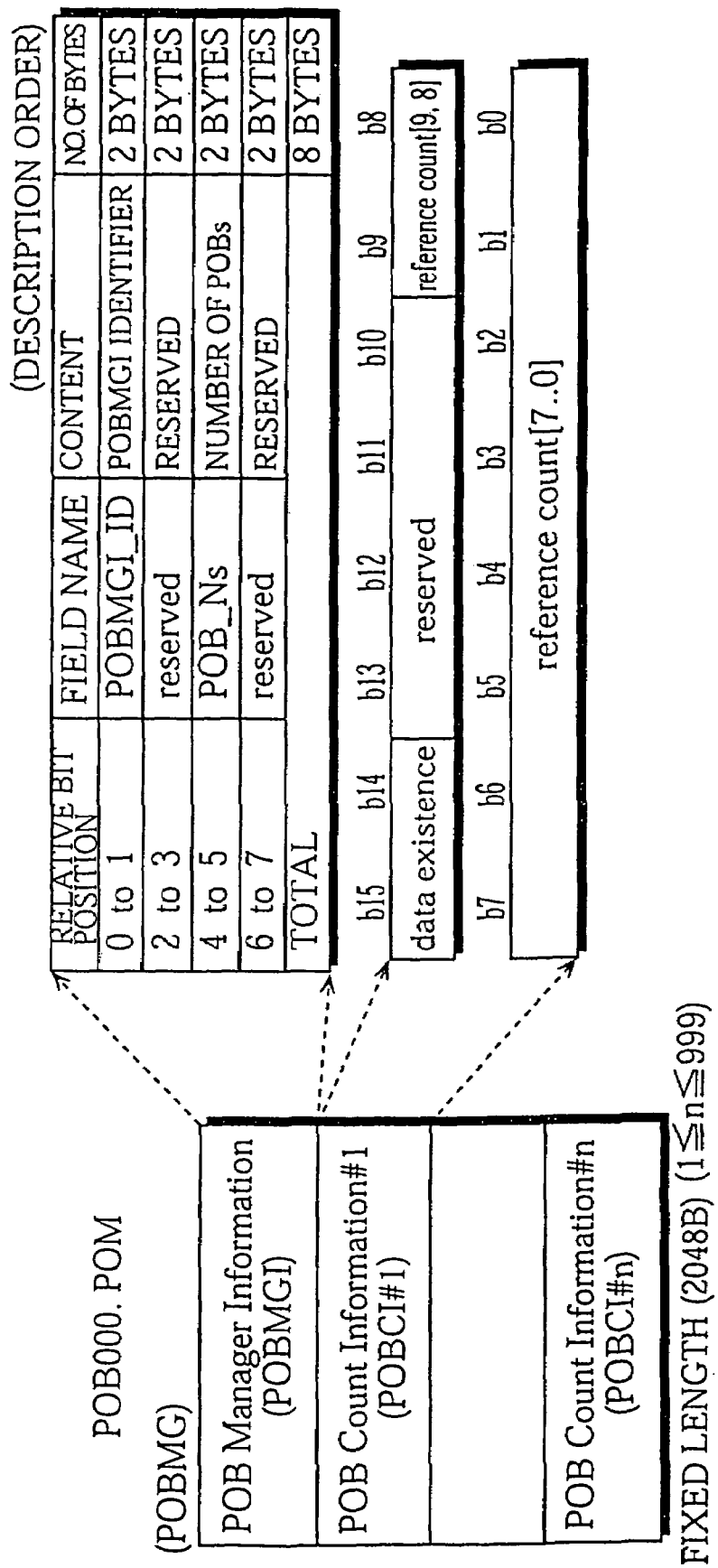
FIG. 89 shows the internal composition of the POBMG.

The following describes the POBManager (POBMGs) that is newly provided in the navigation information in the second embodiment. FIG. 89 shows the composition of the POBMG. As shown in the drawing, a POBMG is composed of POB Management Information (POBMGI) and POB Count Information (POBCI) #1, #2 . . . #n.

{69-4_89-1} POBMGI

As shown by the broken lines in FIG. 89, the POB management information (POBMGI) includes POBMGI identification information that occupies the 0th and 1st bytes, are served field that occupies the 2nd and 3rd fields, a POB_Ns field that occupies the 4th and 5th fields, and a reserved field that occupies the 6th and 7th fields.

An ID (a character set code "A6" according to ISO646) that identifies the POBMGI is written in the POBMGI identification information field. A number of POBs in a range from "0" to "999" is written in the POB_Ns field. This completes the explanation of the POBMGI.

{69-4_89-2} POBCI

The following describes the POB Count Information (POBCI). The POB Count Information is management information that is provided separately for each POB. The bit construction of the POB Count Information is as shown by the broken lines in FIG. 89. That is, the POB Count Information includes a POB_RCN field that occupies the region from bit number b0 to bit number b9, a reserved field that occupies the regions from bit number b10 to b13, and a data existence field that occupies the region from bit number b14 to bit number b15.

{69-4_89-3} POB_RCN

The "POB_RCN" field shows whether the display of a POB corresponding to a POBCI is specified by the DPLGI, a PLGI, or a TKGI. When the corresponding POB is specified, the number of specifications, that is, the number of TKIs specifying the POB for display, is written as a number in the range "1" to "999".

As in the first embodiment, TKIs can be deleted so that the settings in the Default_Playlist_Information and the Playlist_Information can be freely changed by users. When one or more TKIs that specify a particular POB are deleted, the POB reference count for that POB has to be decremented in accordance with the number of specifying TKIs that have been deleted. Also, when the Default_Playlist_Information or a PLI is deleted, the POB_RCN has to be decremented by the number of specifying TKIs that have been deleted.

When a POB is not specified by the DPLGI, a PLGI, or the TKGI, the POB_reference_count is set at "0". As a POB whose POB_reference_count is "0" is not referred to by a TKI or a playlist, on deleting a TKI or playlist, a playback apparatus can detect POBs whose reference_count_number becomes zero and delete the POB files storing such POBs to reduce the amount of still image data recorded in the flash memory card.

When certain POBs have a strong relationship with certain tracks and such POBs will be meaningless if not displayed during the playback of the related tracks, such POBs can be deleted when their reference_count_number becomes zero to avoid wasteful usage of the storage capacity of the flash memory card. This could apply to the case of POBs showing song lyrics for tracks recorded in the flash memory card.

Apart from when one or more TKIs are deleted, when a POB specified by a DPLI_POB_SRP, a PLI_POB_SRP, and/or a TKI_POB_SRP is deleted by an editing operation, the reference_count_number may be decremented in the same way.

{69-4_89-4} Data Existence

The data existence field that occupies bit number b14 and bit number b15 is set to indicate whether a POB that corresponds to the present POB number exists. The binary value "01" is set in this field when a corresponding POB exists, while the value "00" is set when there is no such POB. Here, data is said to "exist" when data with intrinsic value is present.

When this field indicates that a POB exists and the deletion of a TKI or PLI has resulted in the POB_reference_count reaching "0", a playback apparatus will judge that the POB corresponding to the "0" POB_reference_count should be kept and so will not delete the POB.

If a POB has intrinsic value regardless of whether it is referred to by a TKI or a PLI, the data existence field corresponding to this POB can be set at "1". By setting the data existence field corresponding to POBs that are only of value if they are referred to by a TKI or a playlist at "0", it becomes possible to selectively keep only POBs with intrinsic value on the flash memory card. POBs that are only meaningful when displayed together with the playback of a track (i.e., POBs that have no intrinsic value) can be deleted when the corresponding track is deleted, enabling the storage capacity of the flash memory card to be used efficiently.

This completes the explanation of the POBManager (POBMG).

{69-5} Updating that Accompanies the Editing of TKIs

The following describes how the TKI_POB_SRPs and the DPLI_POB_SRPs are updated in the following five cases. The first four cases are the same as in the first embodiment, so that in the first case (case1), a track is deleted. In the second case (case2), a track is deleted and a new track is recorded. In the third case (case3), two out of a plurality of tracks are selected and combined into a single track. In the fourth case (case4), one track is divided to produce two tracks. In the fifth case (case5), the playback order of tracks is changed.

In case1 where a track is deleted, each TKI corresponding to the track is set at "Unused" and the TKI_POB_SRPs in each TKI are deleted. At the same time, the POB_reference_count in the POBManager of the POBs specified by these TKI_POB_SRPs are decremented. POBs that are specified by PLI_POB_SRPs and/or DPLI_POB_SRPs in the DPLGI or a PLGI are unaffected by this deletion.

When the DPL_TK_SRPs are changed so as to specify the tracks in a different order (case5), the playback order of tracks will change, so that the display order of the POBs specified by the TKI_POB_SRPs will also change.

In case3, it is preferable for the TKI_POB_SRPs in the TKIs to also be combined. This is because only the TKI_POB_SRPs in a first TKI are valid for a track composed of a plurality of TKIs. When a track combining operation is performed, the POBs specified by the TKI_POB_SRPs of the latter TKI will need to be specified by TKI_POB_SRPs in the former TKI.

When a track is divided (case4), it is necessary to change the TKI_BLK_ATR of the track and to divide the TKTMSRT and BIT as described in the first embodiment. In addition, the TKI_POB_SRPs specified in the TKGI also need to be divided into two groups that are respectively assigned to the former TKI and to the extra TKI that is newly produced by the division.

{69-6} Actual Example of How the TKI_POB_SRPs and DPLI_POB_SRPs May Be Used

As described above, the data constructions of the TrackManager and PlaylistManager allow the user to freely change the relationship between AOB files and POBs by changing the settings of the TKI_POB_SRPs, DPLI_POB_SRPs, and PLI_POB_SRPs. This means that a producer of music contents can provide music contents with differing amounts of still image data to consumers, such as tracks with lyrics, tracks with no lyrics, and tracks with lyrics and background images. Of course, the producer may charge different amounts for these different types of contents.

When a consumer wishes to buy tracks without the lyrics, the producer may produce an SD_Audio directory that includes the eight AOBs shown in the first embodiment and a TrackManager where the TKI_POB_SRPs in TKI#1 to TKI#8 specify POB020 to POB039 as shown in FIG. 78. The producer then compresses this directory, encrypts it, and transmits it to the consumer's personal computer. Note that the consumer's personal computer can instead download tracks (AOBs) and still images (POBs) corresponding to the tracks from a server computer operated by the record label and generate the SD-Audio directory shown in FIGS. 70A and 70B on the flash memory card 31.

When the consumer wishes to buy tracks with the lyrics, the producer may produce an SD_Audio directory that includes the eight AOBs shown in the first embodiment and a TrackManager where the TKI_POB_SRPs in TKI#1 to TKI#8 specify POB001 to POB019 shown in FIGS. 75 and 76 corresponding to the lyrics. The producer then compresses this directory, encrypts it, and transmits it to the consumer's personal computer.

When the consumer wishes to buy tracks with both the lyrics and the background images, the producer may produce an SD_Audio directory that includes the eight AOBs shown in the first embodiment, a TrackManager where the TKI_POB_SRPs in TKI#1 to TKI#8 specify POB001 to POB019 shown in FIGS. 75 and 76 corresponding to the lyrics, and a Playlist Manager where the DPLI_POB_SRPs specify POB020 to POB039 shown in FIG. 78. The producer then compresses this directory, encrypts it, and transmits it to the consumer's personal computer. Since still image data can be freely associated with audio data by setting the TKI_POB_SRPs, DPLI_POB_SRPs, and PLI_POB_SRPs in the present embodiment, music contents can be easily produced with different prices in accordance with the amount of associated still image data.

{90-1_91} Playback Apparatus for the Second Embodiment

The following describes a playback apparatus for the second embodiment. This playback apparatus differs from the playback apparatus described in the first embodiment in that while the playback apparatus in the first embodiment is portable, the playback apparatus in the second embodiment is designed for installation as a car stereo.

Figure 90:
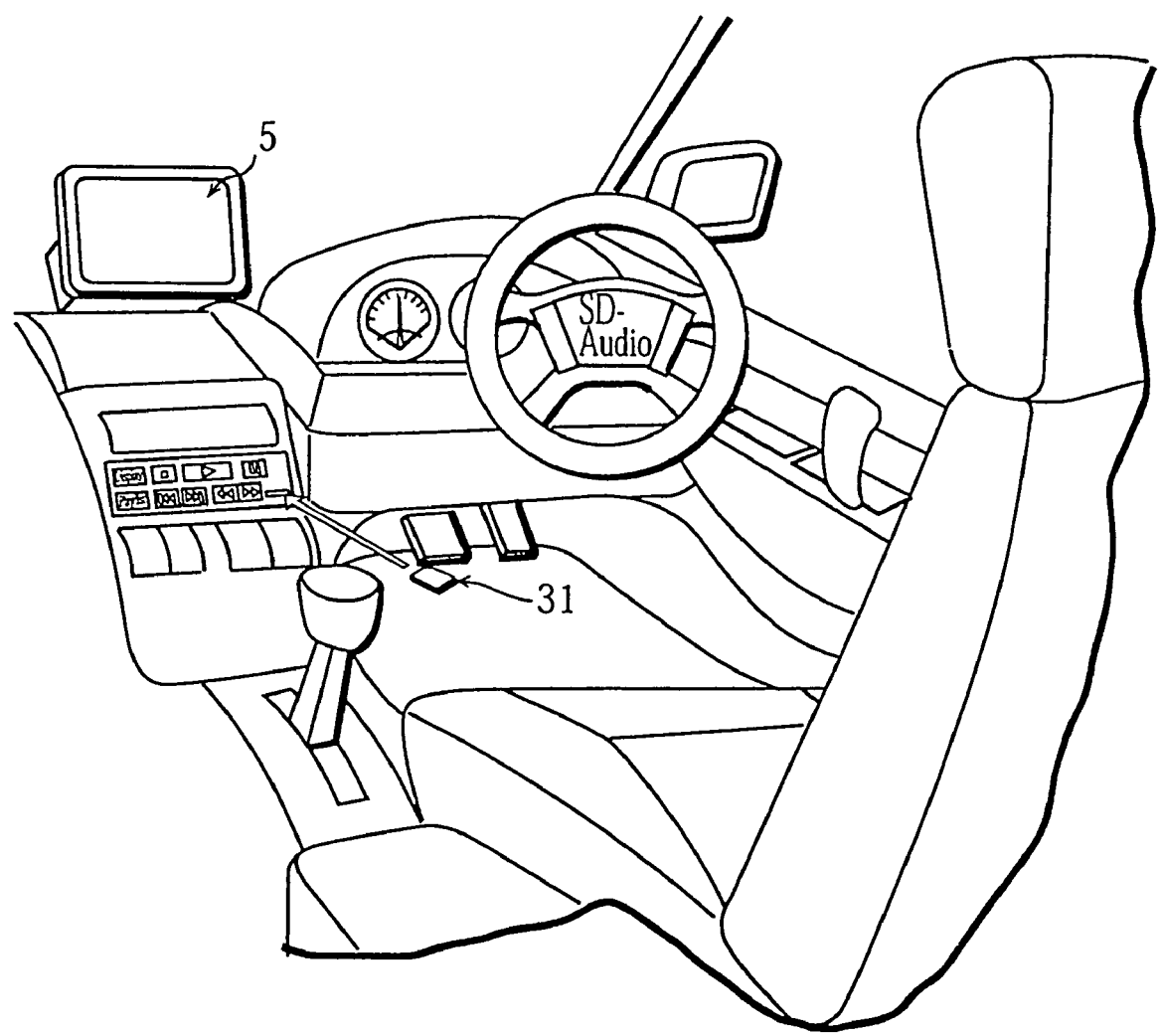
FIG. 90 shows how the playback apparatus of the second embodiment is used.
Figure 91:
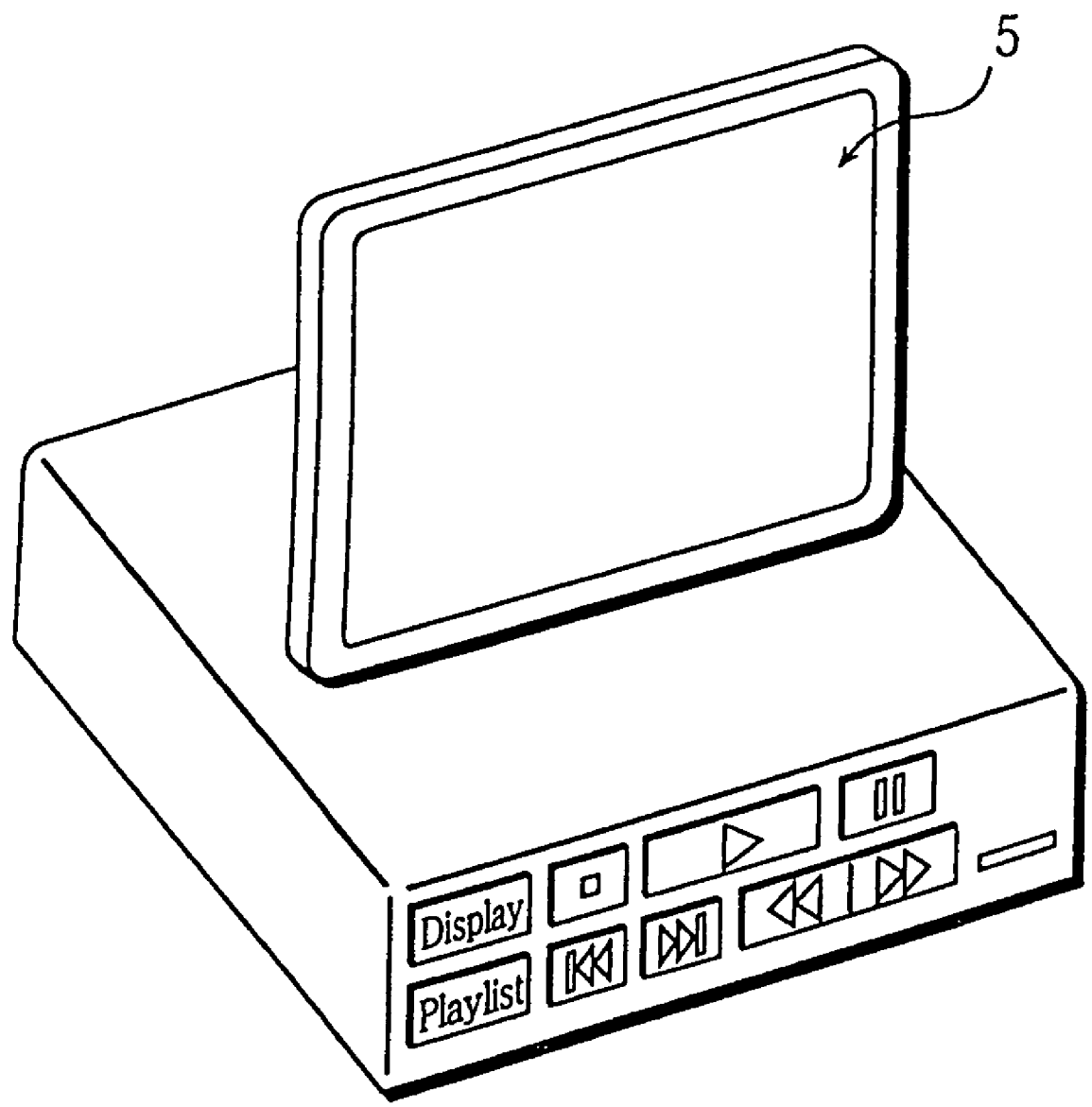
FIG. 91 shows the external appearance of only the playback apparatus of the second embodiment.

FIG. 90 shows how the playback apparatus of the second embodiment is used, while FIG. 91 shows the external appearance of just the playback apparatus.

The playback apparatus of this second embodiment differs from the playback apparatus of the first embodiment in that it is installed in an automobile as shown in FIG. 90, in that it includes a large LCD panel 5, and in that it is connected to car speakers. Due to the provision of the large LCD panel 5, the playback apparatus of this second embodiment is well suited to the display of the various types of still image data mentioned above.

A second difference with the playback apparatus of the first embodiment is that the playback apparatus of the second embodiment has a descrambler 7 that is capable of decrypting encrypted POBs as well as encrypted audio data. When a POB has been encrypted and is stored as a POB file with a "POBXXX.SP1" filename, a FileKey stored in a Key Entry in the encrypted key storing file "POBSP1.KEY" is set in the descrambler 7 which then decrypts the file "POBXXX.SP1".

A third difference with the playback apparatus of the first embodiment is that the playback apparatus of the second embodiment stores a program including the processing required to display POBs as foreground or background images. The CPU 10 in this playback apparatus executes this program to display images.

{90-2__92__93__94}

Figure 92:
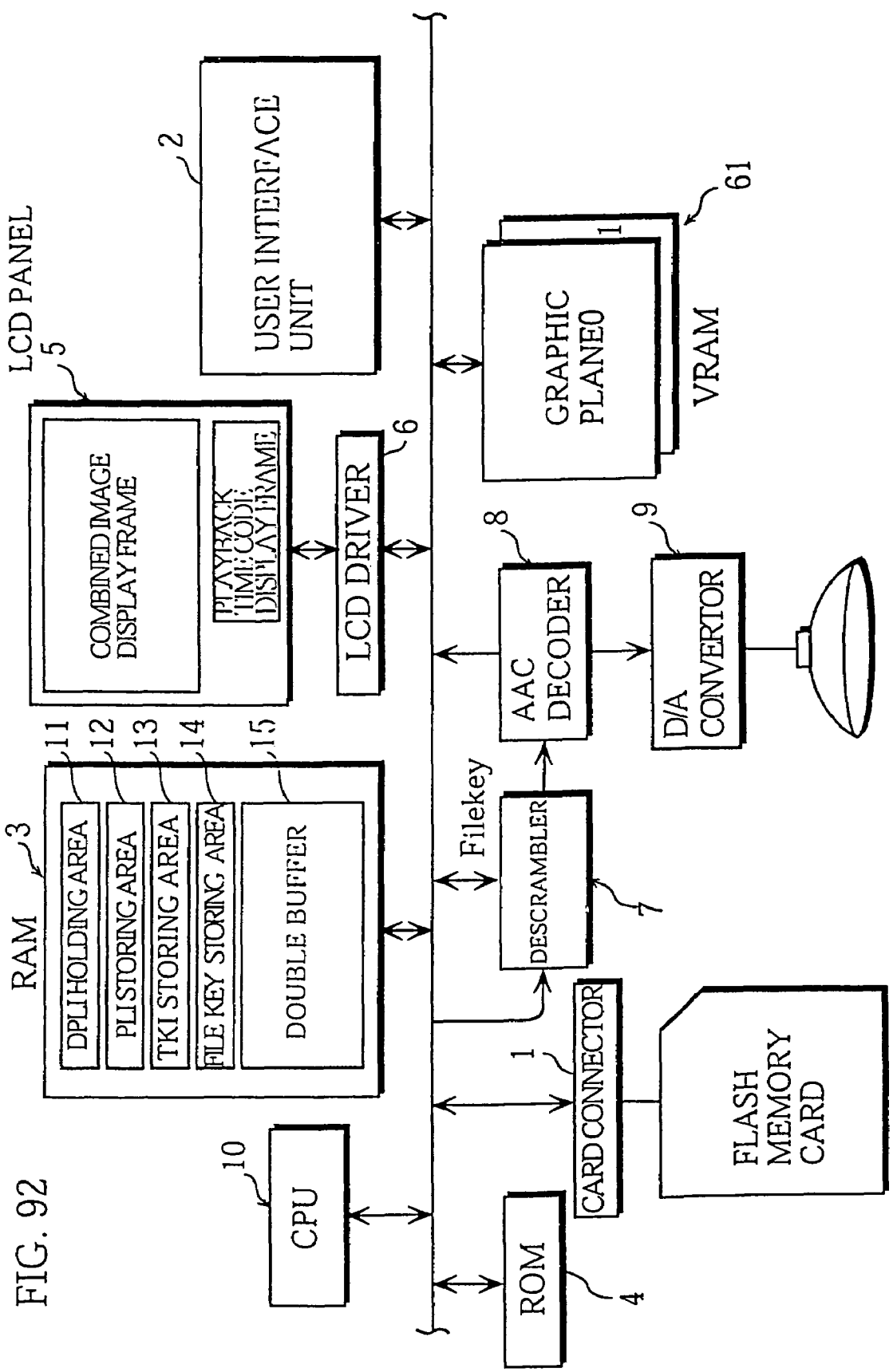
FIG. 92 shows the internal construction of the playback apparatus of the second embodiment.

The following describes the composition of the playback apparatus in this second embodiment. The composition of the playback apparatus shown in FIG. 92 differs from the composition of the playback apparatus of the first embodiment in that it includes a plurality of VRAMs 61.

Figure 93A:
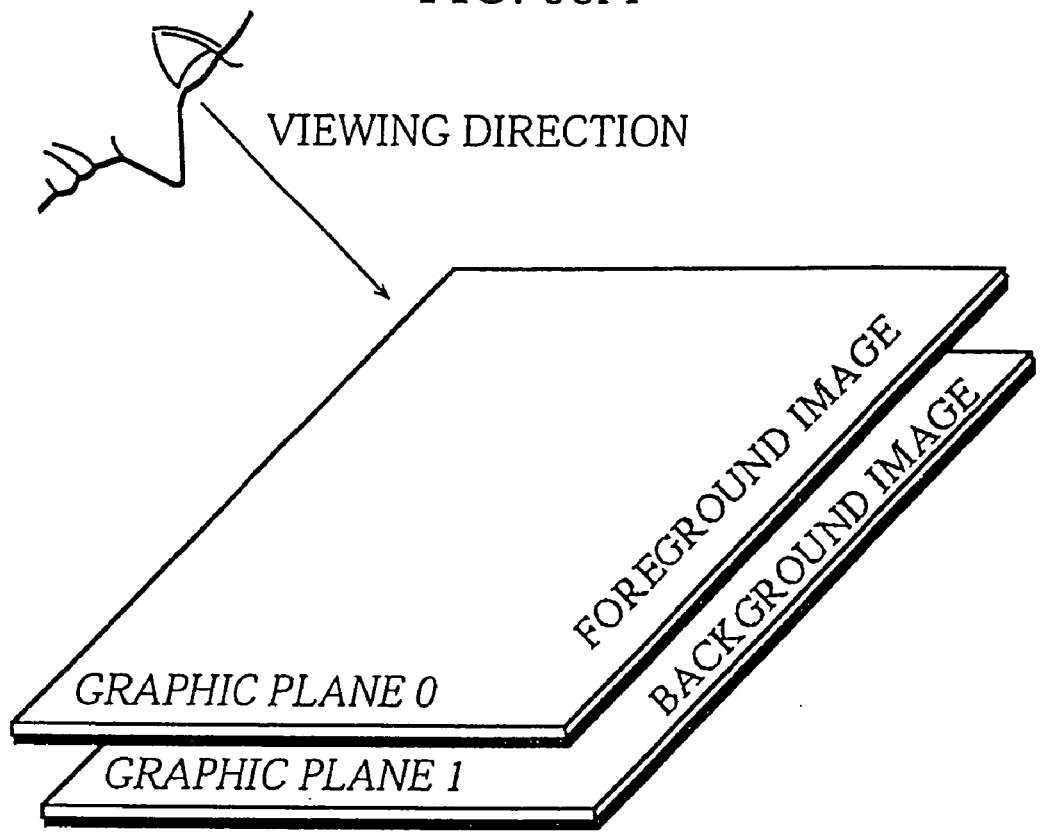
FIG. 93A shows how the still images stored in the plurality of VRAMs 61 can be laid on top of one another.

The plurality of VRAMs 61 respectively correspond to the single graphics planes (layers). The VRAM for a graphics plan has transparency α set in the range 0 to 100% for each pixel. The image that is to be displayed on the first LCD panel 5 is calculated according to the equation given below. FIG. 93A shows how the still images stored in the plurality of VRAMs 61 are combined.

Equation

Pixel Value of Each Pixel=Pixel Value in Graphics Plane 0*(1−α)+Pixel Value in Graphics Plane 1*α

The transparency α is set at 0% for the parts of the foreground image corresponding to the characters showing the lyrics. As a result, parts of the background image that positionally correspond to the character strings showing the lyrics are completely hidden. Conversely, the transparency α is set at 100% for the parts of the foreground image corresponding to plain back ground of the lyrics. This means that the combined image has the character strings showing the lyrics in graphics plane 0 displayed on top of the background image in graphics plane 1.

Figure 93B:
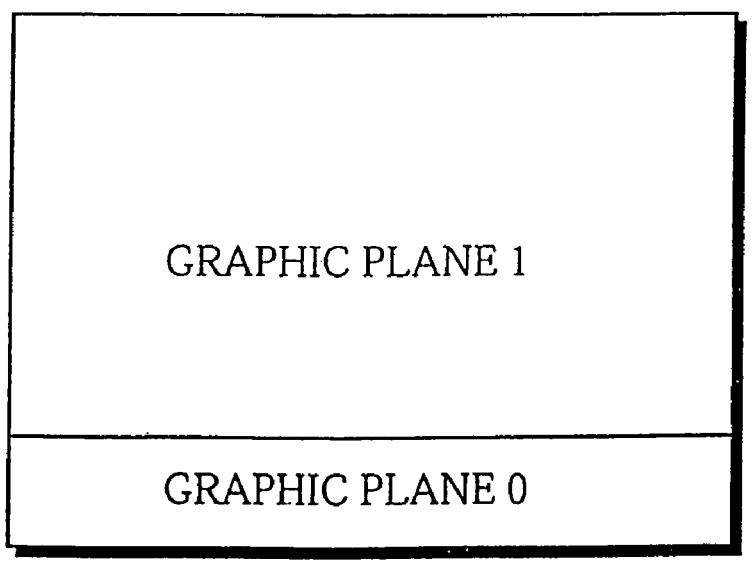
FIG. 93B also shows how the still images stored in the plurality of VRAMs 61 can be laid on top of one another.

By setting the transparency in this way, it is possible to produce a combined image where a lyrics sheet is laid on top of a background image, as shown in FIGS. 80 and 81. Note that a combined image can be produced in other ways aside from that shown in FIG. 93A. As one example, the lyrics may be arranged into the lower part of the screen, with the background image being shown in the upper part, as shown in FIG. 93B.

{94-1} Flowchart of the Foreground Image Display Procedure

Figure 94:
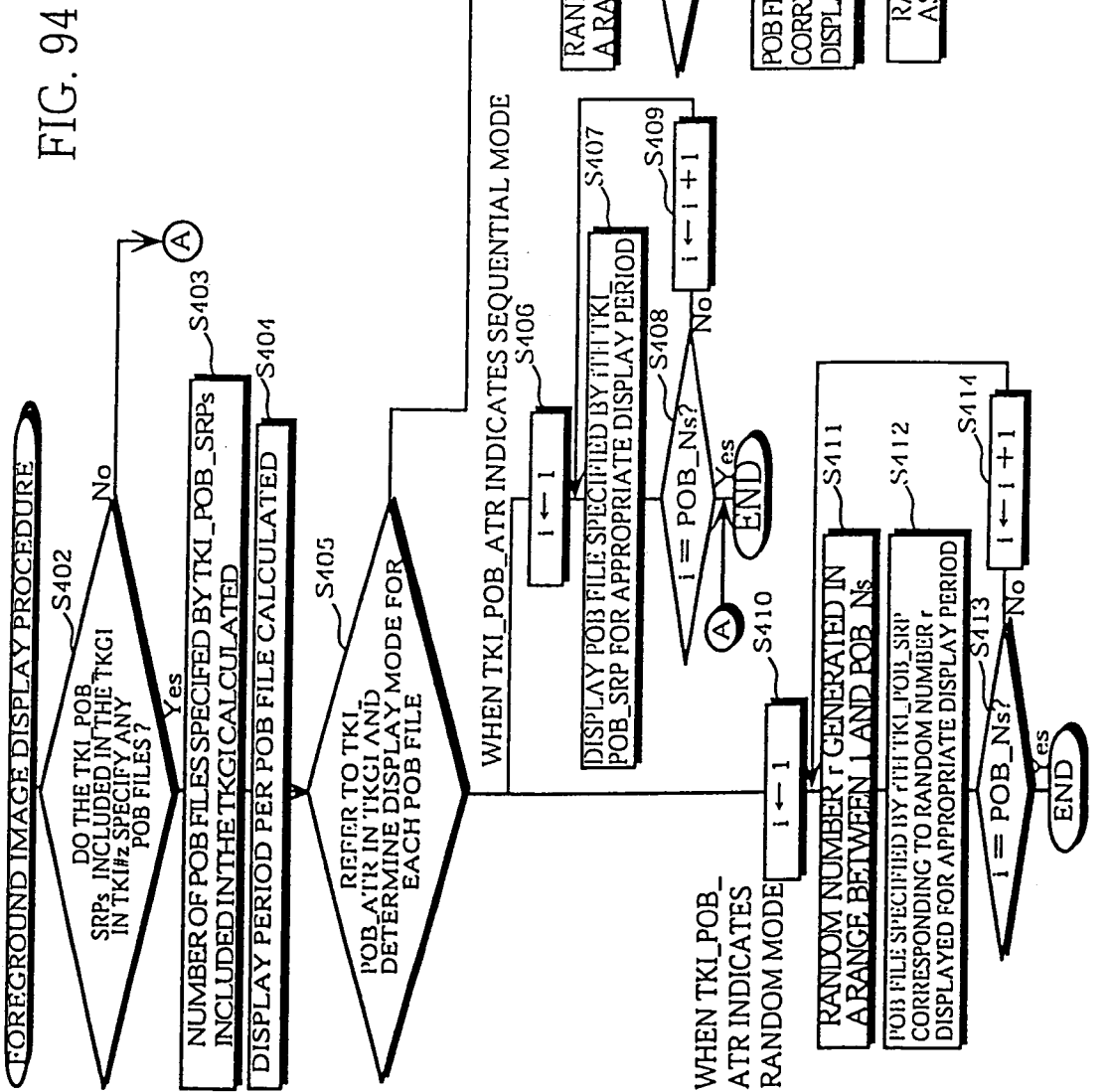
FIG. 94 is a flowchart showing the foreground image display procedure.

FIG. 94 is a flowchart showing the foreground image 15 display procedure. When playback starts according to TKI#z specified by the Default_Playlist_Information, in step S402 the CPU 10 judges whether the TKI_POB_SRPs included in the TKGIs in TKI#z specify any POBs. When the TKI_POB_SRPs specify one or more POB files, the processing advances to step S403 where the CPU 10 counts the number of POB files that are specified by the TKI_POB_SRPs included in the TKGI. In step S404, the CPU 10 calculates the display time "POB_time" showing the display period to be used for each POB file. After this, in step S405 refers to the TKI_POB_ATR in the TKGI and determines the display mode to be used for displaying the POB files. When the TKI_POB_ATR shows sequential mode, the processing advances from step S405 to step S406, where the variable i is initialized, and to step S407, where the POB file specified by the $i^{th}$ TKI_POB_SRP is displayed for the display time POB_time.

At this point, when the extension of the POB file specified by the TKI_POB_SRP is "JPG", the POB is displayed as it is. Conversely, when the extension of the POB file specified by the TKI_POB_SRP is "SP1", the POB file will be in an encrypted state, so that the CPU 10 reads the FileKey corresponding to the POB file from the protected area, decrypts the POB file using the encryption key, and displays the POB.

After this, in step S408 the CPU 10 judges whether the variable i has reached the value given in POB_Ns. If not, the processing proceeds to step S409, where the variable i is incremented, and then returns to step S407. The processing in steps S406 to S409 is hereafter repeated until the variable i reaches the value given in POB_Ns. As a result, the POBs specified by the TKI_POB_SRPs in the TKGI are sequentially displayed. When the variable i reaches the value given in POB_Ns, the processing in this flowchart ends.

When the TKI_POB_ATR shows random mode, the processing advances from step S405 to step S410, where the variable I is initialized, and to step S411, where the CPU 10 generates a random number r in a range from 1 to POB_Ns. In step S412, the POB file specified by the $r^{th}$ TKI_POB_SRP corresponding to the random number r is displayed for the display time POB_time determined in step S404.

After this, in step S413 the CPU 10 judges whether the variable i has reached the value given in POB_Ns. If not, the processing proceeds to step S414, where the variable i is incremented, and then returns to step S411. In step S411, the CPU 10 generates another random number r in a range from 1 to POB_Ns, and the processing proceeds again to step S412, where the CPU 10 reads the POB file specified by the $r^{th}$ TKI_POB_SRP corresponding to the random number r and displays it for the display time POB_time determined in step S404.

As described above, when the extension of the POB file specified by the TKI_POB_SRP is "JPG", the POB is displayed as it is. Conversely, when the extension of the POB file specified by the TKI_POB_SRP is "SP1", the POB file will be in an encrypted state, so that the CPU 10 reads the FileKey corresponding to the POB file from the protected area, decrypts the POB file using the encryption key, and displays the POB.

The processing in steps S411 to S414 is hereafter repeated until the variable I reaches the value given in POB_Ns. As a result, POBs specified by the TKI_POB_SRPs in the TKGI are displayed one after another in a random order. When the variable I reaches the value given in POB_Ns, the processing in this flowchart ends.

When the TKI_POB_ATR shows shuffle mode, the processing advances from step S405 to step S415, where the variable i is initialized, and to step S416, where the CPU 10 generates a random number r in a range from 1 to POB_Ns.

In step S418, the CPU 10 checks whether the newly generated random number r matches one of the used POB numbers that has been previously stored. If so, the processing returns to step S416 where the random number r is regenerated. If not, the processing advances from step S418 to S419 where the POB file specified by the $r^{th}$ TKI_POB_SRP corresponding to the random number r is displayed for the display time POB_time determined in step S404. After this, in step S417 the CPU 10 stores the random number r as a used POB number.

As in random mode, when the extension of the POB file specified by the TKI_POB_SRP is "JPG", the POB is displayed as it is. Conversely, when the extension of the POB file specified by the TKI_POB_SRP is "SP1", the POB file will be in an encrypted state, so that the CPU 10 reads the FileKey corresponding to the POB file from the protected area, decrypts the POB file using the encryption key, and displays the POB. When this display ends, in step S420 the CPU 10 judges whether the variable i has reached the value given in POB_Ns. If not, the processing proceeds to step S421, where the variable i is incremented, and then returns to step S416. The processing in steps S416 to S421 is hereafter repeated until the variable i reaches the value given in POB_Ns. When the variable i reaches the value given in POB_Ns, the processing in this flowchart ends.

{95-1} Flowchart of the Background Image Display Procedure

Figure 95:
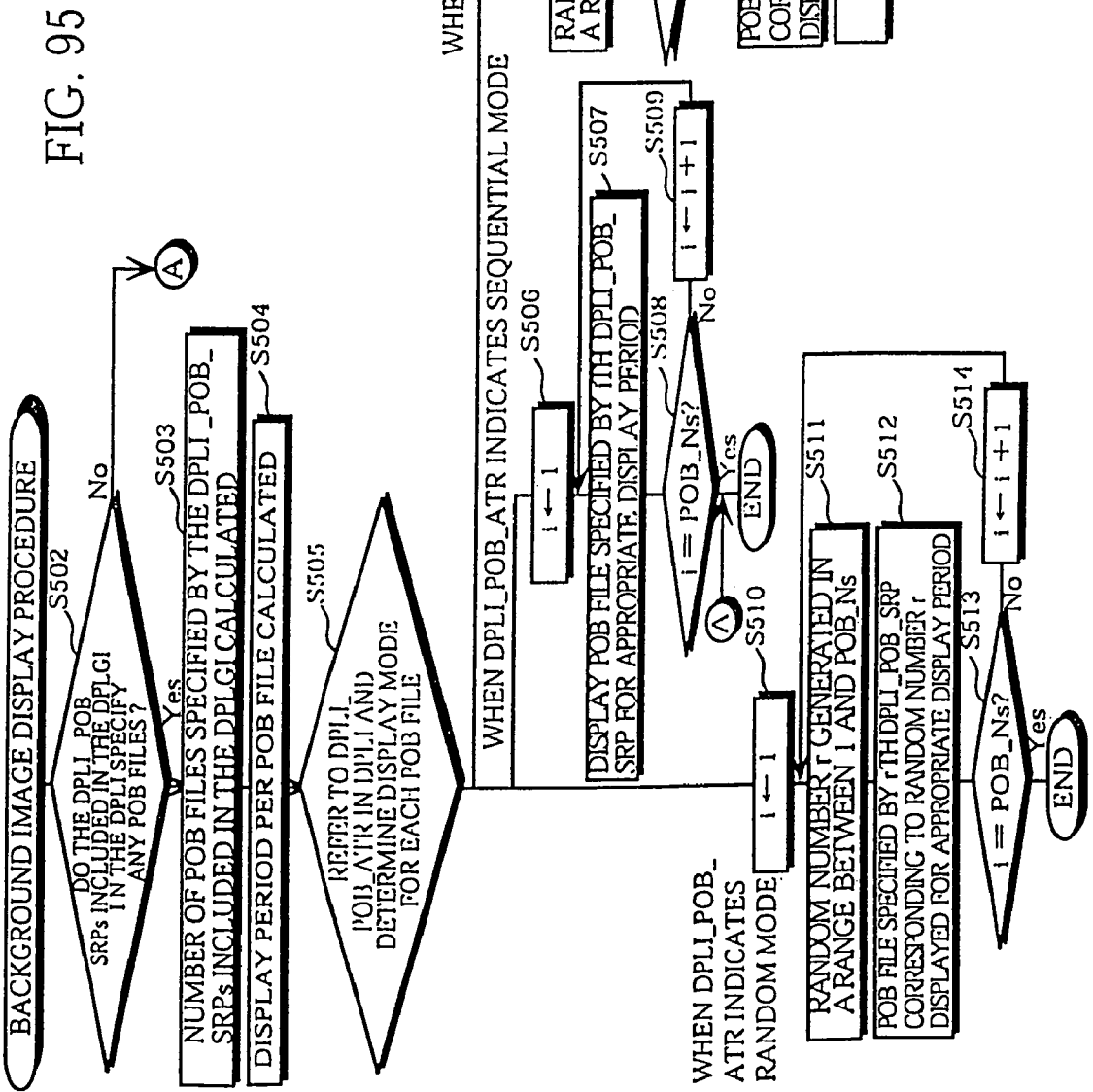
FIG. 95 is a flowchart showing the background image display procedure.

The procedure for displaying a foreground image is as described above and the following describes the procedure for displaying a background image. FIG. 95 is a flowchart for the background image display procedure. This flowchart contains fundamentally the same processing as the flowchart in FIG. 94, with the processing being performed according to the DPLI_POB_SRPs and DPLI_POB_ATR in the DPLGI instead of the TKI_POB_SRPs and TKI_POB_ATRs in the TKGI.

When the Default_Playlist_Information is selected, the CPU 10 performs the processing in steps S502 to S505. As in steps S402 to S405, the CPU 10 judges whether the DPLI_POB_SRPs included in the DPLGI specify any POBs. When one or more POB files are specified, the CPU 10 counts the number of POB files that are specified, calculates the display time POB_time showing the display period to be used for each POB file, and then determines the display mode to be used for displaying the POB files.

When the DPLI_POB_ATR shows sequential mode, the CPU 10 performs step S506 to step S509. As in step S406 to S409, POB files are sequentially displayed in order in accordance with a DPLI_POB_SRP, out of the DPLI_POB_SRPs included in the DPLGI, indicated by the variable i.

When the DPLI_POB_ATR shows random mode, the CPU 10 performs step S510 to step S514. As in step S410 to S414, POB files are displayed in a random order in accordance with a DPLI_POB_SRP, out of the DPLI_POB_SRPs included in the DPLGI, indicated by the random number r.

When the DPLI_POB_ATR shows shuffle mode, the CPU 10 performs step S515 to step S521. As in step S415 to S421, POB files are displayed in a random order with no repetition in accordance with a DPLI_POB_SRP, out of the DPLI_POB_SRPs included in the DPLGI, indicated by the random number r.

{96-1} Flowchart of the Background Image Display Procedure

Figure 96:
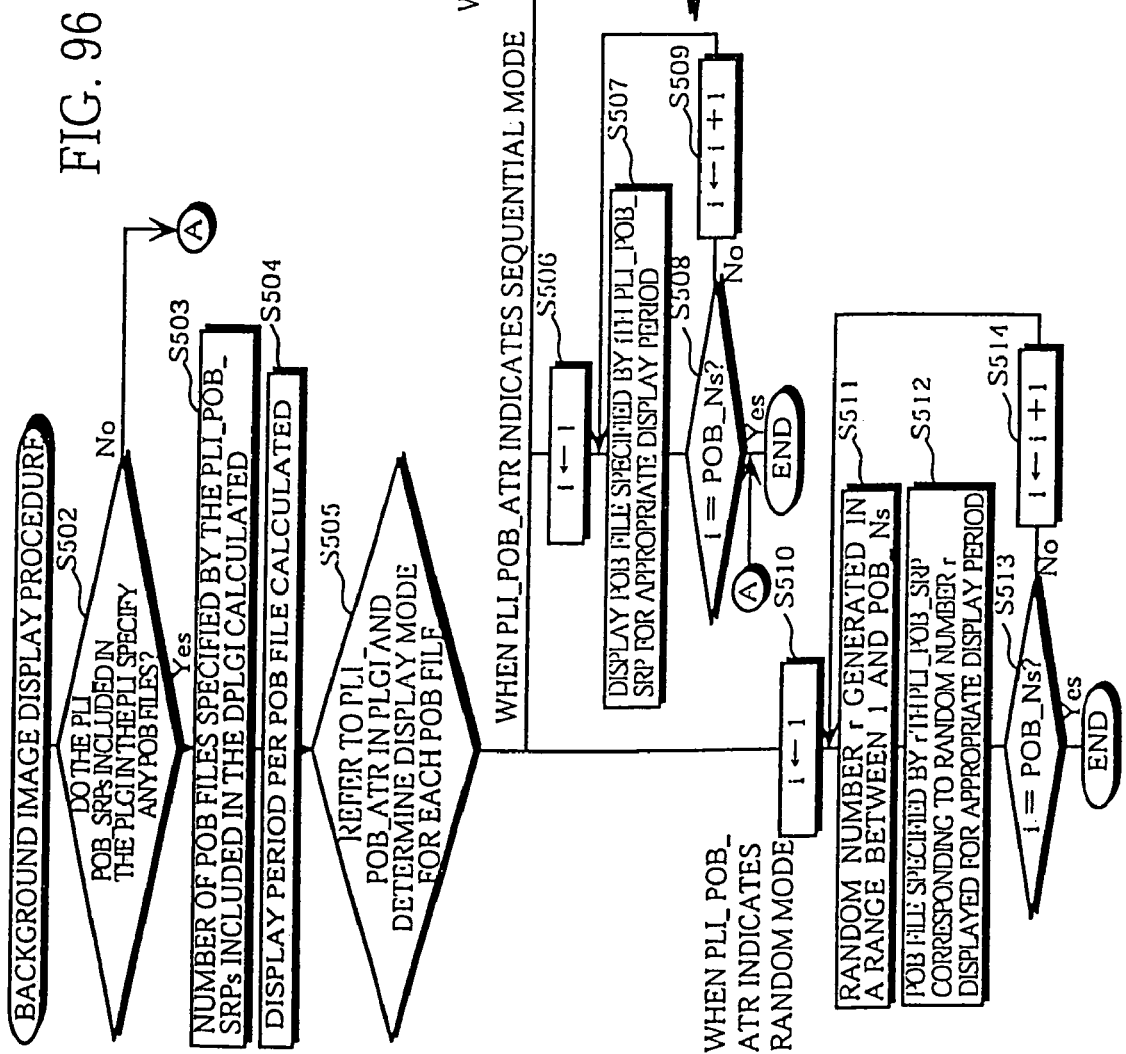
FIG. 96 is a flowchart showing the background image display procedure.

This completes the background image display procedure that is performed based on the DPLI_POB_SRPs in DPLGI. The following describes the background image display procedure that is performed based on the PLI_POB_SRPs in a PLGI. FIG. 96 is a flowchart showing the background image display procedure based on the PLI_POB_SRPs. With the exception of the processes based on DPLI_POB_SRPs being performed based on PLI_POB_SRPs, this flowchart is exactly the same as the flowchart in FIG. 95, so that the processes have been given the same reference numerals. No explanation of FIG. 96 will be given.

{94-2_95-2_97A,B,C} Example Display Screens on the LCD Panel 5

Figure 97A:
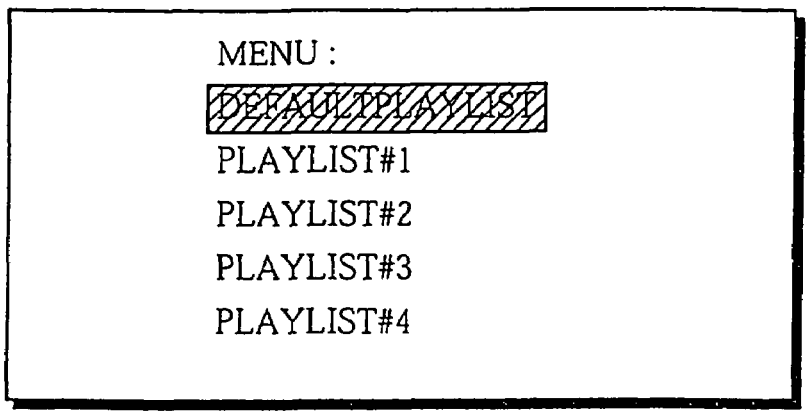
FIGS. 97A to 97C show what kind of combined image is displayed on the LCD panel 5 due to the processing in the flowcharts in FIGS. 94 and 95 that has a POB specified by a TKI_POB_SRP displayed as a foreground image and a POB specified by a DPLI_POB_SRP displayed as a background image.
Figure 97B:
Figure 97C:
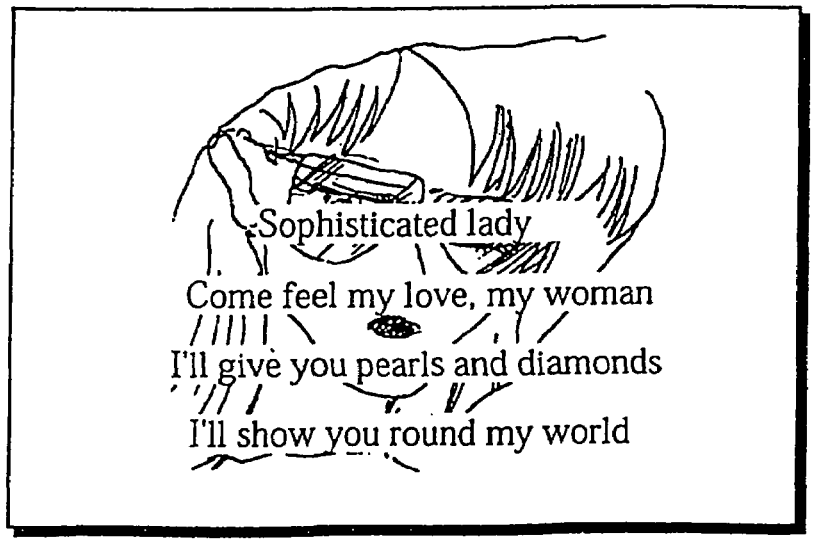

FIGS. 97A to 97C show what kind of combined images are displayed on the LCD panel 5 when a foreground image specified by a TKI_POB_SRP and a background image specified by the DPLGI are displayed according to the display procedures shown in the flowcharts in FIGS. 94 and 95.

In the example in FIG. 97A, assume that the user indicates the Default_Playlist_Information and that the display of POBs begins in accordance with the playback order given in this playlist. The foreground image display procedure shown in FIG. 94 and the background image display procedure shown in FIG. 95 are performed and the POBs specified for display by the TKI_POB_SRPs in the TKGI and the POBs specified for display by the DPLI_POB_SRPs in the DPLGI are displayed one after another. At a point six minutes after the start of playback, images are combined as shown in FIG. 80 and the combined image shown in FIG. 97B is displayed on the LCD panel 5.

At a point sixteen minutes after the start of playback, images are combined as shown in FIG. 81 and the combined image shown in FIG. 97C is displayed on the LCD panel 5.

{94-2_96-1_98A,B,C} Example Display Screens on the LCD Panel 5

Figure 98A:
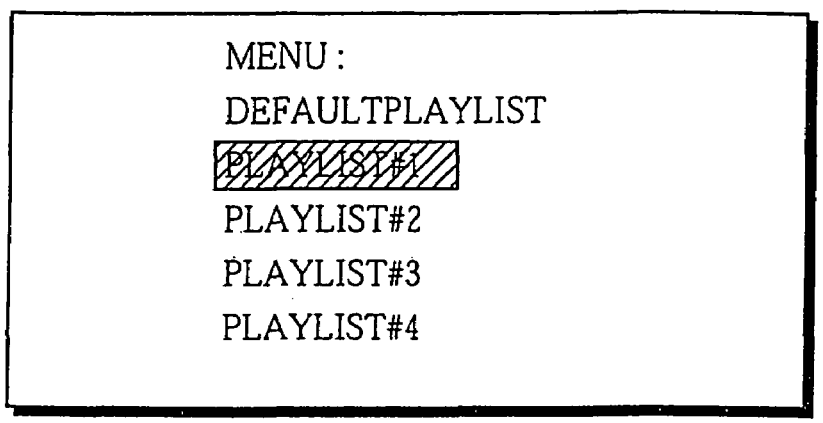
FIGS. 98A to 98C show what kind of combined image is displayed on the LCD panel 5 due to the processing in the flowcharts in FIGS. 94 and 96 that has a POB specified by a TKI_POB_SRP displayed as a foreground image and a POB specified by a PLI_POB_SRP displayed as a background image.
Figure 98B:
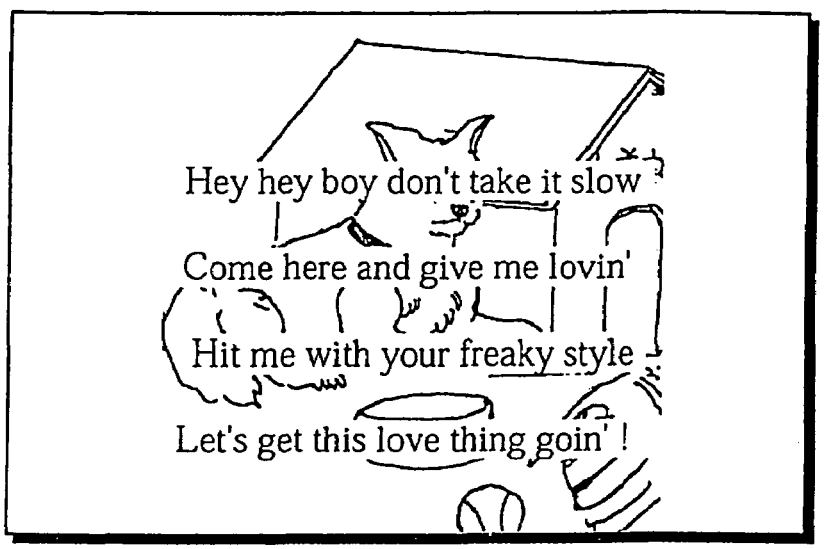
Figure 98C:

FIGS. 98A to 98C show what kind of combined images are displayed on the LCD panel 5 when a foreground image specified by a TKI_POB_SRP and a background image specified by a PLI_POB_SRP are displayed according to the display procedures shown in the flowcharts in FIGS. 94 and 96.

In the example in FIG. 97A, assume that the user indicates a PLI and that the display of POBs begins in accordance with the playback order given in this playlist. The foreground image display procedure shown in FIG. 94 and the background image display procedure shown in FIG. 96 are performed and the POBs specified for display by the TKI_POB_SRPs in the TKGI and the POBs specified for display by the PLI_POB_SRPs in the PLGI are displayed one after another. At a point six minutes after the start of playback, images are combined as shown in FIG. 85 and the combined image shown in FIG. 98B is displayed on the LCD panel 5. At a point sixteen minutes after the start of playback, images are combined as shown in FIG. 86 and the combined image shown in FIG. 98C is displayed on the LCD panel 5.

{99_1} Recording Apparatus of the Second Embodiment

The following describes a recording apparatus of this second embodiment. This recording apparatus differs from that of the first embodiment in that it is capable of recording a plurality of POBs onto a flash memory card, of setting values in the TKI_POB_SRPs, DPLI_POB_SRPs, and PLI_POB_SRPs, and setting values in the TKI_POB_ATR, DPLI_POB_ATR, and PLI_POB_ATR.

Figure 99:
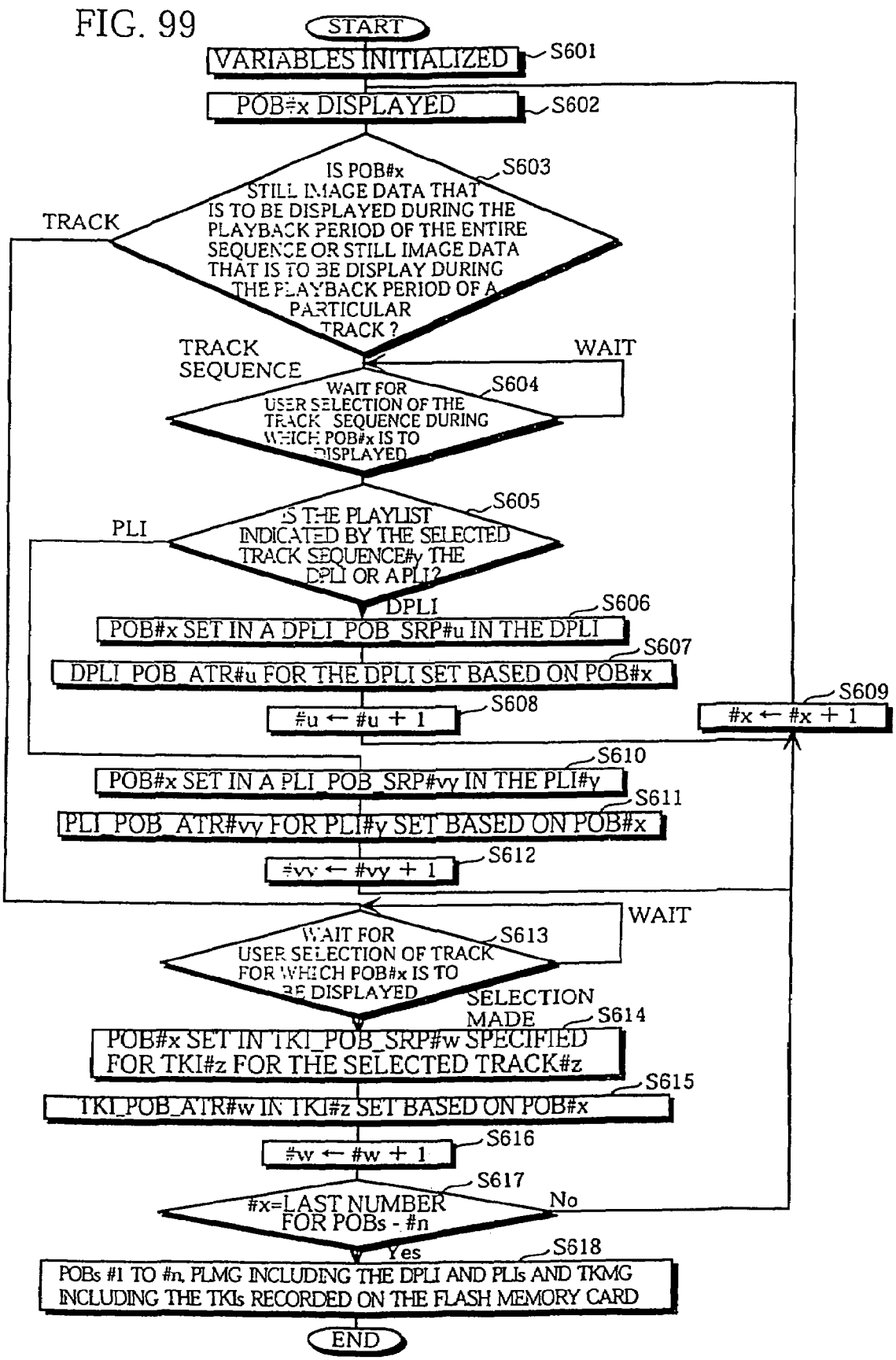
FIG. 99 is a flowchart showing the procedure used by the recording apparatus of the second embodiment.

To perform these processes, the CPU 10 in the recording apparatus of this second embodiment executes the procedure shown in FIG. 99. The following describes the recording procedure executed by the recording apparatus of this second embodiment with reference to the flowchart shown in FIG. 99.

In step S601, the CPU 10 initializes the various variables used in this procedure. These are the variables #x, #y, #z, #u, #vy, and #w. Of these, the variable #x is used to specify which POB is presently being processed, the variable #y is used to specify which track sequence (PLI) is presently being processed, and the variable #z is used to specify which track (TKI) is presently being processed. The variable #u specifies which of the DPLI_POB_SRPs is being processed, while the variable #vy specifies which of the PLI_POB_SRPs in the PLI (PLI#y) specified by the variable #y is being processed. The variable #w specifies which TKI_POB_SRPs in the TKI (TKI#z) specified by the variable #z is presently being processed.

After initializing these variables, the CPU 10 advances to step S602 where it displays POB#x. This allows the user to visually confirm the photo, illustration, or lyric sheet in this POB. In step S603, the CPU 10 asks the user to indicate whether the still image data in POB#x is to be displayed throughout the entire track sequence or just during the playback period of a specific track, and then receives a user selection.

When the user judges that POB#x should be assigned to a track sequence, in step S604 the CPU 10 waits for the user to indicate the track sequence for which POB#x should be displayed. When the user inputs his/her selection, the processing proceeds to step S605 when the CPU 10 judges whether the indicated track sequence #y is the DPLI or a PLI. When the track sequence #y is the DPLI, the processing proceeds to S606 where POB#x is set in the DPLI_POB_SRP#u, and then to S607 where the DPLI_POB_ATR#u of the DPLI is set based on this POB#x.

Once a DPLI_POB_SRP and the DPLI_POB_ATR have been set in this way, the CPU 10 increments the variable #u (#u→#u+1) in step S608 and the variable #x (#x→#x+1) in step S609.

When a PLI is selected in step S605, the processing proceeds to step S610 where POB#x is set in the PLI_POB_SRP#vy in PLI#y, and to step S611 where the PLI_POB_ATR#vy for this PLI is set based on POB#x. After this, in step S612 the CPU 10 increments the variable #vy (#vy→#vy+1), before advancing to step S609 to increment the variable #x (#x→#x+1).

When, in step S603, the user judges that POB#x should be assigned to a specific track, the processing advances to step S613 where the CPU 10 receives a user indication of this specific track. Next, in step S614, the CPU 10 sets POB#x in a TKI_POB_SRP#w set for the TKI#z of the indicated track (track#z).

The processing then proceeds to step S615 where the CPU 10 sets the TKI_POB_ATR#w of TKI#z based on the POB#x, to step S616 where the CPU 10 increments the variable #w (#w→#w+1) and to step S617 where the CPU 10 determines whether the variable #x has reached the final number #n in a POB. If not, the processing proceeds to step S609 where the CPU 10 increments the variable #x. If the variable #x has reached the final number #n in a POB, the processing proceeds to step S618 where POB#1 to POB#n, the TKMG including the TKIs, and the PLMG including the DPLI and PLIs are recorded on the semiconductor memory card to end the processing.

In these embodiments, it is possible to have the same still image data, such as an artist photo or a record label logo, displayed as a background image during the playback of a plurality of tracks. This is achieved by merely specifying the still image data in DPLI_POB_SRPs or PLI_POB_SRPs that correspond to such tracks in the Default_Playlist_Information or in a PLI.

Still image data, such as a lyrics sheet, that is to be displayed with a background image only during the playback of a particular track can be specified by a TKI_POB_SRP in the TKI of the track.

The above explanation focuses on what is presently believed to be the ideal system for realizing the concept of the present invention, though it should be obvious that several modifications can be made within the scope of the invention.

Three examples of such are given as (a), (b) and (c) below.

(a) The procedures explained using the flowcharts in FIGS. 94, 95, 96, and 99 can be achieved by programs that may be distributed and sold having been recorded onto a recording medium.

(b) The present embodiments describe the case where the presentation data and navigation data are used for music contents, although it should be obvious that such data can be used for an audiobook that is a recording of an actor or announcer reading from a book. In such case, still image data that shows text from the book can be ideally specified by the TKI_POB_SRPs as the foreground images while the illustrations from the book are specified by the DPLI_POB_SRPs or PLI_POB_SRPs.

(c) In this second embodiment, the POBs specified by DPLI_POB_SRPs and PLI_POB_SRPs are used as background images while the POBs specified by TKI_POB_SRPs are used as foreground images, though the opposite setup may be used. Alternatively, when different POBs are simultaneously specified by a DPLI_POB_SRP or PLI_POB_SRP and a TKI_POB_SRP, only one of such POBs may be displayed. As another alternative, no distinction into "background image" and "foreground image" need be used. As one example, a POB specified by a DPLI_POB_SRP or PLI_POB_SRP may be displayed first, and a POB specified by a TKI_POB_SRP may be displayed next.

Third Embodiment

While the second embodiment describes the case where each POB is displayed for an equal period during the valid period of a TKI and a PLI, this third embodiment describes the case where a phrase timing table and a highlight coordinate table are also stored on the flash memory card 31 so that the display of lyrics can be properly synchronized to the playback of a song.

The phrase timing table associates the TKI_POB_SRPs specifying the POBs showing each section of the lyrics with information showing at what time the corresponding phrase begins and ends in a song. FIG. 100A shows one example of the phrase timing table. In this example, "phrase timing" refers to the period during which a phrase given in the lyrics of a track is being sung as part of the playback of the AOB. This period is expressed to an accuracy of milliseconds. In addition to updating the playback time code as described in the first embodiment, a playback apparatus monitors the phrase timing given in this table that corresponds to the current value of the playback time code. By monitoring the phrase timing in this way, the playback apparatus can know which POB stores the lyrics for the AOB, AOB_ELEMENT, and AOB_FRAME currently being played back. Using a table that gives the phrase timing of a POB in milliseconds in this way allows the playback apparatus to synchronize the playback of AOBs and the display of lyrics to millisecond accuracy.

When the user indicates a desired playback start time using the jog dial as described in the first embodiment, the playback apparatus can find which AOB_FRAME in which AOB_ELEMENT in which AOB corresponds to the indicated playback start time using Equations 1 to 3 given in the first embodiment. The playback apparatus also judges which phrase timing includes the indicated playback start time and has the POB corresponding to this phrase timing displayed. This means that when the user has playback start from a desired position indicated using the jog dial, the appropriate POB for this desired position can also be displayed. Note that while the present case states that times are given in the phrase timing table, the AOB number, AOB_ELEMENT number and AOB_FRAME number of the AOB, AOB_ELEMENT, and AOB_FRAME to which a phrase should be synchronized may be given in the phrase timing table instead.

On the other hand, the highlight coordinate table associates the display coordinates of characters used in the lyrics and the timing at which the AOB_ELEMENT and AOB_FRAMEs corresponding to these characters will be played back. FIG. 100B shows one example of the highlight coordinate table. Preparing this kind of highlight coordinate table enables a playback apparatus to display the characters corresponding to the lyrics, out of the lyrics displayed according to the phrase timing, in the AOB_ELEMENT and AOB_FRAME currently being played back in a different color.

As one example, when the lyrics include the phrase "Hey hey boy don't take it slow", the highlight coordinate table will include display coordinates for the characters "H", "e", "y", "h", "e", "y", . . . that are associated with the playback period of the AOB_ELEMENT and AOB_FRAME corresponding to these characters. When playing back an AOB, the playback apparatus changes the color of the position shown by the display coordinates of the characters given in the highlight coordinate table.

The playback apparatus can therefore display the lyrics in a manner that allows the user to instantly recognize what part of the AOB is currently being played back. This means that music recorded on a flash memory card can be played back with highlighted lyrics in the same way as conventional karaoke tracks.

In this third embodiment, the phrase timing table and highlight coordinate table are provided to enable precise synchronization between audio playback and the displayed lyrics, in the same way as conventional karaoke tracks.

Although the present invention has been fully described with reference to the accompanying drawings, it is to be noted that various changes and modifications will be apparent to those skilled in the art. Therefore, unless such changes and modifications depart from scope of the present invention, they should be construed as being included therein.

What is claimed is:

1. A program stored on a computer-readable storage medium used for enabling a computer to execute a playback procedure for a semiconductor memory card, the semiconductor memory card containing:
   an audio sequence including a plurality of audio objects;
   a plurality of still image objects;
   at least one piece of playback route information which indicates an order in which audio objects, out of the plurality of audio objects in the audio sequence, are to be played back;
   at least one piece of first pointer information, wherein each of the at least one piece of first pointer information corresponds to a piece of the playback route information and specifies at least one still image object to be displayed when the audio objects in the order indicated by the corresponding piece of playback route information are played back; and
   at least one piece of second pointer information, wherein each of the at least one piece of second pointer information corresponds to an audio object in the audio sequence and specifies at least one still image object that should be displayed during playback of the corresponding audio object;
   said program comprising:
   computer executable code operation to cause the computer to play back audio objects in the audio sequence one at a time in the order indicated by the at least one piece of playback route information;
   computer executable code operable to cause the computer to display the at least one still image object specified by the at least one piece of first pointer information throughout playback of the audio objects in the audio sequence; and
   computer executable code operable to cause the computer to display the at least one still image object specified by the at least one piece of second pointer information throughout playback of a particular audio object corresponding to the at least one piece of second pointer information.

2. A program according to claim 1, wherein:
   computer executable code operable to cause the computer to display the at least one still image object specified by the at least one piece of second pointer information is further operable to cause the computer to display a combined image produced by combining the at least one still image object specified by the at least one piece of second pointer information with the at least one still image object specified by the at least one piece of first pointer information.

3. A program stored on a computer-readable storage medium used for enabling a computer to execute a recording procedure for a semiconductor memory card that stores a plurality of still image objects and an audio sequence including a plurality of audio objects, said program comprising:
   computer executable code operable to cause the computer to assign, to playback route information, at least one still image object that is to be displayed throughout playback of the plurality of audio objects in the audio sequence, and assign at least one still image object that is to be displayed throughout playback of a particular audio object to the particular audio object; and
   computer executable code operable to cause the computer to record onto the semiconductor memory card:
   at least one piece of playback route information which indicates an order in which audio objects, out of the plurality of audio objects in the audio sequence, are to be played back;
   at least one piece of first pointer information, wherein each of the at least one piece of first pointer information corresponds to a piece of the playback route information and indicates the at least one still image object assigned to the audio sequence; and
   at least one piece of second pointer information, wherein each of the at least one piece of second pointer information corresponds to an audio object in the audio sequence and indicates the at least one still image object assigned to the particular audio object.

* * * * *